(12) United States Patent
Takashima et al.

(10) Patent No.: US 8,060,164 B2
(45) Date of Patent: Nov. 15, 2011

(54) INPUT DEVICE AND ELECTRONIC APPARATUS

(75) Inventors: Kouichiro Takashima, Tokyo (JP); Seiji Muramatsu, Saitama (JP); Tsutomu Takahashi, Kanagawa (JP); Shun Kayama, Saitama (JP); Yukiko Shimizu, Saitama (JP); Takashi Sawada, Kanagawa (JP); Satoshi Kushima, Tokyo (JP); Yuuji Arataki, Tokyo (JP); Hiroshi Yokoyama, Kanagawa (JP); Kazuhiko Takeda, Chiba (JP)

(73) Assignees: Sony Corporation, Tokyo (JP); Sony Ericsson Mobile Communications Japan, Inc., Tokyo (JP)

( * ) Notice: Subject to any disclaimer, the term of this patent is extended or adjusted under 35 U.S.C. 154(b) by 537 days.

(21) Appl. No.: 12/211,433

(22) Filed: Sep. 16, 2008

(65) Prior Publication Data
US 2009/0103250 A1    Apr. 23, 2009

(30) Foreign Application Priority Data

Sep. 21, 2007  (JP) ................................ 2007-246071
Feb. 14, 2008  (JP) ................................ 2008-033833
Jul. 10, 2008  (JP) ................................ 2008-180806

(51) Int. Cl.
*H04M 1/00* (2006.01)

(52) U.S. Cl. ................ 455/575.4; 455/575.3; 455/550.1; 361/679.39

(58) Field of Classification Search ............... 455/575.4, 455/550.1, 550.3; 361/679.13
See application file for complete search history.

(56) References Cited

U.S. PATENT DOCUMENTS

| | | | |
|---|---|---|---|
| 2003/0228884 A1* | 12/2003 | Iwai et al. | 455/550.1 |
| 2004/0097258 A1* | 5/2004 | Lee et al. | 455/550.1 |
| 2005/0021873 A1* | 1/2005 | Papadimitriou et al. | 709/250 |
| 2005/0277388 A1* | 12/2005 | Kim et al. | 455/90.3 |
| 2006/0234786 A1* | 10/2006 | Taniguchi et al. | 455/575.4 |
| 2008/0018614 A1* | 1/2008 | Rekimoto | 345/173 |
| 2008/0318645 A1* | 12/2008 | Takamori et al. | 455/575.4 |

* cited by examiner

*Primary Examiner* — Danh Le
(74) *Attorney, Agent, or Firm* — SNR Denton US LLP

(57) ABSTRACT

An input device that inputs information by a slide operation depending on an operation body contains a housing including an operation surface, a detection unit that is provided in the housing and detects a slide position inputted by a slide operation depending on the operation body, and an operation unit that covers at least a portion of the detection unit and is slide-operated along the operation surface of the housing. The operation unit has a convex shape which becomes thicker along the sliding direction from one portion of the operation surface of the housing and also which becomes thinner toward the other portion of the operation surface thereof.

19 Claims, 69 Drawing Sheets

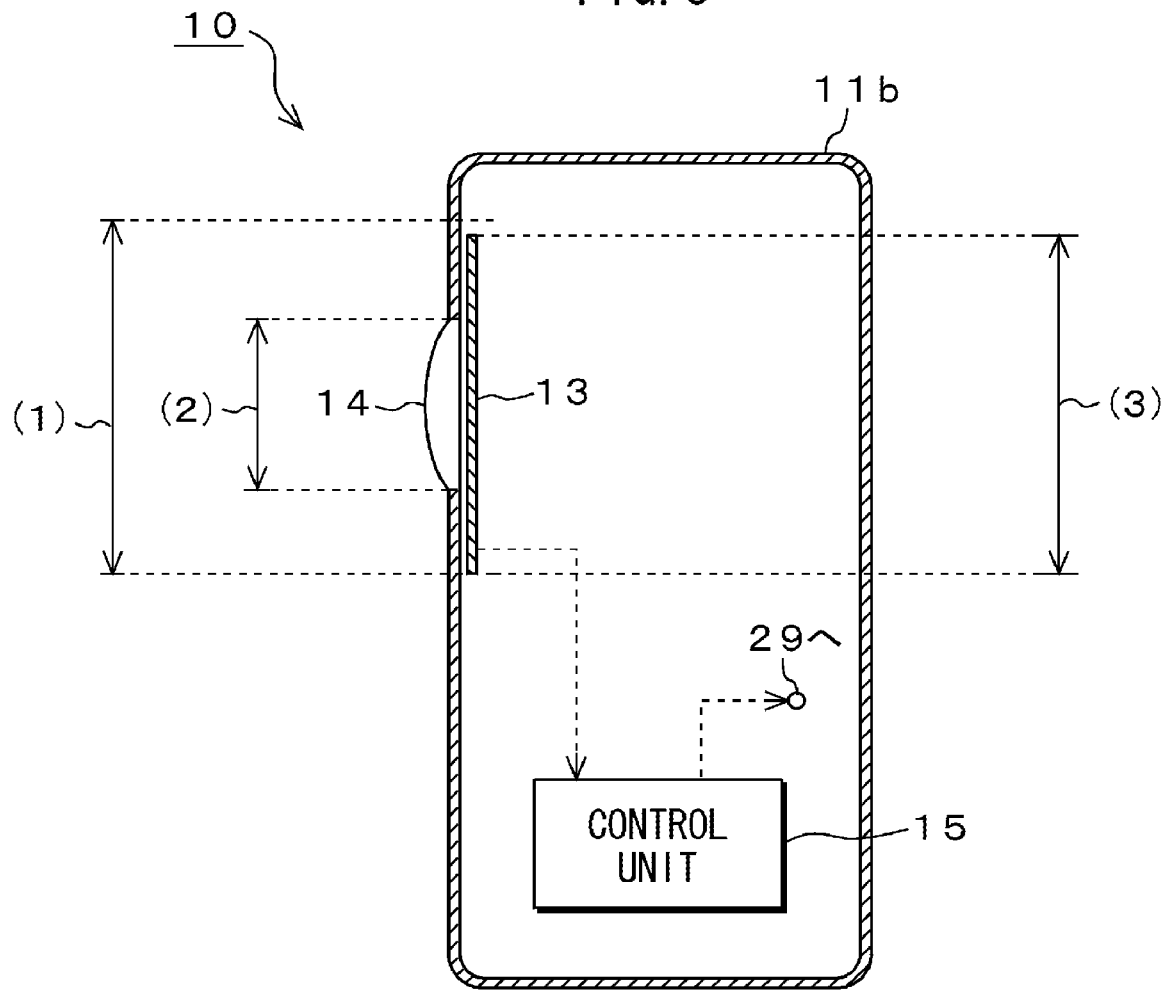

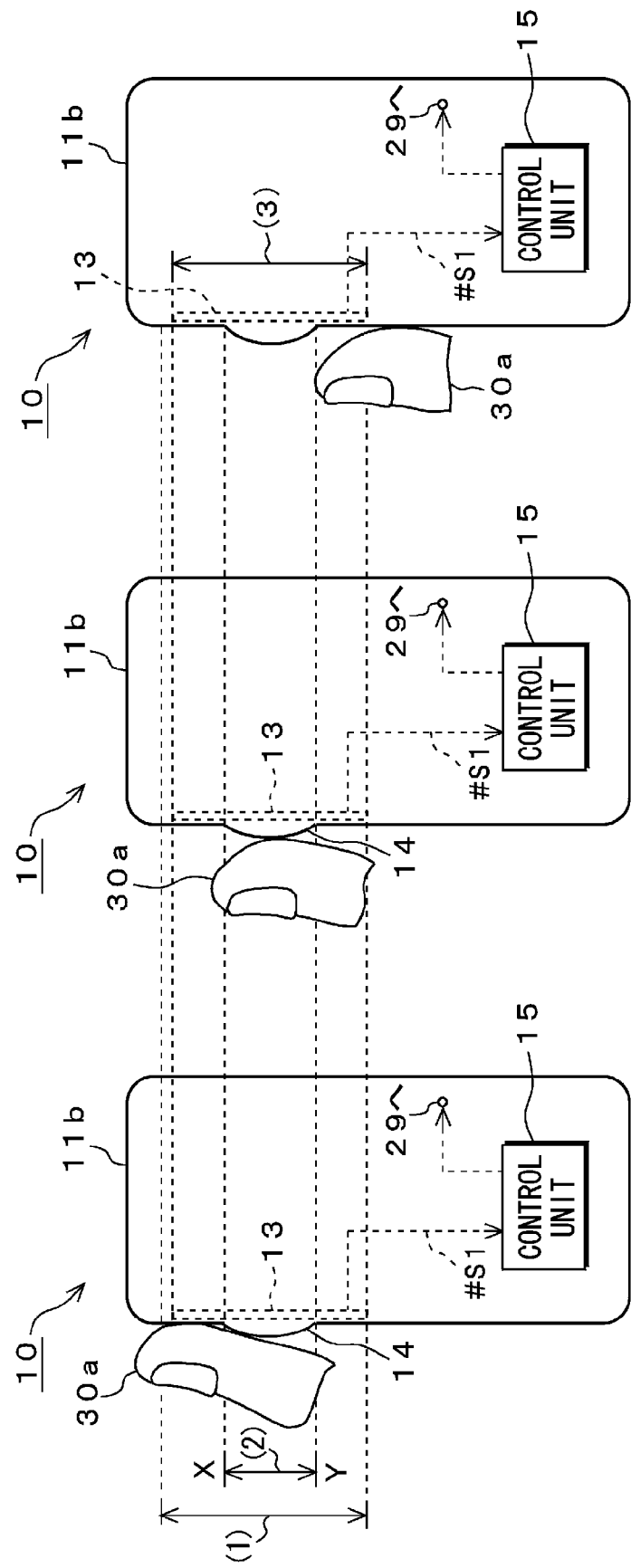

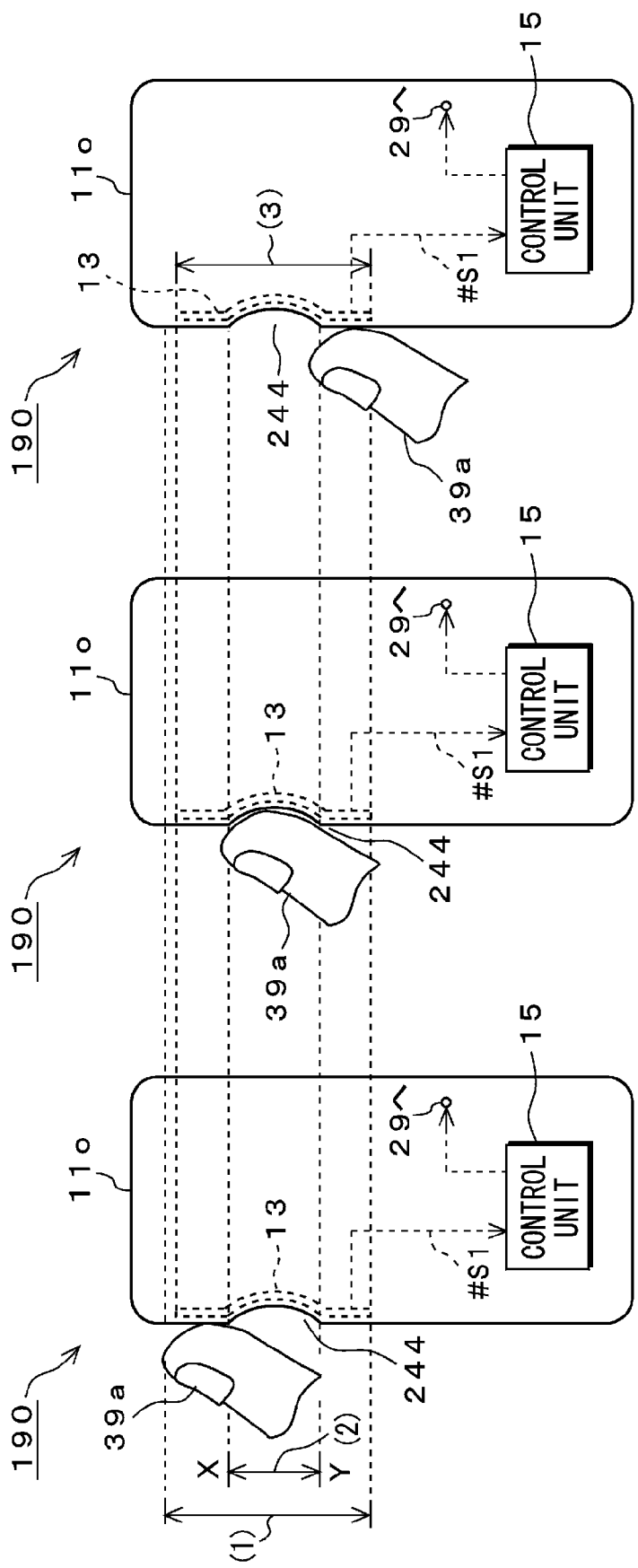

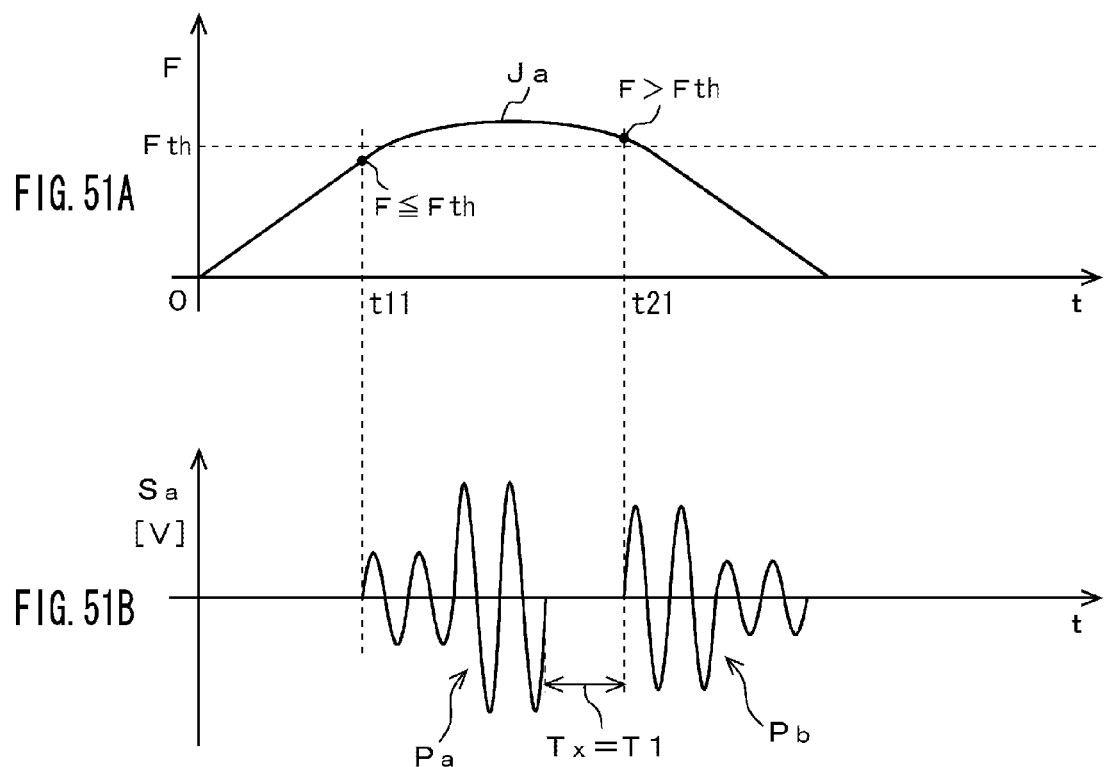

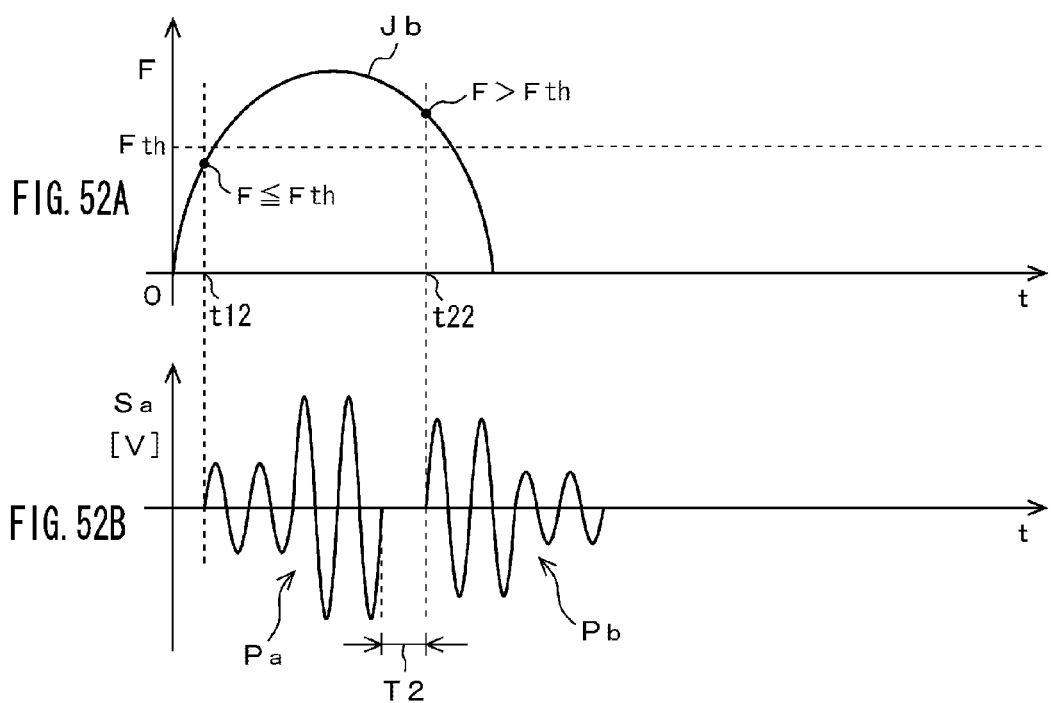

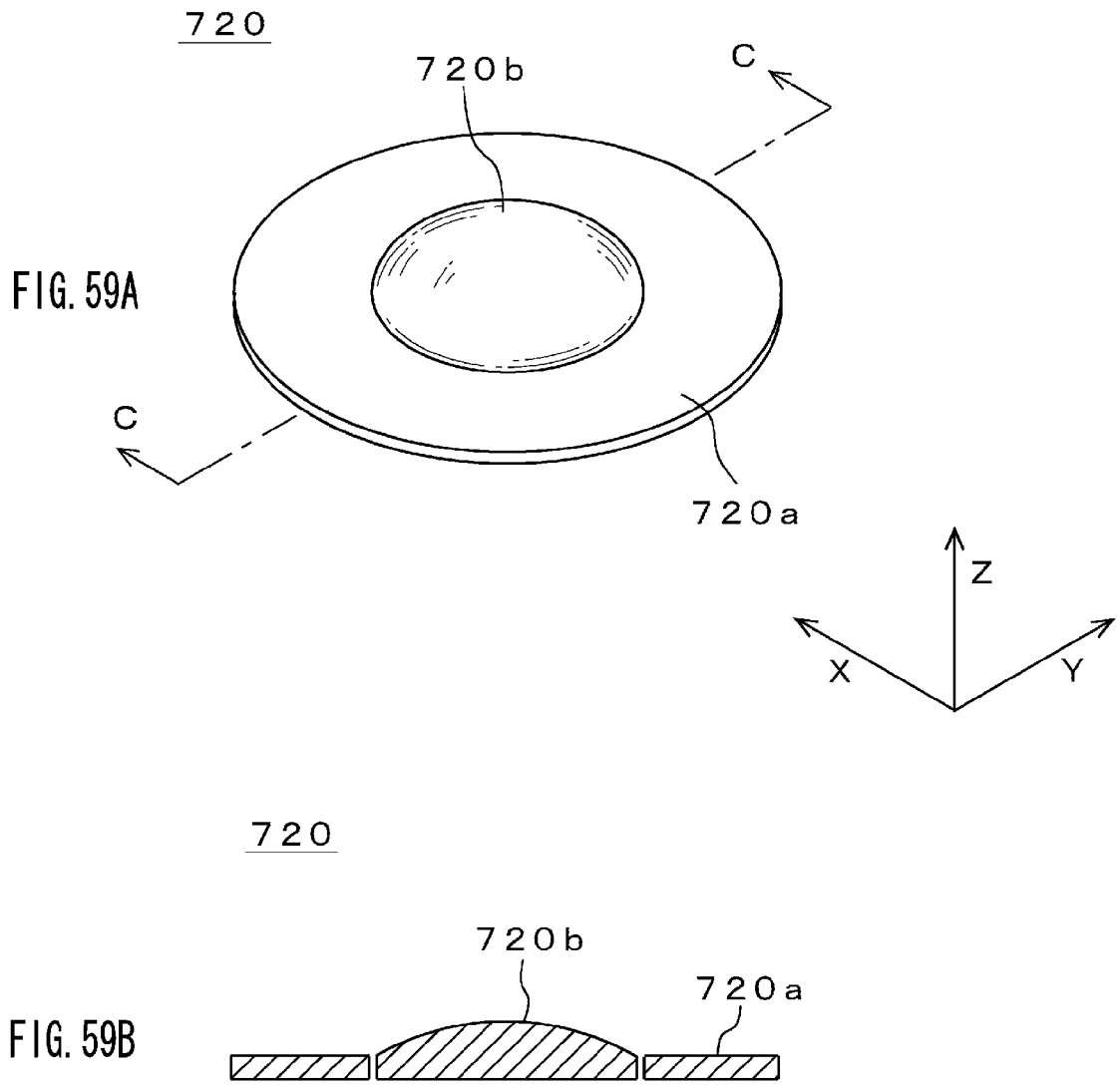

INPUT DEVICE AND ELECTRONIC APPARATUS

CROSS REFERENCES TO RELATED APPLICATIONS

The present invention contains subject manner related to Japanese Patent Applications JP2007-246071, JP2008-33833 and JP2008-180806 filed in the Japanese Patent Office on Sep. 21, 2007, Feb. 14, 2008 and Jul. 10, 2008 the entire contents of which being incorporated herein by reference.

BACKGROUND OF THE INVENTION

1. Field of the Invention

The present invention relates to an input device which is applicable to a digital camera, a video camera, a mobile phone, a mobile terminal device, a personal computer (hereinafter, referred to as PC), a note type PC, a home system electronic apparatus and a remote controller thereof or the like, and an electronic apparatus using the same.

2. Description of Related Art

In resent years, it has become in such a state in which a user (operator) images a subject by using a digital camera with various kinds of operation modes and takes various contents in a mobile terminal device such as a mobile phone, a PDA (Personal Digital Assistant) and the like so as to utilize them. These apparatuses such as the digital camera, the mobile terminal device and the like are provided with input devices. As the input device, a key board, an input unit of a JOG dial or the like, and a touch panel formed by combining a display unit, and the like are often used.

FIG. 1 shows a configuration of an input device 500 relating to related art. The input device 500 shown in FIG. 1 contains a housing 501, a rotary operation unit (hereinafter, referred to as JOG dial 502), a circuit board 503 and a dome switch 504.

The input device 500 has the housing 501 with a predetermined size and the housing 501 has an opening portion 505 at the side portion thereof. The jog dial 502 is mounted on the circuit board 503 in a state in which a key-top portion of the JOG dial 502 is exposed from this opening portion 505. The JOG dial 502 has a circular shape and is mounted rotatably on the circuit board 503 through a shaft 506 (rotation axis). The JOG dial 502 excluding the key-top portion thereof occupies a space within the housing 501.

The JOG dial 502 also has a magnetic material such as a magnet or the like, which is not shown, on the rear surface thereof. Two hall ICs 507, 508, which are placed at the positions interlinking the magnetic field caused by this magnetic material, are mounted on the circuit board 503 with being separated by a predetermined angle, thereby allowing a two-phase rotation detection signal to be outputted by a fact that the magnetic material of the rear surface of the JOG dial cross the hall ICs 507, 508.

Also, a bias member (not shown) biases the shaft 506 from the circuit board 503 toward the outside of the housing 501. The dome switch 504 is mounted on the circuit board 503 which is facing in parallel with the axial direction of the shaft 506 and the dome switch 504 can be turned on or off when the JOG dial 502 is pressed-into against biasing force of the bias member.

Japanese Patent Application Publication No. 2003-256120 discloses a mobile information terminal and a program therefor in connection with an input device including this kind of JOG dial (see Pages 2 to 3 and FIG. 1). This mobile information terminal contains a terminal device main body, a display unit on the terminal device main body, and a JOG dial approximately at the center of the main body. The JOG dial is provided at a position separated from that of the display unit. This JOG dial rotates clockwise or counterclockwise and an image displayed on the display unit rotates in cooperation with this rotation. Furthermore, when the JOG dial is pushed down in the direction of the main body, the image area changes.

Also, Japanese Patent Application Publication No. 2004-070505 discloses an input device mountable on an air conditioner or an electronic apparatus such as audio in connection with an input device accompanied by vibrations (see Page 5 and FIG. 3). This input device contains an operation unit possessing functions of a rotary switch, of a push switch, and of a slide switch concurrently, and the selection of the operation item and input determination operation are executed by rotating, sliding or depressing the operation unit. Any vibrations are accompanied with an occasion of the input determination operation.

FIG. 2 shows a configuration of another input device 600 relating to related art. The input device 600 shown in FIG. 2 includes a key-top 602 of a non-rotary type, which has a flat front surface. The input device 600 has a predetermined sized housing 601 and an opening portion 605 at a side portion of the housing 601. The key-top 602 is mounted movably on a circuit board with a part of the key-top 602 being exposed from this opening portion 605. The key-top 602 is mounted so that it is inserted into the opening portion 605 of the housing 601 and the non-operation surface thereof faces the inside of the housing 601. The key-top 602 has a flange 606 and this flange 606 is hooked on an inside portion of the housing 601 around the opening portion 605. This enables the key-top 602 to be prevented from slipping out of the opening portion 605.

A circuit board 603 is provided on the inside of the key-top 602 and the circuit board 603 is provided with a dome switch 604 which is operated so as to be turned on or/and off by the press-in operation of the key-top 602. On the inside of the key-top 602, there are arranged a sensor 613, a pusher piece 619, the dome switch 604, and the circuit board 603 in this order. The pusher piece 619 is arranged so as to be sandwiched between the sensor 613 and the side portion of the circuit board 603. When the key-top 602 having the flat front surface is mounted with respect to a side portion of the housing in this manner, the key-top 602 hardly occupies a space within the housing as compared with the above-mentioned JOG dial.

Also, Japanese Patent Application Publication Heisei 02-230310 discloses a menu selection device in connection with a function of an input device (see Page 2 and FIG. 1). This menu selection device includes an item selector and an item input unit. The item input unit is provided on the item selector and the selection and the input of an item are allotted to the same key, and it is constituted such that the item display key and the item selection input key are juxtaposed.

Further, Japanese Patent Application Publication No. 2005-063230 discloses an input device in connection with a key-top exposed from an opening portion (see Page 9 and FIG. 16). This input device is provided with a window opening at a predetermined position of a casing and an item selection is executed by slide-operating an operation button exposed from this window opening, changeover of an item selection screen of page shift, scroll or the like is executed by press-operating another operation knob.

Also, Japanese Patent Application Publication No. 2005-063227 discloses an input device (see Page 8 and FIG. 15). This input device is provided with an window opening at a predetermined position of a casing, an item selection is executed by slide-operating an operation button exposed from this window opening, and a predetermined region in the specified item selection screen is zoom-displayed by press-operating another operation knob.

SUMMARY OF THE INVENTION

Meanwhile, the mobile information terminal seen in Japanese Patent Application Publication No. 2003-256120, in which a display unit and a JOG dial are separately arranged, presents to an operator only a single sense of touch which a mechanical structure is to generate and the actual status is that there can be obtained no sense of touch having impact for the operator. Furthermore, the JOG dial excluding the key-top portion thereof occupies a major space within the housing. Consequently, the area (space) in which other parts are mounted is reduced, which blocks compactification of the electronic apparatus applied with the input device.

Also, in the electronic apparatus seen in Japanese Patent Application Publication No. 2004-070505 or Japanese Patent Application Publication Heisei 02-230310, an input device with a touch input function by combining a touch panel selected from various kinds of systems and a display unit is mounted, but when an icon is selected on the display unit, an operator get no sense of touch in synchronization with the selection thereof.

Incidentally, an input device with sense of touch function is constituted by combining a plurality of vibration bodies and an input unit and in case of trying to obtain sense of touch by executing contact-operation linearly on the input operation surface thereof, not only the manufacturing process becomes complicated but also there may be a situation in which no satisfactory sense of touch is obtained when the speed with which the operator executes contact-operation on the input operation surface is different, depending on a fact that a structure for separately arranging a display unit and an input unit as disclosed in Japanese Patent Application Publication No. 2003-256120 and an input function combining a touch panel selected from various kinds of systems and a display unit are only simply combined. As a result thereof, it will cause a cost increase of an electronic apparatus.

According to input devices as disclosed in Japanese Patent Application Publication Nos. 2005-063230 and 2005-063227, the item selection is executed by slide-operating the operation button exposed from the window opening provided at a predetermined position of the casing and the item selection screen of page shift, scroll or the like is changed over by press-operating another operation knob. However, an operation mechanism becomes complicated, so that miniaturization, thinner fabrication or the like of the operation unit may be blocked and it may be a fear that the operability thereof is lowered or malfunction occur.

It is desirable to provide an input device and an electronic apparatus in which miniaturization and operability of the operation unit can be improved and at the same time, malfunction is lowered, cost-down is realized and manufacturing processing can be simplified.

According to an embodiment of the present invention, there is provided a first input device that inputs information by a slide operation depending on an operation body. The device contains a housing including an operation surface, a detection unit that is provided in the housing and detects a slide position inputted by a slide operation depending on the operation body, an operation unit that covers at least a portion of the detection unit and is slide-operated along the operation surface of the housing. The operation unit has a convex shape which becomes thicker along the sliding direction from one portion of the operation surface of the housing and also which becomes thinner toward the other portion of the operation surface thereof.

In the embodiment of the first input device according to the present invention, when information is inputted by the slide operation depending on the operation body, in addition to the slide operation feeling of becoming thicker along the sliding direction from one portion of the operation surface of the housing in response to the slide operation depending on the operation body which operates the input device, it is possible to present the slide operation feeling of becoming thinner toward the other portion of the operation surface.

Consequently, it becomes possible to provide a non-rotary side jog tool or the like which has a different structure from a rotary side jog tool in the past and which obtains the operation feeling approximately similar to such a side jog tool. Furthermore, miniaturization and operability of the operation unit can be improved, so that it is possible to attempt the lowering of malfunction, cost-down and the simplification of manufacturing process of the input device.

According to another embodiment of the present invention, there is provided an electronic apparatus. The electronic apparatus contains a housing having an operation surface, and an input device that is provided at the housing and inputs information by a slide operation depending on an operation body. The input device includes a detection unit that is provided in the housing and detects the slide position of the operation body, and an operation unit that covers at least a portion of the detection unit and is slide-operated along an operation surface of the housing. The operation unit includes a convex shape which becomes thicker along a sliding direction from one portion of the operation surface of the housing and also which becomes thinner toward the other portion of the operation surface thereof.

In an embodiment of the first electronic apparatus according to the present invention, there is provided the first input device relating to the present invention, so that in addition to the slide operation feeling of becoming thicker along the sliding direction from one portion of the operation surface of the housing in response to the slide operation depending on the operation body which operates the electronic apparatus, it is possible to present the slide operation feeling of becoming thinner toward the other portion of the operation surface thereof.

Consequently, it becomes possible to provide an electronic apparatus including a non-rotary side jog tool or the like which has a different structure from a rotary side jog tool in the past and which obtains the operation feeling approximately similar to such a side jog tool. Furthermore, miniaturization and operability of the input device can be improved, so that it is possible to attempt the lowering of malfunction, cost-down and the simplification of manufacturing process of the electronic apparatus.

According to further embodiment of the present invention, there is provided a second input device containing a housing having an operation surface, a detection unit that is provided in the housing and detects a slide position inputted by a slide operation depending on the operation body, and an operation unit that covers at least a portion of the detection unit and is slide-operated along the operation surface of the housing. The operation unit has a concave shape formed by being dug-down along a sliding direction from one portion of the operation surface of the housing and also, by being dug-up toward the other portion of the operation surface thereof.

In the embodiment of the second input device according to the present invention, when information is inputted by the slide operation depending on the operation body, in addition to the slide operation feeling of being dug-down along the sliding direction from one portion of the operation surface of the housing in response to the slide operation depending on the operation body which operates the input device, it is possible to present the slide operation feeling of being dug-up toward the other portion of the operation surface thereof.

Consequently, it becomes possible to provide a non-rotary side jog tool or the like of a reverse structure with respect to the non-rotary side jog tool or the like of the first input device. Furthermore, miniaturization and operability of the operation unit can be improved, so that it is possible to attempt the lowering of malfunction, cost-down and the simplification of manufacturing process of the input device.

According to additional embodiment of the invention, there is provided a second electronic apparatus. The second electronic apparatus contains a housing having an operation surface, and an input device that is provided at the housing and inputs information by a slide operation depending on an operation body. The input device includes a detection unit that is provided in the housing and detects a slide position inputted by a slide operation depending on the operation body, and an operation unit that covers at least a portion of the detection unit and is slide-operated along the operation surface of the housing. The operation unit has a concave shape formed by being dug-down along the sliding direction from one portion of the operation surface of the housing and also, by being dug-up toward the other portion of the operation surface thereof.

In the embodiment of the second electronic apparatus according to the present invention, there is provided the embodiment of the second input device according to the present invention, so that in addition to the slide operation feeling of being dug-down along the sliding direction from one portion of the operation surface of the housing in response to the slide operation depending on the operation body which operates the electronic apparatus, it is possible to present the slide operation feeling of being dug-up toward the other portion of the operation surface thereof.

Consequently, it becomes possible to provide a non-rotary side jog tool or the like of a reverse structure with respect to the non-rotary side jog tool or the like of the first input device. Furthermore, miniaturization and operability of the input device can be improved, so that it is possible to attempt the lowering of malfunction, cost-down and the simplification of manufacturing process of the electronic apparatus.

The concluding portion of this specification particularly points out and directly claims the subject matter of the present invention. However, those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWINGS

FIG. 8 is a cross-section diagram of the input device 10 showing an operation region example thereof;

FIGS. 10A to 10C are conceptional diagrams each showing operation examples of the input device 10;

FIG. 37A to FIG. 37C are conceptional diagrams showing operation examples of the input device 190;

FIGS. 51A and 51B are diagrams showing a relation example (No. 1) of impressed pressure force F and the vibration pattern;

FIGS. 52A and 52B are diagrams showing a relation example (No. 2) of the impressed pressure force F and the vibration pattern;

FIG. 59A is a perspective view of a key-top 720 as a modified example 2 showing a configuration thereof and FIG. 59B is a cross-section diagram thereof;

DESCRIPTION OF THE PREFERRED EMBODIMENTS

Figure 1:
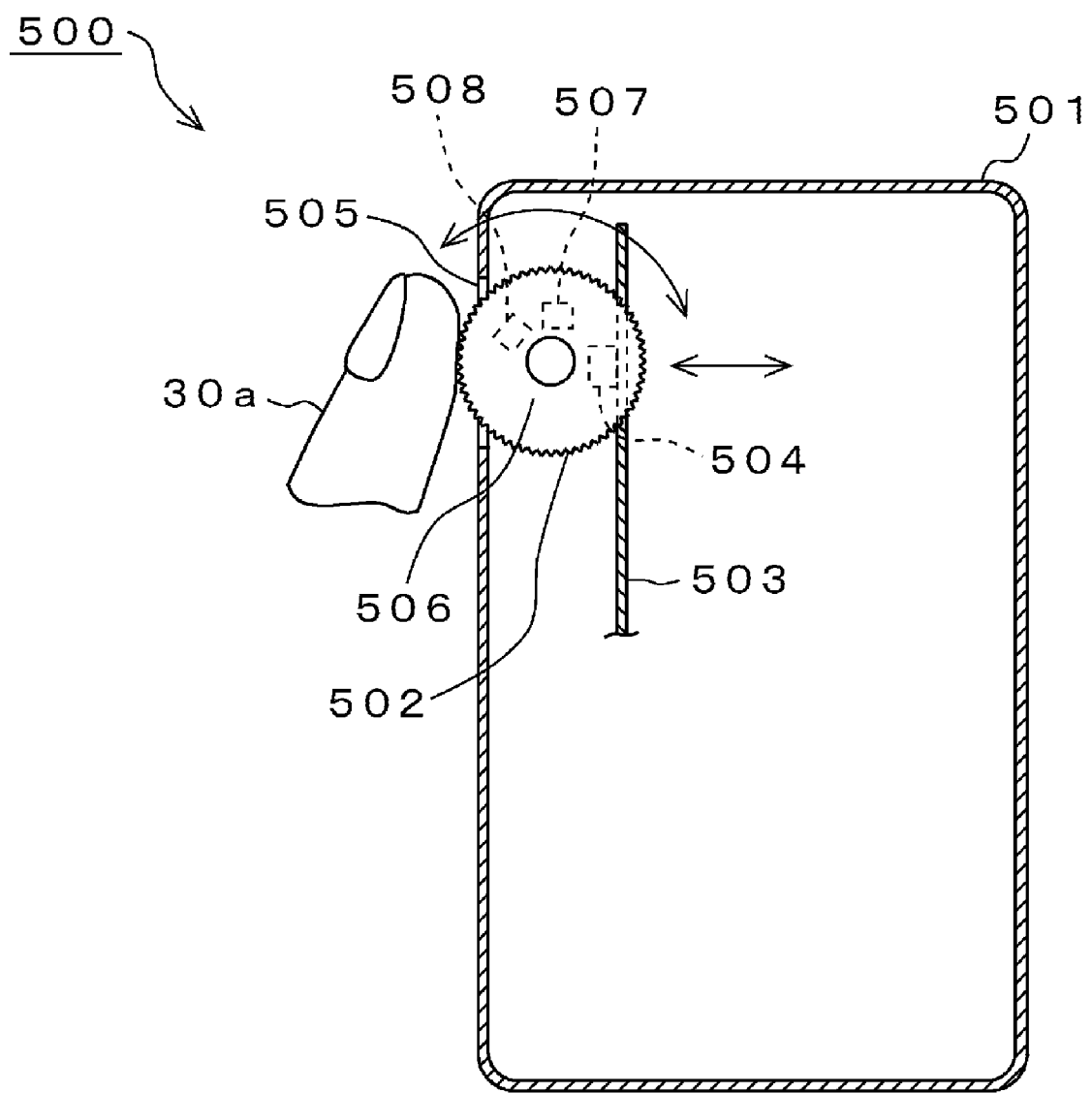
FIG. 1 is a cross-section diagram showing a configuration of an input device 500 relating to related art.

The following will describe preferred embodiments of an input device and an electronic apparatus according to the present invention with reference to the drawings.

Embodiment 1

FIGS. 3A and 3B show a configuration of a mobile phone 101 provided with an input device 10 as a first embodiment of the present invention.

The mobile phone 101 shown in FIG. 3A constitutes one example of an electronic apparatus and includes a slide type housing structure. The mobile phone 101 contains an upper housing 11a and a lower housing 11b which is mounted with an embodiment of the input device 10 according to the present invention. The upper housing 11a, for example, is slidably engaged back and forth with the lower housing 11b. The mobile phone 101 employs an operation surface slide housing structure, as shown in FIG. 3B, such that the upper housing 11a covers the operation surface on the lower housing 11b.

The upper housing 11a contains a display unit 29 having a predetermined size which displays a wait screen image or the phone number of the partner side or the like. A liquid crystal display monitor is used for the display unit 29. The input device 10 is provided in the lower housing 11b. The input device 10 includes the operation surface at an upper portion and a side portion and the upper portion operation surface includes an operation panel 18 in which a ten-key of numerals [0] to [9], a symbol [*] key, a symbol [#] key and the like are arranged.

Figure 4:
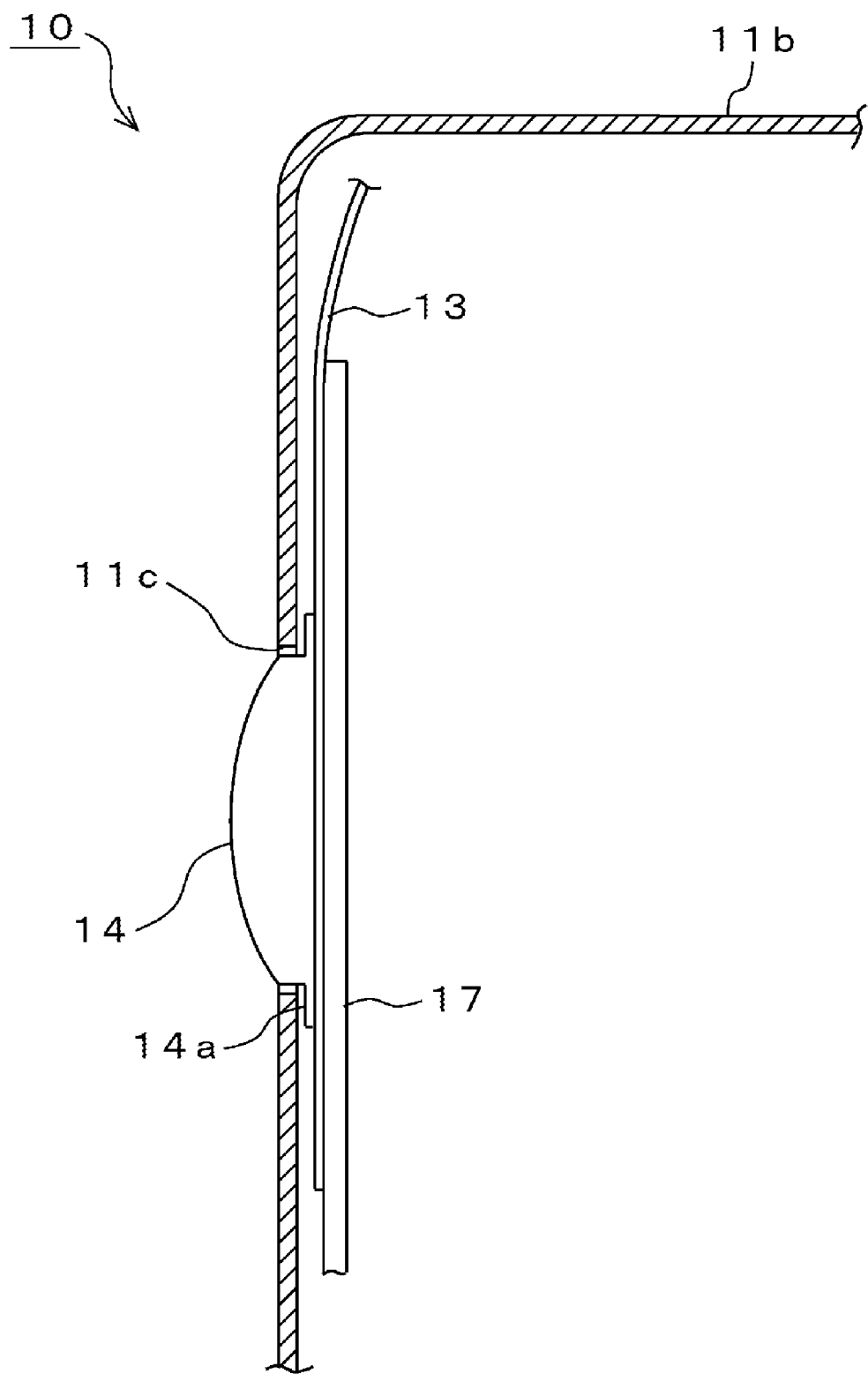
FIG. 4 is a cross-section diagram of the input device 10 showing an internal configuration thereof.

FIG. 4 shows an internal configuration of the input device 10. The input device 10 shown in FIG. 4 is a device for inputting information by a slide operation depending on an operation body, for example, an operator's thumb (hereinafter, simply referred to as finger 39a).

The input device 10 contains a circuit board 17, a sensor 13, and a key-top 14 in addition to the ten-key of number [0] to [9], the [*] key, the [#] key and the like. In this embodiment, the lower housing 11b has a predetermined sized opening portion 11c at a predetermined position, for example, at an operation surface of a left side portion of the lower housing 11b.

The circuit board 17 for mounting electronic parts is arranged in the inside of the lower housing 11b. The sensor 13 is provided in the circuit board 17 and in a case in which the mobile phone 101 is operated by a left hand of the operator, the sensor operates as to detect the slide position of the finger 39a of the operator or the like. Electrostatic capacitance sheet member by which the impressed pressure force of the slide position is converted to the electrostatic capacitance and detected is used for the sensor 13. In a case in which there is mounted the sensor 13 composed of the electrostatic capacitance sheet member, the sensor 13 detects the slide position of the operator's finger to output a position detection signal. The [cursor moving method] described in Japanese Patent No. 3920833 or the [coordinate input device] described in Japanese Patent No. 3909230 are applicable for the electrostatic capacitance sheet member.

Other than the electrostatic capacitance sheet member, a pressure detecting sheet member using piezoresistive effect is used for the sensor 13. The pressure detecting sheet member reads resistance change caused by the impressed pressure force of the slide position and converts it into the electric signal. The [force sensor, force detecting system and force detecting program] described in Japanese Patent Application Publication No. 2005-326293 is applicable for the pressure detecting sheet member. When the sensor 13 composed of the pressure detecting sheet member is mounted, a pressure detection signal is outputted by detecting the pressure of the slide position of the operator's finger.

The key-top 14 is inserted into the opening portion 11c opened in the operation surface of the left side portion of the lower housing 11b. The key-top 14 constitutes one example of the operation unit, covers a portion or the whole of the sensor 13, and is slide-operated along the operation surface of the left side portion of the lower housing 11b. For example, the key-top 14 has the non-operation surface thereof of a flat shape and a flange 14a (flange-shaped portion) at the circumferential edge portion of the non-operation surface.

The key top 14 is mounted in a state in which the non-operation surface thereof is combined toward the inside of the lower housing 11b and the flange 14a is hooked on a portion surrounding the opening portion 11c of the left side portion of the lower housing 11b, thereby prohibiting the key top 14 from being pulled-out. The key top 14 has a convex shape which becomes thicker along the sliding direction from one portion of the operation surface of the lower housing 11b and also which becomes thinner toward the other portion of the operation surface.

In this embodiment, the convex shape of the key-top 14 covering the entire surface of the sensor 13 forms an arc having a predetermined height and width. The key-top 14 is slide-operated along a shape of the arc. By doing like this, in addition to the slide operation feeling of becoming thicker in an arc shape along the sliding direction from one portion of the operation surface of the lower housing 11b in response to the slide operation by the operator's finger 39a, it is possible to present the slide operation feeling of becoming thinner in the arc shape toward the other portion of the operation surface. Consequently, it becomes possible to provide a non-rotary side jog tool with a dome key or the like which is a new structure different from a rotary side jog tool in the past and which obtains the operation feeling approximately similar to such a side jog tool. The key-top 14 of this shape, when retrieving various kinds of information, is applicable, for example, as a scroll key when selecting a telephone directory, when selecting files and on an occasion of expansion and reduction or a determination key for these and also an information selection key of a volume key and the like when adjusting audio volume.

In this embodiment, the key-top 14 is constituted by material that is different from material of the lower housing 11b. Here, when surface roughness of the material constituting the key-top 14 is substituted as "A" and surface roughness of the material constituting the lower housing 11b is substituted as "B", such a relation as A<B is set between the surface roughness "A" and the surface roughness "B". For example, a PC resin, an ABS resin, these synthetic resins or the like is used for the lower housing 11b. Aluminum (Al), its alloy or the like is used for the key-top 14. Totally, it is preferable that at a protrusion portion constituting the key-top 14, the surface roughness "A" thereof is less than the surface roughness "B" of the lower housing 11b. The protrusion portion may be constituted by a PC resin, an ABS resin, these synthetic resins or the like and aluminum or its alloy or the like may be coated on the front surface thereof.

When the material of the key-top 14 is constituted in this manner, it becomes possible to perform the slide operation of the portion which becomes thicker along the sliding direction from the left side portion of the operation surface and also which becomes thinner toward the other portion of the operation surface thereof smoothly as compared with the slide operation in the operation surface of the left side portion of the lower housing 11*b* and it becomes possible to select information easily by the slide operation of the operator's finger 39*a*.

In this embodiment, the detection area in which the slide position of the operator's finger 39*a* is detected by the sensor 13 is set to be wider than the operation area which is slide-operated by the operator's finger 39*a* at the key-top 14. By doing like this, it is possible to include one portion of the operation surface and the other portion of the operation surface of the lower housing 11*b* sandwiched the convex shaped key-top 14 in the slide operation region with respect to the slide operation by the operator's finger 39*a*. It becomes possible for the key-top 14 in this shape to set a retrieving pitch of the scroll key when retrieving various kinds of information and an audio volume adjustment pitch of the volume key and the like when adjusting audio volume so as to be wider.

Figure 5:
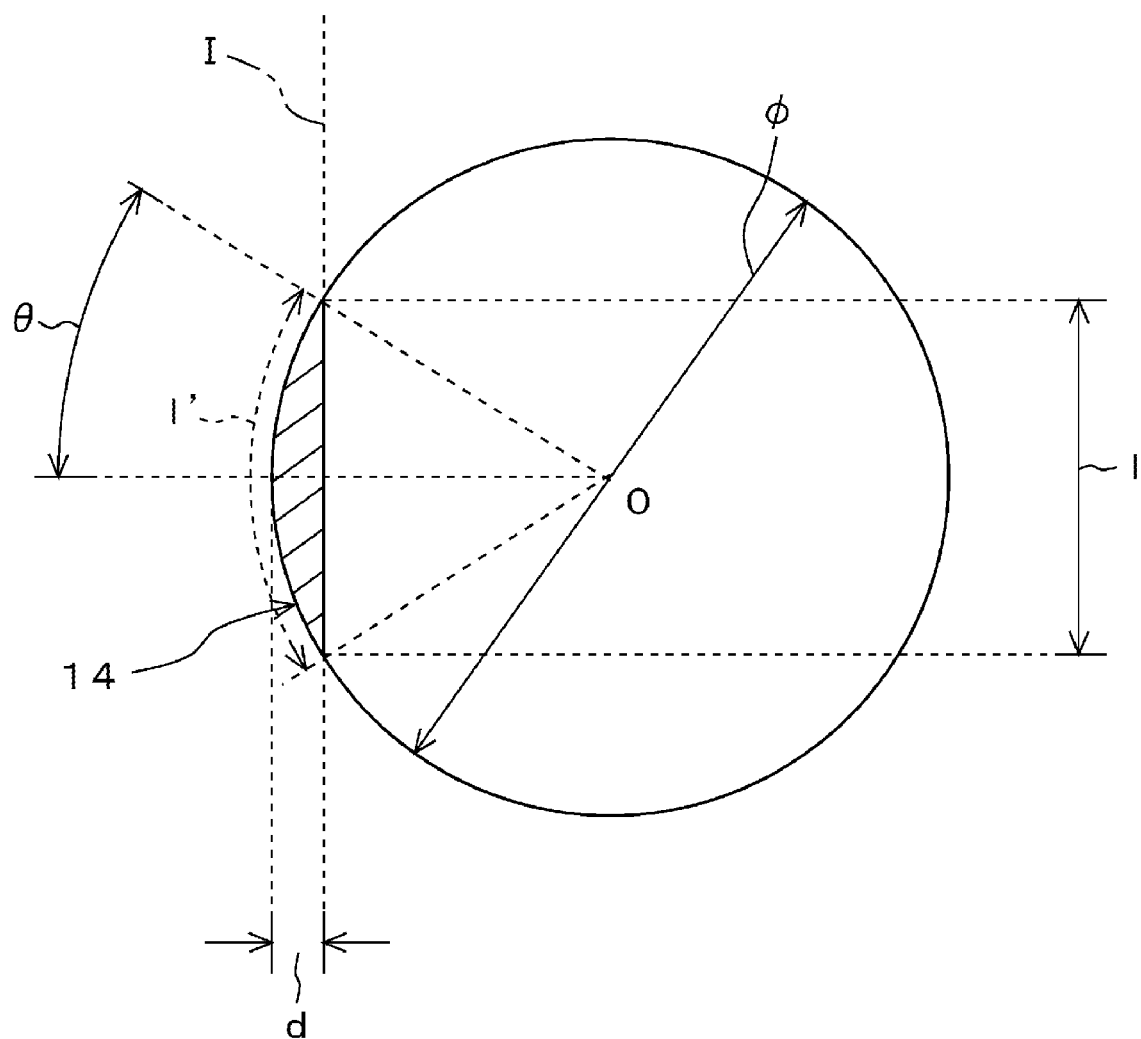
FIG. 5 is a conceptional diagram showing a size setting example of s protrusion position of a key-top 14.

FIG. 5 shows a size setting example of the protrusion position of the key-top 14. The shaded portion shown in FIG. 5 forms an arc convex shape. In the drawing, a line shown by the dotted line corresponds to the side portion operation surface "I". This arc convex shape is a portion formed the left side of the side portion operation surface "I" when a circle intersecting with the side portion operation surface "I" is drawn. Here, a diameter of the circle is $\phi$ and by making the origin "o" of the circle be a reference, when an angle formed between a vertex portion of the arc convex shape and a hem portion of the arc convex shape is substituted as $\theta$, an arc angle of the arc convex shape is $2\theta$ and in this embodiment, $2\theta=2\times 29.2$ degrees. Also, the protrusion distance of the arc convex shape which protrudes on the left side from the side portion operation surface "I" is substituted as "d" and the protrusion length of the sliding direction thereof is substituted as "l".

In this manner, when a circle whose diameter $\phi=20$ mm and an arc angle $2\theta=58.40$ are to be set, for example, with respect to the side portion operation surface "I", it is possible to obtain a shape of the protrusion position of the key-top 14 of around; the protrusion distance of an exposed portion d=1.3 mm, its protrusion length l=10.08 mm and its outer circumferential length la=10.18 mm.

It should be noted that, the outer circumferential length "l" of the exposed portion of the arc convex shape can be applied with $2\pi\cdot\phi\cdot\theta/360$ degrees. In this embodiment, in a case in which the outer circumferential length "l" of the exposed portion of the key-top 14 and the number of pulses obtained from the sensor 13 by the slide operation are to be set, the slide distance is set as 1.7 mm/pulse in case of attempting to obtain 6 pulses from the sensor 13. Similarly, the slide distance is set as 2.03 mm/pulse in case of attempting to obtain 5 pulses, the slide distance is set as 2.545 mm/pulse in case of attempting to obtain 4 pulses and the slide distance is set as 3.39 mm/pulse in case of attempting to obtain 3 pulses.

Figure 6:
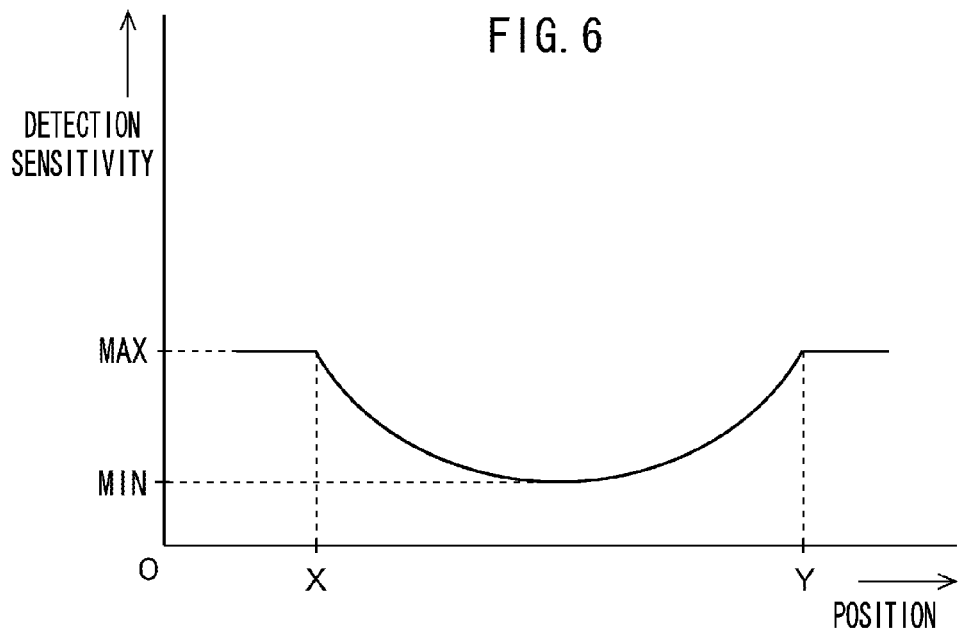
FIG. 6 is a graph diagram showing a detection sensitivity example of an input device 10.

FIG. 6 shows a detection sensitivity example of the input device 10. In FIG. 6, the horizontal axis indicates the slide position along the sliding direction. The vertical axis indicates the detection sensitivity of the sensor 13. In the drawing, "x" is a position of an upward start portion (first hem portion) and is a position at which the arc convex shape of the key-top 14 starts becoming thicker when the key-top 14 is slide-operated along the sliding direction from one portion of the operation surface of the lower housing 11*b*. "Y" is a position of a downward end portion (second hem portion) and is a position at which the arc convex shape of the key-top 14 finishes becoming thinner when this key-top 14 is slide-operated successively toward the other portion of the operation surface.

In this embodiment, with respect to the detection sensitivity of the sensor 13, for example, in a case in which an electrostatic capacitance sheet member is used for the sensor 13, the detection sensitivity of a constant (highest sensitivity) is obtained on the nearer side of the upward start portion "X" of the arc convex shape of the key-top 14. Also, the detection sensitivity thereof lowers while approaching to a center region between the upward start portion "X" and the downward end portion "Y" from the upward start portion "X" and becomes the lowest at approximately the center region. Further, the detection sensitivity thereof uprises while approaching to the downward end portion "Y" from the center region and at the downward end portion "Y" and subsequently, the detection sensitivity of a constant (highest sensitivity) is again obtained. The protrusion distance "d" of such a key-top 14 changes like a quadratic function with respect to the sliding direction. This enables to be realized the sensor 13 having the detection sensitivity which changes like a quadratic function to form a concave shape (reverse $\Omega$ shape).

Figure 7:
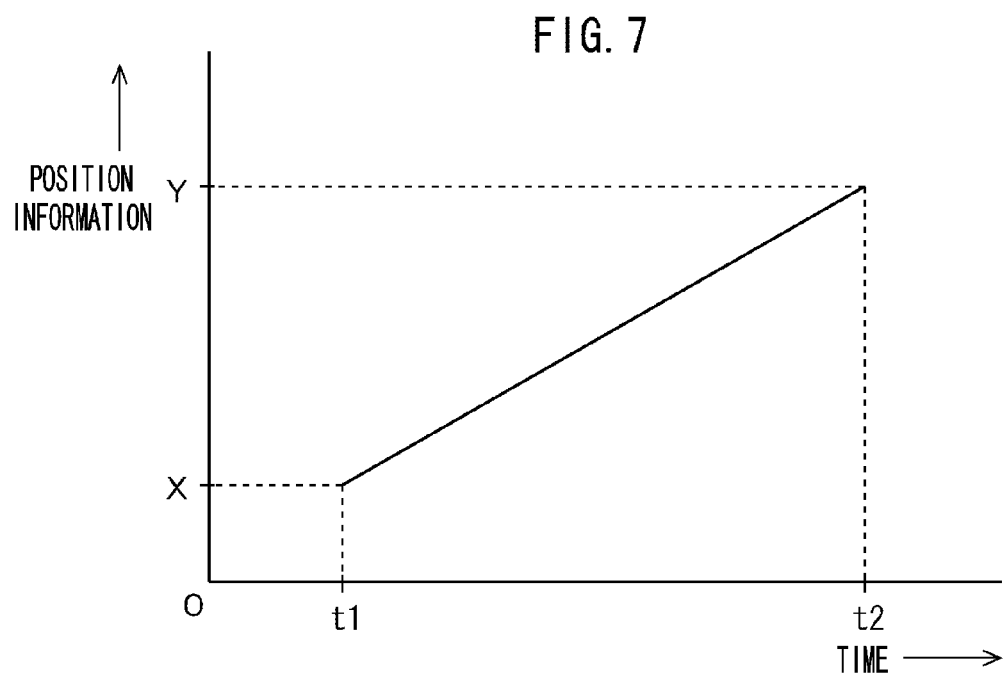
FIG. 7 is a graph diagram showing a position detection example of the input device 10.

FIG. 7 shows a position detection example of the input device 10. In FIG. 7, the horizontal axis indicates the time relating to the slide operation. The vertical axis indicates position detection information of the sensor 13. In the drawing, "X" is a position of the above-mentioned upward start portion (first hem portion) and "Y" is a position of a downward end portion (second hem portion).

In this embodiment, for example, when an electrostatic capacitance sheet member is used for the sensor 13, operating so as to become thicker along the sliding direction from one portion of the operation surface of the lower housing 11*b* with a constant sliding speed from the front side of the upward start portion "X" of an arc convex shape of the key-top 14, so as to become thinner toward the other portion of the operation surface, and so as to slide via the downward end portion "Y" is performed. In this case, with respect to the position detection information of the sensor 13, it is possible to obtain the position information in which the upward start portion "X" and the downward end portion "Y" are coupled in approximately a straight line.

According to this position detection information, when it is passed through the upward start portion "X" at time t1, there is obtained the position detection information indicating the upward start portion "X", and when it is passed through the downward end portion "Y" at time t2, there is obtained the position detection information indicating the downward end portion "Y". Thus, the sensor 13 is used by which the position detection information that changes like a linear function is obtained with respect to the time relating to the slide operation of such a key-top 14.

In the past system, the slide position of the operation body has been judged only by the value of the position detection information. However, when the sensor 13 outputting the detection sensitivity and the position detection information shown in FIG. 6 and FIG. 7 is used, it becomes possible to input-process applications displayed on the display unit 29 by comprehensively judging the slide position, the pressing-into force and the like of the operation body together with the value of the position detection information and respective time change rates of the position detection information and the detection sensitivity. Thus, in case of combining a dome switch in the input device 10, it becomes possible to prevent malfunction in a case in which the dome switch is touched unintendedly or the like (see third embodiment).

FIG. 8 shows an operation region example of the input device 10. In FIG. 8, reference number, (1) denotes an operation region of the input device 10 and a range in which the operator's finger 39*a* actually slides. Reference number, (2)

denotes a protrusion area of the key-top 14 (protrusion length "l" of exposed portion). Reference number (3) denotes a detection area in the sensor 13. On a portion or the whole surface of this detection area, there are bedded an electrostatic capacitance sheet member, a pressure detecting sheet member and the like.

In this embodiment, in order to realize a reliable operability of the input device 10, it is set so as to have a relation such that the detection area (3) of the sensor 13 is more than the protrusion area (2) of the key-top 14. This is because the finger 39a may trace over a wide region backward and forward the protrusion area (2) of the key-top 14 when it is considered about a sliding trajectory when the operator's finger 39a is slide-operated on the key-top 14. When the detection area (3) of the sensor 13 is set to be wide, it becomes possible to secure the amount of movement per one pulse more largely.

The sensor 13 is connected with a control unit 15 in which the slide operation speed of the operator's finger 39a is detected and the display pitch of each of the scroll images 29a, 29b in the display units 29 (see FIG. 3, FIGS. 9A and 9B) is adjusted in response to the slide operation speed of the operator's finger 39a.

Figure 9A:
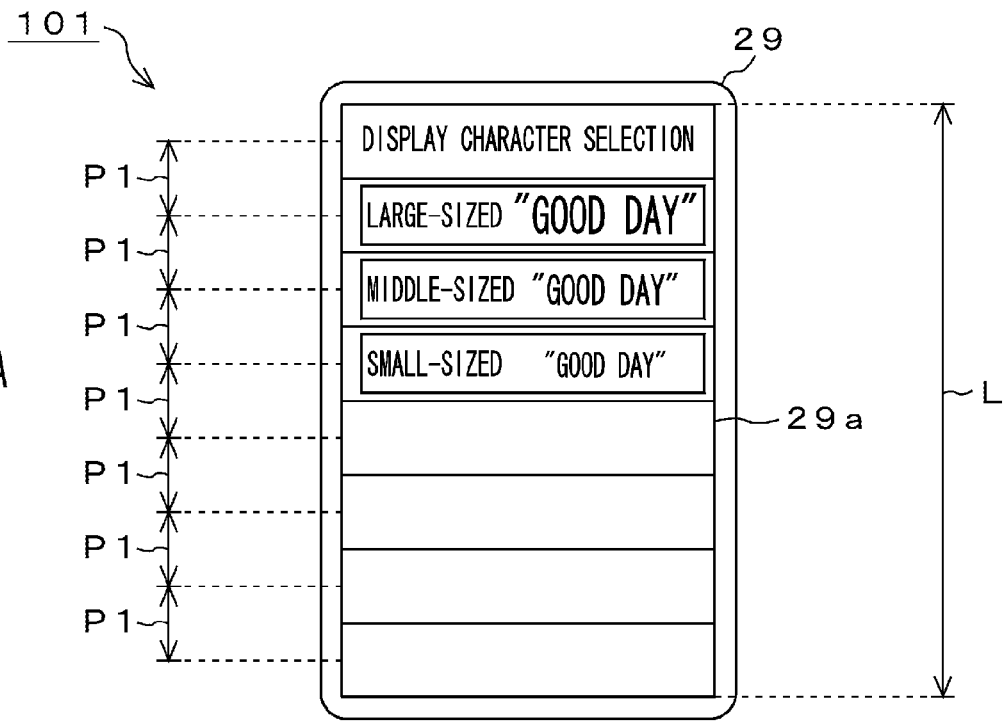
FIGS. 9A and 9B are cross-section diagrams each showing setting examples of the amount of slide Sx in the input device 10.
Figure 9B:
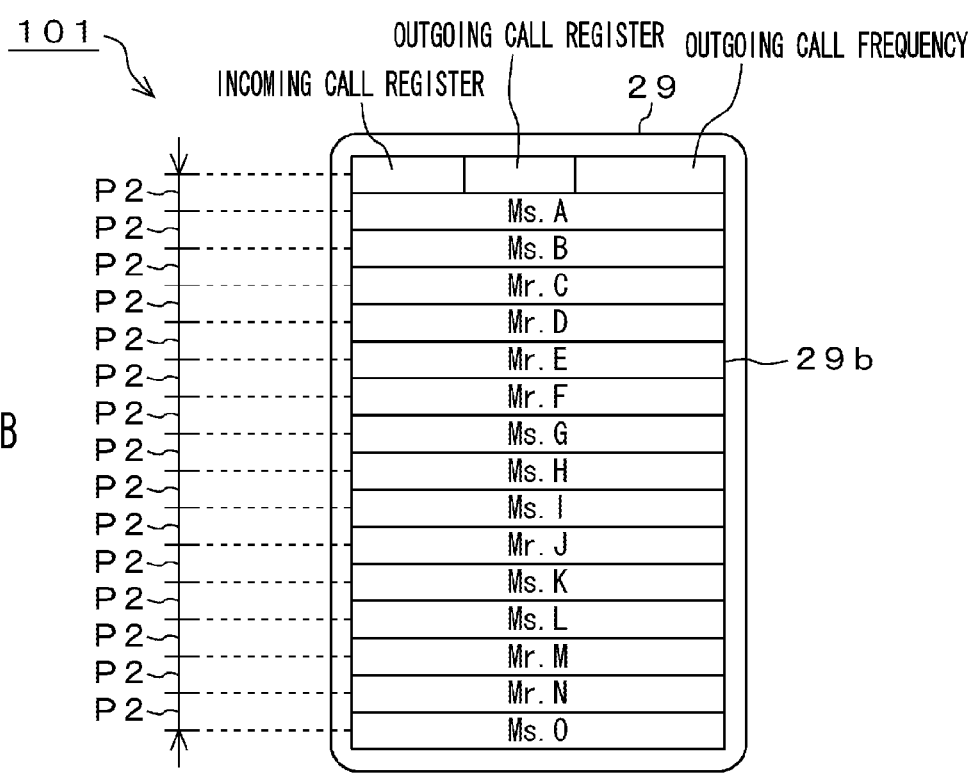

FIGS. 9A and 9B show a setting example of the amount of slide Sx in the input device 10. On the display unit 29 shown in FIG. 9A, the scroll images 29a and the like are displayed corresponding to the slide position of the operator's finger 39a, which is detected by the sensor 13. The scroll image 29a of this example is a display by an application relating to a display character selection having a few selection items or the like. On this scroll screen, character icon images of [Large-sized "Good day."], [Middle-sized "Good day."] and [Small-sized "Good day."] are displayed, and it is operated such that the operator can select any one of the character sizes. The character icon images of [Good day.] are displayed to be smaller gradually.

In this embodiment, the display screen of the display unit 29 is classified into eight display regions and by using the four display regions thereof, the scroll image 29a relating to the display character selection is displayed. The display pitch of the scroll image 29a for the display is P1. When assuming that the screen length of the display unit 29 is to be "L" [mm], the one display region has a length of approximately L/8 mm. For example, when assuming that the screen length "L" of the display unit 29 is to be 40 mm, one display region is 5 mm and the display pitch P1 is 5 mm. With respect to the display pitch P1=5 mm, in a case in which quantity "x" of the selection items housable in one screen is maximum quantity Max or less, for example, S1=4 mm is set for the amount of slide Sx of the key-top 14.

On the contrary, in the display unit 29 shown in FIG. 9B, a scroll image 29b is displayed by a display pitch P2. In this embodiment, there is shown a case in which the display pitch P2 shown in FIG. 9B is set as P2=P1/2 as compared with the display pitch P1 shown in FIG. 9A. In this case, selection items becomes a lot as compared with the application display relating to the display character selection or the like in FIG. 9A and there is assumed an input processing in which phone numbers of the partners are to be searched from a phone number registration column. In this phone number registration column, for example, display columns such as an incoming call register, an outgoing call register, an outgoing call frequency and the like are provided and phone numbers are displayed together with the partner names.

According to the example of the screen length "L" of the display unit 29 shown in FIG. 9A, the screen can be changed over to a screen as shown in FIG. 9B in which the one display region is 2.5 mm and the display pitch P2 is 2.5 mm. In this embodiment, with respect to the display pitch P2=2.5 mm, there is shown a case in which the quantity "x" of the selection items housable in one screen exceeds the maximum quantity Max and, for example, S2=2 mm is set for the amount of slide Sx of the key-top 14. Thus, it becomes possible to set the amount of slide Sx in the slide operation of the key-top 14 so that the amount of slide Sx can be set as Sx=S1, S2 in response to the quantity of the selection items displayed within one screen of the display unit 29. Of course, it is also allowed to set the amount of slide Sx of the key-top 14 arbitrarily based on the length of the electrical detection area (3) of the sensor 13 and all quantity of the selection items existing in the scroll direction.

When the control system is constituted in this manner, following adjustment can be realized: in a case in which the slide operation speed of the operator's finger 39a is quick when retrieving information, the display pitch Px of the scroll image 29b in the display unit is set narrow; and on the contrary, in a case in which the slide operation speed of the operator's finger 39a is slow, the display pitch Px of the scroll image 29a in the display unit is set wide. Consequently, in a case where there exist a plurality of information retrieval objects and in case of being apart from the aimed scroll image, the scroll images are transferred so as to be skipped roughly and when approaching to the aimed scroll image, it becomes possible to execute the search so as to transfer the scroll images slowly.

FIGS. 10A to 10C show an operation example of the input device 10. In this embodiment, there is shown a case in which the input device 10 is operated by the operator's left hand and the key-top 14 having an arc convex shape which becomes thicker along the sliding direction from one portion of the operation surface of the lower housing 11b and also which becomes thinner toward the other portion of the operation surface thereof is used. An electrostatic capacitance sheet member is used for the sensor 13 and in this embodiment, the detection area in which the slide position of the operator's finger 39a is detected by the sensor 13 is set so as to be wider than the operation area which is slide-operated by the operator's finger 39a at the key-top 14.

In FIG. 10A, first, the operator presses his thumb of the left hand at the upper portion of the operation region (1) of the input device 10. Next, the operator's finger 39a is slid from one portion of the operation surface of the lower housing 11b along the sliding direction. At that time, in the lower housing 11b, it becomes a state in which the operator's finger 39a slides on the detection area (3) in the sensor 13.

When the operator continues the slide operation on the protrusion area (2) of the exposed portion of the key-top 14 by the operator's finger 39a, the operator's finger traces upward from the upward start portion "X" and reaches a peak region of the key-top 14 shown in FIG. 10B. Further, when the slide operation on the protrusion area (2) is continued, the operator's finger is traced downward toward the other portion of the operation surface and reaches a downward end portion "Y" of the key-top 14 shown in FIG. 10C.

In this embodiment, during a period in which slide-operation is performed from FIGS. 10A to 10C, the sensor 13 detects the slide position of the operator's finger 39a and outputs a position detection signal #S1 to the control unit 15. Thus, in response to the slide operation by the operator's finger 39a, it is possible to present, in addition to a slide operation feeling of becoming thicker in an arc shape along the sliding direction from one portion of the operation surface of the lower housing 11b, a slide operation feeling of becoming thinner in an arc shape toward the other portion of the operation surface thereof. Furthermore, there can be provided a non-rotary side jog tool or the like which has a structure different from that of a rotary side jog tool in the past and in which an operation feeling approximately similar as that of the rotary side jog tool can be obtained.

Figure 11:
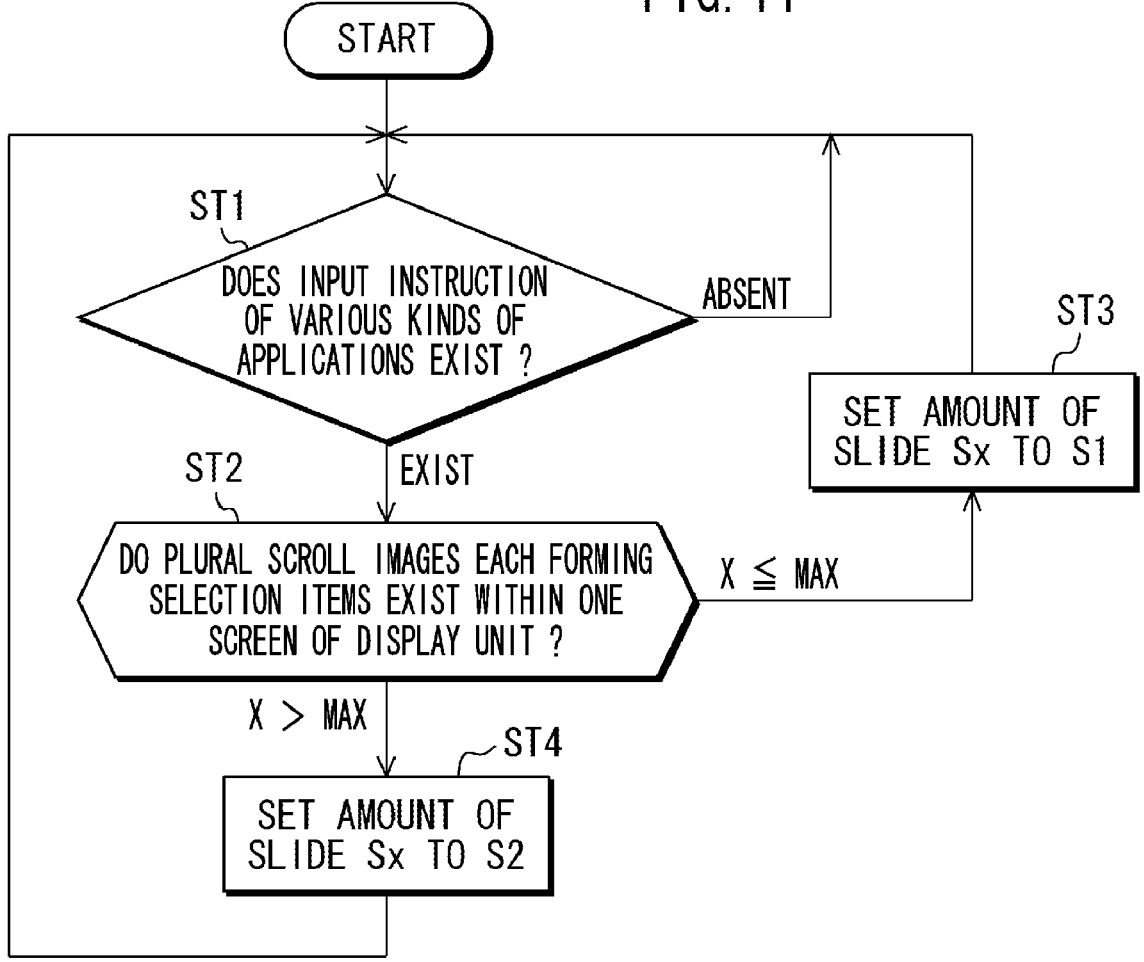
FIG. 11 is a flowchart showing a setting example (fixed value selection) of the amount of slide Sx in the input device 10.

FIG. 11 shows a setting example (fixed value selection) of the amount of slide Sx in the input device 10. In this embodiment, as shown in FIGS. 9A and 9B, the amount of slide Sx of the key-top 14 is set so as to be S1=4 mm in a case where the quantity "x" of the selection items housable within one screen of the display unit 29 is maximum quantity Max or less and the amount of slide Sx of the key-top 14 is set so as to be S2=2 mm in a case where the quantity "x" exceeds the maximum quantity Max of the selection items housable within one screen.

By making these as a setting condition, the control unit 15 waits for input instructions of various kinds of applications in step ST1 of a flowchart shown in FIG. 11. At that time, the operator operates, for example, to instruct an input to a display of the scroll image 29b, through the input device 10, for appointing the application relating to the display character selection or the like having a fewer selection item, an application of a phone number registration column having many selection items as compared with the application display relating to the display character selection, or the like. When there is no input for appointing an application, the control unit 15 continues waiting for input instructions of appointing various kinds of applications.

When there exists an input appointing various kinds of applications in the control unit 15, the operation shifts to step ST2 where the control unit 15 judges whether or not the scroll image 29a, 29b or the like forming a selection item within one screen of the display unit 29 exists by plural items. With respect to the judgment at that time, it is detected how many selection items exist in the scroll direction. According to the display example of the scroll image 29a as shown in FIG. 9A, maximum (Max) 8 of selection items are rendered to be displayable by a display pitch of 5 mm within one screen of the display unit 29 and the previous display example shows a case in which the quantity "x" of the selection items existing in the scroll direction is four items.

In this judgment result, when the quantity "x" of the selection items existing in the scroll direction is maximum quantity Max or less, the operation shifts to step ST3 where the control unit 15 sets the amount of slide Sx so as to be S1=4 mm and controls the display unit 29 to display the selection items. At that time, the display unit 29 receives the display control from the control unit 15 and displays the scroll image 29a as shown in FIG. 9A. Thereafter, the operation returns to the step ST1.

When the quantity "x" of the above-mentioned selection items exceeds the maximum quantity Max, the operation shifts to step ST4 where the control unit 15 sets the amount of slide Sx so as to be S2=2 mm and controls the display unit 29 so as to change over the display of the selection items. At that time, the display unit 29 receives the display control from the control unit 15 and changes over its screen, for example, from the scroll image 29a having the display pitch P1 as shown in FIG. 9A to the scroll image 29b having the display pitch P2 as shown in FIG. 9B to display it. Thereafter, the operation returns to the step ST1. Thus, in response to the quantity "x" of the selection items displayed within one screen of the display unit 29, it becomes possible to set the amount of slide Sx in the slide operation of the key-top 14 so as to be S1 or S2.

Figure 12:
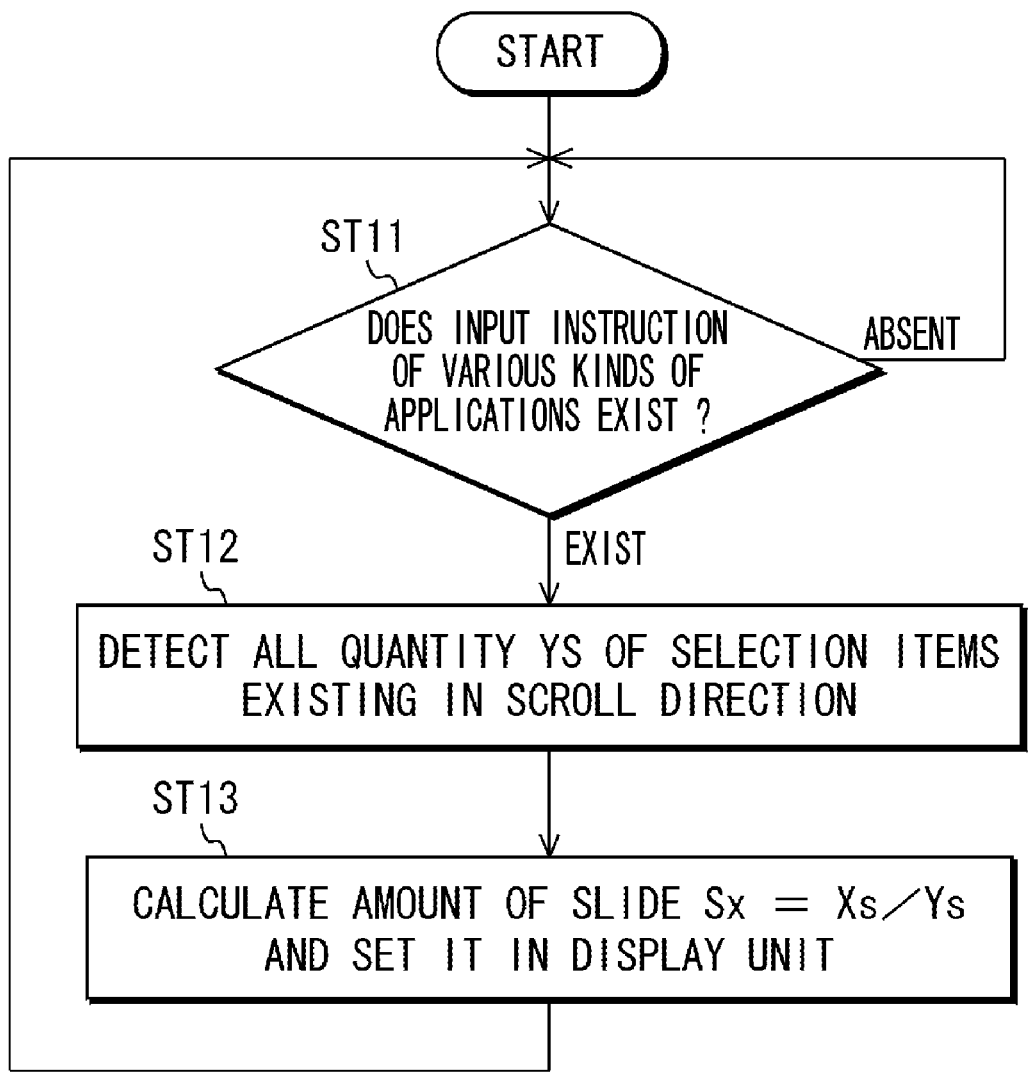
FIG. 12 is a flowchart showing a setting example (setting value is variable) of the amount of slide Sx in the input device 10.

FIG. 12 shows another setting example (setting-value is variable) of the amount of slide Sx in the input device 10. In this embodiment, a length of the electrical detection area (3) of the sensor 13 is rendered to be Xs [mm].

By making this as a setting condition of the amount of slide Sx, the control unit 15 waits for input instructions of various kinds of applications in step ST11 of a flowchart shown in FIG. 12. At that time, the operator operates, for example, to instruct an input to a display of the scroll image 29a, 29b or the like, through the input device 10, for appointing the application relating to the display character selection or the like having a fewer selection item, an application of a phone number registration column or the like having many selection items as compared with the application display relating to the display character selection, or the like. When there is no input for appointing an application, the control unit 15 continues waiting for input instructions of various kinds of applications.

When there exists an input appointing various kinds of applications in the control unit 15, the operation shifts to step ST12 where the control unit 15 detects all the quantity "Ys" of the selection items existing in the scroll direction. In this embodiment, it is detected how many selection items exist in the scroll direction. For example, the memory in which the selection items relating to the application are stored is searched and all the quantity "Ys" of the selection items existing in the scroll direction are read out.

Thereafter, the operation shifts to step ST13 where the control unit 15 calculates the amount of slide Sx of the key-top 14 and sets it to the display unit 29. In this embodiment, when assuming that all the quantity of the selection items existing in the scroll direction is to be Ys and assuming that the length of the electrical detection area (3) of the sensor 13 is to be Xs [mm], the control unit 15 calculates Xs/Ys and sets the amount of slide Sx in the display unit 29 so as to be Sx=Xs/Ys. Thereafter, the operation returns to the step ST11. Thus, based on the length Xs of the electrical detection area (3) of the sensor 13 and all the quantity Ys of the selection items existing in the scroll direction, it becomes possible to set the amount of slide Sx of the key-top 14 arbitrarily.

In this manner, in an embodiment of the mobile phone 101 according to the present invention, the input device 10 as the first embodiment is provided. Then, in a case in which information is inputted by the slide operation in one direction depending on the operator's finger 39a, in addition to the slide operation feeling of becoming thicker along the sliding direction from one portion of the operation surface of the lower housing 11b in response to the slide operation depending on the operator's finger 39a which operates the input device 10, it is possible to present the slide operation feeling of becoming thinner toward the other portion of the operation surface thereof.

Consequently, it becomes possible to provide a non-rotary side jog tool or the like which has a structure that is different from a rotary side jog tool in the past and which obtains the operation feeling approximately similar to such a side jog tool. Furthermore, miniaturization and operability of the key-top 14 can be improved, so that it is possible to attempt the lowering of malfunction, cost-down and the simplification of manufacturing process of the input device 10.

Figure 3:
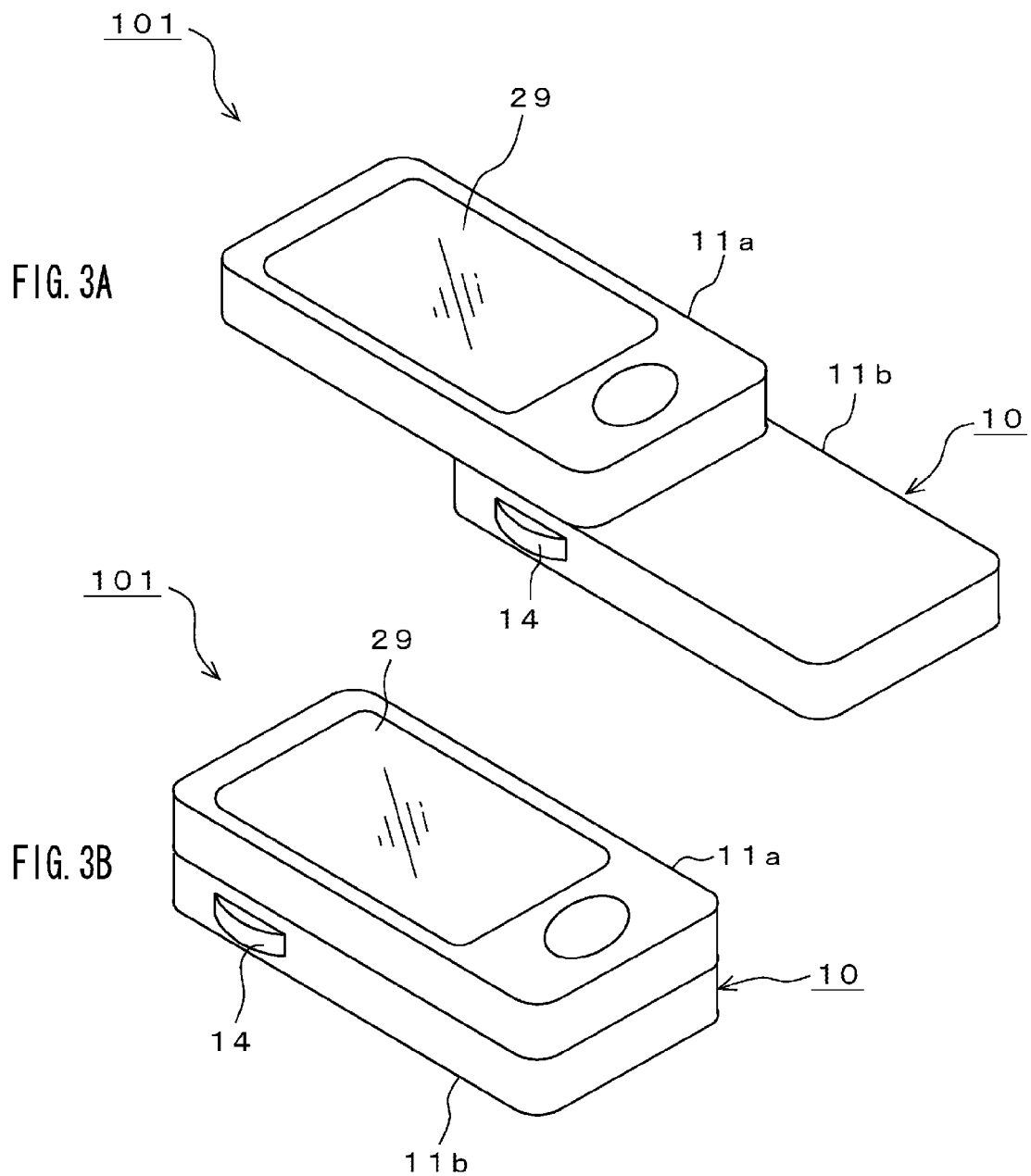
FIGS. 3A and 3B are perspective views of a mobile phone 101 including an input device 10 as a first embodiment of the present invention, each showing a configuration of the mobile phone 101.

In this embodiment, although a case where the key-top 14 is provided on the left side of the lower housing 11b as shown in FIG. 3, has been described, of course, it is not limited to this; it is also allowed for the key-top 14 and an operation unit of another key top or the like mentioned hereinafter to be provided on the operation surface of the right side portion of the lower housing 11b, on the operation surface on the upper or lower side thereof, on the operation surface on the front or rear surface side or the like. Further, it is also allowed for the operation unit to be provided on the operation surface of the left or right side portion of the upper housing 11a, on the operation surface of the upper or lower side thereof, on the operation surface of the front or rear surface side thereof or the like. It is needless to say that a similar effect is obtained also with respect to a case in which the operation unit is provided on the right side of the lower housing 11b, on the upper housing 11a or the like.

Embodiment 2

Figure 13:
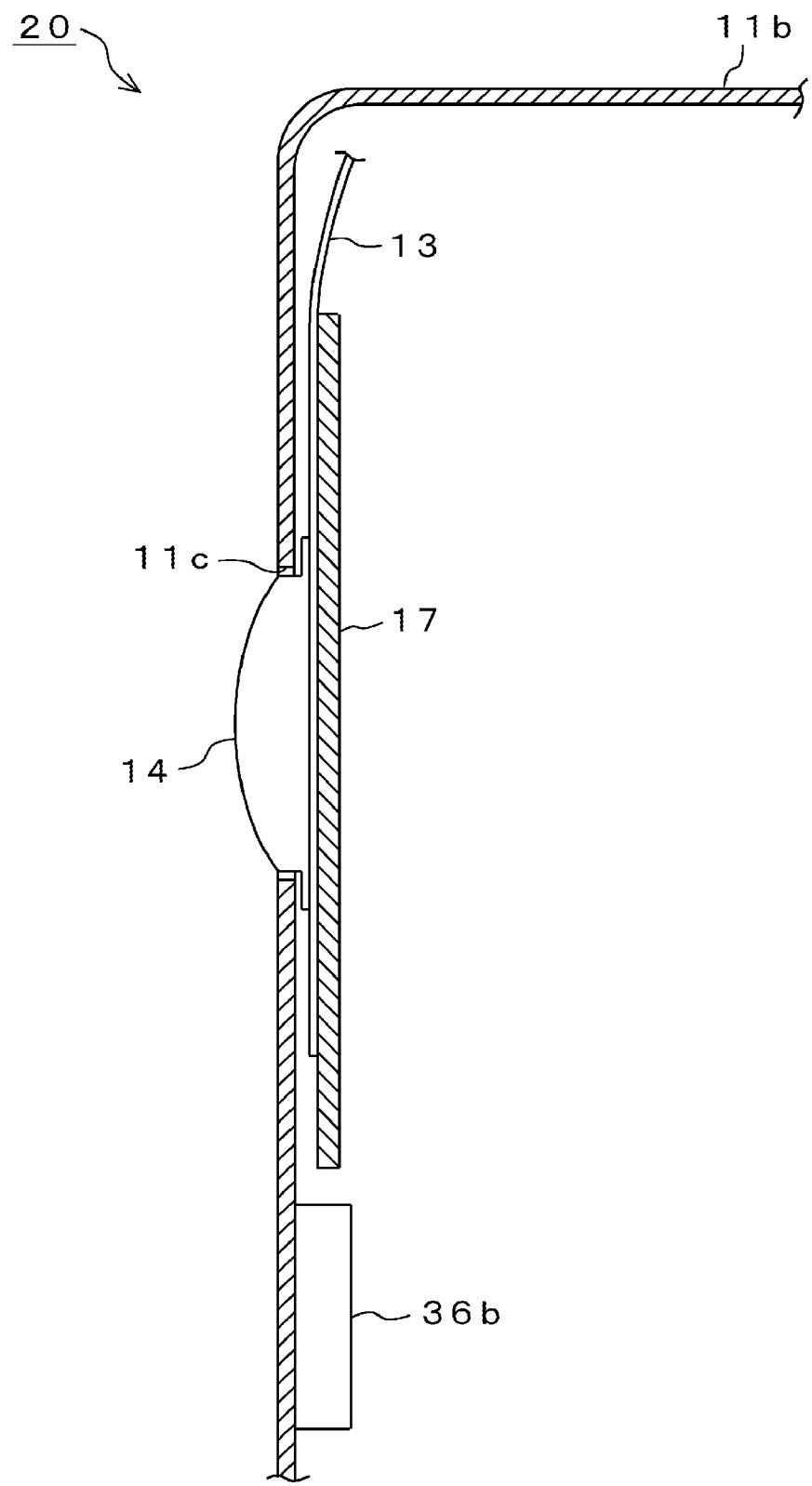
FIG. 13 is a cross-section diagram of an input device 20 as a second embodiment of the invention, showing an internal configuration thereof.
Figure 14:
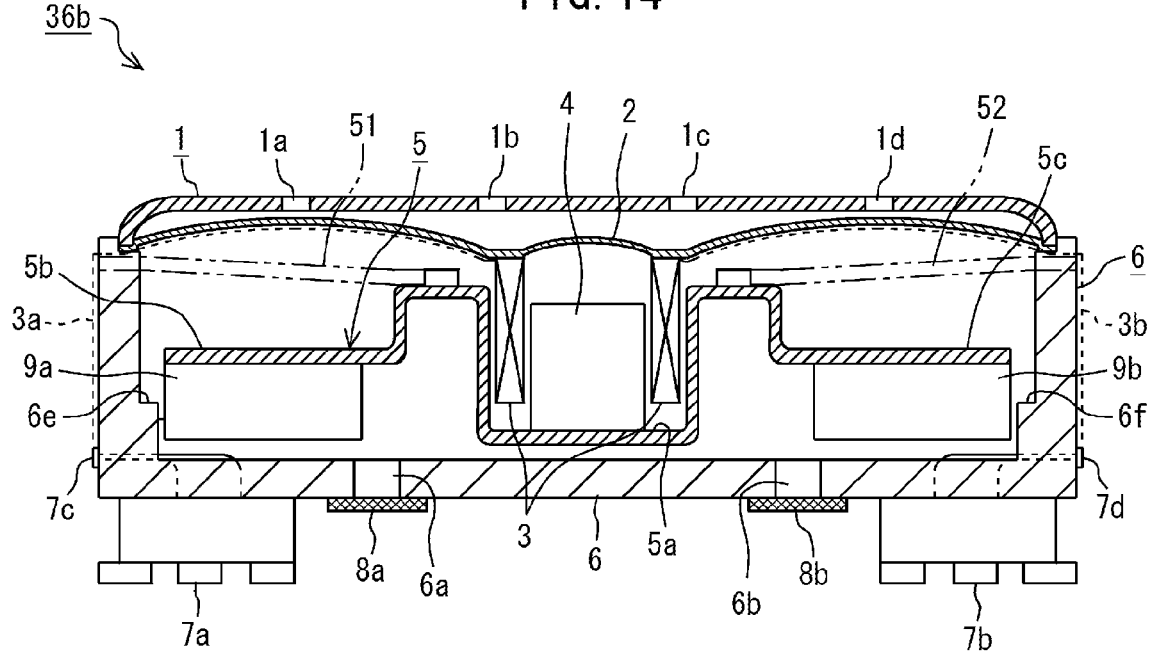
FIG. 14 is a cross-section diagram of a speaker 36b having actuator function, as seen from the front side, showing a configuration thereof.

FIG. 13 shows an internal configuration of an input device 20 as a second embodiment. In this embodiment, a speaker 36b with actuator function which constitutes a function of a vibration body is provided at the input device 20 shown in FIG. 13 and it is constituted such that a vibration is generated with respect to the slide position of the operator's finger 39a, which is detected by the sensor 13. For the speaker 36b, a vibration body which compatibly uses a speaker function is used as shown in FIG. 14. The speaker 36b is, for example, mounted at a portion on the inside of the lower housing 11b and near the arrangement position of the key-top 14.

FIG. 14 shows a configuration of the speaker 36b with the actuator function, seen from the front side thereof. The speaker 36b shown in FIG. 14 has an actuator function which can generate a sense of touch other than the speaker function. This speaker 36b is applicable to an information processing device, a mobile phone, a mobile terminal device or the like which present sense of touch to the operator when inputting information by selecting an icon from the contents of the display screen for the input item selection.

The speaker 36b includes a housing portion 6 and a lid member 1 is engaged therewith after component parts are built-in. With respect to the size of the housing portion 6, the length is around 15 [mm], the width is around 5 [mm] and the height is around 3 [mm]. The lid member 1 is provided with opening portions at predetermined regions. In this embodiment, the lid member 1 has four opening portions 1a, 1b, 1c, 1d such that the sound leaks out therefrom. For example, a resin molded part is used for the lid member 1.

A yoke 5 is arranged in the housing portion 6. The yoke 5 has a concave portion 5a of a bottomed cylindrical shape, which is arranged freely movably in the housing portion 6. For example, the yoke 5 is movably supported by two spring coils 51, 52 of a flat-type waveform shape in the housing portion 6.

In this embodiment, one end of the spring coil 51 is joined with one edge portion of the concave portion 5a of the yoke 5 and the other end thereof is fixed at one upper edge of the housing portion 6. One end of the spring coil 52 is joined with the other edge portion of the concave portion of the yoke 5 and the other end thereof is fixed at the other upper edge of the housing portion 6. In this embodiment, the shape of the spring member for supporting the vibration system elastically is made to be in a flat-type waveform shape.

A magnet 4 (permanent magnet) is fixed at the bottom portion of the yoke 5 which is movably supported in the housing portion 6. For example, neodymium having a cylindrical shape is used for the magnet 4. A movable coil 3 (voice coil) is movably arranged around the magnet 4. The coil 3 includes a winding axis portion. It is configured such that an audio signal, a vibration generating signal or the like is supplied to the coil 3.

A vibration plate 2 is mounted on one side of the above-mentioned winding axis portion of the coil 3 and the outer edge region thereof is made to be sandwiched by the lid member 1 and the housing portion 6. Also, leader electrodes 7a, 7b are provided on the outside of the bottom surface of the housing portion 6 and they are connected to the coil 3 inside the housing portion 6. An audio signal, a vibration generating signal and the like are inputted to the leader electrodes 7a, 7b.

Also, the housing portion 6 has, for example, two opening portions 6a, 6b between the two leader electrodes 7a, 7b which are provided on the outside of the bottom surface of the housing portion 6 and at the bottom surface portion thereof. Mesh seals 8a, 8b are pasted on the bottom surface of the housing portion 6 over these two opening portion 6a, 6b. The mesh seal 8a covers the opening portion 6a and also, the mesh seal 8b covers the opening portion 6b. The function of these mesh seals 8a, 8b is to secure a breath function on the inside and on the outside of the housing portion 6.

The leader electrode 7a includes a terminal 7c and the leader electrode 7b includes a terminal 7d, and they are connected to the leader wires 3a, 3b of the coil 3 on the side wall of the housing portion 6. For example, the one leader wire 3a pulled out from the coil 3 reaches the outer edge portion by passing through the rear surface of the one side of the vibration plate 2, is taken out to the outside from the upper edge of the housing portion 6, is shifted downward the side wall, reaches the terminal 7c and is connected to the leader electrode 7a. Similarly, the other leader wire 3b pulled out from the coil 3 reaches the outer edge portion by passing through the rear surface of the other side of the vibration plate 2, is taken out to the outside from the upper edge of the housing portion 6, is shifted downward the side wall, reaches the terminal 7d and is connected to the leader electrode 7b.

It should be noted that the yoke 5 includes a left arm 5b and a right arm 5c other than the concave portion 5a of the bottomed cylindrical shape. There are joined weights 9a, 9b on the lower surfaces of the left arm 5b and the right arm 5c. There is joined the weight 9b also on the lower surface of the right arm 5c by using adhesive. There is joined the weight 9a on the lower surface of the left arm 5b of the weights 9a, 9b by using adhesive. There is joined the weight 9b also on the lower surface of the right arm 5c by using adhesive. Each of the weights of the weights 9a, 9b is, for example, around 0.597 [g]. Each thickness of these weights 9a, 9b is in the vicinity of 2 mm and is approximately equal to the distance of a space reaching from the lower surface of each of the left arm 5b and the right arm 5c to the bottom surface of the housing portion 6. There are provided very narrow gaps between the lower surfaces of the weights 9a, 9b and the bottom surface of the housing portion 6. This is because strokes (spaces) between the upper and lower portions of the yoke 5 in the direction of coil winding axis portion is to be secured while securing the weights of the weights 9a, 9b.

In this manner, according to the input device 20 as the second embodiment, the speaker 36b with an actuator function is mounted, so that it is possible to generate vibrations by the speaker 36b with respect to the slide position of the operator's finger 39a at a time of the input operation or at a time of the input determination, thereby enabling the sense of touch to be presented with respect to the operator's finger 39a.

In this embodiment, although a case where the key-top 14 is provided on the left side of the lower housing 11b as shown in FIG. 13, of course, it is not limited to this; it is needless to say that a similar effect is obtained also with respect to a case where the key-top is provided on the right side of the lower housing 11b.

Embodiment 3

Figure 15:
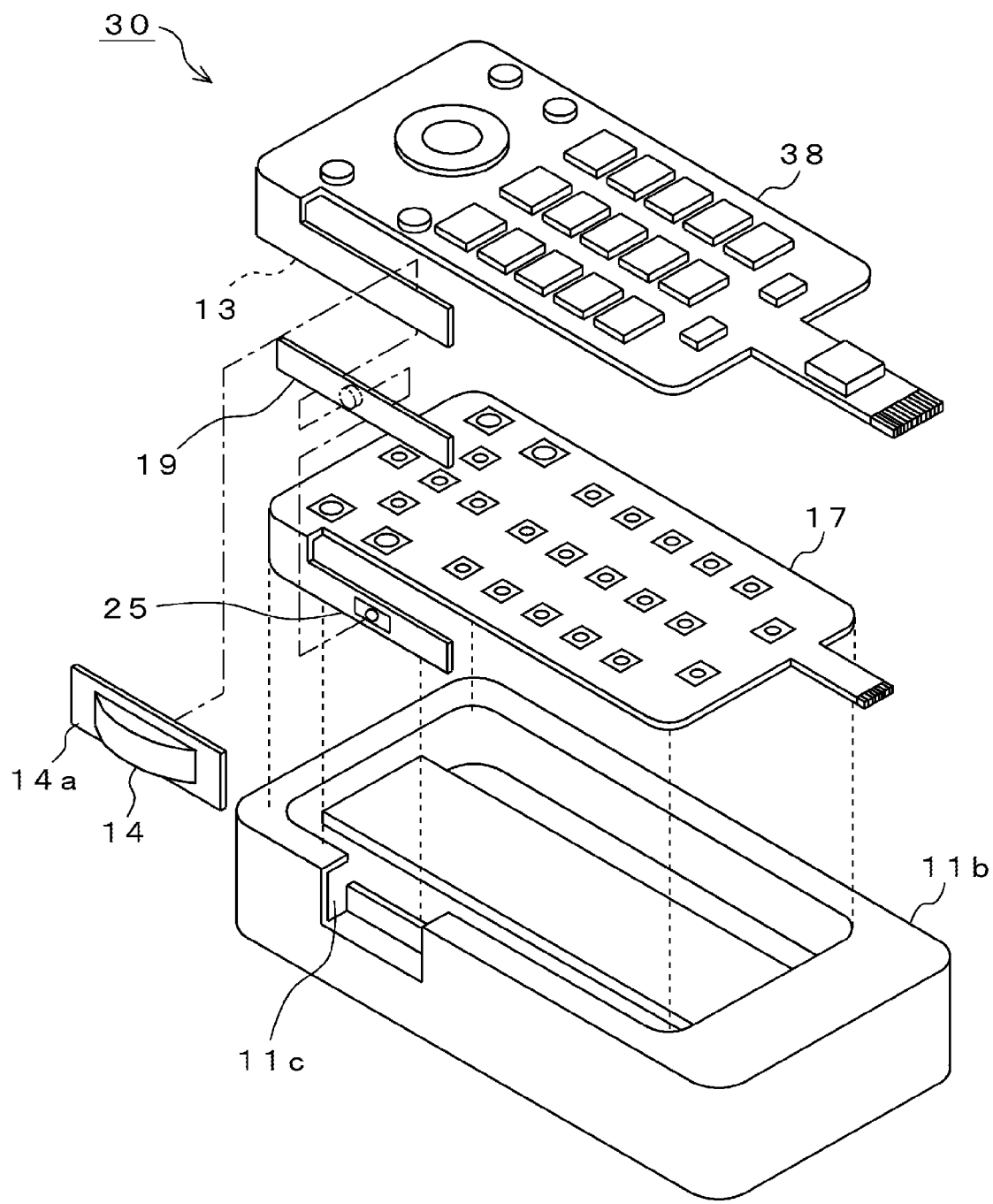
FIG. 15 is an exploded perspective view of an input device 30 as a third embodiment of the invention, showing a configuration thereof.

FIG. 15 shows a configuration of an input device 30 as a third embodiment. In this embodiment, a dome switch 25 constituting one example of a switch portion is provided and is operated so as to be turned on or/and off by the press-in operation of the key-top 14.

The input device 30 shown in FIG. 15 is added with a pusher piece 19 of a rectangular shape and a dome switch 25 of a hemisphere shape with respect to the input device 20 previously explained. According to the input device 30, the key-top 14 is built-in at the opening portion 11c of the lower housing 11b.

For the key-top 14, for example, a part molded by injecting PC (polycarbonate) resin, PC+ABS resin or the like into a die modeled with an arc convex shape is used. In this embodiment, the key-top 14 is molded and thereafter, an UV (ultraviolet) coating is applied. For example, a solution for improving abrasion resistance is applied on the operation surface of the key-top 14. Thereafter, ultraviolet rays are illuminated and the painted surface is cured. Thus, it is possible to improve the abrasion resistance of the operation surface of the key-top 14.

Also, for the lower housing 11b, for example, a part molded by injecting PC (polycarbonate) resin, PC+ABS resin or the like into a die modeled with an opening portion 11c is used.

In case of forming the lower housing 11b by metal, an aluminum plate, a magnesium plate or a stainless plate such as a SUS 304 is used and by processing one of these members depending on press processing, deep drawing processing or extrusion processing, there is formed the lower housing 11b including the opening portion 11c at a predetermined position. In this embodiment, the key-top 14 is combined by directing the non-operation surface thereof toward the inside of the lower housing 11b and the brim shaped flange 14a of the key-top 14 is hooked on the inside of the lower housing 11b surrounding the opening portion 11c. This enables the key-top 14 to be prevented from being slipped out of the opening portion 11c.

On the inside of the key-top 14, the sensor 13, the pusher piece 19, the dome switch 25, and circuit board 17 are arranged in this order. The sensor 13 is formed, for example, continuously with an operation panel 38 of a key-top array system which forms ten-keys of numerals [0] to [9], a symbol [*] key, a symbol [#] key and the like on the operation panel 18. The individual key of the operation panel 38 has a rectangular shape. The operation panel 38 is constituted, for example, such that a silicon rubber is formed by injecting a silicon resin or the like into a die which forms ten-keys of numerals [0] to [9], a symbol [*] key, a symbol [#] key and the like and thereafter, an electrostatic capacitance sheet or a pressure detecting sheet is pasted on that silicon rubber. The pusher piece 19 is arranged so as to be sandwiched between the sensor 13 and the side portion of the circuit board 17. For the circuit board 17, there is used a board in which, for example, a metal dome is formed on a flexible wiring board and a water-proof and dust-proof sheet is pasted on the upper portion thereof.

In this embodiment, the pusher piece 19 has a length approximately equal to the detection area (3) of the sensor 13. This is accomplished in order to hold (line) the sensor 13 of the electrostatic capacitance sheet member or the like in a stable posture on the plane of the pusher piece 19. The circuit board 17 is mounted with the dome switch 25. The dome switch 25 is provided at a position of a pressing projection lower portion of the key-top 14 and is constituted by a switch portion 25a and a cover member 25b. The switch portion 25a is constituted by a spring member and an electrode member, and the cover member 25b is constituted by an insulation member.

The dome switch 25 is, for example, turned on by being pressed-into with the finger 39a or the like strongly against the biasing force of the spring member. When releasing the finger 39a from the dome switch 25, the key-top 14 attaches to the lower housing 11b surrounding the opening portion 11c by the biasing force of the spring member. There are mounted on the circuit board 17 with a plurality of key switches forming ten-keys of numerals [0] to [9] of the operation panel 18, a symbol [*] key, a symbol [#] key and the like other than the dome switch 25.

Figure 16:
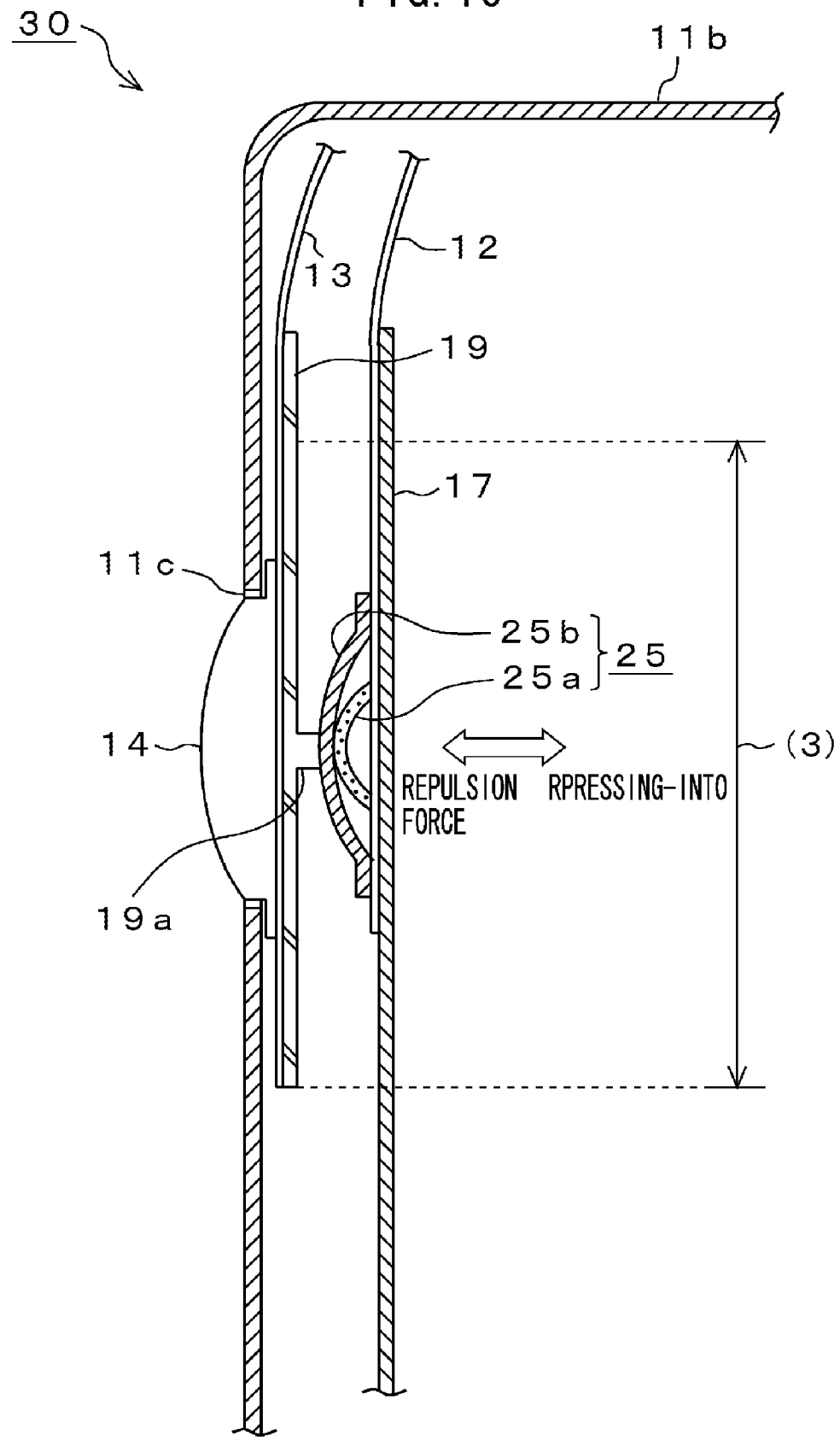
FIG. 16 is a cross-section diagram of the input device 30, seen from upper surface, showing a configuration thereof and a function example thereof.

FIG. 16 shows a configuration of the input device 30 and the function example thereof, seen from the upper surface thereof. According to the input device 30 shown in FIG. 16, a protrusion portion 19a is provided approximately at the center region of the pusher piece 19. The protrusion portion 19a forms, for example, a cylindrical shape having a predetermined protrusion length and is arranged at a position in which the dome switch 25 of the circuit board 17 can be pushed down by the tip portion thereof and a press-in operation is carried out in the arrow direction by the key-top 14. In the drawing, the circuit board 17 is provided with a print wiring 12, the wiring is formed from the dome switch 25 to the control unit 15 (see FIG. 8) and a switch signal for turning on or/and off is transmitted electrically. FIG. 10 should be referred to with respect to an operation example of the input device 30.

In this manner, according to the input device 30 relating to the third embodiment, it is constituted such that the dome switch 25 pushed down through the key-top 14, the sensor 13 and the pusher piece 19 is provided at the side portion of the circuit board 17 and the key-top 14 is to be press-in operated after the information selection of the scroll image 29a, 29b or the like. Consequently, by turning on or/and off the dome switch 25, it becomes possible also for the unrotary key-top 14 to be applied to a determination key when determining the input.

In this embodiment, although a case where the key-top 14 is provided on the left side of the lower housing 11b as shown in FIG. 16 has been described, of course, it is not limited to this; it is needless to say that a similar effect is obtained also with respect to a case where the operation unit is provided on the right side of the lower housing 11b.

Embodiment 4

Figure 17:
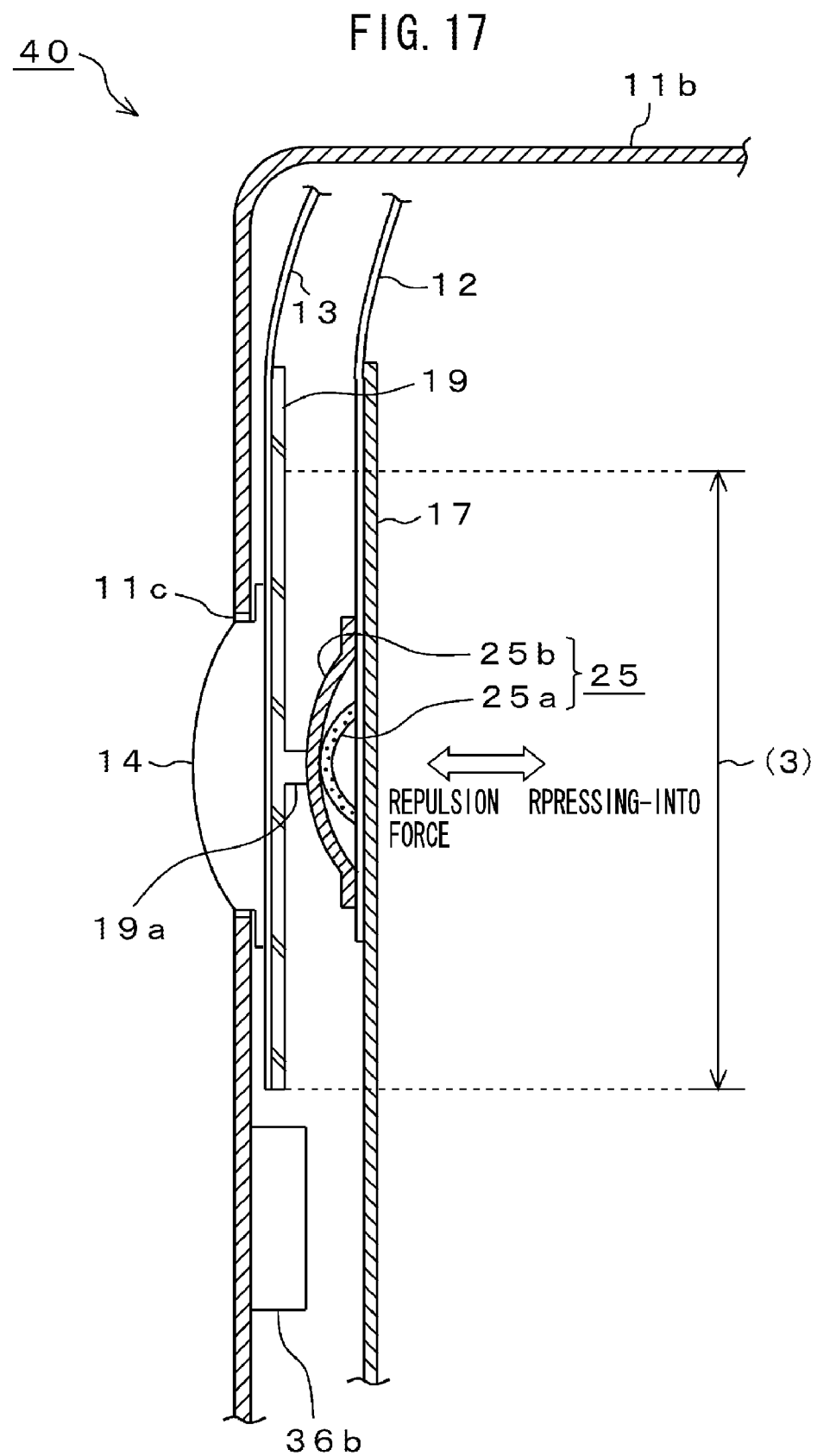
FIG. 17 is a cross-section diagram of an input device 40 as a fourth embodiment of the invention, showing an internal configuration thereof.

FIG. 17 shows an internal configuration of the input device 40 as a fourth embodiment. In this embodiment, it is constituted such that the speaker 36b with an actuator function as explained in the second embodiment is provided in the input device 40 shown in FIG. 17 and vibrations are generated with respect to the slide position of the operator's finger 39a, which is detected by the sensor 13. For the speaker 36b, a vibration body which compatibly uses a speaker function is used as shown in FIG. 14. The speaker 36b is, for example, mounted at a portion on the inside of the lower housing 11b of the input device 40 and near the arrangement position of the key-top 14. With respect to other component parts, they are similar as those of the first to third embodiments, so that the explanation thereof will be omitted. FIG. 10 should be referred to with respect to an operation example of the input device 40.

In this manner, according to the input device 40 as the fourth embodiment, the speaker 36b with an actuator function is mounted with respect to the input device 30 relating to the third embodiment, so that it is possible, similarly as the second embodiment, to generate vibrations by the speaker 36b with respect to the slide position of the operator's finger 39a at a time of the input operation or at a time of the input determination and it becomes possible to present the sense of touch with respect to the operator's finger 39*a*.

In this embodiment, although a case where the key-top 14 is provided on the left side of the lower housing 11*b* as shown in FIG. 17 has been described, of course, it is not limited to this; it is needless to say that a similar effect is obtained also with respect to a case where the key-top is provided on the right side of the lower housing 11*b*.

Embodiment 5

Figure 18:
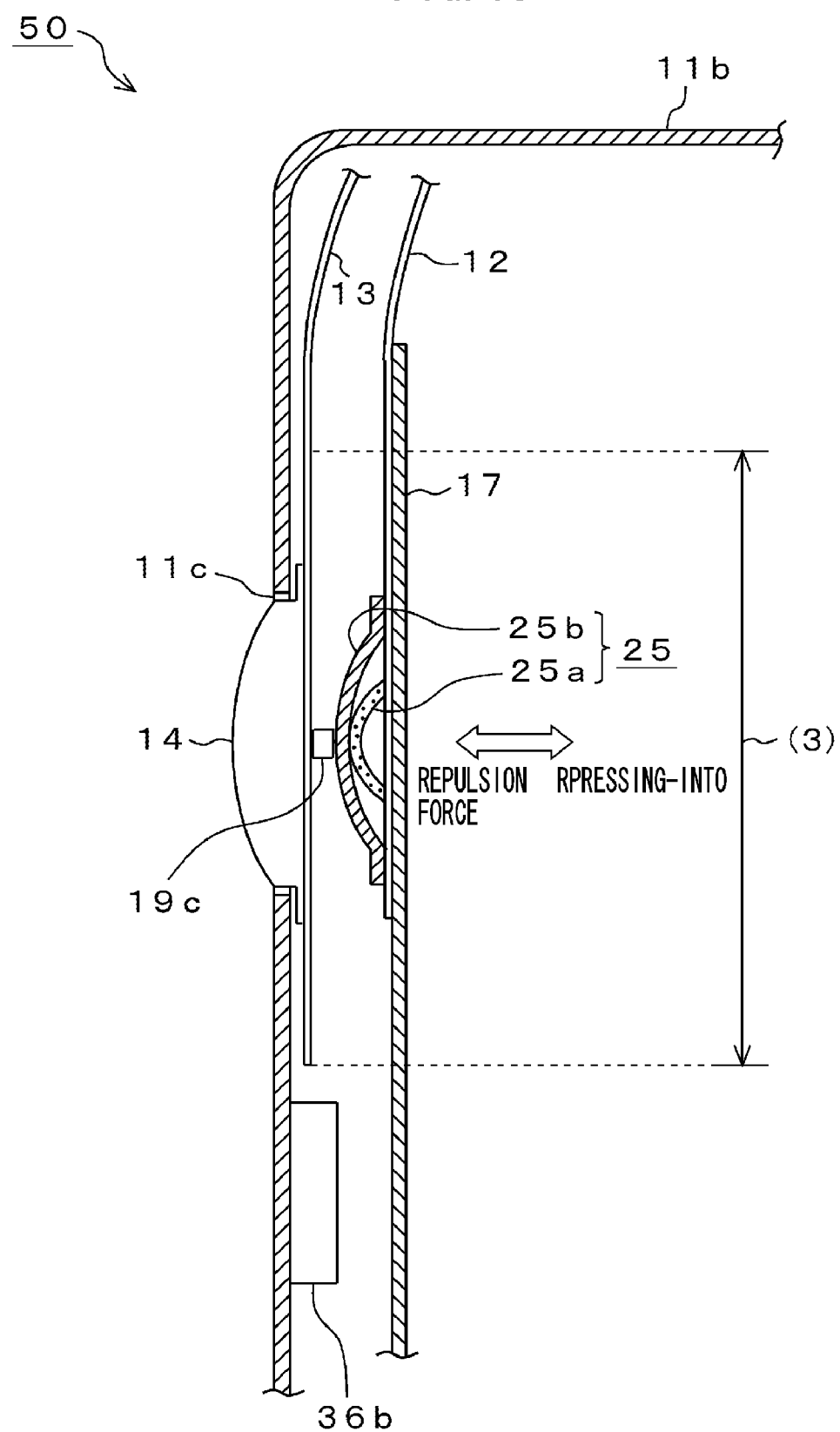
FIG. 18 is a cross-section diagram of an input device 50 as a fifth embodiment of the invention, showing an internal configuration thereof.

FIG. 18 shows an internal configuration of an input device 50 as a fifth embodiment. In this embodiment, a protrusion member 19*c* is to be mounted later on instead of the pusher piece 19. The input device 50 shown in FIG. 18 is constituted such that the rectangular-shaped pusher piece 19 is eliminated from the input device 40 previously explained and the protrusion member 19*c* is to be arranged instead thereof.

On the inside of the key-top 14, there are arranged the sensor 13, the protrusion member 19*c*, the dome switch 25 and circuit board 17 in this order. The protrusion member 19*c* is arranged so as to be sandwiched between the sensor 13 and the side portion of the circuit board 17. In this embodiment, the protrusion member 19*c* is constituted, for example, so as to be pasted by adhesive approximately at the center region of the detection area (3) of the sensor 13. It is needless to say that the protrusion member 19*c* may be integrally molded in the forming process of the sensor 13.

This method is employed based on a fact that while the sensor 13 of the electrostatic capacitance sheet member has lined at the plane region of the pusher piece 19 in the third embodiment, the lining member can be omitted when the bending strength or the like of the plane of the electrostatic capacitance sheet member or the like can be adequately maintained. With respect to other component parts, they are similar as those of the first to fourth embodiments, so that the explanation thereof will be omitted. FIG. 10 should be referred to with respect to an operation example of the input device 50.

In this manner, according to the input device 50 relating to the fifth embodiment, it is constituted such that the key-top 14, the sensor 13 and the dome switch 25 pushed down through the protrusion member 19*c* are provided at the side portion of the circuit board 17 and the key-top 14 is press-in operated after the information selection of the scroll image 29*a*, 29*b* or the like. Consequently, by turning on or/and off the dome switch 25, it becomes possible also for the unrotary key-top 14 to be applied to a determination key when determining the input. Furthermore, the protrusion member 19*c* is mounted later on with respect to the sensor 13, so that it becomes possible to reduce the number of parts and parts cost.

In this embodiment, although a case where the key-top 14 is provided on the left side of the lower housing 11*b* as shown in FIG. 18 has been described of course, it is not limited to this; it is needless to say that a similar effect is obtained also with respect to a case where the key-top is provided on the right side of the lower housing 11*b*.

Embodiment 6

Figure 19:
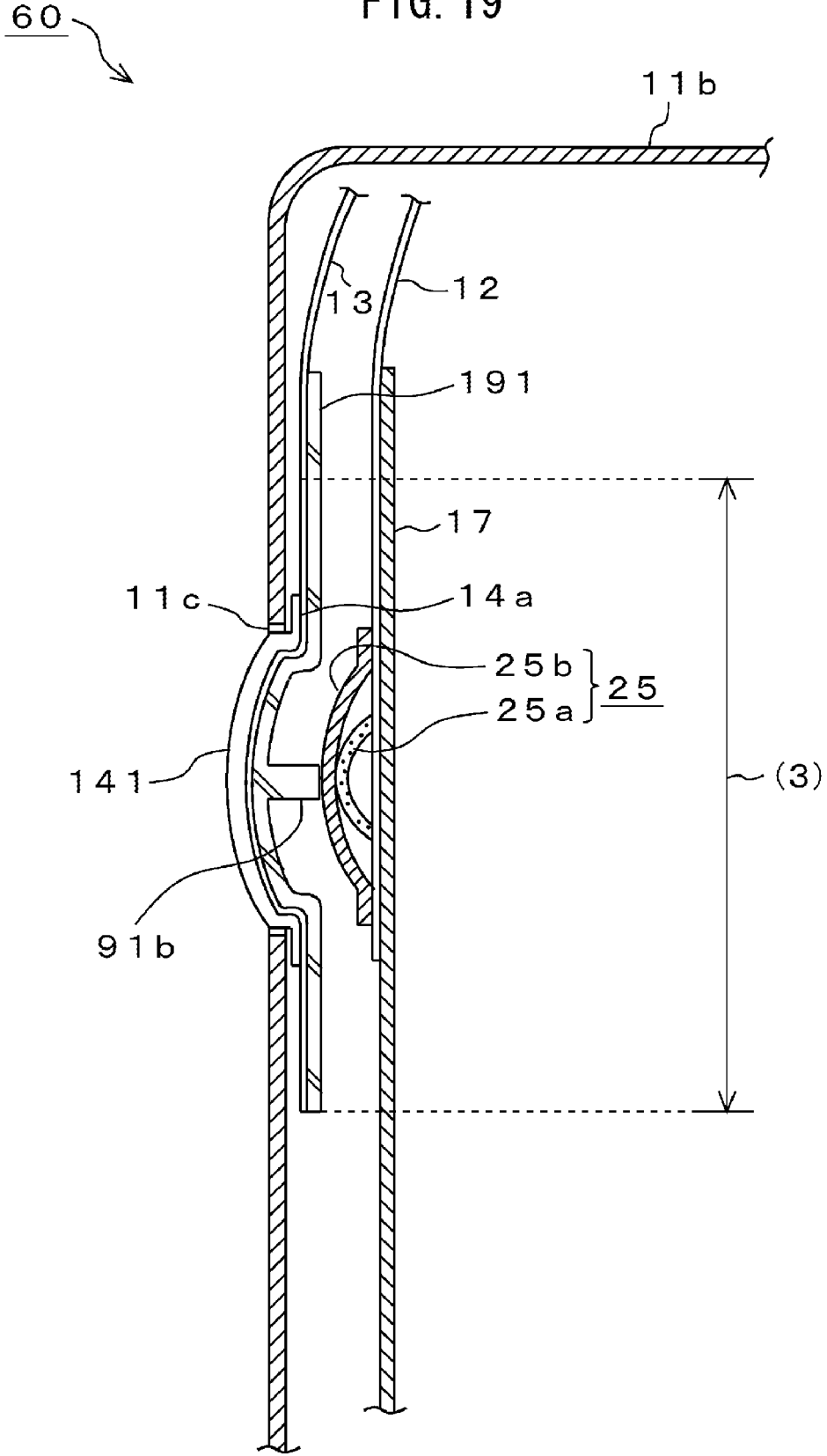
FIG. 19 is a cross-section diagram of an input device 60 as a sixth embodiment of the invention, showing an internal configuration thereof.

FIG. 19 shows an internal configuration of an input device 60 as a sixth embodiment. In this embodiment, there is provided with a key-top 141 having a rear surface of a concave shape instead of the key-top 141 whose rear surface is flat shaped and there is provided with a pusher piece 191 of an insertion type from the rear-surface of the key-top, which has a rear surface of a concave shape instead of the pusher piece 19.

According to the input device 60 shown in FIG. 19, the operation surface of the key-top 141 has the same arc convex shape as the key-top shape shown in FIG. 3 to FIG. 18, but the rear surface thereof has a concave shape. In this embodiment, for the pusher piece 191, a part formed with a convex shape so as to be insertable to the concave portion of the rear surface of the key-top 141 is used. For example, by sealing a resin into a die modeled with the inside concave shape of the key-top 141, the pusher piece 191 which is formed with the convex shape thereof is formed. There is provided approximately at the center region of the pusher piece 191 with a protrusion portion 91*b* similarly as the pusher piece 19.

Also in the input device 60, the key-top 141 is built in at the opening portion 11*c* of the lower housing 11*b*. At that time, similarly as the third embodiment, the key-top 141 is combined by directing the non-operation surface thereof toward the inside of the lower housing 11*b* and the brim shaped flange 14*a* of the key-top 141 is hooked on the inside of the lower housing 11*b* surrounding the opening portion 11*c*. This enables the key-top 141 to be prevented from being slipped out of the opening portion 11*c*.

At the concave portion on the inside of the key-top 141, there are arranged the sensor 13, the pusher piece 191, the dome switch 25 and circuit board 17 in this order. The protrusion portion 91*b* of the pusher piece 191 is arranged at a position so that it can press the sensor 13. The pusher piece 191 is arranged in the concave portion on the inside of the key-top 141 so as to be along the sensor 13. Also in this embodiment, the pusher piece 191 has a length approximately equal to the detection area (3) of the sensor 13. With respect to the function of the dome switch 25, it has been explained in the third embodiment, so that the explanation thereof will be omitted. It is needless to say that the speaker 36*b* with an actuator function, which is not shown, may be provided. FIG. 10 should be referred to with respect to an operation example of the input device 60.

In this manner, according to the input device 60 relating to the sixth embodiment, it is constituted such that the key-top 141, the sensor 13 and the dome switch 25 pushed down through the pusher piece 191 are provided at the side portion of the circuit board 17 and the key-top 141 is press-in operated after the information selection of the scroll image 29*a*, 29*b* or the like. Consequently, by turning on or/and off the dome switch 25, it becomes possible also for the unrotary key-top 141 whose rear surface forms a concave shape to be applied to a determination key when determining the input. In a case where an adequate space (separation distance) is difficult to be secured between the inside surface of the lower housing 11*b* and the circuit board 17, this structure functions advantageously and has a large essence for contributing to the compactification of the input device 60.

In this embodiment, although a case where the key-top 141 is provided on the left side of the lower housing 11*b* as shown in FIG. 19 has been described, of course, it is not limited to this; it is needless to say that a similar effect is obtained also with respect to a case where the key-top 141 is provided on the right side of the lower housing 11*b*.

Figure 20:
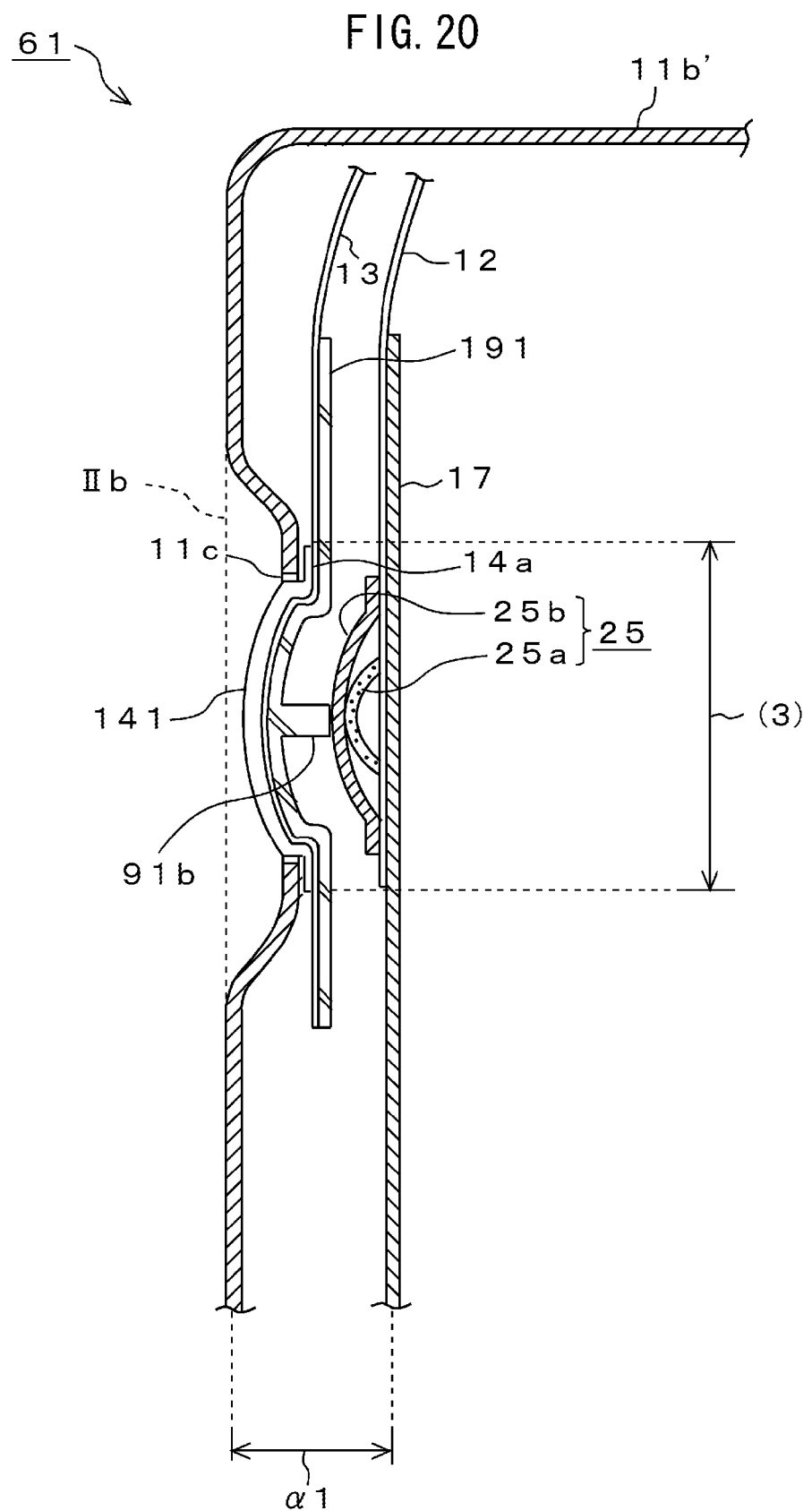
FIG. 20 is a cross-section diagram showing an internal configuration of an input device 61 as a modified example relating to the input device 60.

FIG. 20 shows an internal configuration of an input device 61 as a modified example relating to the sixth embodiment. In this modified example, the key-top 141 is provided in a concave operation area IIb of a lower housing 11*b'*. The input device 61 shown in FIG. 20 includes the lower housing 11*b'* and this lower housing 11*b'* is provided with a concave operation area IIb. The concave operation area IIb is a hole region or a groove region which is depressed by one step for the operation surface thereof as compared with the lower housing 11*b* shown in FIG. 19.

The key-top 141 is arranged in the concave operation area IIb. For example, the key-top 141 is arranged in a region depressed by one step as compared with a broken line portion which connects both the ends of the concave operation area IIb and a structure is employed in which the vertex region of the key-top 141 does not protrude from the operation surface (side surface) of the lower housing 11*b*'. The operation surface of the key-top 141 has the same arc convex shape as that of the key-top shape shown in FIG. 19 and the rear surface thereof also forms a concave shape.

Also in this example, the dome switch 25 is provided on the circuit board 17 and at a position of a pressing projection lower portion of the key-top 141. The dome switch 25 has a similar function as that of the input device 60. Also in this example, the sensor 13 is provided on the pusher piece 191 and includes a detection area (3)', but by providing the concave operation area IIb on the lower housing 11*b*', the detection area (3)' is set to be a little bit narrower that of the sensor 13 of the input device 60.

In this example, there is a separation distance α1 between the circuit board 17 and the lower housing 11*b*' because the dome switch 25, the protrusion portion 91*b*, the pusher piece 191 and the like are provided at a position of the pressing projection lower portion of the key-top 141. It should be noted, with respect to configurations of the pusher piece 191 and the protrusion portion 91*b*, a forming example thereof and an assembly example thereof, their configurations, their forming examples and their assembly examples are similar to those of the input device 60 shown in FIG. 19, so that the explanation thereof will be omitted.

In this manner, according to the input device 61 relating to the modified example, the lower housing 11*b*' is provided with the concave operation area IIb and the key-top 141 is arranged in a region depressed by one step as compared with the broken line portion connecting both the ends thereof, so that it is possible to employ a structure in which the vertex region of the key-top 141 does not protrude from the operation surface (side surface) of the lower housing 11*b*'. Consequently, the input device 61 having a flat feeling of hand touch can be provided and it becomes possible to improve the side surface operability of the lower housing 11*b*' as compared with the input device 60.

Figure 21:
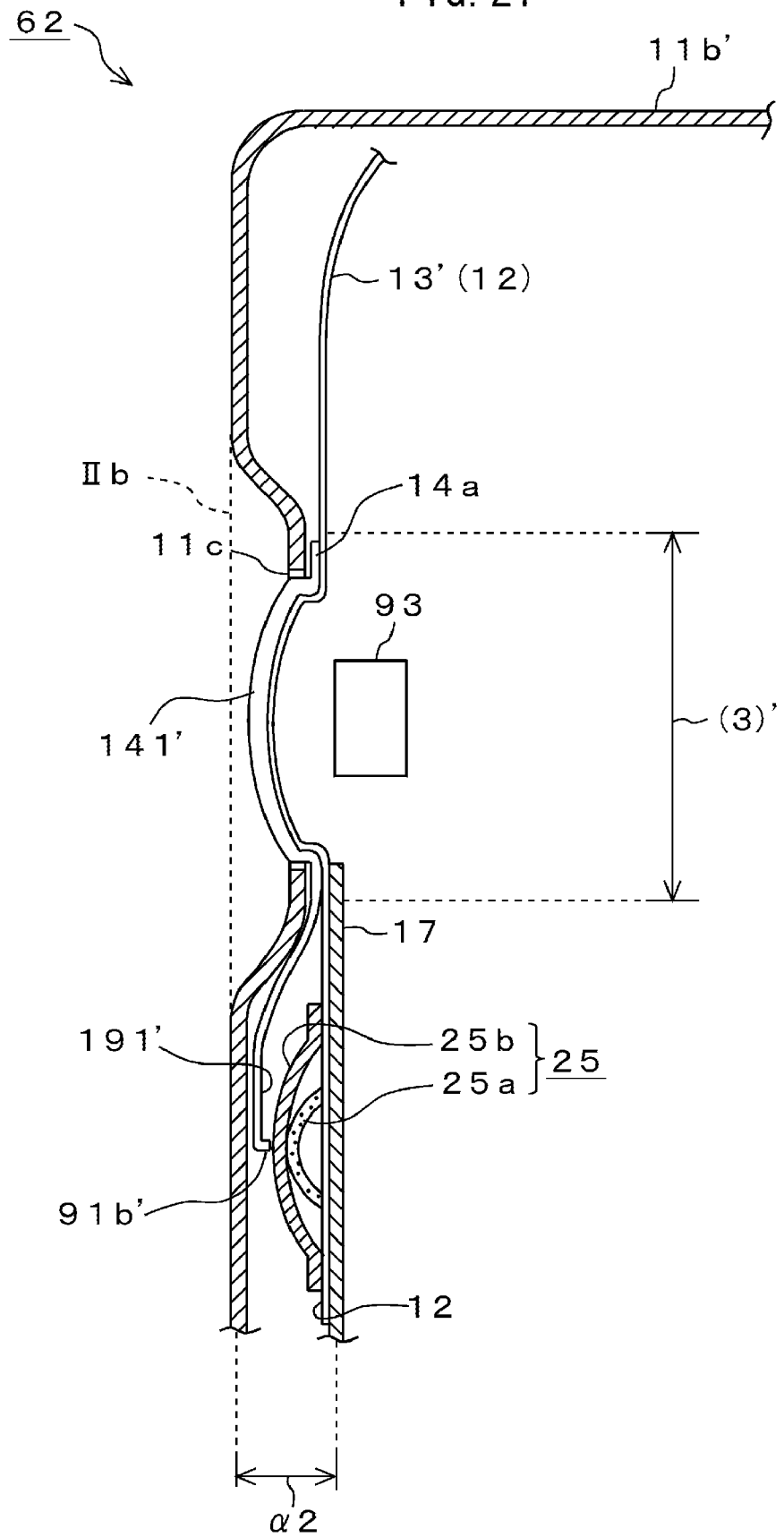
FIG. 21 is a cross-section diagram showing an internal configuration of an input device 62 as a modified example relating to the input device 60.

FIG. 21 shows an internal configuration of an input device 62 as a modified example of the input device 61. In this modified example, a key-top 141' is provided in the concave operation area IIb of the lower housing 11*b*', but the dome switch 25 is arranged at a position other than the pressing projection lower portion of the key-top 141'.

The input device 62 shown in FIG. 21 includes the lower housing 11*b*' with the concave operation area IIb that is similar to the input device 61 shown in FIG. 20. The key-top 141' is arranged in the concave-portion operation area IIb, but the pusher piece 191 as shown in FIG. 20 is omitted from the rear surface side of the key-top 141'.

In this example, the dome switch 25 is provided on the circuit board 17 and at a position other than the pressing projection lower portion of the key-top 141', for example, at a position downward the opening portion 11*c*. The dome switch 25 has a similar function as that of the input device 60. The key-top 141' includes an arm portion 191' and a protrusion portion 91*b*' in addition to the shape of the key-top 141 shown in FIG. 20 and, for example, the key-top 141, the arm portion 191' and the protrusion portion 91*b*' are molded integrally by using a resin.

The arm portion 191' extends from one end of the main body of the key-top 141' (corresponding to the key-top 141) onto the dome switch 25 along the inner wall of the lower housing 11*b*'. The terminal portion of the arm portion 191' is bent approximately by 90° and the protrusion portion 91*b*' is provided at the terminal portion thereof. In the key-top 141', when pushing down the vertex portion thereof, it becomes in such a state in which the arm portion 191' is pushed down or hung down by making a predetermined fulcrum portion as a reference and the posture of the arm portion 191' changes, which is different from the key-top 141 shown in FIG. 20. Caused by this posture change, the protrusion portion 91*b*' of the arm portion 191' is operated so as to push down the upper face of the dome switch 25.

In this example, the sensor 13' includes a detection area (3)', but the lower housing 11*b*' is provided with the concave operation area IIb similarly as the input device 61 shown in FIG. 20, so that it is set to be a little bit narrower than that of the sensor 13 of the input device 60. While the sensor 13 shown in FIG. 20 is provided on the pusher piece 191, the sensor 13', in this example, extends from the circuit board 17 to the rear surface side of the key-top 141'. On this circuit board 17, a print wiring 12 is provided similarly as the input device 61, but by employing a flexible sensor sheet structure for the sensor 13', it is possible to form the print wiring 12 and the sensor 13' integrally, so that it becomes possible to reduce the number of parts.

Also, there is arranged a light emitting element 93 of an LED light source or the like at the pressing projection lower portion of the key-top 141' and the light of blue, red, green or the like can be illuminated from the rear side of the key-top 141'. It becomes possible for the light from the light emitting element 93 to be confirmed with eyes from the center region of the key-top 141'. By employing such a lighting structure, it becomes possible to eliminate a photoconductive member, a component having light guide function or the like to the key-top 141'. An example using a photoconductive member 161 will be shown in FIG. 47.

In this example, there is a separation distance α2 between the circuit board 17 and the lower housing 11*b*' because the dome switch 25, the protrusion portion 91*b*', the arm portion 191' and the like are provided at a position other than the pressing projection lower portion of the key-top 141'. Difference β=α1−α2 occurs between the separation distance α1 of the input device 61 and the separation distance α2 of the input device 62 and thus, even in case of providing the concave operation area IIb on the lower housing 11*b*', thinner fabrication of the input device 62 can be attempted and it becomes possible to realize high density mounting of the mobile phone or the like.

In this manner, according to the input device 62 as a modified example, the key-top 141' is provided in the concave operation area IIb of the lower housing 11*b*' and the dome switch 25 pushed down through the arm portion 191' and the protrusion portion 91*b* is located on the circuit board 17 at a position other than the pressing projection lower portion of the key-top 141' and after the information selection of the scroll image 29*a*, 29*b* or the like, the key-top 141' is press-in operated.

Consequently, by turning on or/and off the dome switch 25, it becomes possible also for the unrotary key-top 141' whose rear surface forms a concave shape to be applied to a determination key when determining the input. When an adequate space (separation distance) is not secured between the inside surface of the lower housing 11*b*' and the circuit board 17, this structure functions advantageously and has a large essence for contributing to the compactification of the input device 62.

Furthermore, it becomes possible to arrange the light emitting element 93 of the LED light source or the like at the pressing projection lower portion of the key-top 141', so that it becomes possible to realize the illumination light to the key-top 141' easily without using the photoconductive member 161, a component having light guide function or the like as compared with the structure of the input device 61. In this example, although a case where the key-top 141' is provided on the left side of the lower housing 11b' as shown in FIG. 21 has been described, of course, it is not limited to this; it is needless to say that a similar effect is obtained also with respect to a case where the key-top is provided on the right side of the lower housing 11b'.

Embodiment 7

Figure 22:
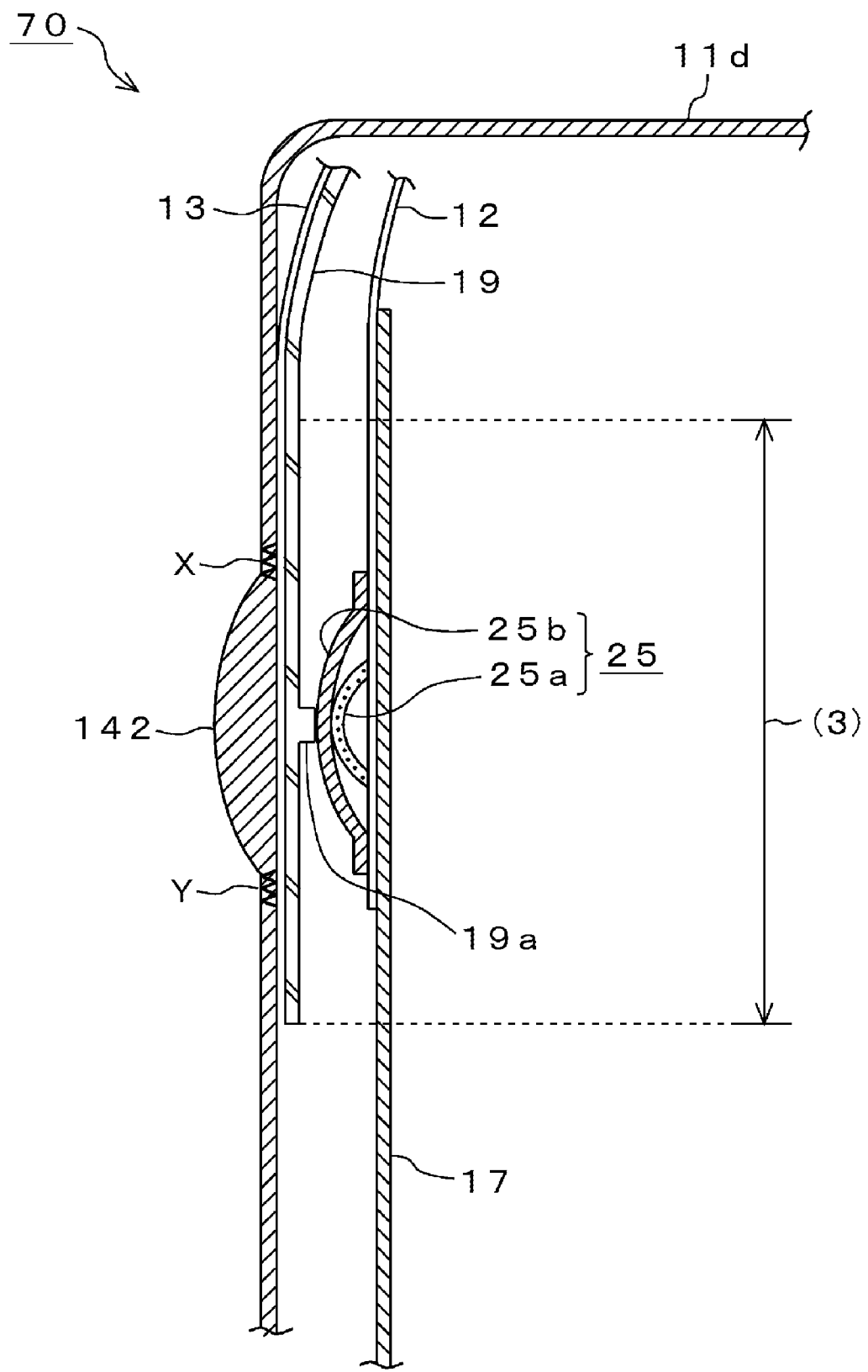
FIG. 22 is a cross-section diagram showing an internal constitution example of the input device 70 as a seventh embodiment.

FIG. 22 shows an internal configuration of an input device 70 as a seventh embodiment. In this embodiment, the lower housing 11d and the key-top 142 whose rear surface is flat shaped are formed by being molded integrally instead of the key-top 14 whose rear surface is flat shaped.

The input device 70 shown in FIG. 22 includes a lower housing 11d with a key-top whose rear surface is flat shaped. According to the lower housing 11d, the operation surface of the key-top 142 has the same arc convex shape as the key-top shape shown in FIG. 3 to FIG. 18, but the main body thereof is integrally molded with the lower housing 11d. For example, by sealing a resin into a die modeled with the lower housing 11d and the key-top 142, the lower housing 11d with a key-top of an arc convex shape is integrally molded.

In this embodiment, a structure in which the key-top 142 is movable to the inside direction of the lower housing 11d is employed in order to press-into the dome switch 25. For example, the vicinity of the upward start portion "x" and the vicinity of the downward end portion "Y" of the key-top 142 are processed in bellows-shapes. It is enough if the portions processed in bellows-shapes are set accordingly in response to the strength of the resin material constituting the lower housing 11d. Thus, the airtight structure and the pressing-into structure of the key-top 142 are made compatible.

Also in this embodiment, on the inside of the key-top 142, there are arranged the sensor 13, the pusher piece 19, the dome switch 25 and circuit board 17 in this order. For the sensor 13, a sensor explained in the third embodiment is used. The pusher piece 19 is arranged so as to be sandwiched between the sensor 13 and the side portion of the circuit board 17. It should be noted with respect to the structure and the function of the dome switch 25, they have been explained in the third embodiment, so that the explanation thereof will be omitted. It is needless to say that the speaker 36b with an actuator function, which is not shown, may be provided. FIG. 10 should be referred to with respect to an operation example of the input device 70.

In this manner, according to the input device 70 as the seventh embodiment, the lower housing 11d and the key-top 142 whose rear surface is flat shaped are molded integrally instead of the key-top 14 whose rear surface is flat shaped. Consequently, the assembly of the input device 70 becomes simple as compared with the method in which the key-top 14, 141 or the like is built in at the opening portion 11c of the lower housing 11b as explained in the first to sixth embodiments. Thus, it becomes possible to provide the input device 70 abundant in water-resistance.

Furthermore, the key-top 142 may be press-in-operated after the information selection of the scroll image 29a, 29b or the like. Consequently, by turning on or/and off the dome switch 25, it becomes possible also for the unrotary key-top 142 forming an airtight shape of the rear surface thereof to be applied to a determination key when determining the input.

In this embodiment, although a case where the key-top 142 is provided on the left side of the lower housing 11d as shown in FIG. 20 has been described, of course, it is not limited to this; it is needless to say that a similar effect is obtained also with respect to a case where the key-top is provided on the right side of the lower housing 11d.

Embodiment 8

Figure 23:
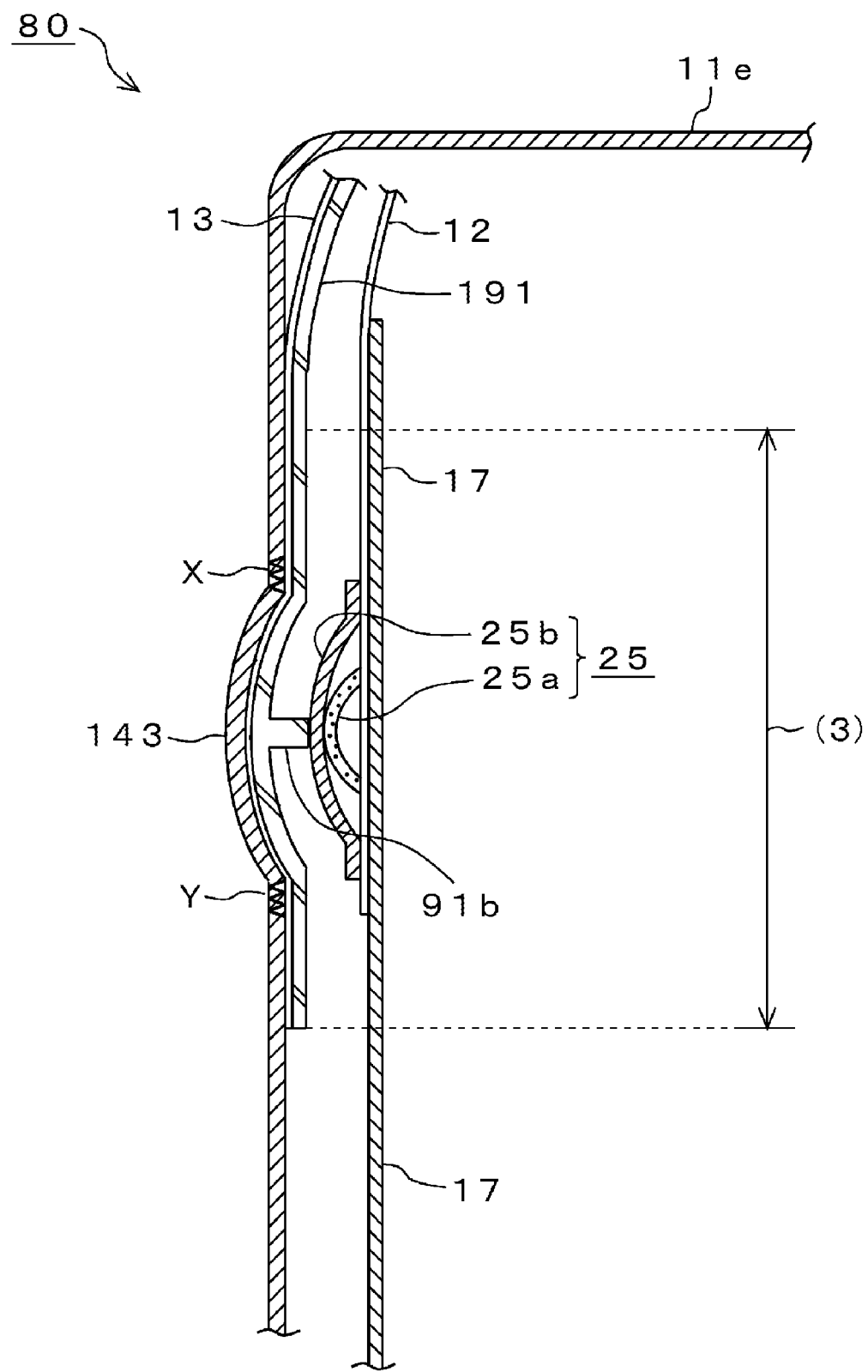
FIG. 23 is a cross-section diagram showing an internal constitution example of an input device 80 as an eighth embodiment.

FIG. 23 shows an internal configuration of an input device 80 as an eighth embodiment. In this embodiment, it is constituted such that the lower housing 11e and a key-top 143 having a rear surface of a concave shape are molded integrally instead of the key-top 142 whose rear surface is flat shaped.

The input device 80 shown in FIG. 23 includes a lower housing 11e with a key-top having a rear surface of a concave shape. According to the lower housing 11e, the operation surface of the key-top 143 has the same arc convex shape as the key-top shape shown in FIG. 3 to FIG. 18, but the rear surface thereof has a concave shape. In this embodiment, for the pusher piece 191, a part formed with a convex shape so as to be insertable to the concave portion of the rear surface of the key-top 143 is used. For example, by sealing a resin into a die modeled with the inside concave shape of the key-top 143, the pusher piece 191 which is formed with the convex shape thereof is formed. A protrusion portion 91b similarly as the pusher piece 19 is provided approximately at the center region of the pusher piece 191.

Also in the input device 80, a structure in which the key-top 143 is movable to the inside direction of the lower housing 11e is employed in order to press-into the dome switch 25. For example, the vicinity of the upward start portion "X" and the vicinity of the downward end portion "Y" of the key-top 143 are processed in bellows-shapes. It is enough if the portions processed in bellows-shapes are set accordingly in response to the strength of the resin material constituting the lower housing 11e. Thus, the airtight structure and the pressing-into structure of the key-top 143 are made compatible.

At the concave portion on the inside of the key-top 143, there are arranged the sensor 13, the pusher piece 191, the dome switch 25 and circuit board 17 in this order. The protrusion portion 91b of the pusher piece 191 is arranged at a position so that it can press the sensor 13. The pusher piece 191 is arranged in the concave portion on the inside of the key-top 143 so as to be along the sensor 13. Also in this embodiment, the pusher piece 191 has a length approximately equal to the detection area (3) of the sensor 13. With respect to the function of the dome switch 25, it has been explained in the third embodiment, so that the explanation thereof will be omitted. It is needless to say that the speaker 36b with an actuator function, which is not shown, may be provided. FIG. 10 should be referred to with respect to an operation example of the input device 80.

In this manner, according to the input device 80 relating to the eighth embodiment, it is constituted such that the lower housing 11e and a key-top 143 having a rear surface of a concave shape are molded integrally instead of the key-top 142 whose rear surface is flat shaped.

Consequently, the assembly of the input device 80 becomes simple as compared with the method in which the key-top 14, 141 or the like is built in at the opening portion 11c of the lower housing 11b as explained in the first to seventh embodiments. This enables to be provided the input device 80 of airtight structure abundant in water-resistance.

Furthermore, the key-top 143 may be press-in-operated after the information selection of the scroll image 29a, 29b or the like. Consequently, by turning on or/and off the dome switch 25, it becomes possible also for the unrotary key-top 143 forming an airtight shape of the rear surface thereof to be applied to a determination key when determining the input. Further, when an adequate space (separation distance) is difficult to be secured between the inside surface of the lower housing 11e and the circuit board 17, this structure functions advantageously and has a large essence for contributing to the compactification of the input device 80.

In this embodiment, although a case where the key-top 143 is provided on the left side of the lower housing 11e as shown in FIG. 23 has been described, of course, it is not limited to this; it is needless to say that a similar effect is obtained also with respect to a case where the operation unit is provided on the right side of the lower housing 11e.

Embodiment 9

Figure 24A:
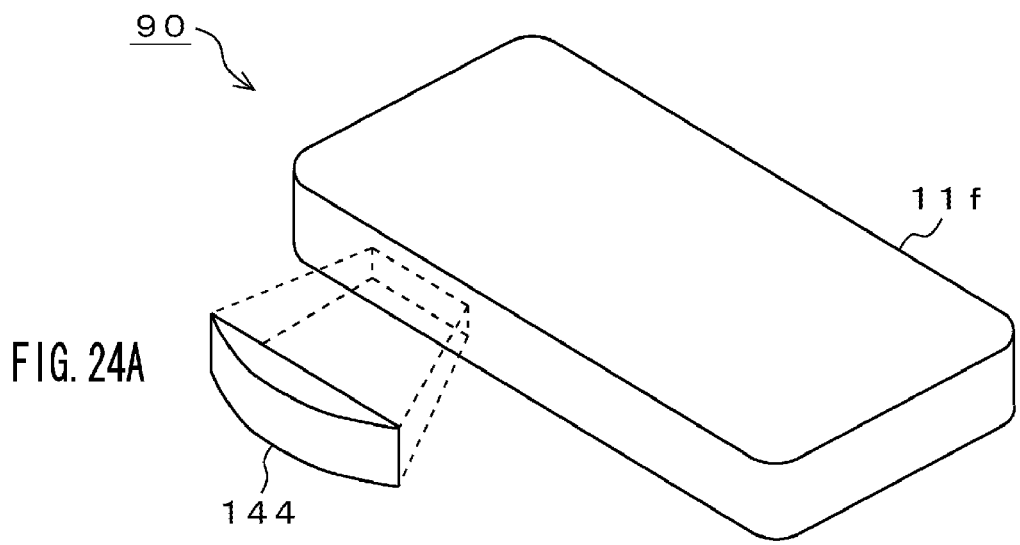
FIG. 24A is a perspective view of an input device 90 as a ninth embodiment of the invention, showing an appearance example.
Figure 24B:
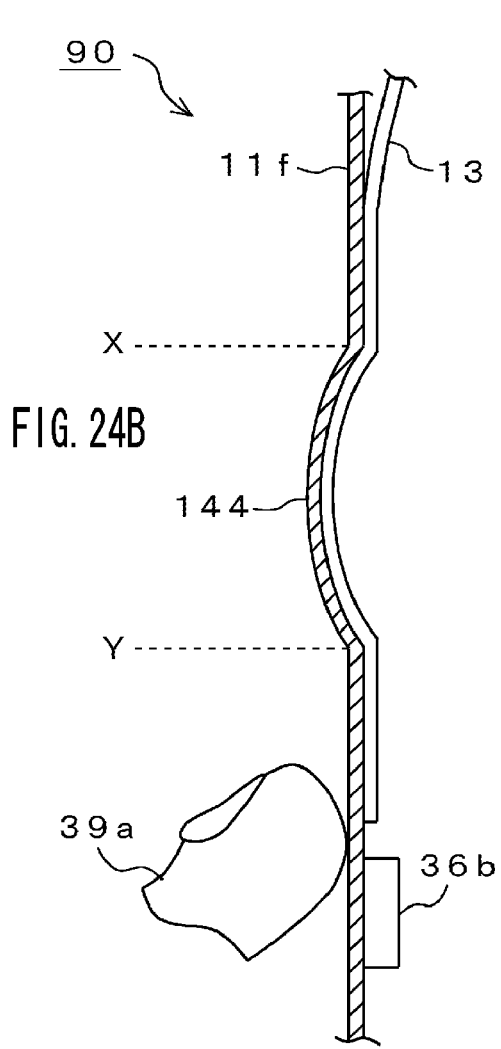
FIGS. 24B and 24C are cross-section diagrams each showing the internal configuration thereof.
Figure 24C:
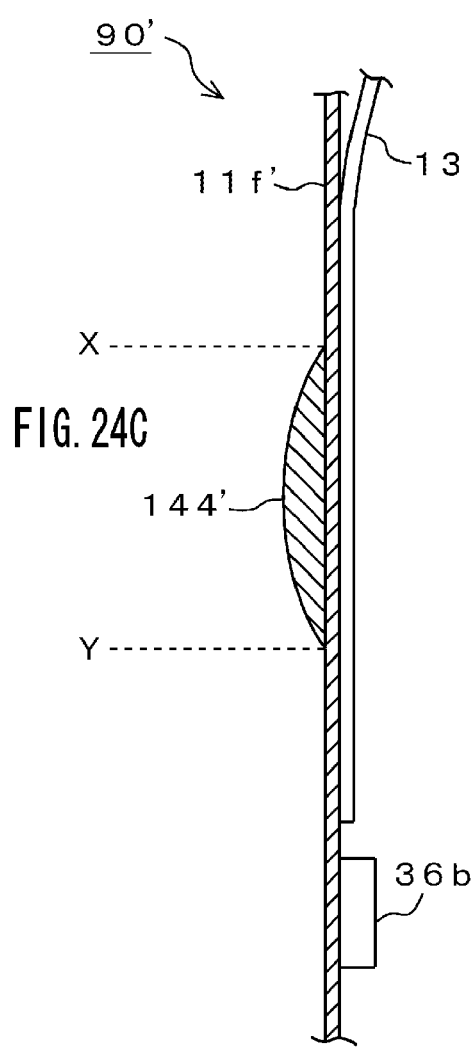

FIG. 24A shows an appearance example of an input device 90 as a ninth embodiment and FIGS. 24B and 24C show an internal configuration thereof.

In this embodiment, it is constituted such that the lower housing 11f and a key-top 144 having a rear surface of a concave shape are molded integrally instead of the key-top 143 whose rear surface is flat shaped and which has been explained in the eighth embodiment. The dome switch 25 and the pusher piece 191 are eliminated.

The input device 90 shown in FIG. 24A includes a lower housing 11f with a key-top having a rear surface of a concave shape. According to the lower housing 11f, the operation surface of the key-top 144 has the same arc convex shape as the key-top shape shown in FIG. 3 to FIG. 18, but the rear surface thereof has a concave shape as shown in FIG. 24B. For example, by sealing a resin into a die for the lower housing, which is modeled with an arc convex shape which becomes the key-top 144, the lower housing 11f having a convex shape for the portion thereof is formed.

In this embodiment, the sensor 13 is arranged at the concave portion on the inside of the key-top 144. Thus, it is possible to form the input device 90 including the key-top 144 as an airtight structure. Also, it is constituted such that the speaker 36b with an actuator function as shown in FIG. 14 is provided on the inside of the lower housing 11f and at a position near the key-top 144 so that sense of touch can be presented to the operator's finger 39a.

In the airtight structure mentioned above, there is employed a method in which a portion of the lower housing 11f is protruded in an arc convex shape, but as shown in FIG. 24C, it is also allowed to employ a structure in which the lower housing 11f' and the key-top 144' of an arc convex shape are fabricated separately and the key-top 144' is pasted on the side surface of the lower housing 11f'. For example, the key-top 144' is bonded on the side surface of the lower housing 11f' by using an UV cure resin or the like. Thus, it is possible to form the input device 90' including the key-top 144' as an airtight structure. FIG. 10 should be referred to with respect to an operation example of the input devices 90, 90'.

In this manner, according to the input device 90 relating to the ninth embodiment, it is constituted such that the lower housing 11f and a key-top 144 having a rear surface of a concave shape are molded integrally instead of the key-top 142 whose rear surface is flat shaped and which has been explained in the seventh embodiment.

Consequently, the assembly of the input device 90 becomes simple as compared with the method in which the key-top 14, 141 or the like is built in at the opening portion 11c of the lower housing 11b as explained in the first to sixth embodiments. Thus, it becomes possible to provide the input device 90 of airtight structure abundant in water-resistance. Of course, as shown in FIG. 24C, it is also allowed to employ a structure in which the key-top 144 of an arc convex shape is pasted on the flat side surface of the lower housing 11f'. When an adequate space (separation distance) is difficult to be secured between the inside surface of the lower housing 11f' and the circuit board 17, which is not shown, this structure functions advantageously and has a large essence for contributing to the compactification of the input devices 90, 90'. It should be noted that by eliminating the dome switch 25, it is possible to omit the bellows-shaping process in the vicinity of the upward start portion "X" and in the vicinity of the downward end portion "Y" of the key-top 144, 144'.

In this embodiment, although a case where the key-top 144 or the like is provided on the left side of the lower housing 11f as shown in FIG. 24A has described, of course, it is not limited to this; it is needless to say that a similar effect is obtained also with respect to a case where the key-top unit is provided on the right side of the lower housing 11f.

Embodiment 10

Figure 25A:
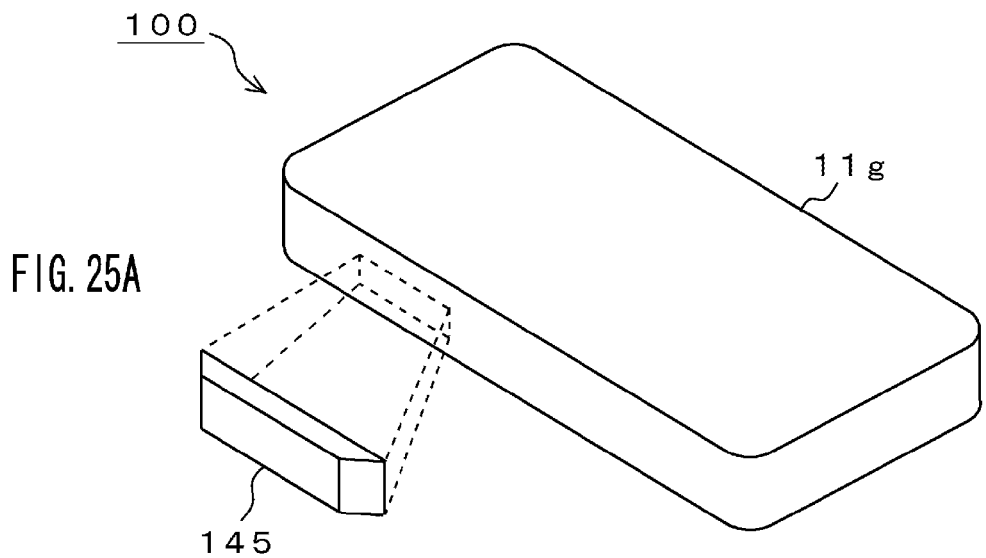
FIG. 25A is a perspective view of an input device 100 as a tenth embodiment of the invention, showing an appearance example.
Figure 25B:
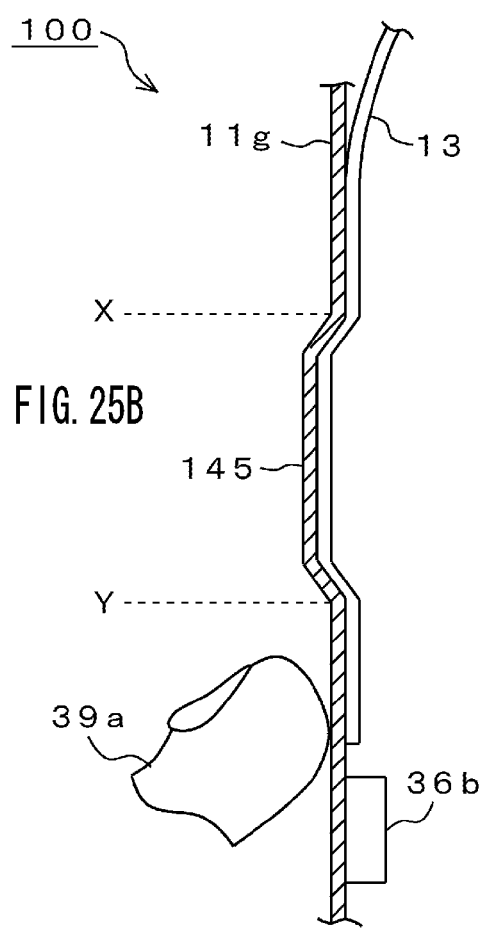
FIGS. 25B and 25C are cross-section diagrams each showing the internal configuration thereof.
Figure 25C:
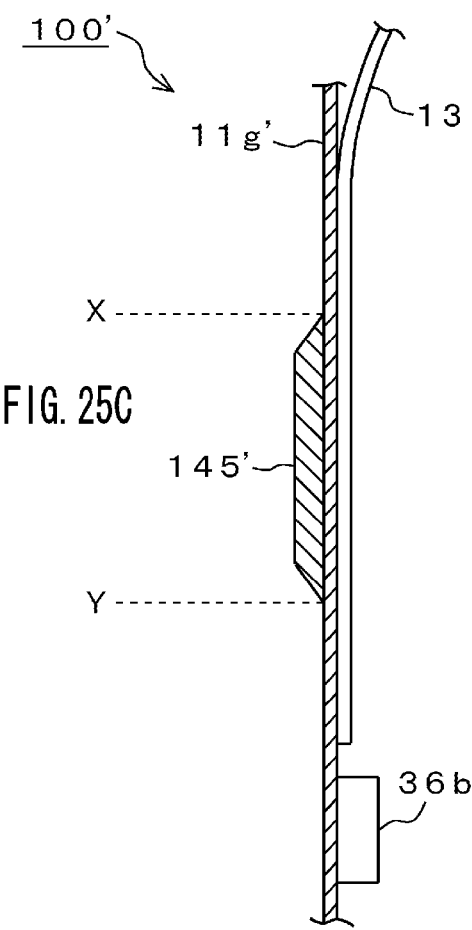

FIGS. 25A to 25C show a configuration of an input device 100 as a tenth embodiment.

In this embodiment, it is constituted such that the lower housing 11g and a key-top 145 having a front surface of a trapezoidal shape are molded integrally instead of the key-top 144 of an arc convex shape which has been explained in the ninth embodiment. The dome switch 25 and the pusher piece 191 are eliminated.

The input device 100 shown in FIG. 25A includes a lower housing 11g with a key-top having a front surface of a trapezoidal shape and also having a rear surface of a concave shape. According to the lower housing 11g, the operation surface of the key-top 145 has a trapezoidal shape that is different from the key-top shapes shown in FIG. 3 to FIG. 21 and the rear surface thereof has a concave shape as shown in FIG. 25B. For example, by sealing a resin into a die for the lower housing, which is modeled with an inside trapezoidal shape which becomes the key-top 145, the lower housing 11g having a convex shape for the portion thereof is formed.

Also in this embodiment, the sensor 13 is arranged at the concave portion on the inside of the key-top 145. Thus, it is possible to form the input device 100 including the key-top 145 as an airtight structure. Also, it is constituted such that the speaker 36b with an actuator function as shown in FIG. 14 is provided on the inside of the lower housing 11g and at a position near the key-top 145 so that sense of touch can be presented to the operator's finger 39a.

In the above-mentioned airtight structure, a method in which a portion of the lower housing 11g is protruded in a trapezoidal shape is employed, but as shown in FIG. 25C, it is also allowed to employ a structure in which the lower housing 11g' and the key-top 145' of a trapezoidal shape are fabricated separately and the key-top 145' is pasted on the side surface of the lower housing 11g'. For example, the key-top 145' is bonded on the side surface of the lower housing 11g' by using an UV cure resin or the like. Thus, it is possible to form the input device 100' including the key-top 145' as an airtight structure. FIG. 10 should be referred to with respect to an operation example of the input devices 100, 100'.

In this manner, according to the input device 100 relating to the tenth embodiment, the lower housing 11g and a key-top 145 having a front surface of a trapezoidal shape are molded integrally instead of the key-top 144 of an arc convex shape which has been explained in the ninth embodiment.

Consequently, the assembly of the input device 100 becomes simple as compared with the method in which the key-top 14, 141 or the like is built in at the opening portion 11c of the lower housing 11b as explained in the first to sixth embodiments. Thus, it becomes possible to provide the input device 100 of airtight structure abundant in water-resistance. Of course, as shown in FIG. 25C, it is also allowed to employ a structure in which the key-top 145' of a trapezoidal shape is pasted on the flat side surface of the lower housing 11g'. When an adequate space (separation distance) is difficult to be secured between the inside surface of the lower housing 11g' and the circuit board 17, which is not shown, this structure functions advantageously and has a large essence for contributing to the compactification of the input devices 100, 100'. It should be noted that by eliminating the dome switch 25, it is possible to omit the bellows-shaping process in the vicinity of the upward start portion "X" and in the vicinity of the downward end portion "Y" of the key-top 145, 145'.

In this embodiment, although a case where the key-top 145 or the like is provided on the left side of the lower housing 11g as shown in FIG. 25A has been described, of course, it is not limited to this; it is needless to say that a similar effect is obtained also with respect to a case where the key-top is provided on the right side of the lower housing 11g.

Embodiment 11

Figure 26A:
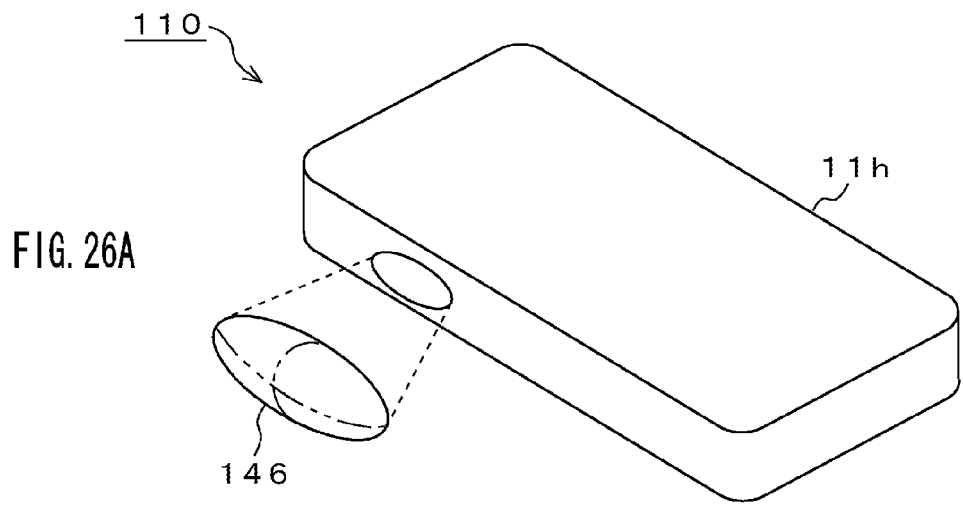
FIG. 26A is a perspective view of an input device 110 as a eleventh embodiment of the invention, showing an appearance example.
Figures 26B, 26C:
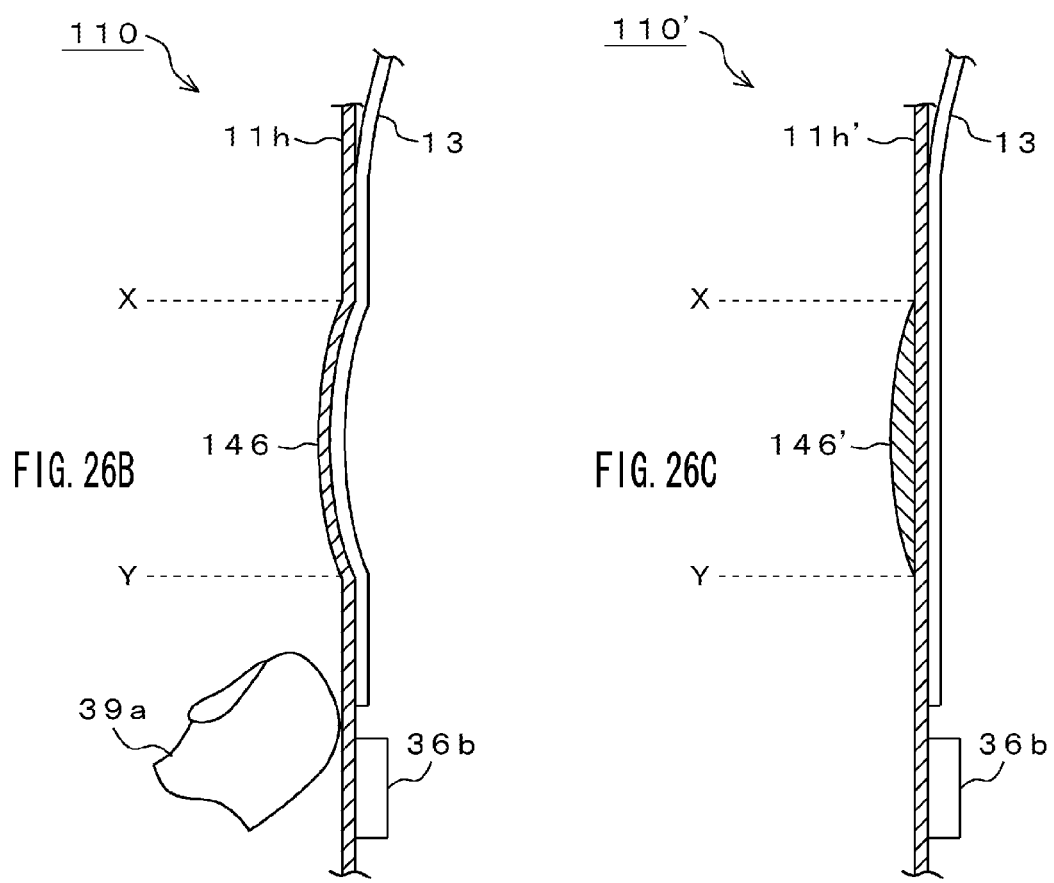
FIGS. 26B and 26C are cross-section diagrams each showing the internal configuration thereof.

FIGS. 26A to 26C show a configuration of an input device 110 as an eleventh embodiment.

In this embodiment, it is constituted such that the lower housing 11h and a key-top 146 having a front surface of a slug dome shape are molded integrally instead of the key-top 145 of a trapezoidal shape which has been explained in the tenth embodiment. The dome switch 25 and the pusher piece 191 are eliminated.

The input device 110 shown in FIG. 26A includes a lower housing 11h with a key-top having a front surface of a slug dome shape and also having a rear surface of a concave shape. According to the lower housing 11h, the operation surface of the key-top 146 has a slug dome shape that is different from the key-top shapes shown in FIG. 3 to FIG. 23 and the rear surface thereof has a concave shape as shown in FIG. 26B. For example, by sealing a resin into a die for the lower housing, which is modeled with an inside slug dome shape which becomes the key-top 146, the lower housing 11h having a convex shape for the portion thereof is formed.

Also in this embodiment, the sensor 13 is arranged at the concave portion on the inside of the key-top 146. Thus, it is possible to form the input device 110 including the key-top 146 as an airtight structure. Also, it is constituted such that the speaker 36b with an actuator function as shown in FIG. 14 is provided on the inside of the lower housing 11h and at a position near the key-top 146 so that sense of touch can be presented to the operator's finger 39a.

In the above-mentioned airtight structure, there is employed a method in which a portion of the lower housing 11h is protruded in a trapezoidal shape, but as shown in FIG. 26C, it is also allowed to employ a structure in which the lower housing 11h' and the key-top 146' of a trapezoidal shape are fabricated separately and the key-top 146' is pasted on the side surface of the lower housing 11h'. For example, the key-top 146' is bonded on a side surface of the lower housing 11h' by using an UV cure resin or the like. Thus, it is possible to form the input device 110' including the key-top 146' as an airtight structure. FIG. 10 should be referred to with respect to an operation example of the input devices 110, 110'.

In this manner, according to the input device 110 relating to the eleventh embodiment, it is constituted such that the lower housing 11h and a key-top 146 having a front surface of a slug dome shape are molded integrally instead of the key-top 145 of a trapezoidal shape which has been explained in the tenth embodiment.

Consequently, the assembly of the input device 110 becomes simple as compared with the method in which the key-top 14, 141 or the like is built in at the opening portion 11c of the lower housing 11b as explained in the first to sixth embodiments. Thus, it becomes possible to provide the input device 110 of airtight structure abundant in water-resistance. Of course, as shown in FIG. 26C, it is also allowed to employ a structure in which the key-top 146' having a front surface of a slug dome shape is pasted on the flat side surface of the lower housing 11h. When an adequate space (separation distance) is difficult to be secured between the inside surface of the lower housing 11h and the circuit board 17, which is not shown, this structure functions advantageously and has a large essence for contributing to the compactification of the input devices 110, 110'. It should be noted that by eliminating the dome switch 25, it is possible to omit the bellows-shaping process in the vicinity of the upward start portion "X" and in the vicinity of the downward end portion "Y" of the key-top 146, 146'.

In this embodiment, although a case where the key-top 146 or the like is provided on the left side of the lower housing 11h as shown in FIG. 26A has been described, of course, it is not limited to this; it is needless to say that a similar effect is obtained also with respect to a case where the key-top is provided on the right side of the lower housing 11h.

Embodiment 12

Figure 27A:
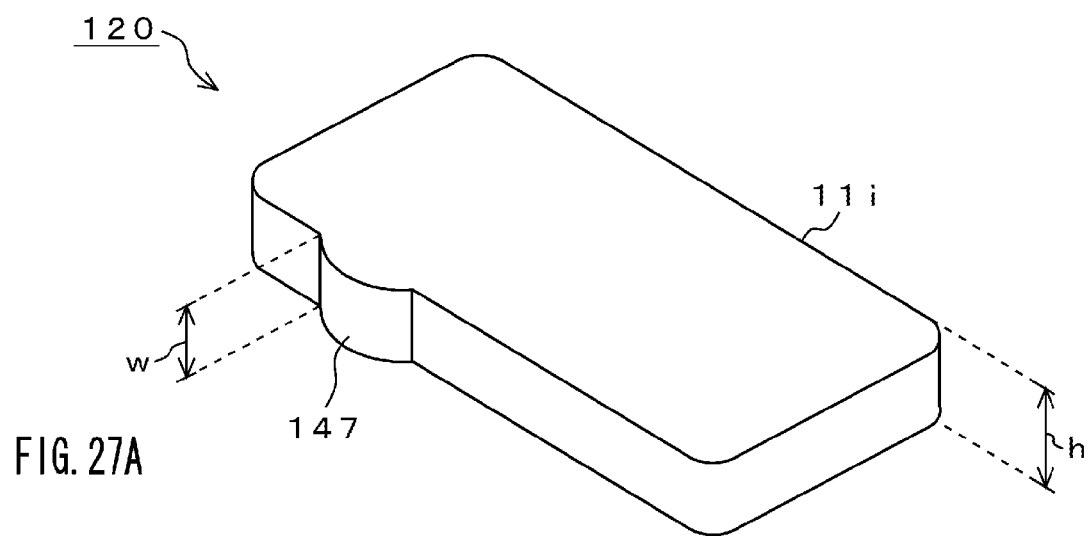
FIG. 27A is a perspective view of an input device 120 as a twelfth embodiment of the invention, showing an appearance example.
Figure 27B:
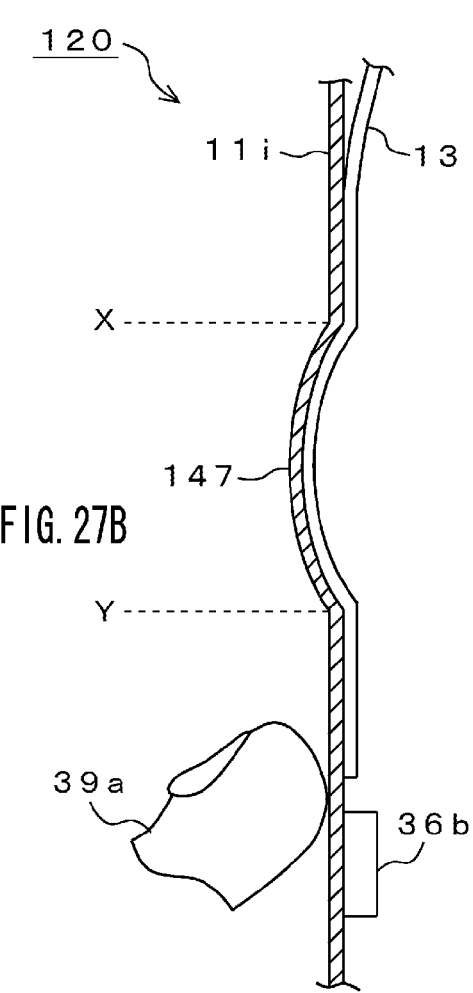
FIGS. 27B and 27C are cross-section diagrams each showing the internal configuration thereof.
Figure 27C:
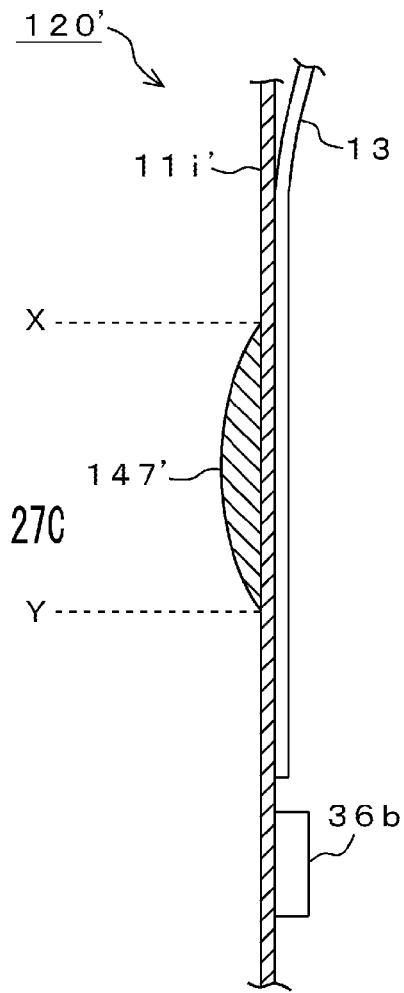

FIGS. 27A to 27C show a configuration of an input device 120 as a twelfth embodiment.

In this embodiment, it is constituted such that the lower housing 11i and a key-top 147 having a front surface of a semi-cylindrical dome shape are molded integrally instead of the key-top 146 having a front surface of a slug dome shape, which has been explained in the eleventh embodiment. The dome switch 25 and the pusher piece 191 are eliminated.

The input device 120 shown in FIG. 27A includes a lower housing 11i with a key-top having a front surface of a semi-cylindrical dome shape and also having a rear surface of a concave shape. According to the lower housing 11i, the operation surface of the key-top 147 has a semi-cylindrical dome shape that is different from the key-top shapes shown in FIG. 3 to FIG. 26. In this embodiment, when assuming, with respect to the key-top 147, that the width thereof is "w" and the height of the lower housing 11i is "h", such a relation as w=h is established. The rear surface of the key-top 147 has a concave shape as shown in FIG. 27B. For example, by sealing a resin into a die for the lower housing, which is modeled with an inside semi-cylindrical dome shape which becomes the key-top 147 having width "w", the lower housing 11i having height "h" and having a convex shape for the portion thereof is formed.

Also in this embodiment, the sensor 13 is arranged at the concave portion on the inside of the key-top 147. Thus, it is possible to form the input device 120 including the key-top 147 as an airtight structure. Also, it is constituted such that the speaker 36b with an actuator function as shown in FIG. 14 is provided on the inside of the lower housing 11i and at a position near the key-top 147 so that sense of touch can be presented to the operator's finger 39*a*.

In the above-mentioned airtight structure, there is employed a method in which a portion of the lower housing 11*i* is protruded in a semi-cylindrical dome shape, but as shown in FIG. 27C, it is also allowed to employ a structure in which the lower housing 11*i*' and the key-top 147' of a semi-cylindrical dome shape are fabricated separately and the key-top 147' is pasted on the side surface of the lower housing 11*i*'. For example, the key-top 147' is bonded on the side surface of the lower housing 11*i*' by using an UV cure resin or the like. Thus, it is possible to form the input device 120' including the key-top 147' as an airtight structure. FIG. 10 should be referred to with respect to an operation example of the input devices 120, 120'.

In this manner, according to the input device 120 relating to the twelfth embodiment, it is constituted such that the lower housing 11*i* and a key-top 147 having a front surface of a semi-cylindrical dome shape are molded integrally instead of the key-top 146 of a slug dome shape which has been explained in the eleventh embodiment.

Consequently, the assembly of the input device 120 becomes simple as compared with the method in which the key-top 14, 141 or the like is built in at the opening portion 11*c* of the lower housing 11*b* as explained in the first to sixth embodiments. Thus, it becomes possible to provide the input device 120 of airtight structure abundant in water-resistance. Of course, as shown in FIG. 27C, it is also allowed to employ a structure in which the key-top 147' having a front surface of a semi-cylindrical dome shape is pasted on the flat side surface of the lower housing 11*i*'. when an adequate space (separation distance) is difficult to be secured between the inside surface of the lower housing 11*i* and the circuit board 17, which is not shown, this structure functions advantageously and has a large essence for contributing to the compactification of the input devices 120, 120'. It should be noted that by eliminating the dome switch 25, it is possible to omit the bellows-shaping process in the vicinity of the upward start portion "X" and in the vicinity of the downward end portion "Y" of the key-top 147, 147'.

In this embodiment, although a case where the key-top 147 or the like is provided on the left side of the lower housing 11*i* as shown in FIG. 27A has been described, of course, it is not limited to this; it is needless to say that a similar effect is obtained also with respect to a case where the key-top is provided on the right side of the lower housing 11*i*.

Embodiment 13

Figure 28A:
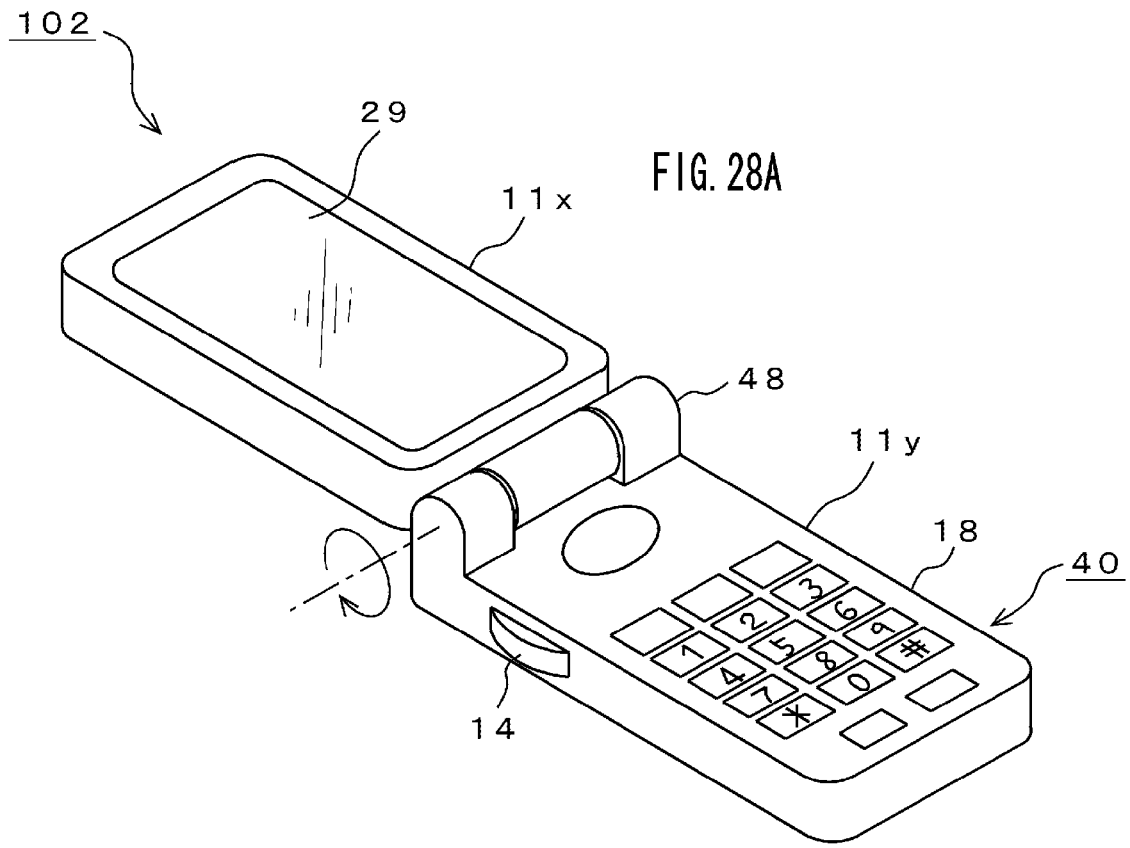
FIGS. 28A and 28B are perspective views of a mobile phone 102 as a thirteenth embodiment of the invention, showing a configuration thereof.
Figure 28B:
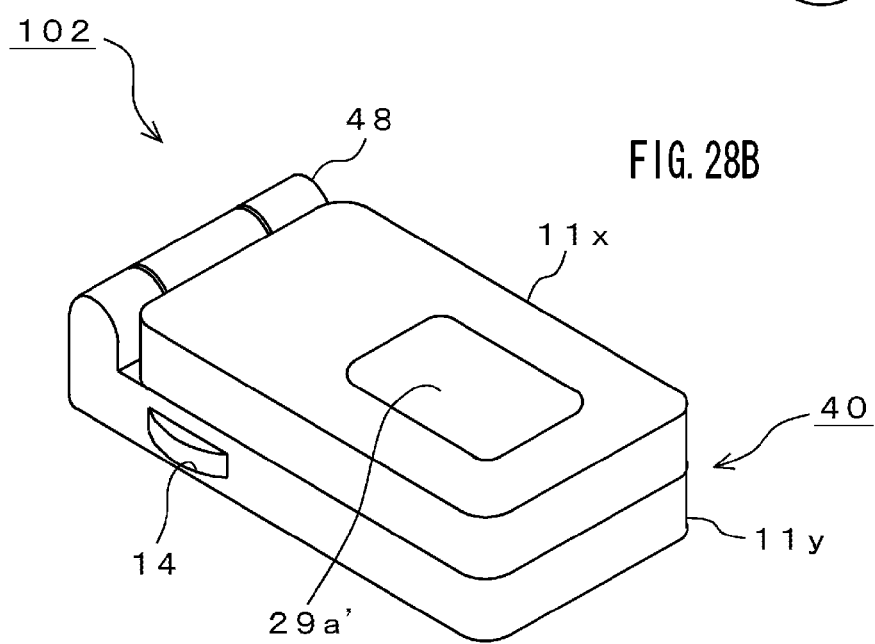

FIGS. 28A and 28B show a configuration of a mobile phone 102 as a thirteenth embodiment according to the present invention.

The mobile phone 102 shown in FIG. 28A constitutes one example of an electronic apparatus and includes a housing structure of a slide-type folding mechanism (Cram manner). The mobile phone 102 is constituted of an upper housing 11*x* and a lower housing 11*y*, and the upper housing 11*x* and the lower housing 11*y* are engaged freely rotatably by a hinge 48 (one axis). The input device 10 to the input device 120 explained in the first to twelfth embodiments are applied to the lower housing 11*y*. It is needless to say that any one of the input device 20 to the input device 120 explained in the second to twelfth embodiments may be applied to the mobile phone 101 explained in the first embodiment.

The mobile phone 102, as shown in FIG. 28B, has a lid-closing housing structure of the operation surface such that the upper housing 11*x* covers the operation surface on the lower housing 11*y*. In this embodiment, in a state of closing the upper housing 11*x*, there is provided on the closing surface thereof with a monitor 29*a* whose size is smaller than that of the display unit 29 and, for example, when utilizing the camera function of the mobile phone 102, the monitor 29*a* displays a subject image as a finder window portion.

The upper housing 11*x* is provided, similarly as the mobile phone 101 explained in the first embodiment, with the display unit 29 having a predetermined size on which a wait screen image, the phone number of the partner side or the like is displayed. A liquid crystal display monitor is used for the display unit 29. The lower housing 11*y* is provided, for example, with the input device 40 that is operated by the slide operation of the operator's finger 39*a* so as to input information.

The input device 40 includes the operation surface at an upper portion and a side portion and an operation panel 18 in which a ten-key of numerals [0] to [9], a symbol [*] key, a symbol [#] key and the like are arranged is included on the upper portion operation surface. The lower housing 11*y* is provided with the sensor 13 for detecting the slide position of the operator's finger 39*a*. The key-top 14 is provided so as to cover a portion or the entire surface of this sensor 13 and is slide-operated along the operation surface of the lower housing 11*y*. The key-top 14 is constituted so as to include a convex shape which becomes thicker along the sliding direction from one portion of the operation surface of the lower housing 11*y* and also which becomes thinner toward the other portion of the operation surface thereof (see FIG. 17).

Figure 29:
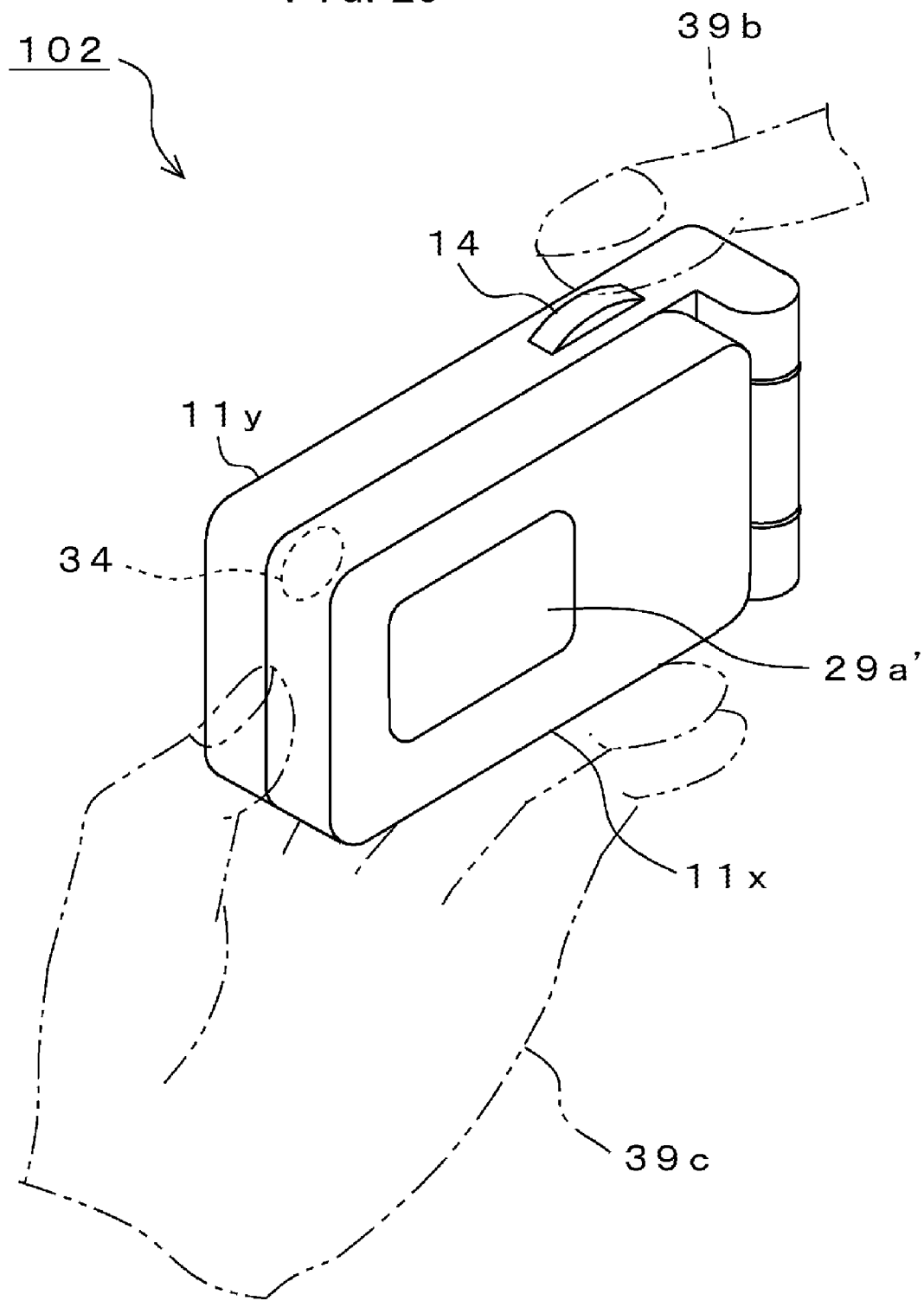
FIG. 29 is a perspective view of the mobile phone 102 showing a handling example on an occasion of imaging.

FIG. 29 shows a handling example on an occasion of taking a picture by the mobile phone 102. A camera 34 is arranged on the bottom surface of the lower housing 11*y* of the mobile phone 102 shown in FIG. 29. In this embodiment, when the mobile phone 102 is made to be in a state of lid-closing housing of the operation surface and the subject is imaged by utilizing the camera function thereof, the operator holds the mobile phone by his left hand 39*c* so as to direct the operation surface of the key-top 14 upward. Then, it is possible to use the key-top 14 such that the forefinger 39*b* of the operator's right hand executes a zoom-in slide operation or activates the shutter. The key-top 14 is not limited to the shutter function but can be used also for an image scaling process or a focus adjustment as various kinds of adjustment keys.

In this manner, according to the mobile phone 102 relating to the thirteenth embodiment, there is provided any one of the first to twelfth input devices 10 to 120 relating to the present invention, so that in addition to the slide operation feeling of becoming thicker along the sliding direction from one portion of the operation surface of the lower housing 11*y* with respect to the slide operation depending on the operator's finger 39*b* which operates the mobile phone 102, it is possible to present the slide operation feeling of becoming thinner toward the other portion of the operation surface thereof. Furthermore, when operating the shutter, it becomes possible to present sense of touch by the speaker 36*b* with an actuator function.

Consequently, it becomes possible to provide a non-rotary side jog tool or the like which has a structure that is different from a rotary side jog tool in the past and which obtains the operation feeling approximately similar to such a side jog tool. Furthermore, miniaturization and operability of the mobile phone 102 can be improved, so that it is possible to attempt the lowering of malfunction, cost-down and the simplification of manufacturing process of the mobile phone 102.

It should be noted that, in case of utilizing a music player function of the mobile phone 102, the monitor 29*a*' is constituted as a musical composition selection window portion such that images of titles, names of musicians and the like are scroll-displayed and it becomes possible to execute the scroll-operation or the volume adjustment of the reproduced sound depending on the key-top 14.

In this embodiment, although a case where the key-top 14 is provided on the left side of the lower housing 11y as shown in FIG. 28A has been described, of course, it is not limited to this; it is needless to say that a similar effect is obtained also with respect to a case where the key-top is provided on the right side of the lower housing 11y.

Embodiment 14

FIGS. 30A and 30B show a configuration of a mobile phone 103 as a fourteenth embodiment according to the present invention.

The mobile phone 103 shown in FIG. 30A constitutes one example of an electronic apparatus and includes a housing structure of a two-axis hinge type folding mechanism. The mobile phone 103 contains an upper housing 11x' and a lower housing 11y', and the upper housing 11x' and the lower housing 11y' are engaged freely rotatably by two hinges 48a, 48b (two axes). The hinge 48a engages the upper housing 11x' and the lower housing 11y' freely in open and in close similarly as the thirteenth embodiment. The hinge 48b is arranged so as to be perpendicular to the hinge 48a and engages the upper housing 11x' rotatably with respect to the lower housing 11y'. Any one of the input device 10 to the input device 120 explained in the first to twelfth embodiments may be applied to the lower housing 11y'.

The upper housing 11x' is provided, similarly as the mobile phone 101 explained in the first embodiment, with the display unit 29 having a predetermined size on which a wait screen image, the phone number of the partner side or the like is displayed. A liquid crystal display monitor is used for the display unit 29. With respect to the mobile phone 103, there is employed a first lid-closing housing structure of the operation surface such that the upper housing 11x' directing the monitor 29a upward covers the operation surface on the lower housing 11y' (see FIG. 28B) and a second lid-closing housing structure of the operation surface as shown in FIG. 30B such that the upper housing 11x' directing the display unit 29 upward covers the operation surface on the lower housing 11y'.

In this embodiment, in a state of closing the upper housing 11x' which directs the display unit 29 upward, the monitor 29a' faces the closing surface thereof. For example, when utilizing one-segment television function of the mobile phone 103, the display unit 29 displays a broadcasting program as a television receiving screen. The lower housing 11y' is provided, for example, with the input device 40 that is operated so as to input information according to the slide operation of the operator's finger 39a.

The input device 40 includes the operation surface at an upper portion and a side portion and an operation panel 18 in which a ten-key of numerals [0] to [9], a symbol [*] key, a symbol [#] key and the like are arranged is included on the upper portion operation surface. The sensor 13 for detecting the slide position of the operator's finger 39a is provided in the lower housing 11y'. The key-top 14 is provided so as to cover a portion or the entire surface of this sensor 13 which is slide-operated along the operation surface of the lower housing 11y'. The key-top 14 has a convex shape which becomes thicker along the sliding direction from one portion of the operation surface of the lower housing 11y' and also which becomes thinner toward the other portion of the operation surface thereof (see FIG. 17).

Figure 31:
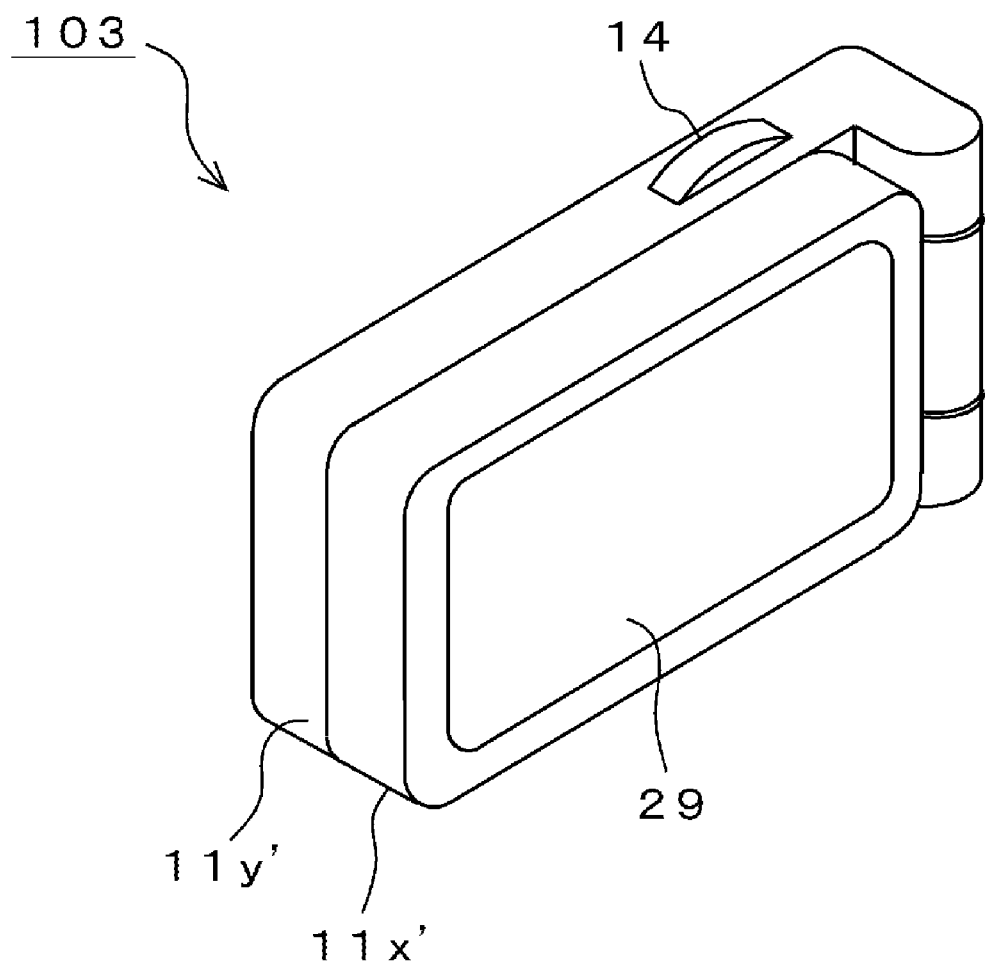
FIG. 31 is a perspective view of the mobile phone 103, showing a handling example on an occasion of viewing a television.

FIG. 31 shows a handling example of the mobile phone 103 when viewing a broadcasting program. In the mobile phone 103 shown in FIG. 31, the mobile phone 103 is in a state of the second lid-closing housing of the operation surface and when a broadcasting program is received by utilizing the television receiving function thereof, the mobile phone is placed on a desk or the like, which is not shown, so as to direct the operation surface of the key-top 14 upward. This enables the key-top 14 to be used so as to carry out slide-operation of channel selection or to fixedly-set a determination of the channel selection or the like by the forefinger of the operator's right hand or the like. The key-top 14 can be used also as a key for audio volume adjustment other than a channel selection key. Of course, the key-top 14 may be also used as a character input operation key or an input candidate selection determination key in case of having a telephone call to a partner, in case of receiving a telephone call from a partner or when making an email.

In this manner, according to the mobile phone 103 relating to the fourteenth embodiment, there is provided any one of the first to twelfth input devices 10 to 120 as embodiments of the present invention, so that in addition to the slide operation feeling of becoming thicker along the sliding direction from one portion of the operation surface of the lower housing 11y' in response to the slide operation depending on the operator's finger 39b which operates the mobile phone 103, it is possible to present the slide operation feeling of becoming thinner toward the other portion of the operation surface thereof. Furthermore, on an occasion of the channel selection determination operation, it becomes possible to present sense of touch by the speaker 36b with an actuator function.

Consequently, it becomes possible to provide a non-rotary side jog tool or the like which has a structure that is different from a rotary side jog tool in the past and which obtains the operation feeling approximately similar to such a side jog tool. Furthermore, miniaturization and operability of the mobile phone 103 can be improved, so that it is possible to attempt the lowering of malfunction, cost-down and the simplification of manufacturing process of the mobile phone 103.

In this embodiment, although a case where the key-top 14 is provided on the left side of the lower housing 11y' as shown in FIGS. 30A and 30B has been described, of course, it is not limited to this; it is needless to say that a similar effect is obtained also with respect to a case where the key-top is provided on the right side of the lower housing 11y'.

Embodiment 15

Figure 32:
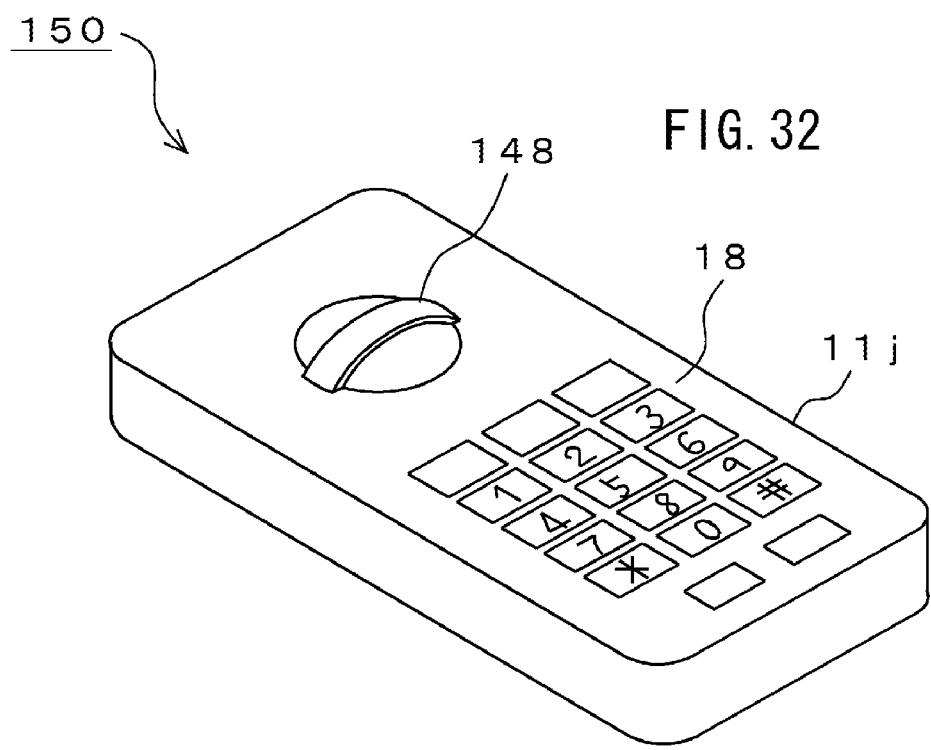
FIG. 32 is a perspective view of an input device 150 as a fifteenth embodiment of the invention, showing a configuration thereof.

FIG. 32 shows a configuration of an input device 150 as a fifteenth embodiment. In this embodiment, instead of the key-tops 14, 141 to 146 for the arrangement on the housing side surface, which have various kinds of shapes and are explained in the first to twelfth embodiments, an operation panel 18 of a lower housing 11j and a key-top 148 having a convex shape of spherical single horizontal-line are molded integrally.

Figure 30:
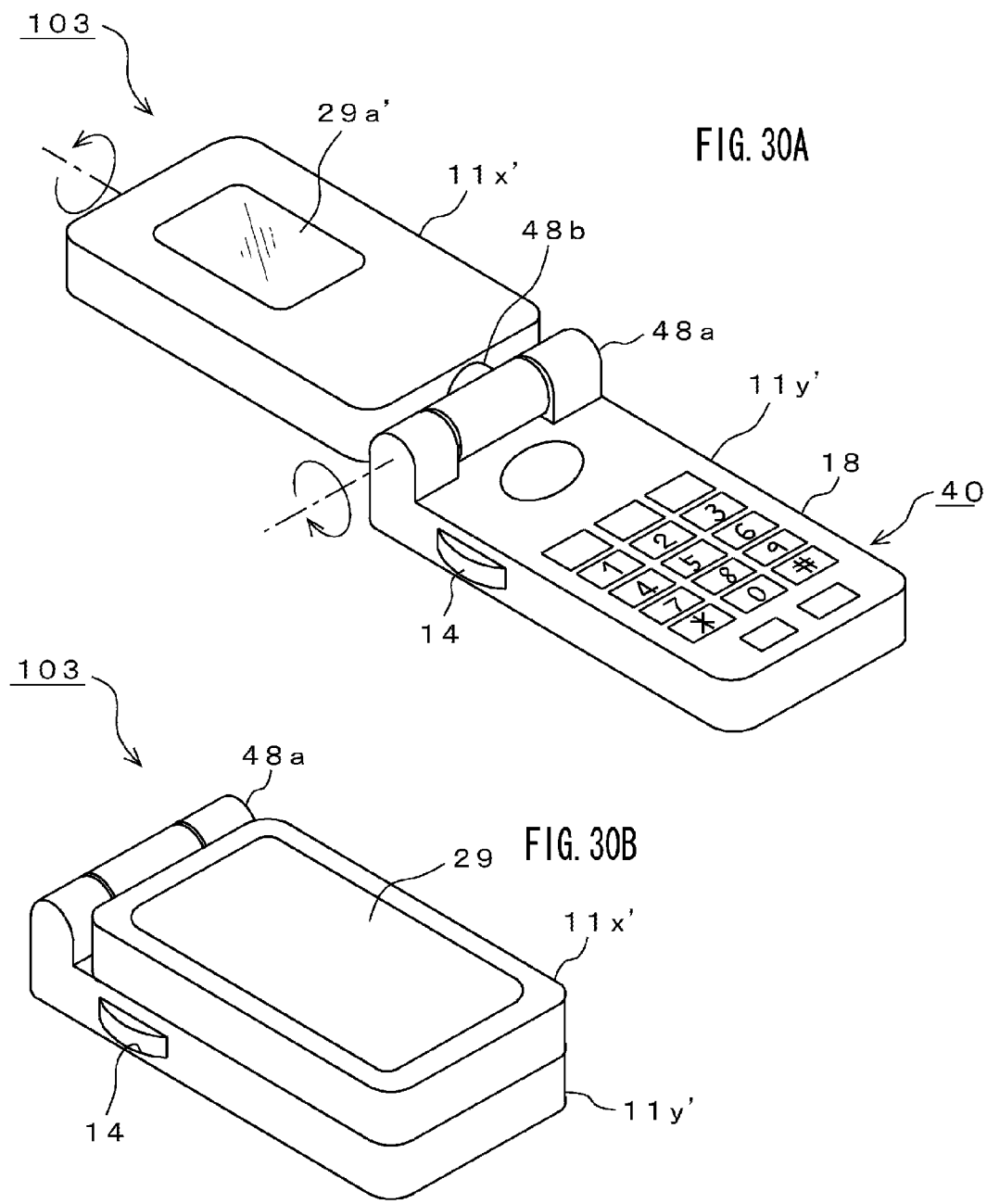
FIGS. 30A and 30B are perspective views of a mobile phone 103 as a fourteenth embodiment of the invention, showing a configuration.

The input device 150 shown in FIG. 30 includes the lower housing 11j with a key-top having a convex shape of spherical single horizontal-line. The upper portion of the lower housing 11j is made as an operation surface and an operation panel 18 in which a ten-key of numerals [0] to [9], a symbol [*] key, a symbol [#] key and the like are arranged is included on the upper portion operation surface. According to the lower housing 11j, the operation surface of the key-top 148 protuberates in a convex shape of spherical single horizontal-line that is different from the key-top shapes shown in FIG. 3 to FIG. 26. The key-top 148 has predetermined height and width. With respect to a structure on the inside of the key-top 148 of the lower housing 11j, the structure of the sensor 13 as shown in FIG. 22, FIG. 23 or FIG. 24B is employed (see FIG. 22, FIG. 23 or FIG. 24B).

For example, by sealing a resin into a die for the lower housing, which is modeled with the convex shape of spherical single horizontal-line which becomes the key-top 148, ten-keys of numerals [0] to [9], a symbol [*] key, a symbol [#] key and the like, which become the operation panel 18, the lower housing 11j is formed so as to form a convex shape at the portion thereof. Thus, it is possible to form the input device 150 including the key-top 148 as an airtight structure. Also, it is constituted such that the speaker 36b with an actuator function as shown in FIG. 14 is provided on the inside of the lower housing 11j and at a position near the key-top 148 so that sense of touch can be presented to the operator's finger 39a.

In this embodiment, the key-top 148 is slide-operated along the convex shape of spherical single horizontal-line. Thus, in addition to the slide operation feeling of becoming thicker along the convex shape of spherical single horizontal-line from one portion of the operation surface of the lower housing 11j in response to the slide operation depending on the operator's finger 39a, it is possible to present the slide operation feeling of becoming thinner in an arc convex shape toward the other portion of the operation surface thereof.

In this manner, according to the input device 150 relating to the fifteenth embodiment, the operation panel 18 of the lower housing 11j and the key-top 148 having a convex shape of spherical single horizontal-line are molded integrally. Consequently, it becomes possible to provide the input device 150 of airtight structure abundant in water-resistance. Furthermore, the assembly of the input device 150 becomes simple as compared with the method in which the key-top 148 with an arc convex shape of spherical single horizontal-line and the operation panel forming the ten-keys of numerals [0] to [9], the [*] key, the [#] key and the like are assembled separately.

In this embodiment, although a case where the key-top 148 is provided on the front surface side of the lower housing 11j as shown in FIG. 32 has been described, of course, it is not limited to this; it is needless to say that a similar effect is obtained also with respect to a case where the key-top is provided on the rear surface side of the lower housing 11j.

Embodiment 16

Figure 33:
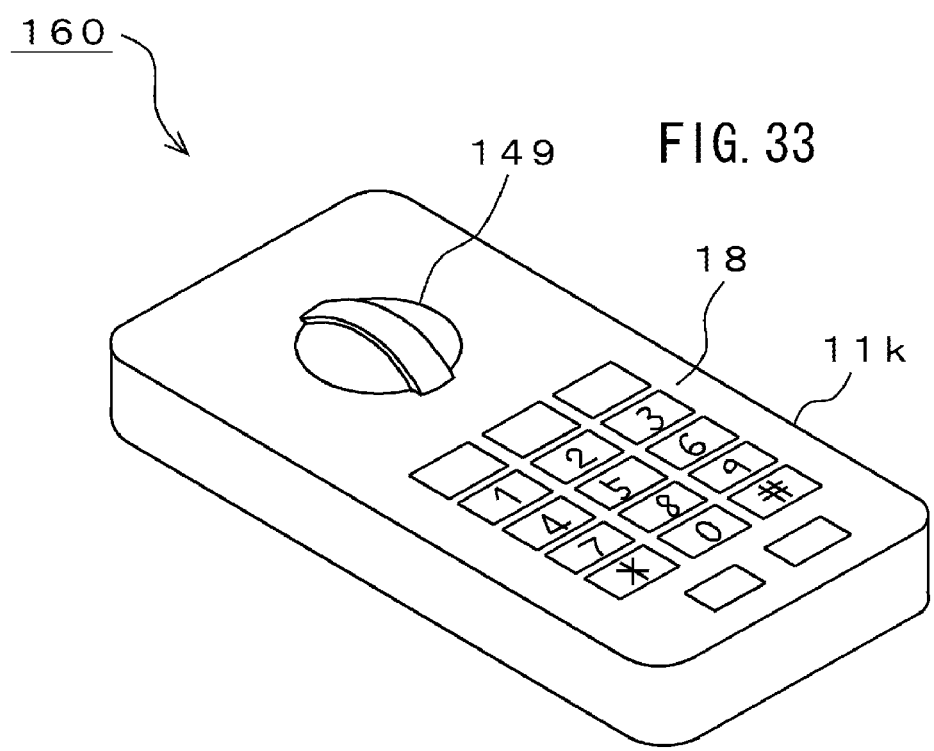
FIG. 33 is a perspective view of an input device 160 as a sixteenth embodiment of the invention, showing a configuration thereof.

FIG. 33 shows a configuration of an input device 160 as a sixteenth embodiment. In this embodiment, instead of the key-tops 14, 141 to 146 for the arrangement on the housing side surface, which have various kinds of shapes and are explained in the first to twelfth embodiments, an operation panel 18 of a lower housing 11k and a key-top 149 having a convex shape of spherical single vertical-line are molded integrally.

The input device 160 shown in FIG. 33 includes the lower housing 11k with a key-top having a convex shape of spherical single vertical-line. The upper portion of the lower housing 11k is made as an operation surface and an operation panel 18 in which a ten-key of numerals [0] to [9], a symbol [*] key, a symbol [#] key and the like are arranged is included on the upper portion operation surface. According to the lower housing 11k, the operation surface of the key-top 149 protuberates in a convex shape of spherical single vertical-line that is different from the key-top shape shown in FIG. 32. The key-top 149 has predetermined height and width. With respect to the structure on the inside of the key-top 149 of the lower housing 11k, the structure of the sensor 13 as shown in FIG. 22, FIG. 23 or FIG. 24B is employed (see FIG. 22, FIG. 23 or FIG. 24B).

For example, by sealing a resin into a die for the lower housing, which is modeled with the convex shape of spherical single vertical-line which becomes the key-top 149, ten-keys of numerals [0] to [9], a symbol [*] key, a symbol [#] key and the like, which become the operation panel 18, the lower housing 11k is formed so as to form a convex shape at the portion thereof. Thus, it is possible to form the input device 160 including the key-top 149 as an airtight structure. Also, it is constituted such that the speaker 36b with an actuator function as shown in FIG. 14 is provided on the inside of the lower housing 11k and at a position near the key-top 149 so that sense of touch can be presented to the operator's finger 39a.

In this embodiment, the key-top 149 is slide-operated along the convex shape of spherical single vertical-line. Thus, in addition to the slide operation feeling of becoming thicker along the convex shape of spherical single vertical-line from one portion of the operation surface of the lower housing 11k in response to the slide operation depending on the operator's finger 39a, it is possible to present the slide operation feeling of becoming thinner in an arc convex shape toward the other portion of the operation surface.

In this manner, according to the input device 160 relating to the sixteenth embodiment, the operation panel 18 of the lower housing 11k and the key-top 149 having a convex shape of spherical single vertical-line are molded integrally. Consequently, it becomes possible to form the input device 160 as airtight structure abundant in water-resistance. Furthermore, the assembly of the input device 160 becomes simple as compared with the method in which the key-top 149 with a convex shape of spherical single vertical-line and the operation panel forming the ten-keys of numerals [0] to [9], the [*] key, the [#] key and the like are assembled separately.

In this embodiment, although a case where the key-top 149 is provided on the front surface side of the lower housing 11k as shown in FIG. 31 has been described, of course, it is not limited to this; it is needless to say that a similar effect is obtained also with respect to a case where the key-top is provided on the rear surface side of the lower housing 11k.

Embodiment 17

Figure 34:
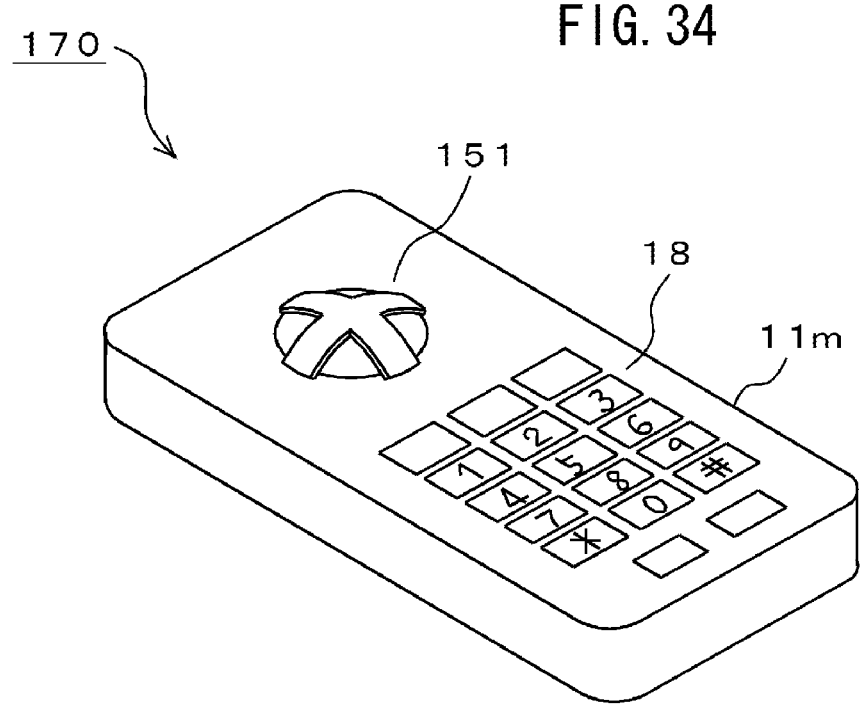
FIG. 34 is a perspective view of an input device 170 as a seventeenth embodiment of the invention, showing a configuration thereof.

FIG. 34 shows a configuration of an input device 170 as a seventeenth embodiment. In this embodiment, instead of the key-tops 14, 141 to 146 for the arrangement on the housing side surface, which have various kinds of shapes and are explained in the first to twelfth embodiments, an operation panel 18 of a lower housing 11m and a key-top 151 having a convex shape of a spherical cross are molded integrally.

The input device 170 shown in FIG. 32 includes the lower housing 11m with a key-top having a convex shape of a spherical cross. The upper portion of the lower housing 11m is made as an operation surface and an operation panel 18 in which a ten-key of numerals [0] to [9], a symbol [*] key, a symbol [#] key and the like are arranged is included on the upper portion operation surface. According to the lower housing 11m, the operation surface of the key-top 151 protuberates in a convex shape of a spherical cross that is different from the key-top shape shown in FIG. 33. With respect to the structure on the inside of the key-top 151 of the lower housing 11m, the structure of the sensor 13 as shown in FIG. 22, FIG. 23 or FIG. 24B is employed (see FIG. 22, FIG. 23 or FIG. 24B).

For example, by sealing a resin into a die for the lower housing, which is modeled with the convex shape of a spherical cross which becomes the key-top 151, ten-keys of numerals [0] to [9], a symbol [*] key, a symbol [#] key and the like, which become the operation panel 18, the lower housing 11m is formed so as to form a convex shape at the portion thereof. Thus, it is possible to form the input device 170 including the key-top 151 as an airtight structure. Also, it is constituted such that the speaker 36b with an actuator function as shown in FIG. 14 is provided on the inside of the lower housing 11m and at a position near the key-top 151 so that sense of touch can be presented to the operator's finger 39a.

In this embodiment, the convex shape of a spherical cross of the key-top 151 has a shape crossing the convex shape of spherical single horizontal-line shown in FIG. 32 and the convex shape of spherical single vertical-line shown in FIG. 33. The key-top 151 is slide-operated along the convex shape of spherical single horizontal-line or/and slide-operated along the convex shape of spherical single vertical-line which intersects with that horizontal-line. Thus, in response to the slide operation depending on the operator's finger 39a, in addition to the slide operation feeling of becoming thicker along the convex shape of spherical single horizontal-line from one portion of the operation surface of the lower housing 11m, it is possible to present the slide operation feeling of becoming thinner in an arc convex shape toward the other portion of the operation surface. Further, in addition to the slide operation feeling of becoming thicker along the convex shape of spherical single vertical-line from one portion of the operation surface of the lower housing 11m, it is possible to present the slide operation feeling of becoming thinner in an arc convex shape toward the other portion of the operation surface.

In this manner, according to the input device 170 relating to the seventeenth embodiment, the operation panel 18 of the lower housing 11m and the key-top 151 having a convex shape of a spherical cross are molded integrally. Consequently, it becomes possible to form the input device 170 as airtight structure abundant in water-resistance. Furthermore, the assembly of the input device 170 becomes simple as compared with the method in which the key-top 151 with a convex shape of a spherical cross and the operation panel forming the ten-keys of numerals [0] to [9], the [*] key, the [#] key and the like are assembled separately. Also, the structure is different from the cross key in the past and an approximately similar operation feeling as that of the cross key can be obtained, and it becomes possible to apply the key-top 151 with a convex shape of a spherical cross as an information selection key for selecting information.

In this embodiment, although a case where the key-top 151 is provided on the front surface side of the lower housing 11m as shown in FIG. 34, of course, it is not limited to this; it is needless to say that a similar effect is obtained also with respect to a case where the key-top is provided on the rear surface side of the lower housing 11m.

Embodiment 18

Figure 35:
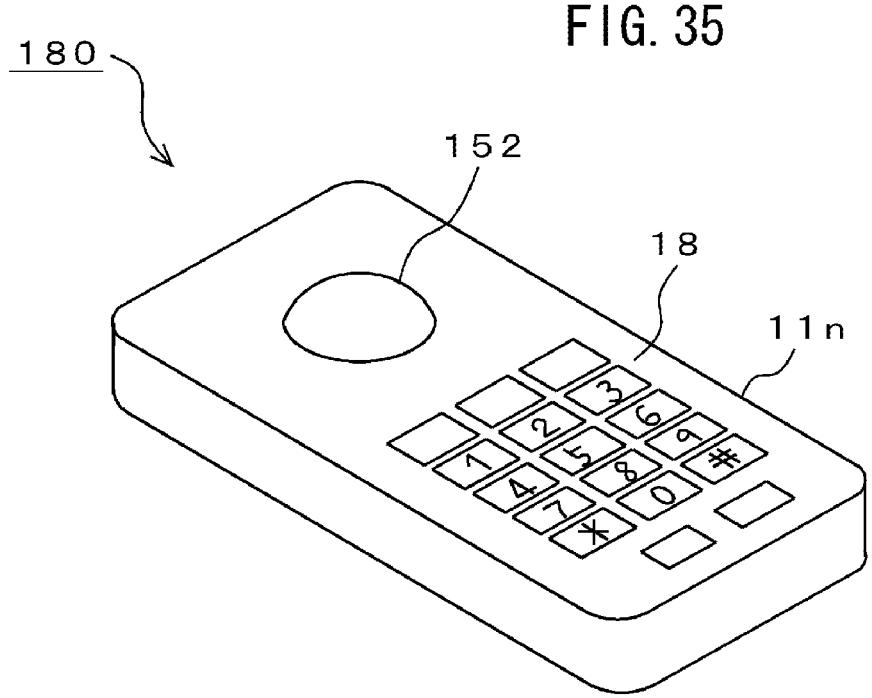
FIG. 35 is a perspective view of an input device 180 as an eighteenth embodiment of the invention, showing a configuration thereof.

FIG. 35 shows an internal configuration of an input device 180 as an eighteenth embodiment. In this embodiment, instead of the key-tops 14, 141 to 146 for the arrangement on the housing side surface, which have various kinds of shapes explained in the first to twelfth embodiments, an operation panel 18 of the lower housing 11n and a key-top 152 having a hemispheric convex shape are molded integrally.

The input device 180 shown in FIG. 35 includes the lower housing 11n with a key-top having a hemispheric convex shape. The upper portion of the lower housing 11n is made as an operation surface and an operation panel 18 in which a ten-key of numerals [0] to [9], a symbol [*] key, a symbol [#] key and the like are arranged is included on the upper portion operation surface. According to the lower housing 11n, the operation surface of the key-top 152 protuberates in a hemispheric convex shape that is different from the key-top shape shown in FIG. 34. With respect to the structure on the inside of the key-top 152 of the lower housing 11n, there is employed the sensor 13 structure as shown in FIG. 22, FIG. 23 or FIG. 24B (see FIG. 22, FIG. 23 or FIG. 24B).

For example, by sealing a resin into a die for the lower housing, which is modeled with the hemispheric convex shape which becomes the key-top 152, and ten-keys of numerals [0] to [9], a symbol [*] key, a symbol [#] key and the like, which become the operation panel 18, the lower housing 11n is formed so as to form a convex shape at the portion thereof. Thus, it is possible to form the input device 180 including the key-top 152 as an airtight structure. Also, it is constituted such that the speaker 36b with an actuator function as shown in FIG. 14 is provided on the inside of the lower housing 11n and at a position near the key-top 152 so that sense of touch can be presented to the operator's finger 39a.

In this embodiment, the key-top 152 forms a hemispheric convex shape having a predetermined height and width. The key-top 152 is slide-operated along one orbit of a hemispheric convex shape or/and is slide-operated another orbit intersected with the orbit.

Thus, in response to the slide operation by the operator's finger 39a, in addition to the slide operation feeling of becoming thicker in an arc shape along one orbit of a hemispheric convex shape from one portion of the operation surface of the lower housing 11n, it is possible to present the slide operation feeling becoming thinner in an arc shape toward the other portion of the operation surface. Further, in addition to the slide operation feeling of becoming thicker in an arc shape along another orbit intersected with one orbit of the hemispheric convex shape from one portion of the operation surface of the lower housing 11n, it is possible to present the slide operation feeling of becoming thinner in an arc shape along the other portion of the operation surface.

In this manner, according to the input device 180 relating to the eighteenth embodiment, the operation panel 18 of the lower housing 11n and the key-top 152 having a hemispheric convex shape is integrally molded. Consequently, it becomes possible to form the input device 180 as an airtight structure abundant in water-resistance. Furthermore, assembly of the input device 180 becomes simple as compared with a method in which the key-top 152 of a hemispheric convex shape and an operation panel which forms a ten-key of numerals [0] to [9], a symbol [*] key, a [#] symbol key are assembled separately. Also, the structure which is different from a cross key in the past is obtained and an operation feeling approximately similar to that of the cross key is obtained. It becomes possible to apply the key-top 152 of the hemispheric convex shape as an information selection key for selecting information.

It should be noted that the above-mentioned key-tops 141 to 143 and 148 to 152 can be utilized for the function of the key-top 14 of the first embodiment, and the key-top 144 to 147 can be utilized for the function of the key-top 14 of the first embodiment excluding the dome switch function.

In this embodiment, although a case where the key-top 152 is provided on the front surface side of the lower housing 11n as shown in FIG. 35 has been described, of course, it is not limited to this; it is needless to say that a similar effect is obtained also with respect to a case where the key-top is provided on the rear surface side of the lower housing 11n.

Embodiment 19

Figure 36A:
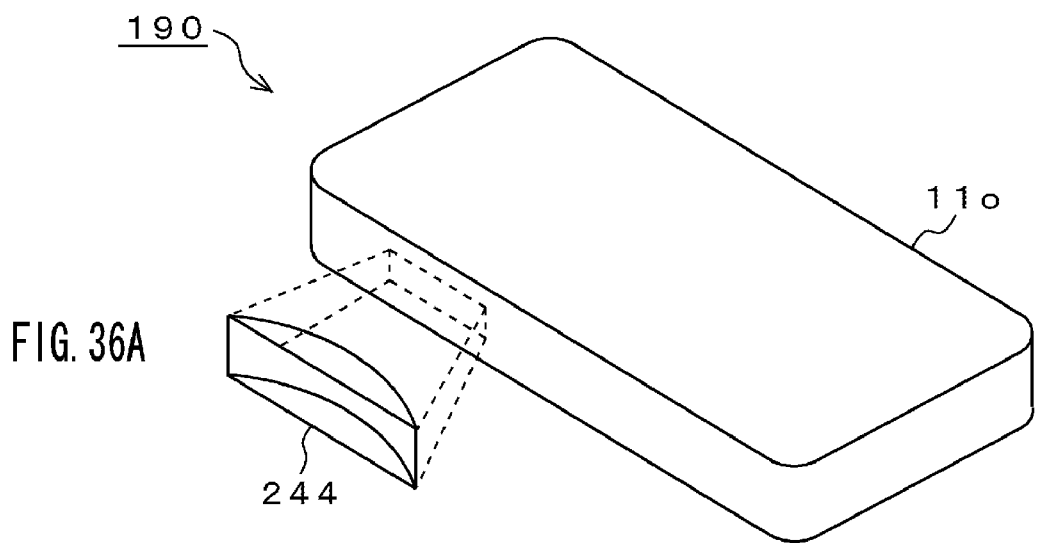
FIG. 36A is a perspective view showing an appearance example of an input device 190 as a nineteenth embodiment and FIG. 36B is a cross-section diagram showing an internal configuration thereof.
Figure 36B:
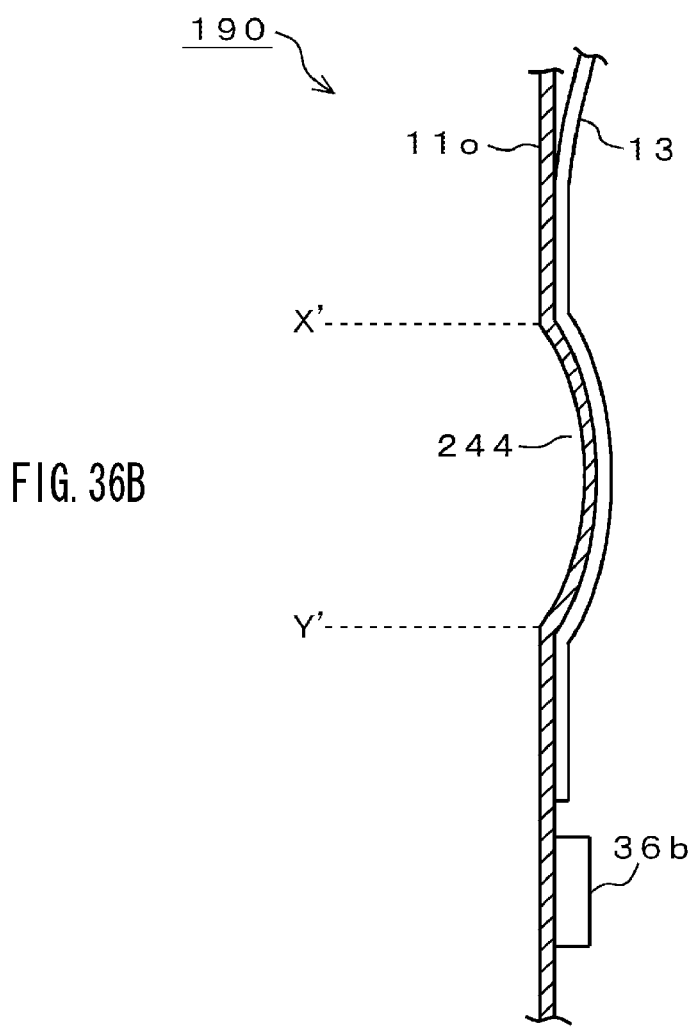

FIG. 36A shows an appearance example of an input device 190 as a nineteenth embodiment and FIG. 36B shows its internal configuration.

In this embodiment, a lower housing 11o and a key-top 244 having a reverse arc concave shape are integrally molded instead of the key-top 144 of the convex shape explained in the ninth embodiment. A dome switch 25 and a pusher piece 19 will be omitted. When the dome switch 25 is applied to the input device 190, it is enough if a pressure detecting sheet member is used for the sensor 13 instead of an electrostatic capacitance sheet member.

The input device 190 shown in FIG. 36A includes a lower housing 11o with a key-top having a convex shape on a rear surface thereof. According to the lower housing 11o, with respect to the operation surface of the key-top 244, the rear surface thereof has a convex shape as shown in FIG. 36B.

In this embodiment, the reverse arc concave shape of the key-top 244 forms a bottomed reverse arc having a predetermined depth and aperture width. For example, the key-top 244 has a concave shape which is dug-down along the sliding direction from one portion of the operation surface of the lower housing 11o and also which is dug-up toward the other portion of the operation surface thereof. In order to obtain such a shape, a lower housing 11o may be formed with the portion having a concave shape by injecting a resin into a die molded with a reverse arc convex shape which becomes a key-top 244. A key-top 244 is formed in the region which covers a portion or the entire surface of a sensor 13.

Also in this embodiment, a sensor 13 is disposed on the inside of a concave portion of the key-top 244 and operates so as to detect a slide position of the operator's finger 39a. An electrostatic capacitance sheet member is used for the sensor 13 and detects a slide position of the operator's finger 39a to output a position detection signal. A pressure detecting sheet member is used for the sensor 13 other than the electrostatic capacitance sheet member and detects a pressure of the slide position of the operator's finger 39a to output a pressure detection signal.

In this embodiment, the operation surface of the key-top 244 is constituted by material that is different from material of the lower housing 11o and when surface roughness of the material constituting the key-top 244 is substituted as "A" and surface roughness of the material constituting the lower housing 11o is substituted as "B", such a relation as A<B is set between the surface roughness A and the surface roughness B. As constituting like this, it becomes possible to execute the slide operation of the portion which is dug-down along the sliding direction from one portion of the operation surface and also which is dug-up toward the other portion of the operation surface smoothly as compared with the slide operation on the operation surface of the lower housing 11o, and it becomes possible to select information easily by the slide operation of the operator's finger 39a. Thus, it is possible to form the input device 190 including the key-top 244 as an airtight structure.

The key-top 244 is slide-operated along the operation surface of the lower housing 11o and also is slide-operated along the bottomed arc convex shape thereof. By doing like this, in addition to the slide operation feeling of being dug-down in an arc shape along the sliding direction from one portion of the operation surface of the lower housing 11o in response to the slide operation by the operator's finger 39a, it is possible to present the arc shaped slide operation feeling of being dug-up toward the other portion of the operation surface thereof. Consequently, it becomes possible to provide a non-rotary side jog tool or the like which has a reverse structure of the non-rotary side jog tool or the like of the first input device 10. The key-top 244 of this shape is applicable as a scroll key when retrieving various kinds of information and as an information selection key of a volume key and the like when adjusting audio volume.

Also, a speaker 36b with actuator function as shown in FIG. 14 is provided at the position which is on the inside of the lower housing 11o and which is near the key-top 244, and on an occasion of the input determination, it is possible to generate vibration with respect to the slide position of the operator's finger 39a by a vibration body, thereby enabling a sense of touch to be presented to the operator's finger 39a.

FIGS. 37A to 37C show an operation example of the input device 190. Also in this embodiment, the detection area (3) in which a slide position of the operator's finger 39a is detected by the sensor 13 is set to be wider than the concave-portion region (2) in the key-top 244 which is slide-operated by the operator's finger 39a.

In this embodiment, the input device 190 is operated by a left hand and the key-top 244 having a concave shape which is dug-down along the sliding direction from one portion of the operation surface of the lower housing 11o and also which is dug-up toward the other portion of the operation surface is used. An electrostatic capacitance sheet member is used for the sensor 13 and a case in which the detection area that detects a slide position of the operator's finger 39a by the sensor 13 is set to be wider than the operation area which is slide-operated by the key-top 244 depending on the operator's finger 39a is cited as an example.

In FIG. 37A, first, an operator presses a thumb of left hand on an upper portion of the operation region (1) of the input device 190. Next, the operator's finger 39a is slid along the sliding direction from one portion of the operation surface of the lower housing 11b. At that time, in the lower housing 11b, the operator's finger 39a slides on the detection area (3) in the sensor 13.

When the operator's finger 39a continues the slide operation in the concave-portion region (2) of an exposed portion of the key-top 244, the operator's finger digs-down from a downward start portion "X" and reaches the hole bottom region of the key-top 244 shown in FIG. 37B. Further, when the slide operation is continued in the concave-portion region (2), the operator's finger digs-up toward the other portion of the operation surface and reaches an upward end portion "Y" of the key-top 244 shown in FIG. 37C.

In this embodiment, while slide-operating from FIG. 37A to FIG. 37C is performed, the sensor 13 detects the slide position of the operator's finger 39a to output the position detection signal to the control unit 15. Thus, in addition to the slide operation feeling of being dug-down in an arc shape along the sliding direction from one portion of the operation surface of the lower housing 11b in response to the slide operation by the operator's finger 39a, it is possible to present the arc shaped slide operation feeling of being dug-up toward the other portion of the operation surface. Furthermore, it becomes possible to provide a non-rotary side jog tool or the like whose structure is different from the rotary side jog tool in the past and by which unique operation feeling which does not exist in such a side jog tool is obtained.

In this manner, according to the input device 190 relating to the nineteenth embodiment, the lower housing 11o and the key-top 244 having the reverse arc concave shape are integrally molded instead of the key-top 144 of the rear surface flat shape explained in the ninth embodiment.

Consequently, assembly of the input device 190 in a mobile phone or the like becomes simple as compared with a method in which the key-top 24, 141 or the like is built in the opening portion 11c of the lower housing 11b as explained in the first to the sixth embodiments. Furthermore, the detection area (3) of the sensor 13 is set to be wider than the concave portion region (2) of the key-top 244, so that it is possible to include in the slide operation region one portion of the operation surface of the lower housing 11o and the other portion of the operation surface, which sandwiches the key-top 244 of the concave shape with respect to the sliding operation by the operator's finger 39a. Thus, it becomes possible to provide a mobile phone or the like including the input device 190 of an airtight structure abundant in water-resistance.

In this embodiment, although a case where the key-top 244 is provided on the right side of the lower housing 11o as shown in FIG. 36 has been described, of course, it is not limited to this; it is needless to say that a similar effect is obtained with respect to a case where the key-top is provided on the left side of the lower housing 11o.

Embodiment 20

Figure 38A:
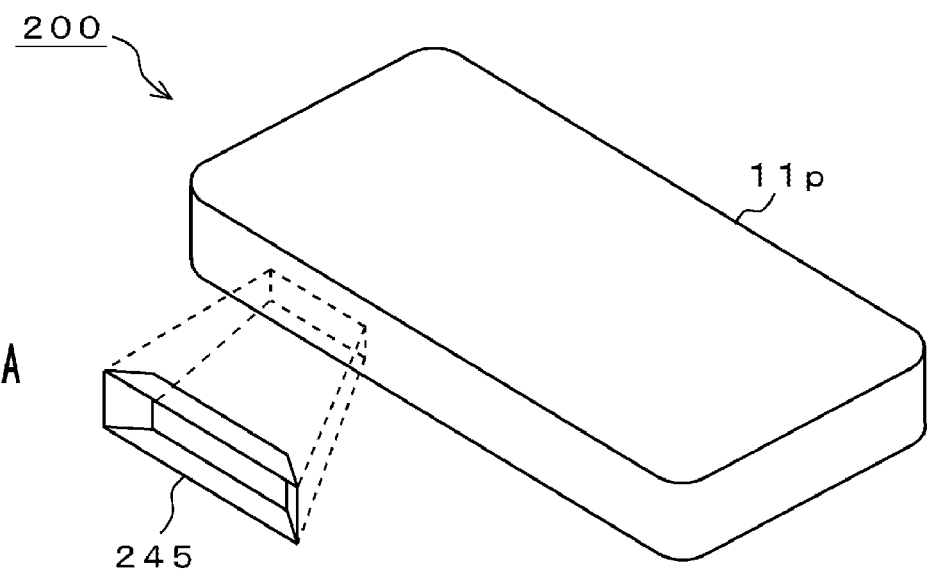
FIG. 38A is a perspective view showing an appearance example of an input device 200 as a twentieth embodiment and FIG. 38B is a cross-section diagram showing an internal configuration thereof.
Figure 38B:
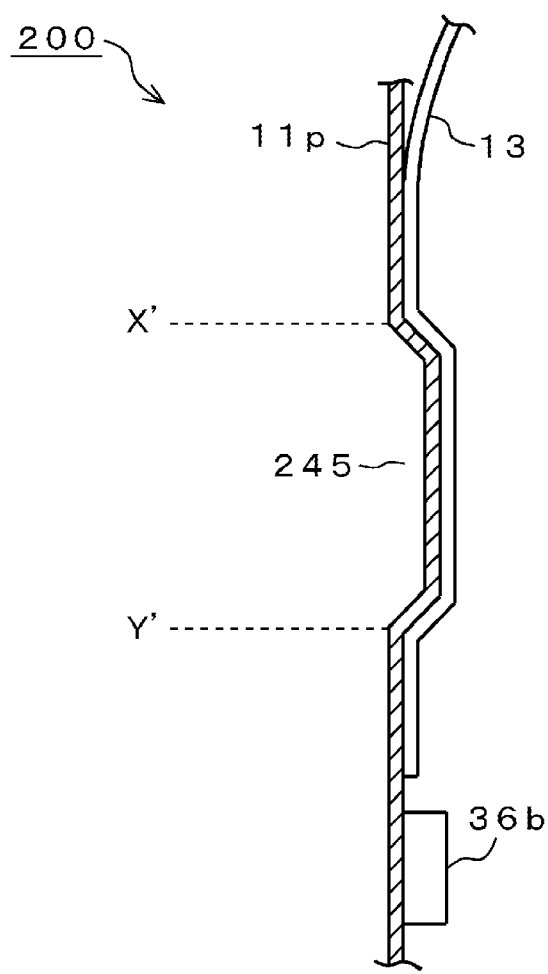

FIGS. 38A and 38B show a configuration of an input device 200 as a twentieth embodiment.

In this embodiment, a lower housing 11p and a key-top 245 having a reverse trapezoid concave shape are integrally molded instead of the key-top 244 of the reverse arc concave shape explained in the nineteenth embodiment. A dome switch 25 and a pusher piece 19 will be omitted. When the dome switch 25 is applied to the input device 200, it is enough if a pressure detecting sheet member is used for the sensor 13 instead of the electrostatic capacitance sheet member.

The input device 200 shown in FIG. 38A includes a lower housing 11p with a key-top having a reverse trapezoid concave shape and also a convex shape on a rear surface thereof. According to the lower housing 11p, the operation surface of the key-top 245 has the reverse trapezoid concave shape that is different from the key-top shapes shown in FIG. 3 to FIG. 37 and the rear surface thereof has a convex shape as shown in FIG. 38B. For example, by injecting a resin to a die for the lower housing which is modeled with an inside reverse trapezoidal shape which becomes the key-top 245, the lower housing 11p having the concave shape is formed.

Also in this embodiment, a sensor 13 is disposed on the inside of the concave portion of the key-top 245. Thus, it is possible to form the input device 200 including the key-top 245 as an airtight structure. The key-top 245 is slid along a concave shape which is dug-down along the sliding direction from one portion of the operation surface of the lower housing 11p and also which is dug-up toward the other portion of the operation surface. Also, a speaker 36b with actuator function as shown in FIG. 14 is provided at a position which is on the inside of the lower housing 11p and which is near the key-top 245 and presents sense of touch to the operator's finger 39a. It should be noted that with respect to an operation example of the input device 200, FIG. 37 is referred.

In this manner, according to the input device 200 relating to the twentieth embodiment, the lower housing 11p and the key-top 245 having the reverse trapezoid concave shape are integrally molded instead of the key-top 244 of the arc convex shape explained in the nineteenth embodiment.

Consequently, assembly of the input device 200 becomes simple as compared with a method in which the key-top 14, 141 or the like is built in the opening portion 11c of the lower housing 11b as explained in the first to the sixth embodiments. Thus, it becomes possible to form the input device 200 as an airtight structure abundant in water-resistance. It should be noted that it is possible to eliminate a bellows-shape process in the vicinity of the downward start portion "X" and in the vicinity of the upward end portion "Y" of the key-top 245 by eliminating a dome switch 25.

In this embodiment, although a case where the key-top 245 is provided on the right side of the lower housing 11p as shown in FIG. 38 has been described, of course, it is not limited to this; it is needless to say that a similar effect is obtained with respect to a case where the key-top is provided on the left side of the lower housing 11p.

Embodiment 21

Figure 39A:
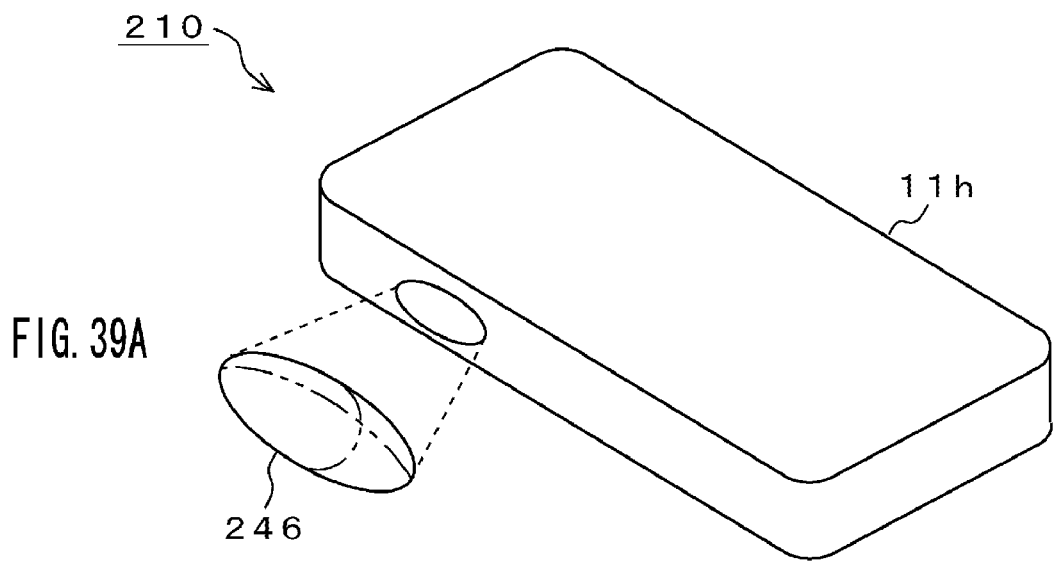
FIG. 39A is a perspective view showing an appearance example of an input device 210 as a twenty-first embodiment and FIG. 39B is a cross-section diagram showing an internal configuration thereof.
Figure 39B:
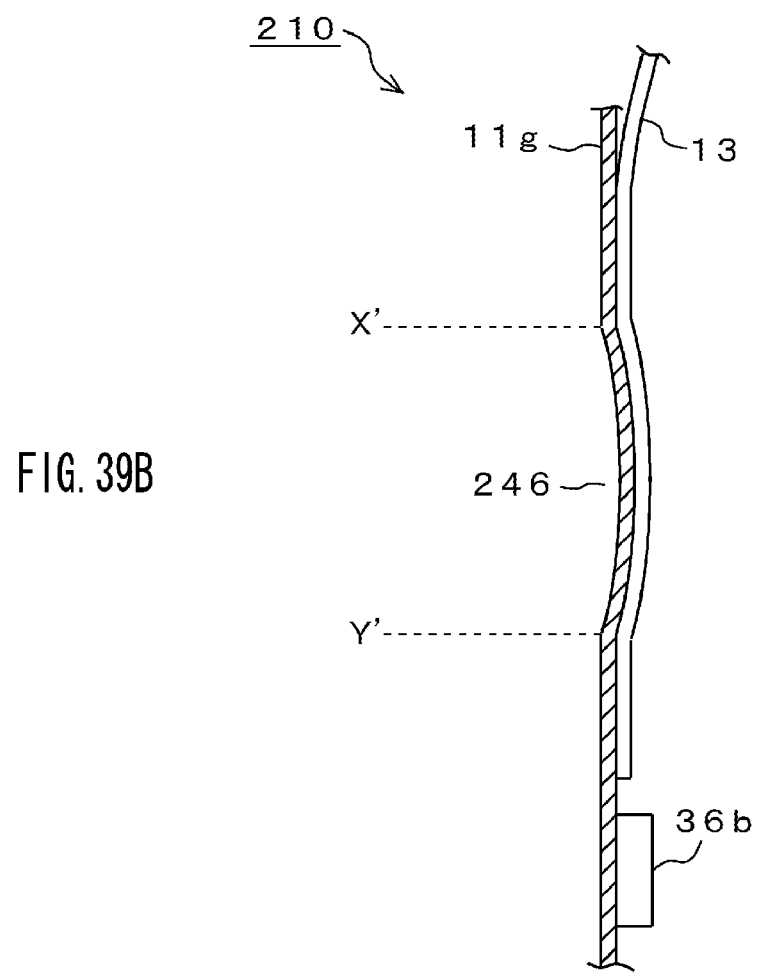

FIGS. 39A and 39B show a configuration of an input device 210 as a twenty-first embodiment.

In this embodiment, a lower housing 11q and a key-top 246 having a long concave shape are integrally molded instead of the key-top 245 of the reverse trapezoid concave shape explained in the twentieth embodiment. A dome switch 25 and a pusher piece 19 will be omitted. When the dome switch 25 is applied to the input device 210, it is enough if a pressure detecting sheet member is used for the sensor 13 instead of the electrostatic capacitance sheet member.

The input device 210 shown in FIG. 39A includes a lower housing 11q with a key-top having a long concave shape and also a convex shape on a rear surface thereof. According to the lower housing 11q, the operation surface of the key-top 246 has the long concave shape that is different from the key-top shapes shown in FIG. 3 to FIG. 38 and the rear surface thereof has a convex shape as shown in FIG. 39B. For example, by injecting a resin to a die for the lower housing which is modeled with a long concave shape which becomes the key-top 246, the lower housing 11q having the concave shape is formed.

Also in this embodiment, a sensor 13 is disposed on the inside of the concave portion of the key-top 246. Thus, it is possible to form the input device 210 including the key-top 246 as an airtight structure. The input device 210 is operated by a left hand and the key-top 246 is slide-operated along a concave shape which is dug-down along the sliding direction from one portion of the operation surface of the lower housing 11q and also which is dug-up toward the other portion of the operation surface thereof. Also, a speaker 36b with actuator function as shown in FIG. 14 is provided at a position which is on the inside of the lower housing 11q and which is near the key-top 246 and can present sense of touch to the operator's finger 39a. It should be noted that with respect to the operation example of the input device 210, FIG. 37 is referred.

In this manner, according to the input device 210 relating to the twenty-first embodiment, the lower housing 11q and the key-top 246 having the long concave shape are integrally molded instead of the key-top 245 of the reverse trapezoid concave shape explained in the twentieth embodiment.

Consequently, assembly of the input device 210 becomes simple as compared with a method in which the key-top 14, 141 or the like is built in the opening portion 11c of the lower housing 11b as explained in the first to the sixth embodiments. Thus, it becomes possible to provide the input device 210 of an airtight structure abundant in water-resistance. It should be noted that it is possible to eliminate a bellows-shape process in the vicinity of the downward start portion "X" and in the vicinity of the upward end portion "Y" of the key-top 246 by eliminating a dome switch 25.

In this embodiment, although a case where the key-top 246 is provided on the right side of the lower housing 11q as shown in FIGS. 39A and 39B has been described, of course, it is not limited to this; it is needless to say that a similar effect is obtained with respect to a case where the key-top is provided on the left side of the lower housing 11q.

Embodiment 22

Figure 40A:
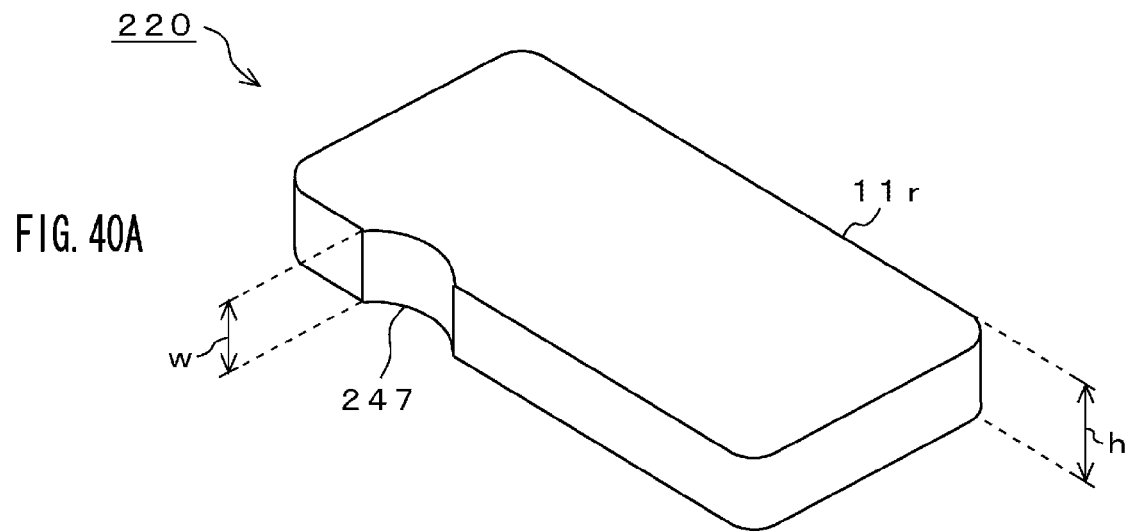
FIG. 40A is a perspective view showing an appearance example of an input device 220 as a twenty-second embodiment and FIG. 40B is a cross-section diagram showing an internal configuration thereof.
Figure 40B:
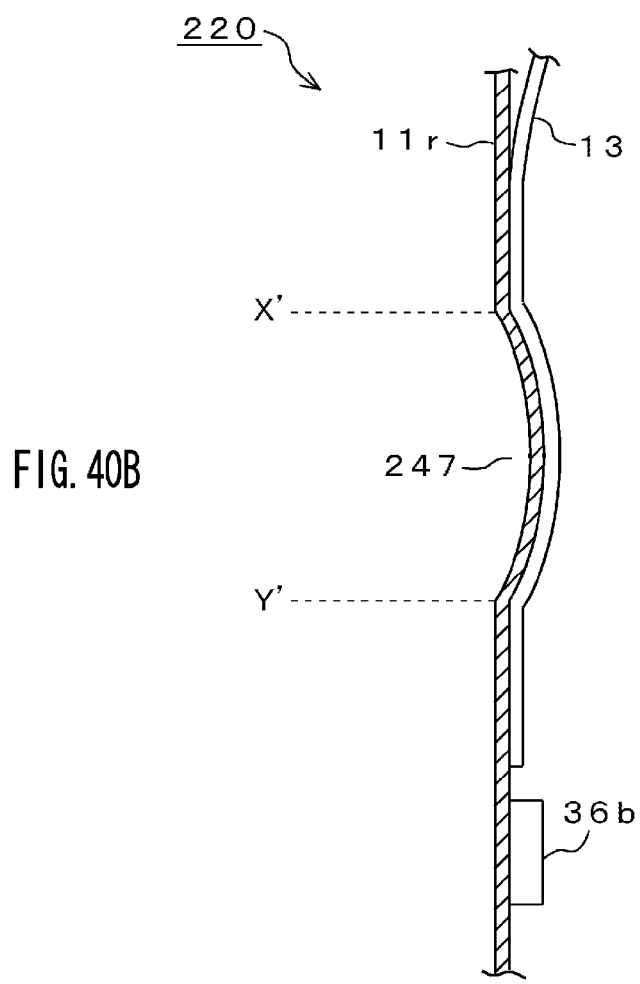

FIGS. 40A and 40B show a configuration of an input device 220 as a twenty-second embodiment.

In this embodiment, a lower housing 11r and a key-top 247 having a reverse semi-cylindrical shape are integrally molded instead of the key-top 246 of the long concave shape explained in the twenty-first embodiment. A dome switch 25 and a pusher piece 19 will be omitted. When a press-in function is applied by the key-top 247, it is enough if a pressure detecting sheet member is used for the sensor 13 instead of the electrostatic capacitance sheet member.

The input device 220 shown in FIG. 40A includes a lower housing 11r with a key-top having a reverse semi-cylindrical shape and also a convex shape on rear surface. According to the lower housing 11r, the operation surface of the key-top 247 has the reverse semi-cylindrical shape that is different from the key-top shapes shown in FIG. 3 to FIG. 39. In this embodiment, when the key-top 247 whose width is substituted as "w" and a height of the lower housing 11r is substituted as "h", such a relation as w=h is formed. The rear surface of the key-top 247 has a convex shape as shown in FIG. 40B. For example, by injecting a resin to a die for the lower housing which is modeled with a semi-cylindrical dome shape which becomes a key-top 247 of width "w", the lower housing 11r of height "h" having the concave shape is formed.

Also in this embodiment, a sensor 13 is disposed on the inside of the concave portion of the key-top 247. Thus, it is possible to form the input device 220 including the key-top 247 as an airtight structure. The key-top 247 is slide-operated along a concave shape which is dug-down along the sliding direction from one portion of the operation surface of the lower housing 11r and also which is dug-up toward the other portion of the operation surface thereof. Also, a speaker 36b with an actuator function as shown in FIG. 14 is provided at a position which is on the inside of the lower housing 11r and which is near the key-top 247 and presents sense of touch to the operator's finger 39a. It should be noted that with respect to the operation example of the input device 220, FIG. 37 is referred.

In this manner, according to the input device 220 relating to the twenty-second embodiment, the lower housing 11r and the key-top 247 having the reverse semi-cylindrical shape are integrally molded instead of the key-top 246 of the long concave shape explained in the twenty-first embodiment.

Consequently, assembly of the input device 220 becomes simple as compared with a method in which the key-top 14, 141 or the like is built in the opening portion 11c of the lower housing 11b as explained in the first to the sixth embodiments. Thus, it becomes possible to provide the input device 220 of airtight structure abundant in water-resistance. It should be noted that it is possible to eliminate a bellows-shape process in the vicinity of the downward start portion "X" and in the vicinity of the upward end portion "Y" of the key-top 247 by eliminating a dome switch 25.

In this embodiment, although a case where key-top 247 is provided on the right side of the lower housing 11r as shown in FIGS. 40A and 40B has been described, of course, it is not limited to this; it is needless to say that a similar effect is obtained with respect to a case where the key-top is provided on the left side of the lower housing 11r.

Embodiment 23

Figure 41:
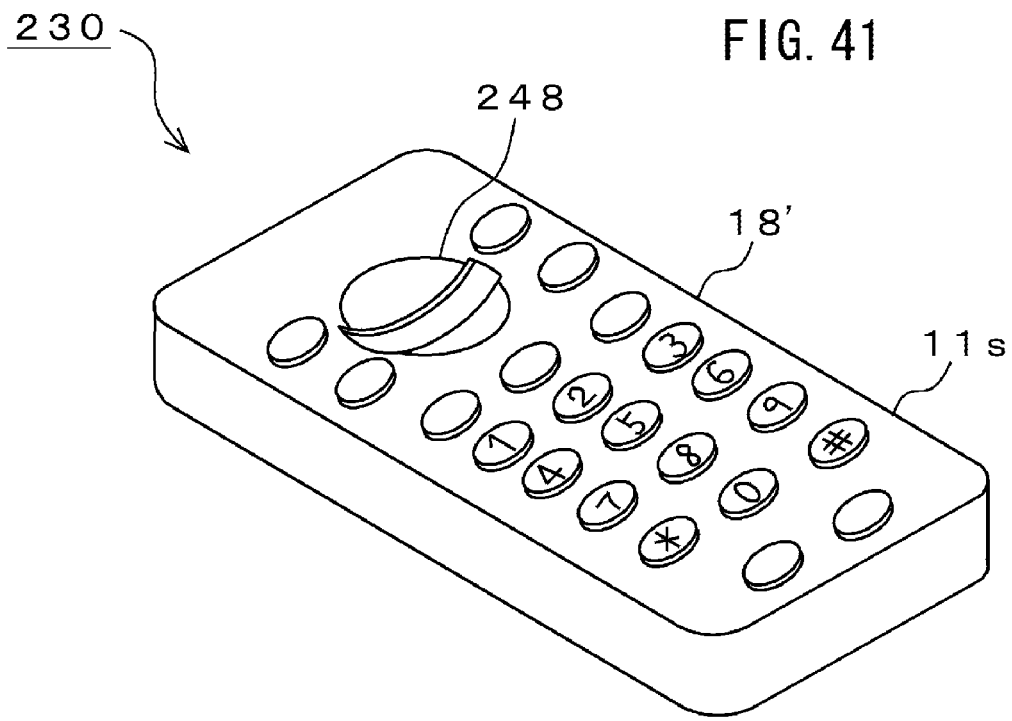
FIG. 41 is a perspective view showing a configuration of an input device 230 as a twenty-third embodiment.

FIG. 41 shows a configuration of an input device 230 as a twenty-third embodiment. In this embodiment, instead of the key-tops 14, 141 to 146 for the housing side surface arrangement including various kinds of shapes explained in the first to the twelfth embodiments, an operation panel 18' of a lower housing 11s and a key-top 248 having a concave shape of hemispheric inner surface single horizontal-line are integrally molded.

The input device 230 shown in FIG. 41 includes a lower housing 11s with a key-top having a concave shape of hemispheric inner surface single horizontal-line. An upper portion of the lower housing 11s is the operation surface and an operation panel 18' in which a ten-key of numerals [0] to [9], a symbol [*] key, a [#] symbol key and the like are arranged is provided on the upper portion operation surface. In this embodiment, an individual key has an elliptical shape.

According to the lower housing 11s, the operation surface of the key-top 248 is curved in the concave shape of hemispheric inner surface single horizontal-line that is different from the key-top shapes shown in FIG. 3 to FIG. 40. The key-top 248 forms a bottomed hemispheric concave shape having a predetermined depth and aperture width. With respect to a structure on the inside of the key-top 248 of the lower housing 11s, a structure of the sensor 13 as shown in FIG. 36, FIG. 39 or FIG. 39B is employed (see FIG. 36, FIG. 39 or FIG. 39B). When a press-in function by the key-top 248 is applied, it is enough if a pressure detecting sheet member is used for the sensor 13 instead of the electrostatic capacitance sheet member.

The lower housing 11s having the concave shape is formed, for example, by injecting a resin in a die for the lower housing which is modeled with a concave shape of hemispheric inner surface single horizontal-line which becomes a key-top 248 and a ten-key of numerals [0] to [9], a symbol [*] key, a [#] symbol key and the like which become an operation panel 18'. Thus, the operation panel 18' of the ten-key and the like and the key-top 248 are integrally molded and it is possible to form the input device 230 including the key-top 248 as an airtight structure. The key-top 248 is slide-operated along a concave shape which is dug-down along the sliding direction from one portion of the operation surface of the lower housing 11s and also which is dug-up toward the other portion of the operation surface thereof. Also, a speaker 36b with an actuator function as shown in FIG. 14 is provided at a position which is on the inside of the lower housing 11s and which is near the key-top 248 and can present sense of touch to the operator's finger 39a.

In this embodiment, the key-top 248 is slide-operated along the concave shape of hemispheric inner surface single horizontal-line (one orbit of the bottomed hemispheric concave shape). Thus, in addition to the slide operation feeling of being dug-down in an arc shape along one orbit of the shape of hemispheric inner surface from one portion of the operation surface of the lower housing 11s in response to the slide operation by the operator's finger 39a, it is possible to present the slide operation feeling of being dug-up in an arc shape toward the other portion of the operation surface thereof. Consequently, it is a structure which is different from the cross key in the past and unique operation feeling which does not exist in the cross key is obtained, thereby enabling the key-top 248 of the shape to be applied as an image information selection key for selecting information.

In this manner, according to the input device 230 relating to the twenty-third embodiment, the operation panel 18' of the lower housing 11s and the key-top 248 having the concave shape of hemispheric inner surface single horizontal-line are integrally molded. Consequently, it becomes possible to provide the input device 230 of an airtight structure abundant in water-resistance. Furthermore, assembly of the input device 230 becomes simple as compared with a method in which the key-top 248 of the concave shape of hemisphere inner surface single horizontal-line arc and the operation panel which forms a ten-key of numerals [0] to [9], a symbol [*] key, a [#] symbol key and the like are assembled separately.

In this embodiment, although a case where the key-top 248 is provided on the front surface side of the lower housing 11s as shown in FIG. 57 has been described, of course, it is not limited to this; it is needless to say that a similar effect is obtained with respect to a case where the key-top is provided on the rear surface side of the lower housing 11s.

Embodiment 24

Figure 42:
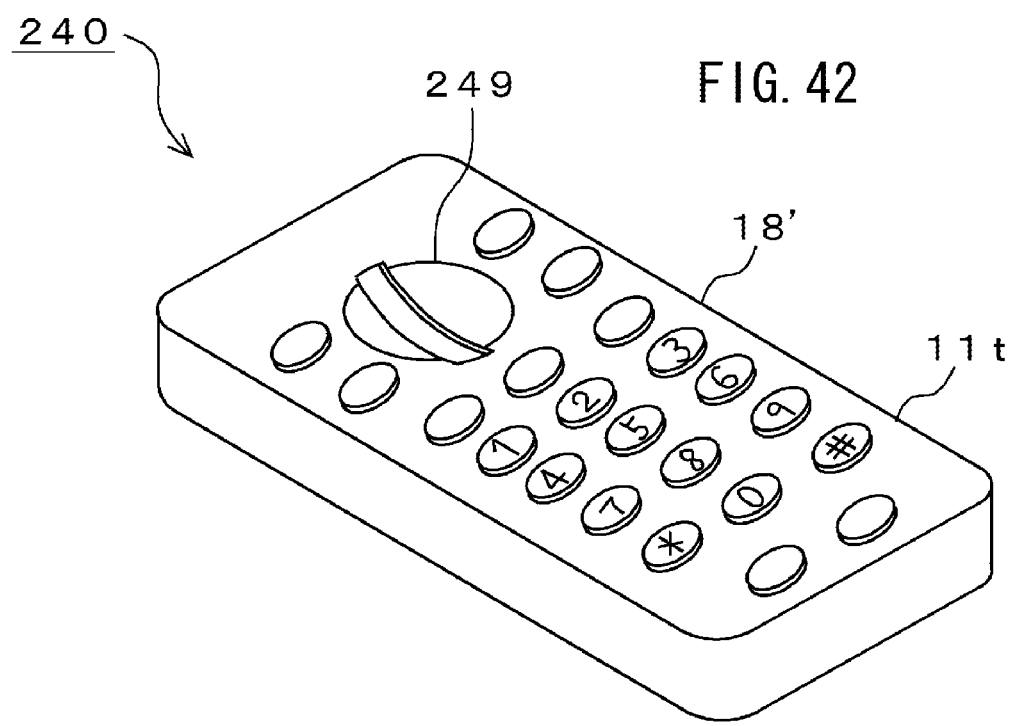
FIG. 42 is a perspective view showing a configuration of an input device 240 as a twenty-fourth embodiment.

FIG. 42 shows a configuration of an input device 240 as a twenty-fourth embodiment. In this embodiment, instead of the key-tops 14, 141 to 146 for the housing side surface arrangement including various kinds of shapes explained in the first to the twelfth embodiments, an operation panel 18' of a lower housing 11t and a key-top 249 having a concave shape of hemispheric inner surface single vertical-line are integrally molded.

The input device 240 shown in FIG. 58 includes a lower housing 11t with a key-top having a concave shape of hemispheric inner surface single vertical-line. An upper portion of the lower housing 11t is the operation surface and an operation panel 18' in which a ten-key of numerals [0] to [9], a symbol [*] key, a [#] symbol key and the like are arranged is provided on the upper portion operation surface. According to the lower housing 11t, the operation surface of the key-top 249 is different from the key-top shape shown in FIG. 41 and is curved in the concave shape of hemispheric inner surface single vertical-line. The key-top 249 has a predetermined depth and aperture width. With respect to a structure on the inside of the key-top 249 of the lower housing 11t, a structure of the sensor 13 as shown in FIG. 36, FIG. 39 or FIG. 39B is employed (see FIG. 36, FIG. 39 or FIG. 39B). When a press-in function by the key-top 249 is applied, it is enough if a pressure detecting sheet member is used for the sensor 13 instead of the electrostatic capacitance sheet member.

The lower housing 11t having the concave shape, for example, by injecting a resin in a die for the lower housing which is modeled with a concave shape of hemispheric inner surface single vertical-line which becomes a key-top 249 and a ten-key of numerals [0] to [9], a symbol [*] key, a [#] symbol key and the like which become an operation panel 18'. Thus, it is possible to form the input device 240 including the key-top 249 as an airtight structure. The key-top 251 is slide-operated along a concave shape which is dug-down along the sliding direction from one portion of the operation surface of the lower housing 11t and also which is dug-up toward the other portion of the operation surface thereof. Also, a speaker 36b with an actuator function as shown in FIG. 14 is provided at a position which is on the inside of the lower housing 11t and which is near the key-top 249 and can present sense of touch to the operator's finger 39a.

In this embodiment, the key-top 249 is slide-operated along the concave shape of hemispheric inner surface single vertical-line. Thus, in addition to the slide operation feeling of being dug-down in an arc shape along the concave shape of hemispheric inner surface single vertical-line (one orbit of the hemispheric concave shape) from one portion of the operation surface of the lower housing 11t in response to the slide operation by the operator's finger 39a, it is possible to present the slide operation feeling of being dug-up in a concave shape toward the other portion of the operation surface thereof. Consequently, it is a structure which is different from the cross key in the past and unique operation feeling which does not exist in the cross key is obtained, thereby the key-top 249 of the shape to be applied as an image information selection key for selecting information.

In this manner, according to the input device 240 relating to the twenty-fourth embodiment, the operation panel 18' of the lower housing 11t and the key-top 249 having the concave shape of hemispheric inner surface single vertical-line are integrally molded. Consequently, it becomes possible to provide the input device 240 of an airtight structure abundant in water-resistance. Furthermore, assembly of the input device 240 becomes simple as compared with a method in which the key-top 249 of the concave shape of hemispheric inner surface single vertical-line and the operation panel which forms a ten-key of numerals [0] to [9], a symbol [*] key, a [#] symbol key and the like are assembled separately.

In this embodiment, although a case where the key-top 249 is provided on the front surface side of the lower housing 11t as shown in FIG. 58 has been described, of course, it is not limited to this; it is needless to say that a similar effect is obtained with respect to a case where the key-top is provided on the rear surface side of the lower housing 11t.

Embodiment 25

Figure 43:
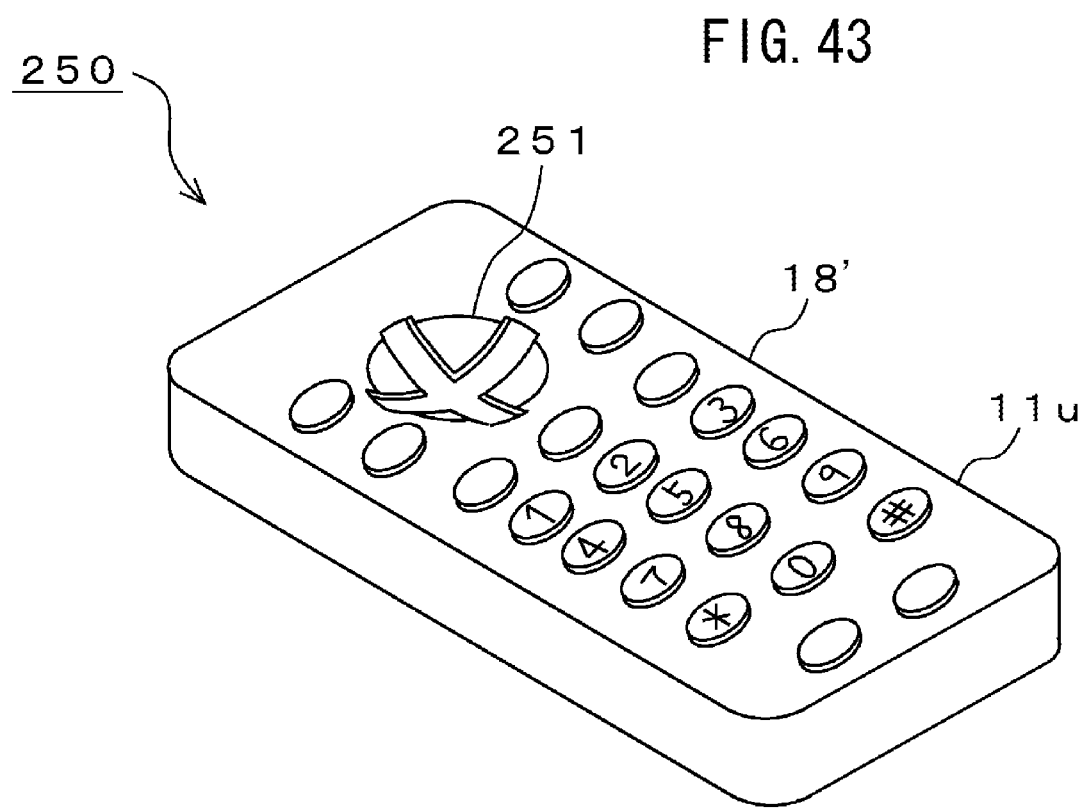
FIG. 43 is a perspective view showing a configuration of an input device 250 as a twenty-fifth embodiment.

FIG. 43 shows a configuration of an input device 250 as a twenty-fifth embodiment. In this embodiment, instead of the key-tops 14, 141 to 146 for the housing side surface arrangement including various kinds of shapes explained in the first to the twelfth embodiments, an operation panel 18' of a lower housing 11u and a key-top 251 having a concave shape of hemispheric inner surface cross are integrally molded.

The input device 250 shown in FIG. 41 includes a lower housing 11u with a key-top having a concave shape of hemispheric inner surface cross. An upper portion of the lower housing 11u is the operation surface and an operation panel 18' in which a ten-key of numerals [0] to [9], a symbol [*] key, a [#] symbol key and the like are arranged is provided on the upper portion operation surface.

According to the lower housing 11u, the operation surface of the key-top 251 is different from a key-top shape shown in FIG. 42 and is curved in the concave shape of hemispheric inner surface cross. With respect to a structure on the inside of the key-top 251 of the lower housing 11u, a structure of the sensor 13 as shown in FIG. 36, FIG. 39 or FIG. 39B is employed (see FIG. 36, FIG. 39 or FIG. 39B). When a press-in function is applied by the key-top 251, it is enough if a pressure detecting sheet member is used for the sensor 13 instead of an electrostatic capacitance sheet member.

The lower housing 11u having the concave shape is formed, for example, by injecting a resin in a die for the lower housing which is modeled with a concave shape of hemispheric inner surface cross which becomes a key-top 251 and a ten-key of numerals [0] to [9], a symbol [*] key, a [#] symbol key and the like which become an operation panel 18'. Thus, it is possible to form the input device 250 including the key-top 251 as an airtight structure. The key-top 251 is slide-operated along a concave shape which is dug-down along the sliding direction from one portion of the operation surface of the operation panel 18' and also which is dug-up toward the other portion of the operation surface. Also, a speaker 36b with an actuator function as shown in FIG. 14 is provided at a position which is on the inside of the lower housing 11u and which is near the key-top 251 and can present sense of touch to the operator's finger 39a.

In this embodiment, the concave shape of hemispheric inner surface cross of the key-top 251 includes a shape in which the concave shape of hemispheric inner surface single horizontal-line shown in FIG. 41 and the concave shape of hemispheric inner surface single vertical-line shown in FIG. 42 are intersected. The key-top 251 is slide-operated along the concave shape of hemispheric inner surface single horizontal-line or/and is slide-operated along the concave shape of hemispheric inner surface single vertical-line intersected with this.

Consequently, in response to the slide operation by the operator's finger, in addition to the slide operation feeling of being dug-down in an arc shape along the concave shape of hemispheric inner surface single horizontal-line (one orbit of the hemispheric concave shape) from one portion of the operation surface of the lower housing 11u, it is possible to present the slide operation feeling of being dug-up in an arc convex shape toward the other portion of the operation surface thereof. Further, in addition to the slide operation feeling of being dug-down in an arc shape along the other orbit intersected with the concave shape of hemispheric inner surface single horizontal-line (one orbit of the hemispheric concave shape) from one portion of the operation surface of the lower housing 11u, it is possible to present the slide operation feeling of being dug-up in the concave shape of hemispheric inner surface single vertical-line toward the other portion of the operation surface.

Figure 44:
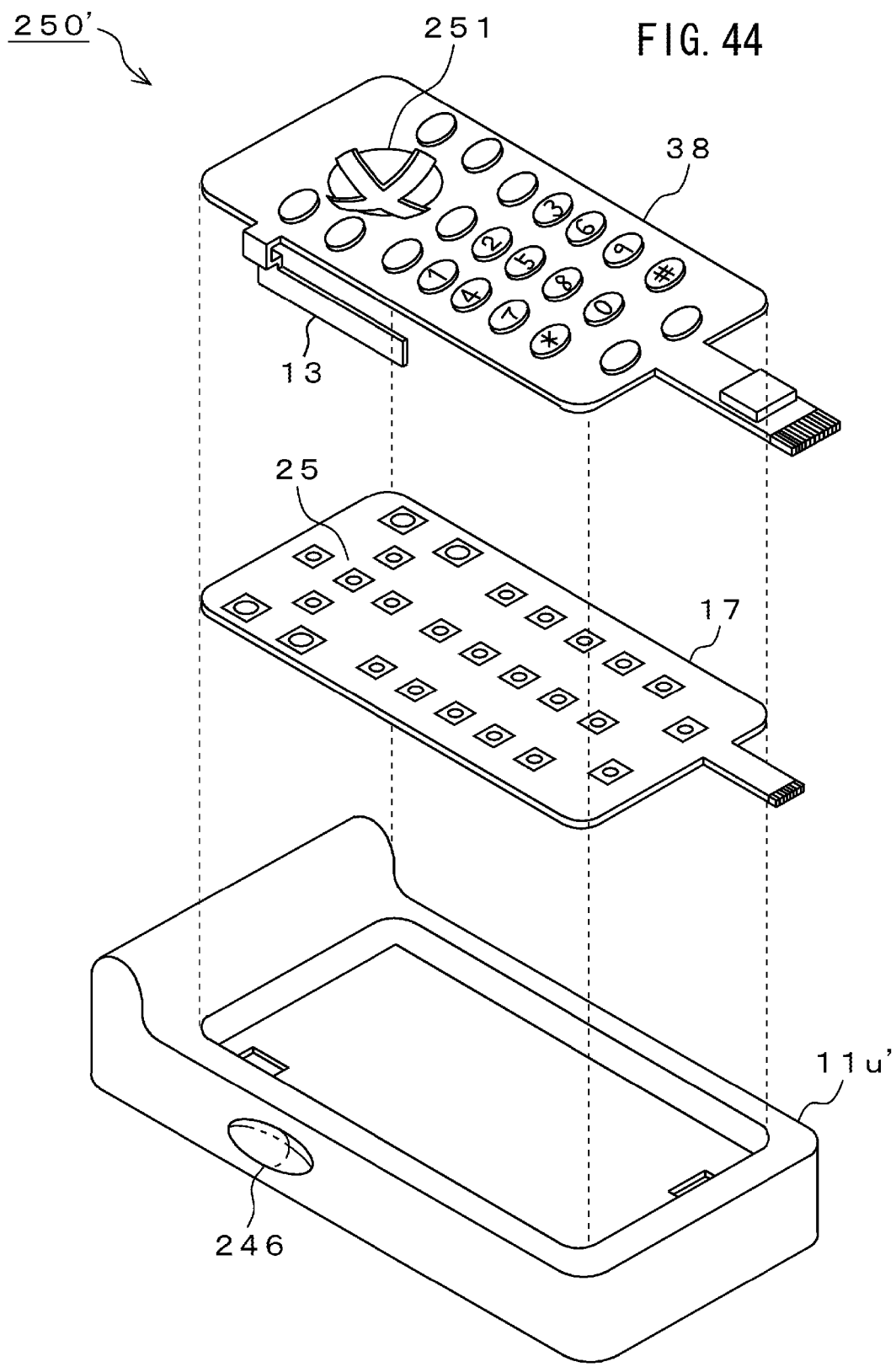
FIG. 44 is an exploded perspective view of an input device 250' showing a configuration thereof.

FIG. 44 shows a configuration of an input device 250'. In this embodiment, dome switches 25 are provided on the circuit board 17 and operate so as to be turned on or/and off by a press-in operation of the key-top 251. According to the input device 250' shown in FIG. 44, it is assembled so that the circuit board 81 is disposed in a lower housing 11u' and from the upper portion thereof, a key-top array type operation panel 38 is overlaid.

In this embodiment, the key-top 246 having the long concave shape as shown in FIG. 39 is formed and also the lower housing 11u' including a hinge mechanism is used. The lower housing 11u' is molded, by injecting a PC (polycarbonate) resin, a PC+ABS resin or the like into a die which is modeled with a hinge mechanism and a long shape for key-top. In this embodiment, the key-top 246 is molded and thereafter, an UV (ultraviolet ray) coating is applied thereto. For example, a solution for improving abrasion resistance is applied to the operation surface of the key-top 246. Thereafter, ultraviolet rays are illuminated thereto and the painted surface is cured. Thus, it is possible to improve abrasion resistance of the operation surface of the key-top 246.

When the lower housing 11u' is formed by a metal, the lower housing 11u' including the key-top 246 is formed at a predetermined position by using an aluminum plate, a magnesium plate, a stainless plate of a SUS 304 or the like and by applying a press processing, a deep drawing processing or an extrusion processing to these members. The sensor 13 and the circuit board 17 are arranged in this order on the inside of the key-top 246. The sensor 13, for example, is formed in continuation of the key-top array type operation panel 38 which forms a ten-key of numerals [0] to [9], a symbol [*] key, a [#] symbol key and the like.

The key-top array type operation panel 38 is formed, for example, such that a silicon rubber is formed by injecting a silicon resin or the like into a die which forms ten-keys of numerals [0] to [9], a symbol [*] key, a symbol [#] key and the like and thereafter, an electrostatic capacitance sheet or a pressure detecting sheet is pasted on that silicon rubber. The pusher piece 19 is arranged so as to be sandwiched between the sensor 13 and the side portion of the circuit board 17. For the circuit board 17, there is used a board in which, for example, a metal dome is formed on a flexible wiring board and a water-proof and dust-proof sheet is pasted on the upper portion thereof.

The dome switch 25 is mounted on the operation surface side of the upper portion of the circuit board 17. The dome switch 25 is constituted of a switch portion and a cover member. The switch portion is constituted of a spring member and an electrode member, and the cover member is constituted of an insulation member (see FIG. 17). The dome switch 25 is, for example, turned on by being pressed-into strongly and by overcoming the biasing force of the spring member depending on the finger or the like. When releasing the finger from the key-top 251, the key-top 251 returns by the biasing force of the spring member and the dome switch 25 is made to be turned off. There are mounted on the circuit board 17 with a plurality of key switches forming ten-keys of numerals [0] to [9], a symbol [*] key, a symbol [#] key and the like, which form the key-top array type operation panel 38, other than the dome switch 25.

In this manner, according to the input device 250' relating to the twenty-fifth embodiment, the operation panel 18' of the lower housing 11u and the key-top 251 having a plane cross concave shape are integrally molded. Consequently, it becomes possible to provide the input device 250 of an air-tight structure abundant in water-resistance. Furthermore, assembly of the input device 250 becomes simple as compared with a method in which a key-top of a plane cross convex shape in the past and an operation panel which forms a ten-key of numerals [0] to [9], a symbol [*] key, a [#] symbol key and the like are assembled separately.

Also, according to the input device 250', the key-top 251 is slide-operated along the concave shape of hemispheric inner surface single horizontal-line or/and is slide-operated along the concave shape of hemispheric inner surface single vertical-line intersected with this. Further, the dome switch 25 is turned on or/and off by a press-in operation of the key-top 251. Thus, after the information selection, it is possible to turn on or/and off the dome switch 25 by press-in-operating the key-top 251 and it becomes possible to apply to a determination key when the input is determined. Consequently, it is a structure which is different from a cross key in the past and the unique operation feeling which does not exist in the cross key is obtained and it becomes possible for the key-top 251 of the shape to widely set a retrieval pitch of a scroll key when retrieving various kinds of information and a audio volume adjustment pitch of a volume key and the like when adjusting audio volume.

In this example, although a case where the key-top 251 is provided on the front surface side of the lower housing 11u as shown in FIG. 44 has been described, of course, it is not limited to this; it is needless to say that a similar effect is obtained with respect to a case where the key-top is provided on the rear surface side of the lower housing 11u.

Embodiment 26

Figure 45:
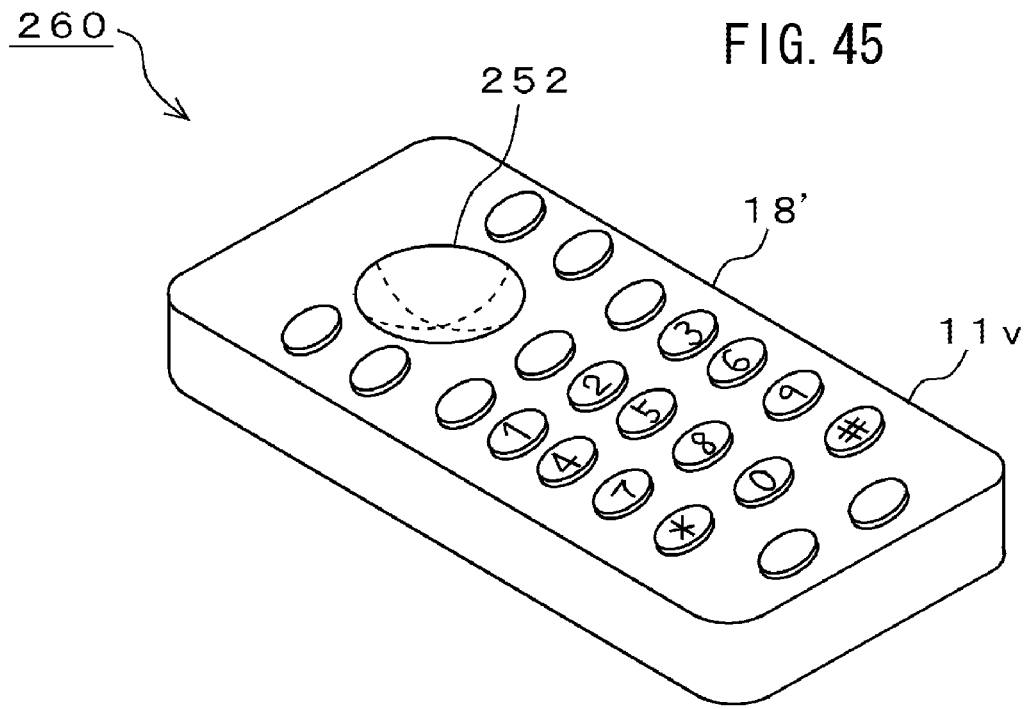
FIG. 45 is a perspective view showing a configuration of an input device 260 as a twenty-sixth embodiment.

FIG. 45 shows a configuration of an input device 260 as a twenty-sixth embodiment. In this embodiment, an operation panel 18' of a lower housing 11v and a key-top 252 having a concave shape of hemispheric inner surface are integrally molded, instead of the key-tops 14, 141 to 146 for the housing side surface arrangement including various kinds of shapes explained in the first to the twelfth embodiments.

The input device 260 shown in FIG. 45 includes a lower housing 11v with a key-top having a concave shape of hemispheric inner surface. An upper portion of the lower housing 11v is the operation surface and on the upper portion operation surface thereof, the operation panel 18' on which a tenkey of numerals [0] to [9], a symbol [*] key, a [#] symbol key and the like are arranged is provided. An individual key of the operation panel 18' has an elliptical shape. According to the lower housing 11v, the operation surface of the key-top 252 is different from the key-top shape shown in FIG. 43 and is curved in the concave shape of hemispheric inner surface. With respect to a structure on the inside of the key-top 252 of the lower housing 11v, a structure of the sensor 13 shown in FIG. 36, FIG. 39 or FIG. 39B is employed (see FIG. 36, FIG. 39 or FIG. 39B). When a press-in function by the key-top 252 is applied, it is enough if a pressure detecting sheet member is used for the sensor 13 instead of the electrostatic capacitance sheet member.

By injecting a resin to a die for the lower housing which is modeled with, for example, a concave shape of hemispheric inner surface which becomes a key-top 252 and a ten-key of numerals [0] to [9], a symbol [*] key, a [#] symbol key and the like which become an operation panel 18' having concave shape, the lower housing 11v is formed. Thus, it is possible to form the input device 260 including the key-top 252 as an airtight structure. Also, a speaker 36b with an actuator function as shown in FIG. 14 is provided on a position which is on the inside of the lower housing 11v and which is near the key-top 252, and can present a sense of touch to the operator's finger 39a.

In this embodiment, the concave shape of hemispheric inner surface of the key-top 252 has a predetermined depth and aperture width. The key-top 252 is slide-operated along one orbit of the concave shape of hemispheric inner surface or/and is slide-operated along another orbit intersected with the orbit. Thus, in response to the slide operation by the operator's finger, in addition to the slide operation feeling of being dug-down in an arc shape along one orbit of the concave shape of hemispheric inner surface from one portion of the operation surface of the lower housing 11v, it is possible to present the slide operation feeling of being dug-up in an arc shape toward the other portion of the operation surface thereof. Then, in addition to the slide operation feeling of being dug-down in an arc shape along another orbit intersected with one orbit of the concave shape of hemispheric inner surface from one portion of the operation surface of the lower housing 11v, it is possible to present the slide operation feeling of being dug-up in an arc shape along the other portion of the operation surface thereof.

In this manner, according to the input device 260 relating to the twenty-sixth embodiment, the operation panel 18' of the lower housing 11v and the key-top 252 having the concave shape of hemispheric inner surface is integrally molded. Consequently, it becomes possible to provide the input device 260 of an airtight structure abundant in water-resistance. Furthermore, assembly of the input device 260 becomes simple as compared with a method in which the key-top 252 of the concave shape of hemispheric inner surface and the operation panel which forms a ten-key of numerals [0] to [9], a symbol [*] key, a [#] symbol key are assembled separately. Also, a structure which is different from the cross key in the past is obtained and unique operation feeling which does not exist in the cross key is obtained. Further, the key-top 252 of the concave shape of hemispheric inner surface can is applied to an image information selection key for selecting information. For example, it becomes possible to realize the slide operation of the key-top 252 to one direction or plural directions, the information selection by a press-in operation to one direction and the determination operation thereof.

In this embodiment, although a case where the key-top 252 is provided on the front surface side of the lower housing 11v as shown in FIG. 45 has been described, of course, it is not limited to this; it is needless to say that a similar effect is obtained with respect to a case where the key-top is provided on the rear surface side of the lower housing 11v.

Embodiment 27

Figure 46:
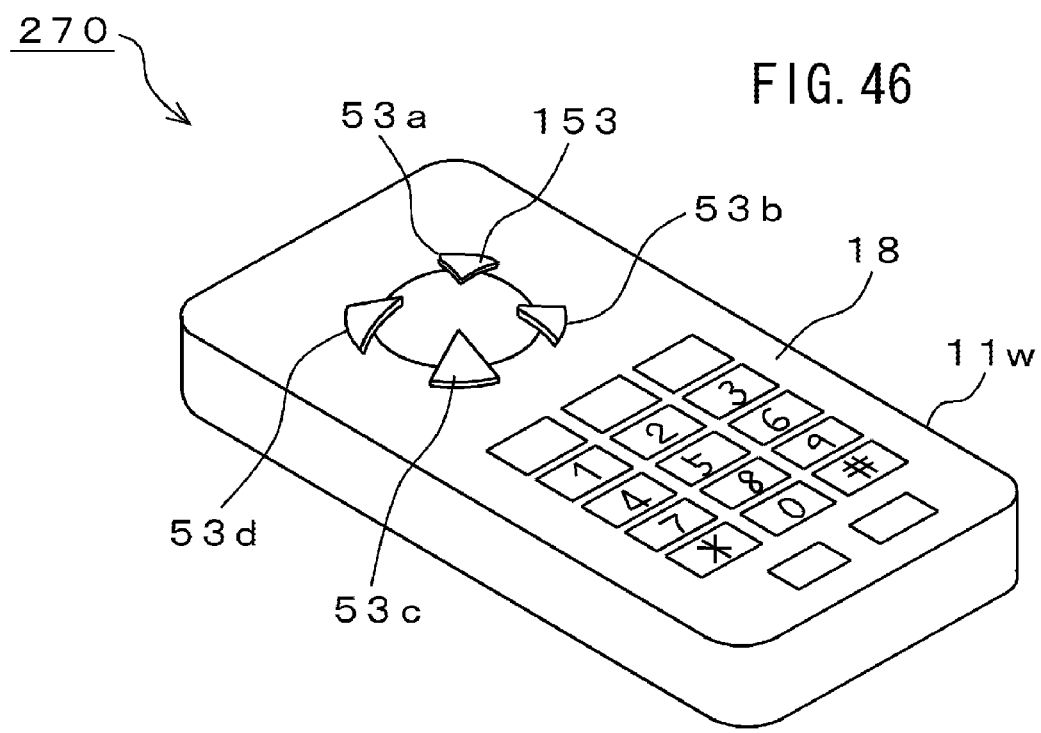
FIG. 46 is a perspective view showing a configuration of an input device 270 as a twenty-seventh embodiment.

FIG. 46 shows a configuration of an input device 270 as a twenty-seventh embodiment. In this embodiment, an operation panel 18 of a lower housing 11w and a key-top 153 having a convex shape of hemispheric outer surface cross are integrally molded, instead of the key-top 152 having the hemispheric concave shape explained in the eighteenth embodiment.

The input device 270 shown in FIG. 46 includes a lower housing 11w with a key-top having a convex shape of hemispheric outer surface cross. An upper portion of the lower housing 11w is the operation surface and on the upper portion operation surface, the operation panel 18 on which a ten-key of numerals [0] to [9], a symbol [*] key, a [#] symbol key and the like are arranged is provided. According to the lower housing 11w, the operation surface of the key-top 153 is different from the key-top shape shown in FIG. 34 and is protuberated in the convex shape of hemispheric outer surface cross. With respect to a structure on the inside of the key-top 153 of the lower housing 11w, a structure of the sensor 13 as shown in FIG. 22, FIG. 23 or FIG. 24B is employed (see FIG. 22, FIG. 23 or FIG. 24B).

By injecting a resin to a die for the lower housing which is modeled with a convex shape of hemispheric outer surface cross which becomes a key-top 153 and a ten-key of numerals [0] to [9], a symbol [*] key, a [#] symbol key and the like which become an operation panel 18, the lower housing 11w having the convex shape is formed. Thus, it is possible to form the input device 270 including the key-top 153 as an airtight structure. Also, the speaker 36b with an actuator function as shown in FIG. 14 is provided on a position which is on the inside of the lower housing 11w and which is at a position near the key-top 252, and can present a sense of touch to the operator's finger 39a.

In this embodiment, the key-top 153 forms the convex shape of hemispheric outer surface cross having a predetermined height and width. Touch marks 53a to 53d (key marks) of a ginkgo's leaf shape (approximately triangle) are provided crosswise on the key-top 153. The key-top 153 is slide-operated along one orbit of the convex shape of hemispheric outer surface cross or/and is slide-operated along the other orbit intersected with the orbit. Further, four touch marks 53a to 53d are pressed individually. The press-in region is operated so as to press the peak region of the key-top 153 in addition to four touch marks 53a to 53d.

Thus, in response to the slide operation by the operator's finger, in addition to the slide operation feeling of becoming thicker in an arc shape along one orbit of the convex shape of hemispheric outer surface cross from one portion of the operation surface of the lower housing 11w, it is possible to present the slide operation feeling of becoming thinner in an arc shape toward the other portion of the operation surface thereof. Further, in addition to the slide operation feeling of becoming thicker in an arc shape along the other orbit intersected with one orbit of the convex shape of hemispheric outer surface cross from one portion of the operation surface of the lower housing 11w, it is possible to present the slide operation feeling of becoming thinner in an arc shape along the other portion of the operation surface thereof.

Further, vibration is transmitted from the speaker 36b with an actuator function as shown in FIG. 14 to the key-top 153 by the press-in operation of any one of the four touch marks 53a to 53d or the peak region of the key-top 153, thereby enabling sense of touch to be presented to the operator's finger.

In this manner, according to the input device 270 relating to the twenty-seventh embodiment, the operation panel 18 of the lower housing 11w and the key-top 153 having the convex shape of hemispheric outer surface cross are integrally molded. Consequently, it becomes possible to provide the input device 270 of an airtight structure abundant in water-resistance. Furthermore, assembly of the input device 270 becomes simple as compared with a method in which the key-top 153 of the convex shape of hemispheric outer surface cross and the operation panel which forms a ten-key of numerals [0] to [9], a symbol [*] key, a [#] symbol key are assembled separately. Also, a structure which is different from a cross key in the past is obtained and unique operation feeling which does not exist in such a cross key is obtained. The key-top 153 of the convex shape of hemispheric outer surface cross can be applied to an image information selection key for selecting information.

In this embodiment, although a case where the key-top 153 is provided on the front surface side of the lower housing 11w as shown in FIG. 46 has been described, of course, it is not limited to this; it is needless to say that a similar effect is obtained with respect to a case where the key-top is provided on the rear surface side of the lower housing 11w.

Embodiment 28

Figure 47:
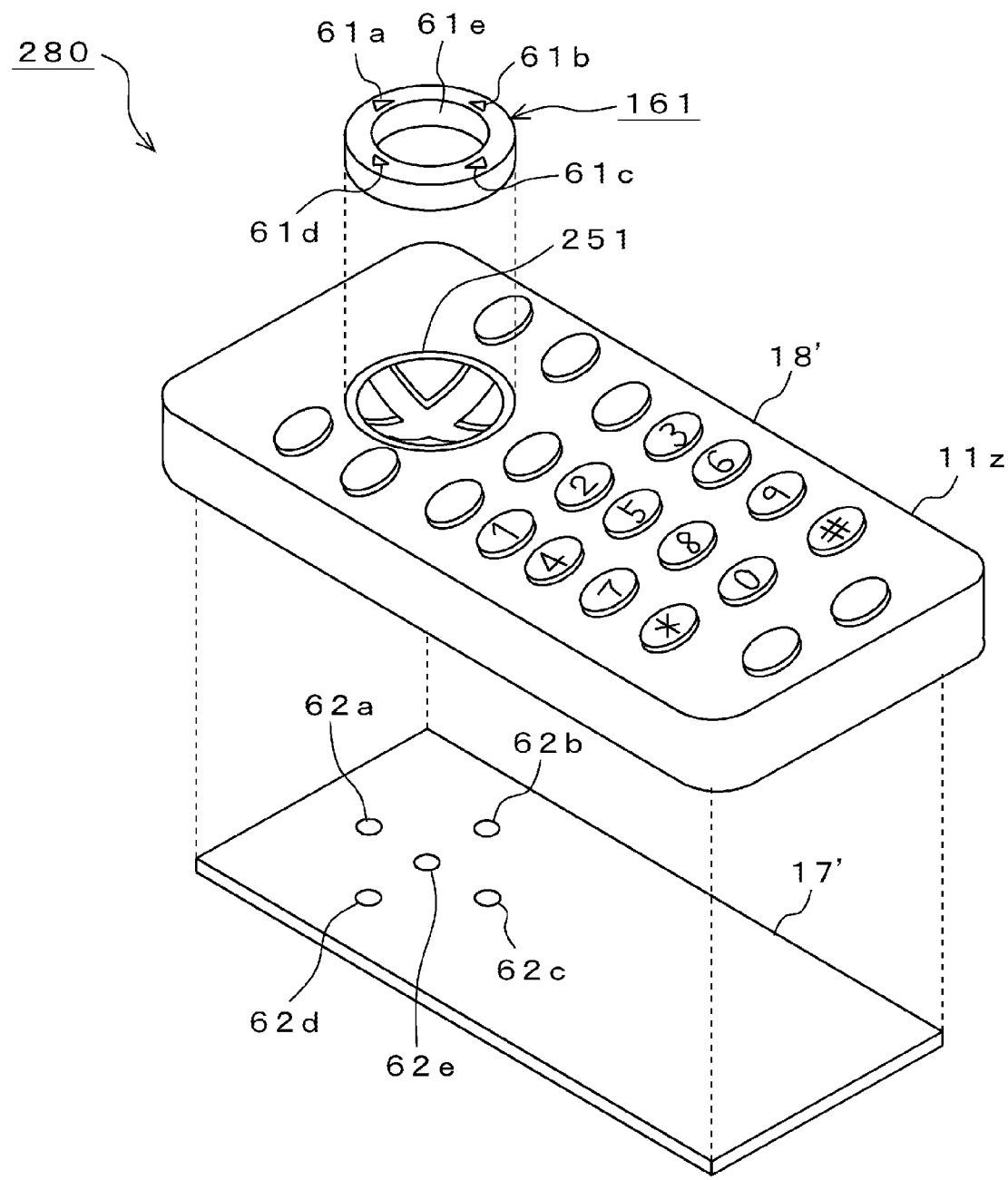
FIG. 47 is an exploded perspective view showing a configuration of an input device 280 as a twenty-eighth embodiment.

FIG. 47 shows a configuration of an input device 280 as a twenty-eighth embodiment. In the input device 280 shown in FIG. 47, a photoconductive member 161 is added to the input device 250 shown in FIG. 43. In this embodiment, the input device 280 includes a lower housing 11z with a key-top of a concave shape of hemispheric inner surface cross. An upper portion of the lower housing 11z is the operation surface and on the upper portion operation surface thereof, an operation panel 18' on which a ten-key of numerals [0] to [9], a symbol [*] key, a [#] symbol key and the like are arranged is provided. According to the lower housing 11z, the operation surface of the key-top 251 is different from the input device 250 shown in FIG. 43 and the photoconductive member 161 is arranged around the key-top 251. The lower housing 11z is obtained by die-injection-molding a polycarbonate (PC) resin or an ABS resin.

The photoconductive member 161 forms a cylindrical ring shape having an opening portion 61e inside thereof. On an outer circumferential edge portion of the photoconductive member 161, for example, four concave/convex shaped triangular marks 61a to 61d are provided. The photoconductive member 161 is obtained by die-injection-molding a transparent acrylic system resin. Of course, the photoconductive member 161 and the key-top 251 may be formed integrally. The thickness thereof is around 11.0 mm. A material thereof is a polycarbonate or the like.

In this embodiment, the photoconductive member 161 having the cylindrical ring shape is fitted into an outer circumferential groove portion of the key-top 251 with the key-top 251 on the operation panel 18' exposing the opening portion 61e of the photoconductive member 161. A circuit board 17' is mounted in the lower housing 11z. A glass epoxy board having the thickness of around 1.1 mm is used for the circuit board 17'. A plurality of LED devices 62a to 62e constituting one example of light sources are provided at predetermined positions of the circuit board 17', for example, at the positions under the key-top 251 and facing it and irradiate light to the photoconductive member 161 and the vicinity of the center portion of the key-top 251.

For example, the LED device 62a illuminates with a LED light the triangular mark 61a of the photoconductive member 161. The LED device 62b illuminates with a LED light the triangular mark 61b thereof. The LED device 62c illuminates with a LED light the triangular mark 61c thereof. The LED device 62d illuminates with a LED light the triangular mark 61d thereof. The LED device 62e illuminates with a LED light the vicinity of the center portion of the key-top 251. Of course, by integrating the light sources into one, it is also allowed to be light-dispersed and to be light-distributed. A laser diode which emits a red light, a laser diode which emits a green-light and/or a laser diode which emits a blue light are used for the LED devices 62a to 62e (LED light diffusion structure).

In this manner, according to the input device 280 relating to the twenty-eighth embodiment, the key-top 251 is provided with the photoconductive member 161. It is possible to illuminate the key-top 251 and the peripheral portion thereof with the LED light emitted from the LED devices 62a to 62e, so that the operability of the input device 280 can be improved. The above-mentioned LED light diffusion structure can be applied to not only the twenty-eighth embodiment but also the first to the twenty-seventh embodiments.

In this embodiment, although a case where the key-top 251 is provided on the front surface side of the lower housing 11z as shown in FIG. 47 has been described, of course, it is not limited to this; it is needless to say that the similar effect is obtained with respect to a case where the key-top is provided on the rear surface side of the lower housing 11z.

Embodiment 29

Figure 48:
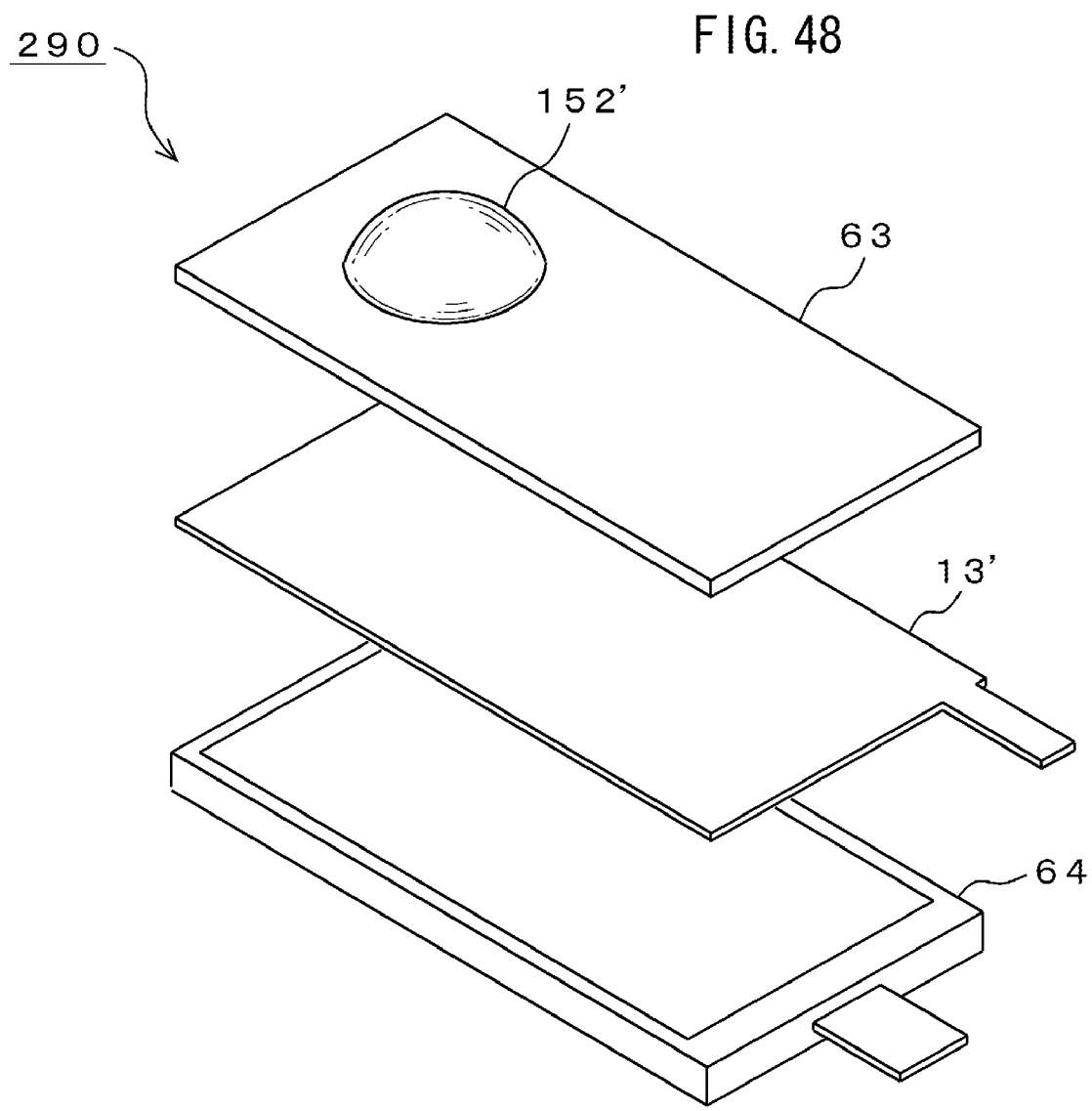
FIG. 48 is an exploded perspective view showing a configuration of an input device 290 relating to a twenty-ninth embodiment.

FIG. 48 shows a configuration of an input device 290 relating to a twenty-ninth embodiment. In the input device 290 shown in FIG. 48, a structure of the key-top 152 of the input device 180 shown in FIG. 35 is applied to the display unit 29 of any one of the mobile phones 101 to 103 shown in FIGS. 3A and 3B, FIGS. 28A and 28B, and FIGS. 30A and 30B.

The input device 290 shown in FIG. 48 includes a display unit 29. The input device 290 is constituted by layering a display top member 63, a sensor 13' and an LCD device 64 in order from an upper portion. The display unit 29 includes the display top member 63 and the LCD device 64. A key-top 152' formed in a convex shape is arranged at the predetermined position thereof. The display unit 29 displays information inputted by the key-top 152'.

The display top member 63 is assembled so as to cover the whole sensor 13'. A polycarbonate plate or the like having the thickness of around 1.0 mm is used for the display top member 63. In this embodiment, a convex portion constituting the key-top 152' is provided at a predetermined position of the display top member 63. An electrostatic capacitance sheet member, a pressure detecting sheet member or the like is used for the sensor 13'.

It is nice for the key-top 152' to be disposed, for example, at a little bit upward or downward position compared with the center region of the display unit 29 in order to improve the operability. It is nice for the key-top 152' to be formed by a method for pasting the key-top 152' on the display top member 63 or by a method for molding the display top member 63 and the key-top 152' integrally by die-injection-molding a resin for key-top. The thickness thereof is around 1.0 mm. The LCD device 64 is arranged on the rear surface side of the sensor 13' and a liquid crystal display device for color having the thickness of around 1.7 mm is used for the LCD device 64.

In this embodiment, the key-top 152' forms a hemispheric convex shape having a predetermined height and width. The key-top 152' is slide-operated along one orbit of the hemispheric convex shape or/and is slide-operated another orbit intersected with the orbit. It is needless to say that an icon image for selecting input information is displayed in the display unit 29 through the LCD device 64 and it is also allowed for the operator's finger to slide-operate along this icon image.

In this manner, according to the input device 290 relating to the twenty-ninth embodiment, the key-top 152' is provided at a little bit upward or downward position compared with the center region of the display unit 29 in which the display top member 63, the sensor 13' and the LCD device 64 are layered in this order, and the display top member 63 and the key-top 152' having the hemispheric convex shape are integrally molded or the key-top 152' is pasted on the display top member 63.

Consequently, it becomes possible to provide the input device 290 of an airtight structure abundant in water-resistance. Furthermore, in addition to the slide operation feeling of becoming thicker in an arc shape along one orbit of the hemispheric convex shape from one portion of the display surface of the display top member 63 of the display unit 29 in response to the slide operation by the operator's finger, it is possible to present the slide operation feeling of becoming thinner in an arc shape toward the other portion of the display surface thereof. Then, in addition to the slide operation feeling of becoming thicker in an arc shape along another orbit intersected with one obit of the hemispheric convex shape from one portion of the display surface of the display top member 63, it is possible to present the slide operation feeling of becoming thinner in an arc shape toward the other portion of the display surface thereof.

Thus, there is improved the input operability of an electronic apparatus of a mobile phone, a video camera, a digital camera or the like which is applied with the input device 290 and unique operation feeling which does not exist in the touch panel in the past can be obtained.

Figure 49:
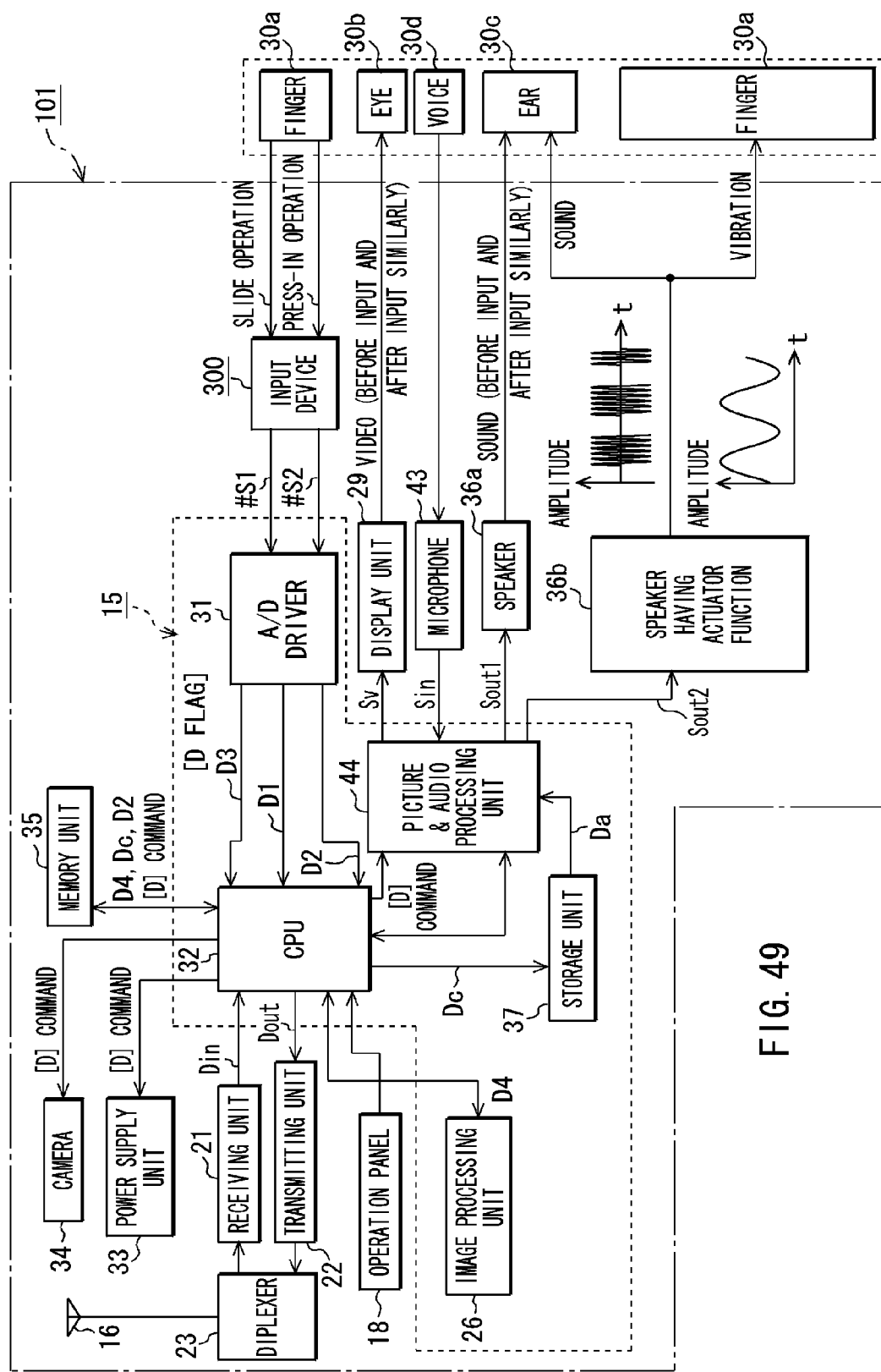
FIG. 49 is a block diagram showing a configuration of a control system of the mobile phone 101 or the like and its feeling feedback function example.

The following will describe a mobile phone 101 with sense of touch input function or the like. FIG. 49 shows a configuration of a control system of the mobile phone 101 or the like and its feeling feedback function example.

The mobile phone 101 or the like shown in FIG. 49 is constituted by mounting each function block on the circuit board 17 or the like of the lower housing 11b. It should be noted that each portion corresponding to each portion shown in FIG. 3 to FIG. 15 or the like is indicated by the same reference numeral. The mobile phone 101 or the like includes a control unit 15, an operation panel 18, a receiving unit 21, a transmitting unit 22, an antenna diplexer 23, an input device 300, a display unit 29, a power supply unit 33, a camera 34, a memory unit 35, a speaker 36a for received melody and a speaker 36b with an actuator function.

Figure 68:
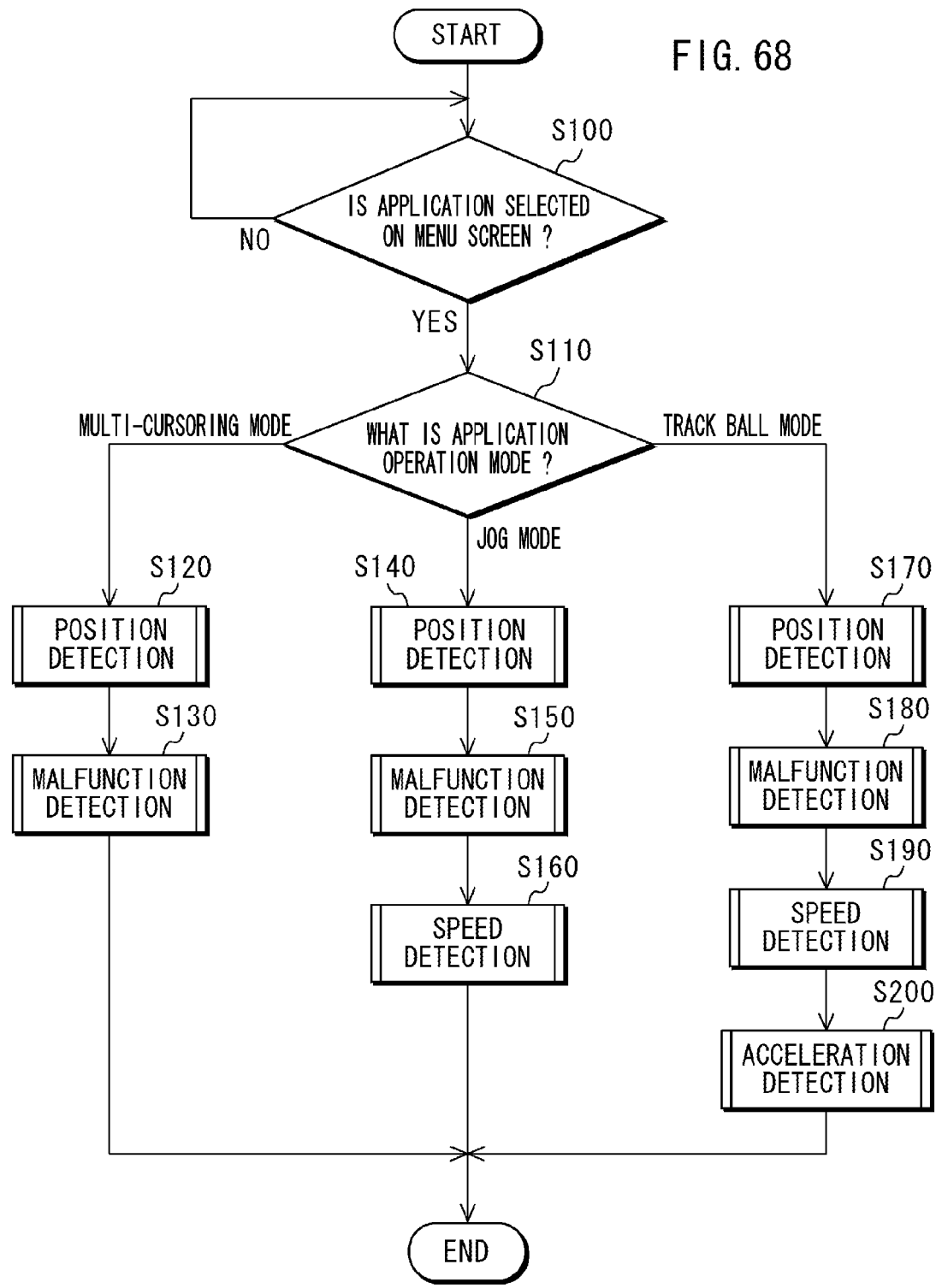
FIG. 68 is a flowchart showing an operation example of a mobile phone as a thirty-second embodiment.

Although cases in which the electrostatic capacitance sheet member are used with respect to the sensor 13 shown in FIG. 3 to FIG. 43 have been described, anything is acceptable in the input device 300 shown in FIG. 68 if function of the slide operation (cursoring) and function of the press-in (selection determination) can be distinguished. For example, an input device of the pressure detecting sheet member or the like is also acceptable, and preferably it is enough if the input device has a configuration such that the position detection information and the press-in detection information are applied to the control unit 15.

The input device 300 is provided in the lower housing constituting the mobile phone 101 or the like and inputs information by the slide operation and by the press-in operation depending on the operator's finger 39a. For example, the input device 300 detects a slide position or a press-in force of the operator's finger 39a, and outputs at least a position detection signal #S1 and a press-in detection signal #S2 to the control unit 15.

The input devices 10 to 290 relating to the first to the twenty-ninth embodiments can be used for the input device 300. For example, when the input device 250 relating to the twenty-ninth embodiment is used, the input device 250 includes a sensor 13 which is provided in the lower housing 11u and which detects a slide position of the operator's finger, and a key-top 246 which is provided so as to cover the sensor 13 and which is slide-operated along the operation surface of the lower housing 11u. The key-top 246 has a concave shape which is dug-down along the sliding direction from one portion of the operation surface of the lower housing 11u and also which is dug-up toward the other portion of the operation surface (see FIG. 43 and FIG. 44).

The control unit 15 constitutes a control system and includes an image processing unit 26, an A/D-driver 31, a CPU 32, and a storage unit 37. The A/D-driver 31 is supplied with the position detection signal #S1 and the press-in detection signal #S2 from the input device 300. In the A/D-driver 31, an analogue signal composed of the position detection signal #S1 and the press-in detection signal #S2 is converted to digital data in order to distinguish function of the cursoring and function of the icon selection. Other than this, the A/D-driver 31 performs arithmetic-calculation-processing on this digital data, detects which is a cursoring input and the icon selection information, and supplies image information data D3 by which the cursoring input or the icon selection is distinguished, position detection information D1 or press-in detection information D2 to the CPU 32. It is also allowed for these arithmetic calculations to be executed in the CPU 32.

The A/D-driver 31 is connected with the CPU 32. The CPU 32 controls the whole phone based on a system program. The memory unit 35 stores system program data for controlling the whole phone. RAM, which is not shown, is used as a work memory. The CPU 32 turns the power ON and at the same time, reads the system program data out of the memory unit 35, expands the system program data in the RAM, and turns on the system to control the whole mobile phone.

For example, the CPU 32 controls so as to receive the position detection information D1, the press-in detection information D2, and the information data D3 (hereinafter, simply also referred to as input data) from the A/D driver 31, supply predetermined instruction data "D" to the devices of the power supply unit 33, the camera 34, the memory unit 35, the storage unit 37, a picture and audio processing unit 44 or the like, receive the reception data from the receiving unit 21, and transmit the transmission data to the transmitting unit 22.

The picture and audio processing unit 44 is connected with the display unit 29 which displays, for example, the scroll image 29a, 29b or the like corresponding to the slide operation or the press-in operation of the operator's finger 39a detected by the sensor 13. In this embodiment, the CPU 32 detects the slide operation speed of the operator's finger 39a, and adjusts a display pitch of the scroll image 29a, 29b or the like in the display unit 29 in response to the slide operation speed of the operator's finger 39a.

Under the display control thus executed, adjustment is realized such that when retrieving information, a display pitch of the scroll image 29b or the like in the display unit 29 is set as narrow in a case in which the slide operation speed of the operator's finger 39*a* is quick and on the contrary, a display pitch of the scroll image 29*a* or the like in the display unit 29 is set as wide in a case in which the slide operation speed of the operator's finger 39*a* is slow. Consequently, when plural information retrieval objects exist and the aimed scroll image is far therefrom, the scroll image is transmitted so as to skip roughly but when approaching to the aimed scroll image, it becomes possible to execute the search so as to transmit the scroll image slowly.

In this embodiment, when the pressure detecting sheet member is used for the sensor 13, the CPU 32 compares the press-in detection information D2 obtained from the input device 300 with a preset pushdown determination threshold Fth, in addition to the display pitch adjustment of the scroll image 29*a*, 29*b* or the like, and controls the storage unit 37 to read out thereof data that controls the vibration of the speaker 36*b* with an actuator function based on the comparison result. For example, when senses of touch propagated from the operation surface in the pushdown position of the input device 300 are assumed to be A and B, respectively, the sense of touch #A is obtained by changing the operation surface in response to the slide operation of the operator's finger 39*a* in the slide position thereof from vibration pattern of low frequency and small amplitude to vibration pattern of high frequency and large amplitude. Also, the sense of touch #B is obtained by changing the operation surface in response to existence or nonexistence of the pressing-in force of the operator's finger 39*a* in the slide position thereof from vibration pattern of high frequency and large amplitude to vibration pattern of low frequency and small amplitude.

The above-mentioned CPU 32 is connected with the memory unit 35 which stores display information D4 for displaying the display screen for input item selection three-dimensionally, for example, control information Dc relating to the selection position of the icon corresponding to the display information D4 and the vibration mode, and the like in every display screen. The control information Dc includes a plurality of specific vibration waveforms by which a plurality of differed senses of touch that are synchronized with applications (three-dimensional display and various kinds of display contents) in the display unit 29 can be generated and which generate these senses of touch thereof, and algorism that sets the specific sense of touch generation mode of every application. An EEPROM, a ROM, a RAM or the like is used for the memory unit 35.

In this embodiment, the CPU 32 executes the display control of the display unit 29 and the output-control of the speaker 36*b* with an actuator function based on the position detection information D1, the press-in detection information D2, and information data D3 which are outputted from the A/D-driver 31. For example, the control unit 15 reads the control information Dc out of the memory unit 35 based on the position detection signal #S1 and the press-in detection signal #S2 which are obtained from the input device 300, accesses to the storage unit 37 and controls so as to supply a vibration generating signal Sa to the speaker 36*b* with an actuator function.

In this embodiment, when the pressure detecting sheet member is used for the sensor 13, the CPU 32 controls the storage unit 37 to read the data out thereof such that the sense of touch #A is started up when the press-in detection information D2 less than the pushdown determination threshold Fth is detected, and then, the sense of touch #B is started up when the input device 300 detects the press-in detection information D2 which exceeds the pushdown determination threshold Fth. By doing like this, it is possible to generate different vibration patterns coincidentally with an [pressure force] by the operator's finger 39*a* or the like.

The CPU 32 is connected with the storage unit 37 and reads vibration generating data Da out of the storage unit 37 based on the control information Dc from the CPU 32. The vibration generating data Da includes an output waveform composed of a sinusoidal waveform. The storage unit 37 is connected with the picture and audio processing unit 44. Each item of the vibration generating data Da is supplied to the picture and audio processing unit 44, the vibration generating data Da thereof is audio-processed (digital/analogue conversion, amplification or the like) and becomes a vibration generating signal Sout 2, and it is supplied to the speaker 36*b* with actuator function. The speaker 36*b* vibrates based on the vibration generating signal Sout 2.

In this embodiment, the storage unit 37 memorizes the pushdown determination threshold Fth corresponding to each application. For example, the pushdown determination threshold Fth is stored beforehand in a ROM or the like provided in the memory unit 35 as trigger parameter. The memory unit 35 reads out the press-in detection information D2 under the control of the CPU 32, and the CPU 32 compares the preset pushdown determination threshold Fth with the impressed pressure force F obtained from the press-in detection information D2 to execute the determination process of Fth≧F, the determination process of Fth<F or the like.

For example, when the pushdown determination threshold Fth=100 [gf] is set in the storage unit 37, the operation surface vibrates based on the vibration pattern for obtaining the sense of touch of a classic switch. Also, when the pushdown determination threshold Fth=20 [gf] is set, the operation surface vibrates based on the vibration pattern for obtaining the sense of touch of a cyber switch.

The CPU 32 is connected with the image processing unit 26, in addition to the storage unit 37, which image-processes the display information D4 for scroll-displaying the scroll image 29*a*, 29*b* or the like. The display information D4 thus image-processed is supplied to the display unit 29. In this embodiment, the CPU 32 controls the display unit 29 so as to display the scroll image 29*a*, 29*b* or the like three-dimensionally with including the perspective in the depth direction of the display screen.

By the sense of sight depending on the eyes of the operator, each function for the display contents of the display unit 29 is judged and by the sense of hearing depending on the ears of the operator, each function for the sound release from the speakers 36*a*, 36*b* or the like is judged. The above-mentioned CPU 32 is connected with the operation panel 18 which is used, for example, when a phone number of the partner is inputted manually. The display unit 29 may display a received picture based on a picture signal Sv in addition to the above-mentioned icon selection screen.

Also, the antenna 16 shown in FIG. 49 is connected with the antenna diplexer 23 and receives a radio wave from the partner through a base station or the like when receiving calls. The antenna diplexer 23 is connected with the receiving unit 21 which receives the reception data introduced from the antenna 16, demodulates it to image picture data and audio data or the like, Din, and outputs the picture data and audio data, Din thus demodulated to the CPU 32 or the like. The receiving unit 21 is connected through the CPU 32 with the picture and audio processing unit 44 which performs digital/analog conversion on digital audio data to output an audio signal Sout or performs digital/analog conversion on digital image data to output a picture signal Sv.

The picture and audio processing unit 44 is connected with the speaker 36*a* which constitutes a big sound use and the speaker 36*b* with actuator function (vibration body) which constitutes a receiver. The speaker 36*a* rumbles the received sound, the received melody or the like based on an acoustic signal Sout 1 when receiving calls. The speaker 36*b* receives an audio signal Sout 2', and magnifies speaking voice 30*d* or the like of the partner. Also, the speaker 36*b* vibrates based on the vibration generating signal Sout 2 when presenting the sense of touch.

This picture and audio processing unit 44 is connected with a microphone 43 constituting a transmitter, in addition to the speakers 36*a*, 36*b*, which gathers the operator's voice and outputs an audio signal Sin. The picture and audio processing unit 44 performs analog/digital conversion on the analog audio signal Sin to be transmitted to the partner to output the digital audio data when transmitting calls, or performs analog/digital conversion on the analog picture signal Sv to output the digital image data.

The CPU 32 is connected with the transmitting unit 22, in addition to the receiving unit 21, which modulates picture data and audio data, Dout, or the like to be transmitted to the partner, supplies the transmission data thus modulated to the antenna 16 through the antenna diplexer 23. The antenna 16 radiates a radio wave supplied from the antenna diplexer 23 toward a base station or the like.

The above-mentioned CPU 32 is connected with the camera 34, in addition to the transmitting unit 22, which images a subject and for example, transmits still image information or operation information to the partner through the transmitting unit 22. It is also allowed for the camera 34 to be provided on the rear surface side of the upper housing 11*x*. The power supply unit 33 includes a battery, not shown, and supplies DC power to the operation panel 18, the receiving unit 21, the transmitting unit 22, the display unit 29, the CPU 32, the camera 34, the memory unit 35, the storage unit 37, the picture and audio processing unit 44, and the input device 300. It should be noted that in this embodiment, although a case where the storage unit 37 is provided separately from the picture and audio processing unit 44, it is also allowed to use compatibly the memory device which is included in the picture and audio processing unit 44. This enables the number of parts to be reduced.

Figure 50A:
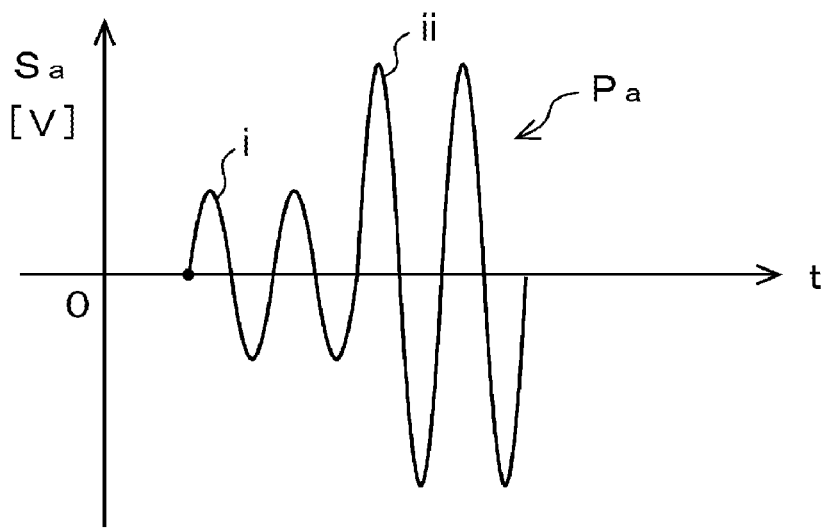
FIGS. 50A and 50B are waveform diagrams each showing vibration pattern examples relating to sense of touch #A and #B.
Figure 50B:
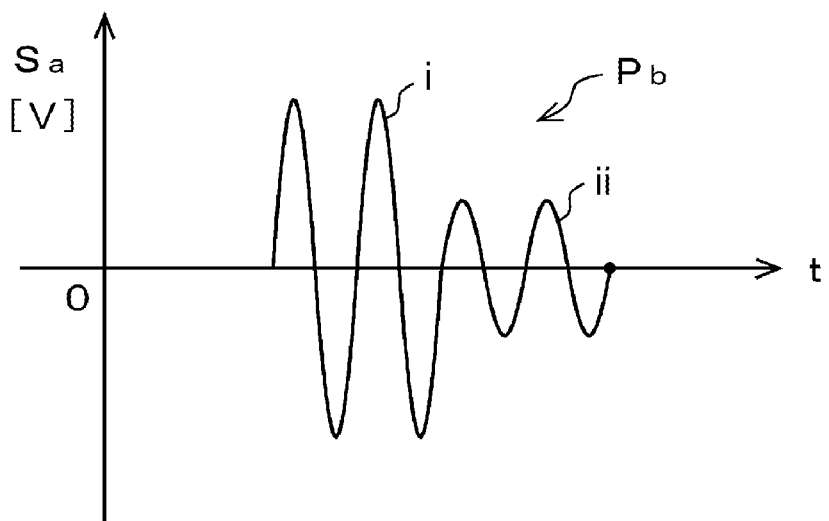

FIGS. 50A and 50B show vibration pattern examples relating to the senses of touch #A and #B. In FIGS. 50A and 50B, either one of horizontal axes indicates the time "t". Either one of vertical axes indicates amplitude Ax [V] of the vibration generating signal Sa. In this embodiment, in the scroll image 29*a*, 29*b* or the like which is displayed on the display unit 29, for example, the sense of touch #A and the sense of touch #B are applied on an occasion of the slide operation of the operator's finger 39*a*. In this embodiment, there is cited an example of a case in which the sense of touch #A is applied in case of slide-operating by tracing on the key-top 246 and the sense of touch #B is applied in a case of pressing into the key-top 246.

The first vibration pattern Pa shown in FIG. 50A is a waveform which gives the sense of touch #A. The drive condition "a" of the sense of touch #A thereof is a case in which when the scroll operation (slide operation) is executed by the key-top 246 and the relation between the pushdown determination threshold Fth and the impressed pressure force F becomes Fth≧F, vibrate is made by a vibration pattern of frequency fx=50 Hz, amplitude Ax=5 μm and the number of times Nx=2 during a period of time of around 0.1 second, in the first step "i". Hereinafter, it is expressed as [fx, Ax, Nx]= [50, 5, 2]. Similarly, in the second step ii, the vibration is made by a vibration pattern of [fx, Ax, Nx]=[100, 10, 2] during a period of time of around 0.1 second. When the operation surface vibrates based on such a vibration pattern, it is possible to obtain the sense of touch of the JOG dial switch or the like.

The second vibration pattern Pb shown in FIG. 50B is a waveform which gives the sense of touch #B. The drive condition "b" of the sense of touch #B thereof is a case in which when the key-top 246 is pressed-into by the information selection determination operation or the like after the key-top 246 is scroll-operated (slide-operated) to scroll the scroll image 29*a* or the like, the relation between the pushdown determination threshold Fth and the impressed pressure force F becomes Fth<F. In this case, in the first step "i", the vibration is made by a vibration pattern of [fx, Ax, Nx]=[80, 8, 2] during a period of time of around 0.1 second and similarly, in the second step ii, the vibration is made by a vibration pattern of [fx, Ax, Nx]=[40, 8, 2] during a period of time of around 0.1 second. Thus, it becomes possible to execute the same information selection determination operation as that of the dome switch 25. In this embodiment, when the pushdown determination threshold Fth=100 [gf] is set, it is possible to obtain the sense of touch of a classic switch.

FIGS. 51A and 51B show a relation example (No, 1 thereof) of the impressed pressure force F and the vibration pattern. In this embodiment, the pressure detecting sheet member is used for the sensor 13. The vertical axis shown in FIG. 51A indicates the impressed pressure force F which is obtained from the press-in detection signal #S2 (press-in detection information D2 after binarization). In FIG. 51B, the vertical axis indicates the amplitude [V] of the vibration generating signal Sa. In FIGS. 51A and 51B, either one of the horizontal axes is a sampling time "t". The sampling time "t" means timing for latching the impressed pressure force F imposed on the pressure detecting sheet member by scanning the output value of the sensor 13 based on the sampling clock of a predetermined frequency.

Generally, in the button switch operation or the like, there exists an input motion peak. In a case in which the pushdown speed (operation input speed) is coincident with the design, it is known that the impressed pressure force F thereof is around 30 [gf] to 240 [gf]. The impressed pressure force distribution waveform Ja shown in FIG. 51A is reflected with the impressed pressure force F by the pushdown speed toward the press-in direction (Z direction), which is made to be a reference at a time of the input device design.

In this embodiment, the pushdown determination threshold Fth is set with respect to the press-in detection signal #S2 obtained from the input device 300 beforehand. The CPU 32 controls the storage unit 37 to reads the data out so as to generate the first vibration pattern Pa at a sampling time t11 when a rise-up waveform of the press-in detection signal #S2 crosses the pushdown determination threshold Fth, and so as to generate the second vibration pattern Pb at a sampling time t21 when a rise-down waveform of the press-in detection signal #S2 crosses the pushdown determination threshold Fth.

By doing like this, when the input device 300 detects the impressed pressure force F which is made as a reference on an occasion of the slide operation and the relation of Fth≧F between the pushdown determination threshold Fth and the impressed pressure force F is detected, it is possible to start up the sense of touch #A. It is possible to start up the sense of touch #B when the CPU 32 or the like detects the relation of Fth<F between the pushdown determination threshold Fth and the impressed pressure force F. It should be noted that there is provided a vibration-free blank period Tx=T1 between the vibration pattern Pa and the vibration pattern Pb. This blank period Tx varies in response to the pressing speed toward the press-in direction.

FIGS. 52A and 52B show a relation example (No, 2 thereof) of the impressed pressure force F and the vibration pattern. Even in this embodiment, the pressure detecting sheet member is used for the sensor 13. In FIG. 52A, the vertical axis indicates the impressed pressure force F which is obtained from the press-in detection signal #S2 (press-in detection information D2 after binarization). In FIG. 52B, the vertical axis indicates the vibration generating signal Sa (amplitude). In FIGS. 52A and 52B, either one of the horizontal axes indicates the time "t".

The impressed pressure force distribution waveform Jb shown in FIG. 52A is reflected with the impressed pressure force F when the scroll images 29a, 29b or the like is pushed down in a midway of the slide operation. Also in this embodiment, similarly as FIG. 51A, the pushdown determination threshold Fth is set with respect to the press-in detection signal #S2 obtained from the input device 300 beforehand. The CPU 32 controls the storage unit 37 to read the data out so as to generate the vibration pattern Pa at a sampling time t12 when a rise-up waveform of the press-in detection signal #S2 crosses the pushdown determination threshold Fth, and so as to generate the vibration pattern Pb at a sampling time t22 when a rise-down waveform of the press-in detection signal #S2 crosses the pushdown determination threshold Fth.

By doing like this, the input device 300 detects the impressed pressure force F when the scroll image 29a, 29b or the like is selection-and-press-in-operated during the slide operation, and it is possible to start up the sense of touch #A when the CPU 32 or the like detects the relation of Fth≧F between the pushdown determination threshold Fth and the impressed pressure force F, and also it is possible to start up the sense of touch #B when the CPU 32 or the like detects the relation of Fth<F between the pushdown determination threshold Fth and the impressed pressure force F.

It should be noted that there is provided a vibration-free blank period Tx=T2 (T2<T1) between the vibration pattern Pa and the vibration pattern Pb. Thus, the sense of touch #A is transmitted during the slide operation relating to the scroll image 29a or 29b or the like and the sense of touch #B is transmitted in a case in which the scroll image 29a, 29b or the like is selection-and-press-in-operated, thereby enabling a load having the click feeling to be reached.

Figure 53:
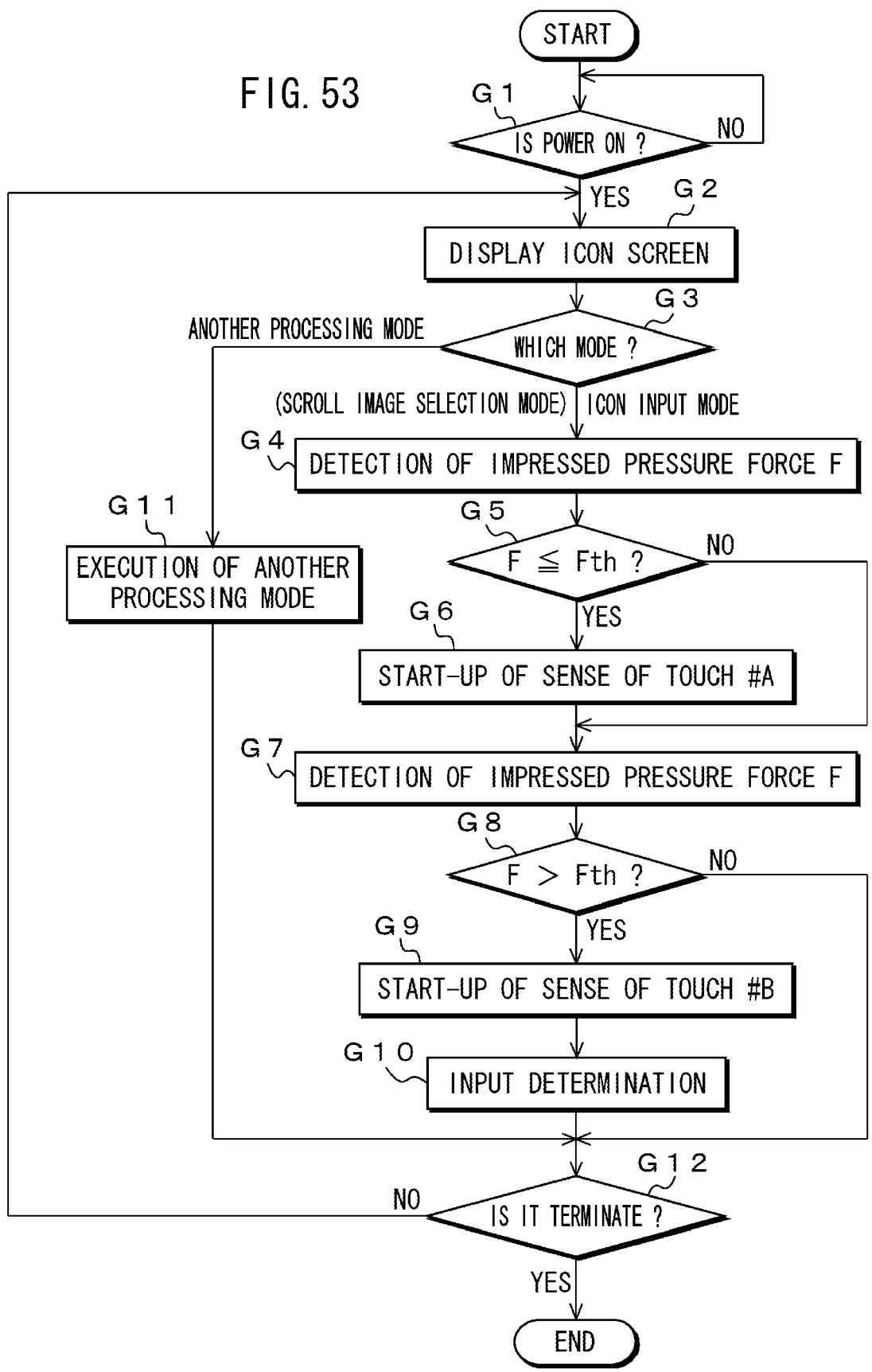
FIG. 53 is a flowchart showing an information processing example in the mobile phone 101 or the like relating to respective embodiment.

The following will describe an information processing example in the mobile phone 101 or the like. FIG. 53 shows the information processing example in the mobile phone 101 or the like relating to respective embodiments.

In this embodiment, the mobile phone 101 or the like is provided the input device 210 explained in the twenty-first embodiment and the sensor 13 and the key-top 246 are provided in the input device 210. Further, the display unit 29 for displaying the scroll image, which has been explained in the first embodiment, and the speaker 36b with actuator function, which has been explained in the second embodiment, are provided therein and there is assumed a case in which information is inputted by slide-operating or pushdown-operating the operation surface of the side surface of the mobile phone 101 or the like by the operator's finger 39a.

A function (algorism) for processing waveforms by making the impressed pressure force F by the operator's finger 39a or the like as parameter, for example, in the same vibration mode is provided in the mobile phone 101 or the like. The CPU 32 calculates the impressed pressure force F from the press-in detection information D2 and carries out the judgment corresponding to the drive conditions "a", "b" as shown in FIG. 51A and by the judgment result thereof, the sense of touch #A, #B corresponding to the movement during the input operation can be generated with respect to any kinds of inputs in the same vibration mode.

By setting these as the information processing conditions, the CPU 32 waits power ON in step G1 of a flowchart shown in FIG. 53. For example, the CPU 32 detects power-ON information and starts up the system. The power-ON information is generated normally when a time function or the like works, thereafter a power switch of the mobile phone or the like which is in a sleeping state is turned on.

Then, the operation shifts to step G2 where the CPU 32 controls the display unit 29 so as to display the icon screen of the menu or the like. For example, the CPU 32 supplies the display information D4 to the display unit 29 which displays the icon screen of the menu or the like. An information processing mode is set by this icon screen. In this embodiment, the information processing mode includes an icon input mode or other processing mode, so that the operator selects either one of them. The icon input mode includes, for example, a scroll image selection mode.

The scroll image selection mode means an operation for slide-operating or pushdown-operating the key-top 246 of the operation surface at a time of selection of the scroll image 29a, 29b or the like. The scroll image selection mode includes a telephone mode, a mail making mode, a transmission display mode or the like. The telephone mode includes an operation for dialing telephone to the partner. The scroll image 29b includes a character input item at a time of the telephone mode selection. The scroll images 29a, 29b are input information as shown in FIGS. 9A and 9B.

At that time, as shown in FIGS. 9A and 9B, when quantity "x" of the selection items housable within one screen of the display unit 29 is maximum quantity Max or less, S1=4 mm is set as the amount of slide Sx of the key-top 246. When the quantity "x" of the selection items housable within one screen of the display unit 29 exceed maximum quantity Max, S2=2 mm is set as the amount of slide Sx of the key-top 246 (see FIG. 11). Also, as shown in FIG. 12, it is also allowed to set the amount of slide Sx of the key-top 246 arbitrarily based on the length Xs of the electrical detection area (3) of the sensor 13 and all quantity Ys of the selection items existed in the scroll direction (see FIG. 12).

Then, the operation shifts to step G3 where the CPU 32 branches the control based on the scroll image selection mode or other processing mode. If the scroll image selection mode is set, then the key-top 246 is slide-operated for the scroll operation of the scroll image 29a, 29b or the like, and the operation shifts to step G4 where the CPU 32 detects the impressed pressure force F by the sensor 13. At that time, the key-top 246 is slide-operated along a concave shape which is dug-down along the sliding direction from one portion of the operation surface of the lower housing 11q of the input device 210 and also which is dug-up toward the other portion of the operation surface thereof. The sensor 13 detects the impressed pressure force F of the slide position of the operator's finger 39a which is slide-operated on the key-top 246, and outputs the position detection signal #S1 to the A/D-driver 31. The A/D-driver 31 performs A/D-conversion on the position detection signal #S1 to the position detection information D1 and transfers the position detection information D1 thus A/D-converted to the CPU 32.

Then, the operation shifts to step G5 where the CPU 32 compares the impressed pressure force F based on the position detection information D1 with the pushdown determination threshold Fth and judges whether or not the relation is F≦Fth. If the relation becomes F≦Fth, the operation shifts to step G6 where the sense of touch #A is started up. The sense of touch #A is obtained by vibrating the operation surface based on the vibration pattern Pb corresponding to the impressed pressure force F of the operator's finger 39a by the speaker 36b with actuator function. In the sense of touch #A, for example, with respect to frequency fx, amplitude Ax and the number of times Nx shown in FIG. 53A, in the first step "i", vibration is made by a vibration pattern of [fx, Ax, Nx]= [50, 5, 2] during a period of time of around 0.1 second and in second step ii, vibration is made by a vibration pattern of [fx, Ax, Nx]=[100, 10, 2] during a period of time of around 0.1 second. By doing like this, it is possible to generate different vibration patterns coincidentally with the [impressed pressure force] of the operator (drive condition "a"). It should be noted that if the relation between the impressed pressure force F based on the position detection information D1 and the pushdown determination threshold Fth is not F≦Fth, the operation shifts to step G7 where the detection of the impressed pressure force F is continued.

Then, when the press-in operation is executed to the keytop 246 by the operator's finger 39a, the operation shifts to step G7 where the CPU 32 calculates the impressed pressure force F based on the press-in detection information D2. At that time, the sensor 13 detects the impressed pressure force F of the pushdown position of the operator's finger 39a in the operation surface and outputs the press-in detection signal #S2 to the A/D-driver 31. The A/D-driver 31 performs A/D-conversion on the press-in detection signal #S2 to the press-in detection information D2 and transfers the press-in detection information D2 thus A/D-converted to the CPU 32.

Then, the operation shifts to step G8 where the CPU 32 compares the impressed pressure force F with the pushdown determination threshold Fth and judges whether or not the relation is F>Fth. If the relation becomes F>Fth, the operation shifts to step G9 where the sense of touch #B is started up. The sense of touch #B is obtained by vibrating the operation surface based on the vibration pattern Pb corresponding to the impressed pressure force F of the operator's finger 39a by the speaker 36b with actuator function. In the sense of touch #B, in the first step "i" shown in FIG. 53B, vibration is made by a vibration pattern of [fx, Ax, Nx]=[80, 8, 2] during a period of time of around 0.1 second and in second step ii, vibration is made by a vibration pattern of [fx, Ax, Nx]=[40, 8, 2] during a period of time of around 0.1 second. By doing like this, it is possible to generate different vibration patterns coincidentally with the [impressed pressure force] of the operator (drive condition "b"). It should be noted that if the relation between the impressed pressure force F based on the position detection information D1 and the pushdown determination threshold Fth is not F>Fth, the operation shifts to step G12.

Thereafter, the operation shifts to step G10 where the input is determined. At that time, the CPU 32 determines the input information displayed at the pushdown position in the input operation surface. Then, the operation shifts to the step G12. It should be noted that if other processing mode is selected in step G3, the operation shifts to step G11 where such other processing mode is executed. Such other processing mode includes a music reproduction function and a television reception function.

After such other processing mode is executed, the operation shifts to the step G12. The CPU 32 makes termination-judgment in the step G12. For example, the power OFF information is detected and the information processing is terminated. If the power-OFF information is not detected, the operation returns to the step G2 where the menu screen is displayed and the above-mentioned processing is repeated.

In this manner, according to the mobile phone 101 or the like to which the input device 210 with the sense of touch function for each embodiment is applied, the embodiments of the input device 300 relating to the present invention are provided. Therefore, in addition to the slide operation feeling of being dug-down along the sliding direction from one portion of the operation surface of the side surface of the mobile phone 101 or the like in response to the slide operation of the operator's finger 39a which operates the mobile phone 101 or the like, it is possible to present the slide operation feeling of being dug-up toward the other portion of the operation surface thereof.

Consequently, it becomes possible to provide the side jog tool or the like of the non-rotary of the reverse structure with respect to the side jog tool or the like of the non-rotary of the first input device 10. Furthermore, miniaturization and operability of the input device 210 can be improved, so that it is possible to attempt the lowering of malfunction of the mobile phone 101 or the like, cost-down and simplification of the manufacturing process.

Embodiment 30

Figure 54:
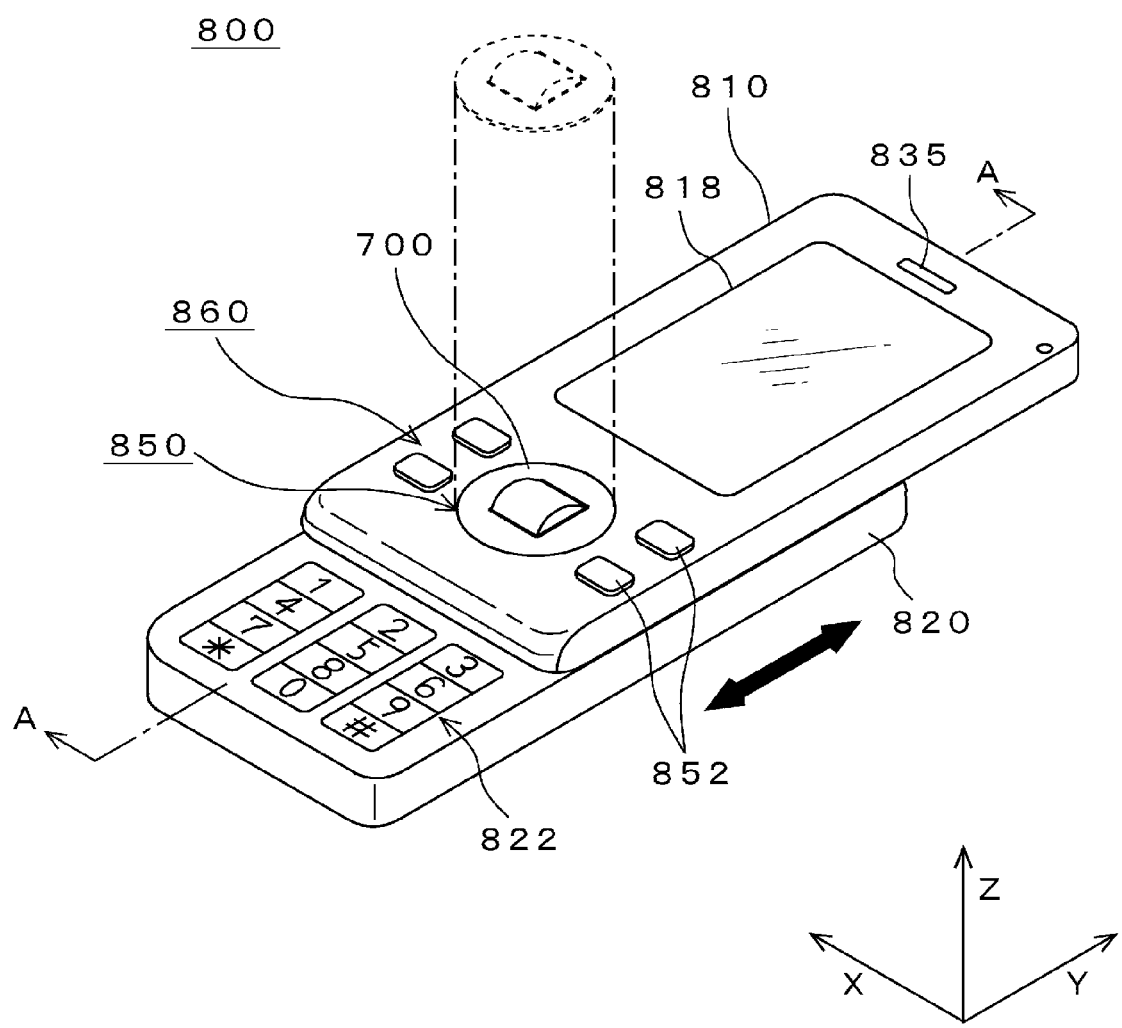
FIG. 54 is a perspective view showing a configuration of a mobile phone 800 as a thirtieth embodiment.
Figure 55:
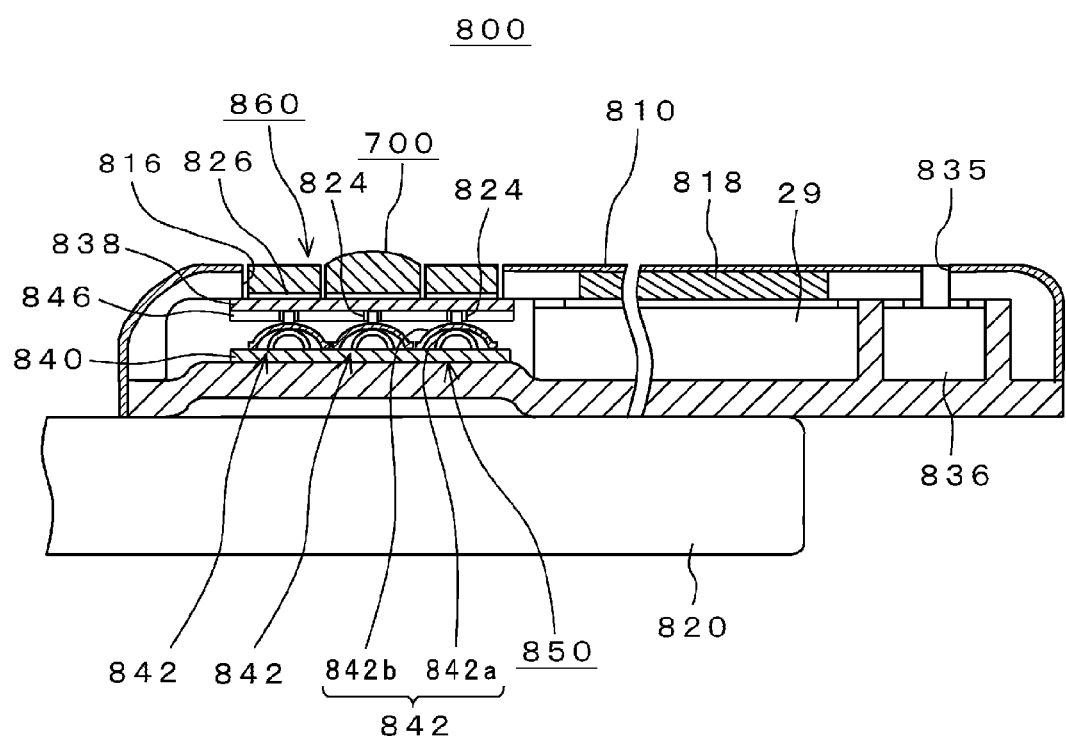
FIG. 55 is a cross-section diagram taken along an A-A line of the mobile phone 800 shown in FIG. 54 showing an internal configuration of the mobile phone 800.
Figure 56:
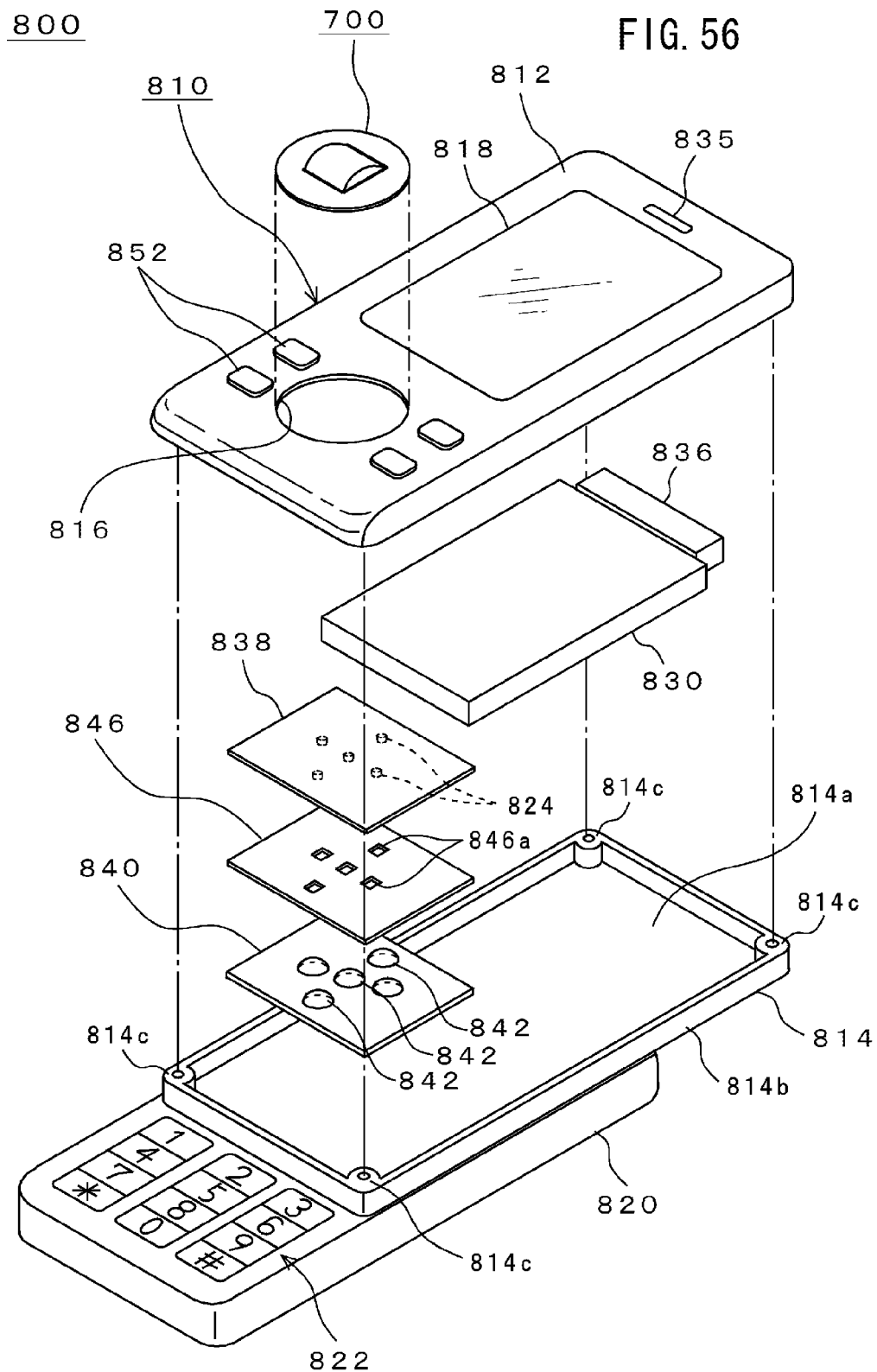
FIG. 56 is an exploded perspective view of the mobile phone 800 showing a configuration thereof.

The following will describe a mobile phone 800 relating to a thirtieth embodiment of the present invention. FIG. 54 shows a configuration of the mobile phone 800. FIG. 55 shows an internal configuration of the mobile phone 800. FIG. 56 shows a structure of the mobile phone 800. In the following FIG. 54 to FIG. 56, the short side direction of an upper housing 810 and a lower housing 820 is made as "X" (right/left) direction, the long side direction thereof is made as "Y" (up/down) directions, the direction perpendicular to the "X" and "Y" directions is made as "Z" direction. Also, in FIG. 55, the upper housing 810 is simplified and shown in the drawing for convenience.

The mobile phone 800 includes the upper housing 810, the lower housing 820 and an input device 850. The upper housing 810 and the lower housing 820 are coupled slidably relatively along the long side direction of the upper housing 810 and the lower housing 820 as shown in FIG. 54, and constitute a so-called slide type mobile phone terminal.

The upper housing 810 contains, as shown in FIG. 56, a front cover 812 and a front case 814. The front case 814 includes a bottom plate 814a and a wall portion 814b which stands at a circumferential edge portion of this bottom plate 814a, and has a box shape in which the upper surface thereof is opened. Fixed portions 814c each for fixing the front cover 812 are provided at corner portions of the front case 814. Electronic parts such as circuit board 840, which will be mentioned later, are housed in the front case 814.

The front cover 812 is a lid body formed by an insert mold, and is attached to the front case 814 through the fixed portions 814c of the front case 814 and fixed. For example, material of a polycarbonate (PC), an acrylonitrile-butadiene-styrene (ABS), a PC+ABS, a polyethylene terephthalate (PET), a polyethersulfone (PES), a poly lactic acid (PLA), a polyamide (PA), an acrylic resin (PMMA) or the like is used for a material of the upper housing 810 suitably.

A transparent panel 818 is mounted on a front surface of the front cover 812. The transparent panel 818 is constituted by a transparent material of, for example, an acrylic resin (PMMA) or the like. An aperture 835 for outputting the voice generated from a receiver 836, which will be mentioned later, is provided on an upper side of the transparent panel 818.

The input device 850, as shown in FIG. 55, includes an operation unit 860, a sensor 846, a circuit board 840 and a dome switch 842. The operation unit 860 is provided on the front surface of the front cover 812 at a region lower than the transparent panel 818, and includes a key-top 700 and operation buttons 852 (see FIG. 54). The key-top 700 is mounted detachably on a front surface of the silicon rubber 838, which will be mentioned later, by an attachment member 826 through an opening portion 816 formed on the front cover 812. For example, an adhesive tape coated both sides or the like is used for the attachment member 826. Thus, it is possible to change (exchange) key-top 700 in response to application or the user's taste.

Figure 57A:
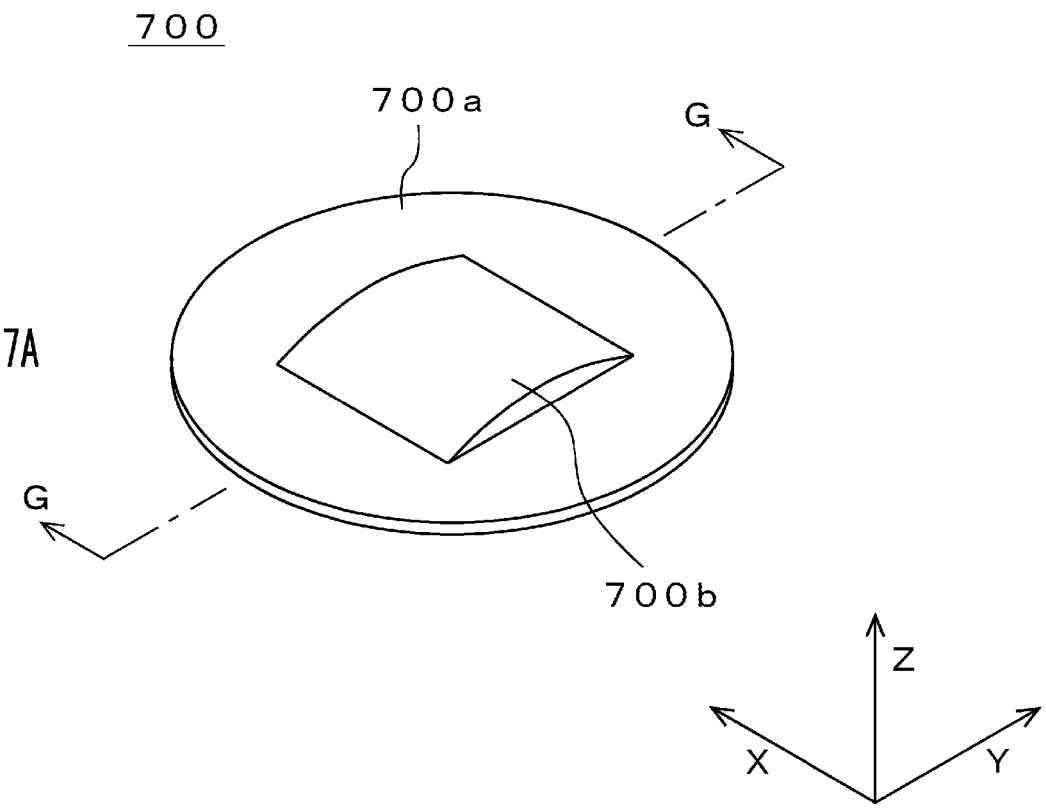
FIG. 57A is a perspective view of a key-top 700 showing a configuration thereof and FIG. 57B is a cross-section diagram thereof.
Figure 57B:
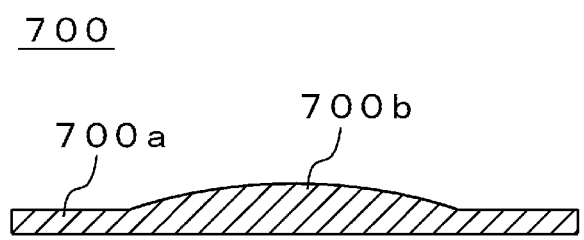

FIG. 57A shows a configuration of the key-top 700 and FIG. 57B is a cross-section diagram along the G-G line thereof. The key-top 700, for example, is a type corresponding to a jog mode, and contains a key main body 700a and a jog portion 700b. For example, a PC (polycarbonate) resin, a PC+ABS resin or the like is used for material of the key-top 700.

The key main body 700a forms a disk shape having about the same diameter as a diameter of the opening portion 816 and on the rear surface thereof, there is pasted the attachment member 826 (see FIG. 56) for attaching the key-top 700 on the upper housing 810. The jog portion 700b is protrudingly provided in a half cylindrical shape at the center portion of the key main body 700a, and is mounted on the key main body 700a such that the circumferential direction of the curved surface thereof becomes parallel with the upward and downward directions (Y direction). It is possible for the user to move a cursor to the up/down and right/left by slide-operating the curved surface of the jog portion 700b along the upward and downward directions. Thus, such an operation feeling as to operate a JOG dial artificially is obtained. Also, a cursor is moved by slide-operating a front surface of the key main body 700a, and it is possible also to move a cursor in the up/down and right/left directions by pushing-down a position of the front surface of the key main body 700a corresponding to the up/down and right/left directions.

Return to FIG. 54, the operation buttons 852 are disposed at a peripheral portion of the key-top 700, and contain a mail button by which a mail is created and transmitted/received, a menu button by which a menu screen is displayed, an internet connection button by which internet is connected and the like.

The circuit board 840 is housed in the upper housing 810, and print wiring, not shown, is formed on the main surface of the circuit board 840. Plural dome switches 842 are respectively mounted on the circuit board 840 as shown in FIG. 55, and contains a switch portion 842a and a cover member 842b for covering this. The switch portion 842a is composed of an electrically conductive member including elasticity and the cover member 842b is composed of an insulation member. The plural dome switches 842 are arranged at the positions (five places) corresponding to a center portion and the up/down and right/left directions of the key-top 700 respectively.

The sensor 846 is a sensor of an electrostatic capacitance system, and is constituted by a sheet shaped member including flexibility. The sensor 846 is pasted on a rear surface of the silicon rubber 838, and detects the position detection information D1 which is inputted by a slide operation of the key-top 700 of the user through the silicon rubber 838. The sensor 846 has opening portions 846a (see FIG. 56) for allowing pusher pieces 824, which will be mentioned later, to be inserted therethrough.

The silicon rubber 838 is inserted between the sensor 846 and the rear surface of the key-top 700. On the rear surface side of silicon rubber 838, there are mounted a plurality of pusher pieces 824 for depressing the dome switches 842 in response to the pushdown operation in the Z direction of the key-top 700 of the user. The pusher pieces 824 are provided at four places of the position corresponding to the up/down and right/left directions of the key-top 700 respectively and at one place of the position corresponding to the center thereof, and are protruded from the rear surface of the sensor 846 through the opening portions 846a formed in the sensor 846.

In the inside of the upper housing 810 constituted by the front cover 812 and the front case 814, there are housed a display unit 830 and a receiver 836 and the like in addition to the electronic parts constituting the input device 850. The display unit 830 is provided at a position facing the transparent panel 818 and for example, is constituted by a liquid crystal display, an organic electro luminescence (EL) display or the like. The receiver 836 is disposed at a position corresponding to the aperture 835, and outputs voice based on an audio signal supplied from a picture and audio processing unit 44 (see FIG. 49).

A key operation unit 822 including a [numerals] key, a symbol [#] key, a symbol [*] key and the like is provided in lower housing 820, as shown in FIG. 54. The key operation unit 822 is constituted so as to be exposed when the mobile phone 800 becomes an open state by relatively sliding the lower housing 820 with respect to the upper housing 810.

Modified Example 1 of Key-Top

Figure 58A:
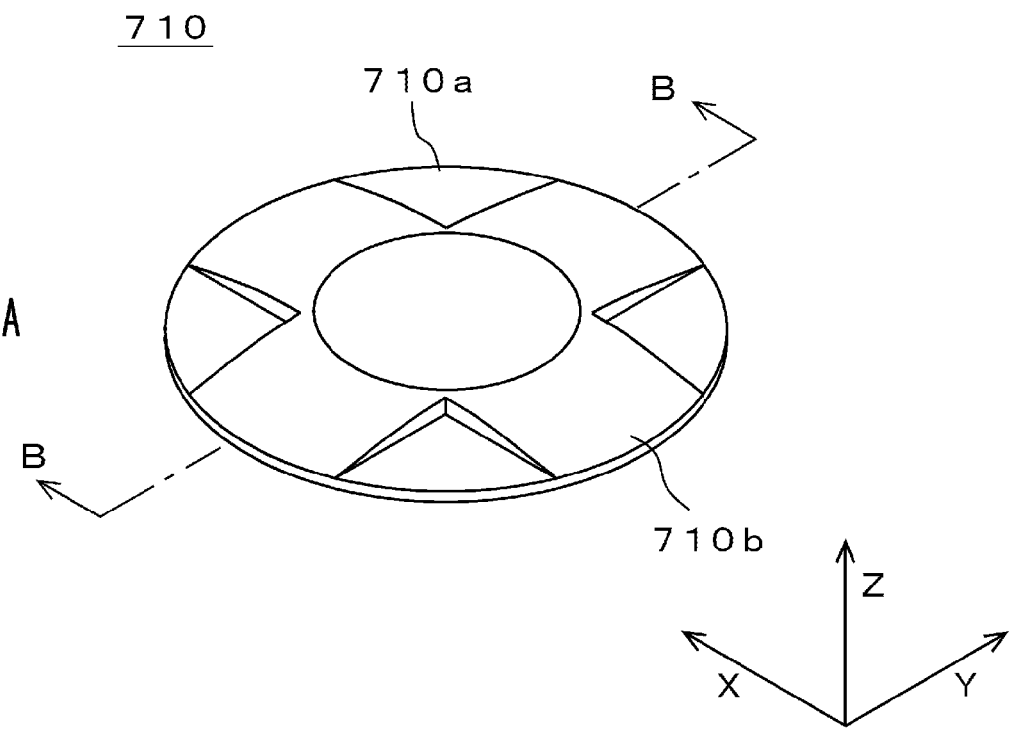
FIG. 58A is a perspective view of a key-top 710 as a modified example 1 showing a configuration thereof and FIG. 58B is a cross-section diagram thereof.
Figure 58B:
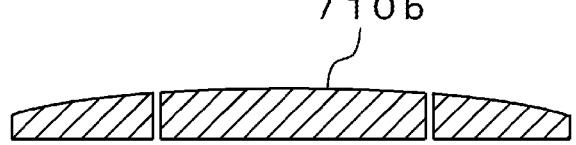

FIG. 58A shows a structure of a key-top 710 and FIG. 58B is a cross-section diagram along the B-B line thereof. The key-top 710, for example, is a type corresponding to a multi-cursoring mode, and includes a key main body 710a formed in a disk shape and a direction key 710b. The direction key 710b forms a cross shape corresponding to the up/down and right/left directions, and is formed so as to become thicker in a spherical shape from the front surface of the key main body 710a. Thus, it is possible to move a cursor on screen by slide-operating along the direction of the direction key 710b and by pushdown-operating a position corresponding to the up/down and right/left directions. Also, it is possible to determine a selected item by pushdown-operating the center portion of the direction key 710b.

Modified Example 2 of Key-Top

FIG. 59A shows a structure of a key-top 720 and FIG. 59B is a cross-section diagram along the C-C line thereof. The key-top 720, for example, is a type corresponding to a trackball mode, and includes a key main body 720a formed in a disk shape and a global body 720b. The global body 720b is provided by protruding in an approximately hemisphere shape to the center portion of the key main body 720a from the front surface thereof. Thus, it is possible to move a cursor on screen by slide-operating the spherical surface of the global body 720b like a trackball by the user. Also, for example, it is possible to determine a selected item by pushing-down the global body 720b.

Modified Example 3 of Key-Top

Figure 60A:
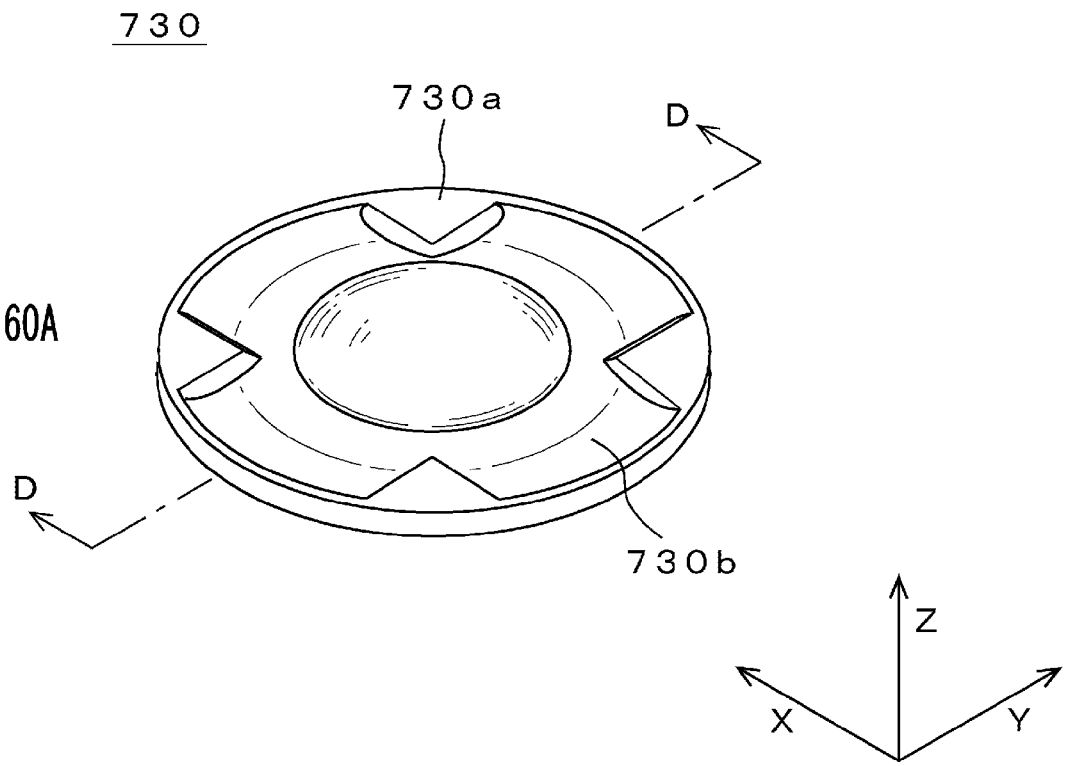
FIG. 60A is a perspective view of a key-top 730 as a modified example 3 showing a configuration thereof and FIG. 60B is a cross-section diagram thereof.
Figure 60B:
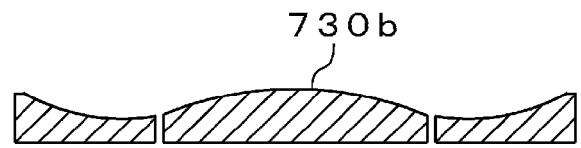

FIG. 60A shows a structure of a key-top 730 and FIG. 60B is a cross-section diagram along the D-D line thereof. The key-top 730, for example, is a type corresponding to a multi-cursoring mode, and includes a key main body 730a formed in a disk shape and a direction key 730b. The direction key 730b is formed such that the center portion thereof becomes thicker in an approximately hemisphere shape and positions corresponding to the up/down and right/left directions are dug-down in an arc shape. Thus, it is possible to move a cursor on screen by slide-operating along the direction of the direction key 730b and by pushdown-operating any one of the positions corresponding to the up/down and right/left directions. Also, it is possible to determine a selected item by pushdown-operating a center portion of the direction key 730b.

Modified Example 4 of Key-Top

Figures 61A, 61B:
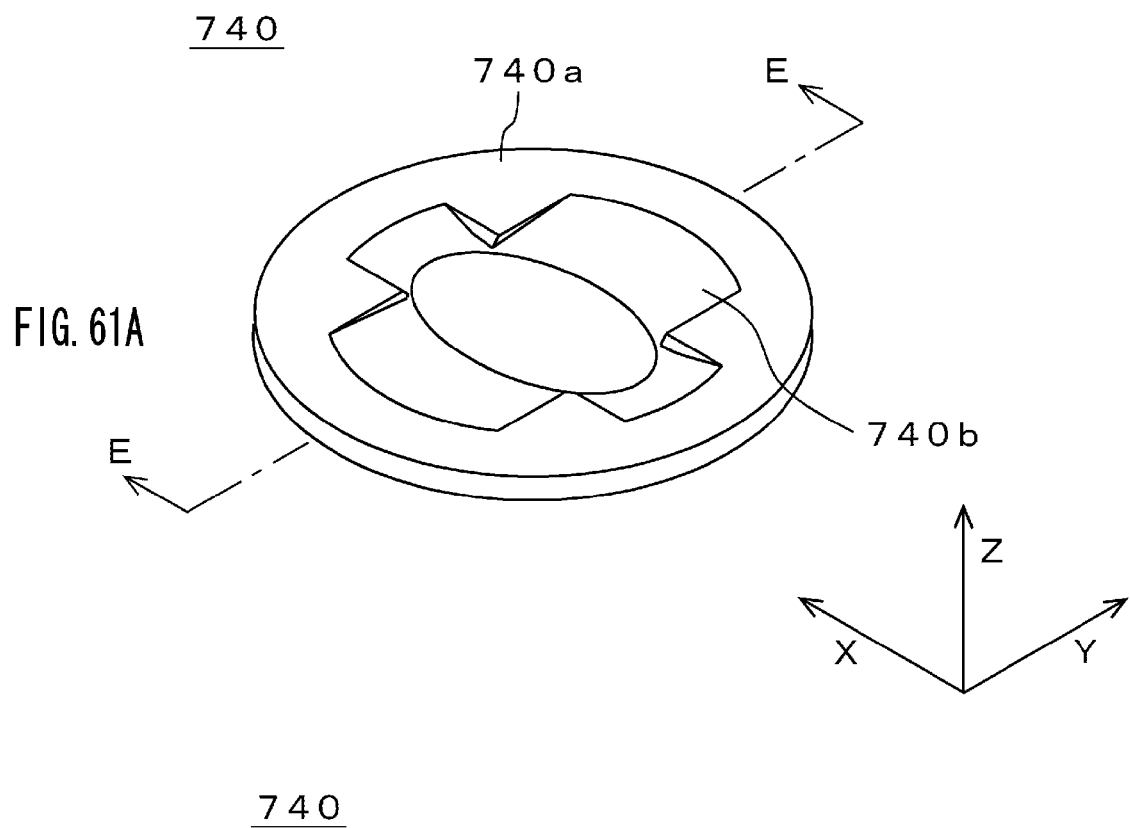
FIG. 61A is a perspective view of a key-top 740 as a modified example 4 showing a configuration thereof and FIG. 61B is a cross-section diagram thereof.

FIG. 61A shows a structure of a key-top 740 and FIG. 61B is a cross-section diagram along the E-E line thereof. The key-top 740, for example, is a type corresponding to a multi-cursoring mode, and includes a key main body 740a formed in a disk shape and a direction key 740b. The direction key 740b is formed so as to be dug-down toward the center from respective positions corresponding to the up/down and right/left directions. Thus, it is possible to move a cursor on screen by slide-operating along the direction of the direction key 740b and by pushdown-operating any one of the positions corresponding to the up/down and right/left directions. Also, it is possible to determine a selected item by pushdown-operating a center portion of the direction key 740b.

Modified Example 5 of Key-Top

Figure 62A:
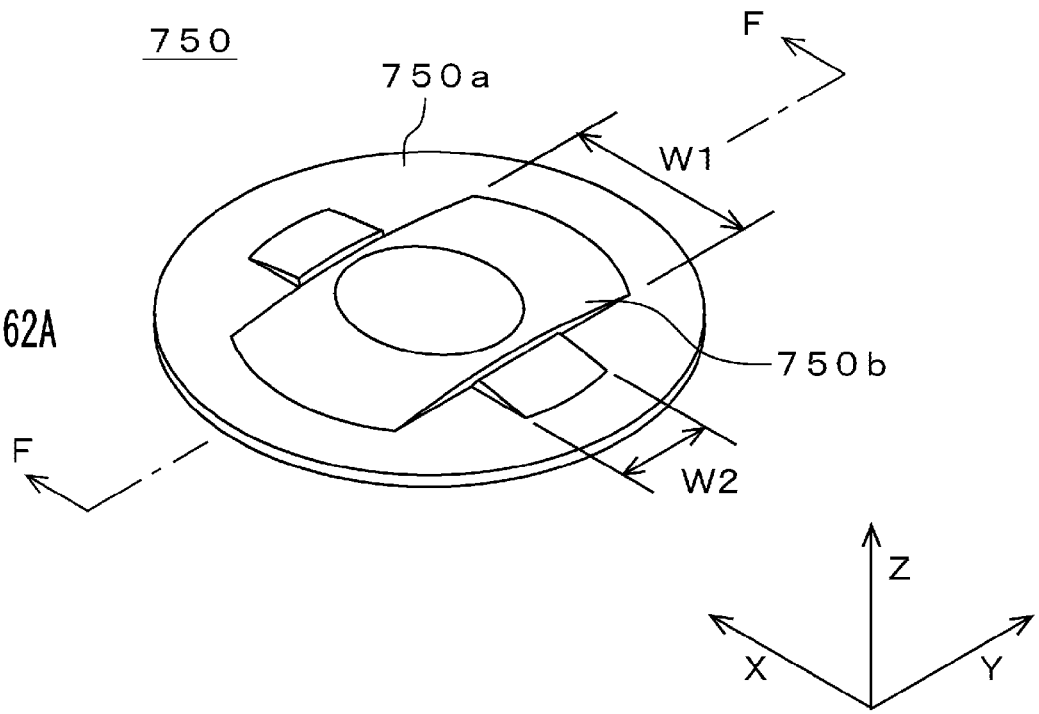
FIG. 62A is a perspective view of a key-top 750 as a modified example 5 showing a configuration thereof and FIG. 62B is a cross-section diagram thereof.
Figure 62B:
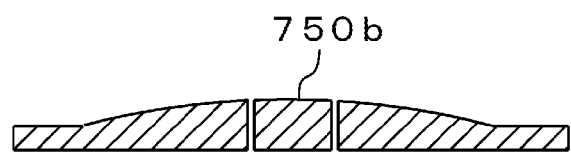

FIG. 62A shows a structure of a key-top 740 and FIG. 62B is a cross-section diagram along the F-F line thereof. The key-top 750, for example, is a part corresponding to a multi-cursoring mode, and includes a key main body 750a formed in a disk shape and a direction key 750b. The direction key 750b forms a cross shape corresponding to the up/down and right/left directions, and is formed so as to become thicker in a spherical shape from the front surface of the key main body 750a. The sliding surface width W1 of the upward and downward directions of the direction key 750b is selected so as to be wider than the sliding surface width W2 of the right/left directions. Thus, it is possible to move a cursor on screen by slide-operating along the direction of the direction key 750b and by pushdown-operating any one of the positions corresponding to the up/down and right/left directions. Also, it is possible to determine a selected item by pushdown-operating a center portion of the direction key 750b.

Modified Example 6 of Key-Top

Figure 63A:
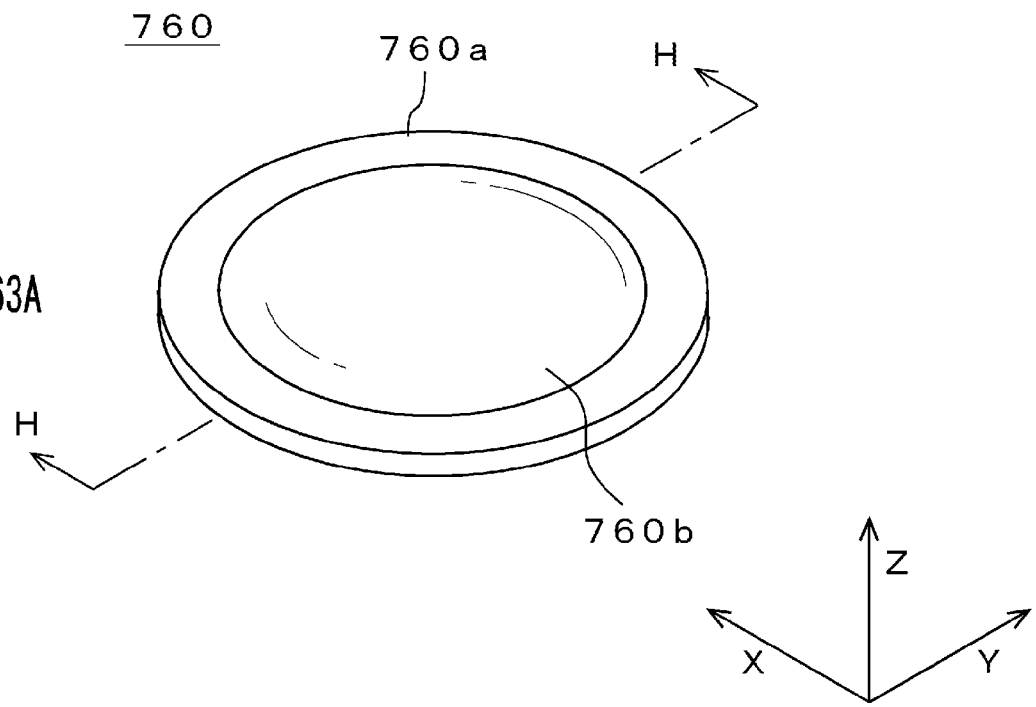
FIG. 63A is a perspective view of a key-top 760 as a modified example 6 showing a configuration thereof and FIG. 63B is a cross-section diagram thereof.
Figure 63B:
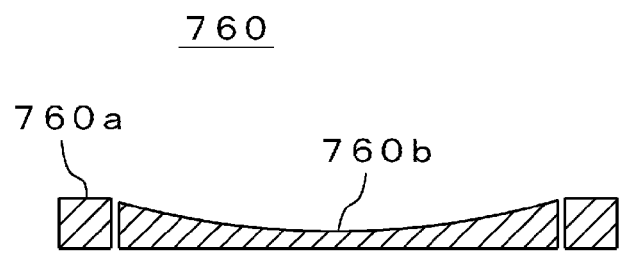

FIG. 63A shows a structure of a key-top 760 and FIG. 63B is a cross-section diagram along the H-H line thereof. The key-top 760, for example, is a type corresponding to a multi-cursoring mode, and includes a key main body 760a and a direction key 760b. The direction key 760b is formed so as to become thinner in an approximately hemisphere shape from a circumferential edge portion of the key main body 760a. Thus, it is possible to move a cursor on screen by slide-operating along the direction of the direction key 760b and by pushdown-operating any one of the positions corresponding to the up/down and right/left directions. Also, it is possible to determine a selected item by pushdown-operating a center portion of the direction key 760b.

Embodiment 31

Figure 64:
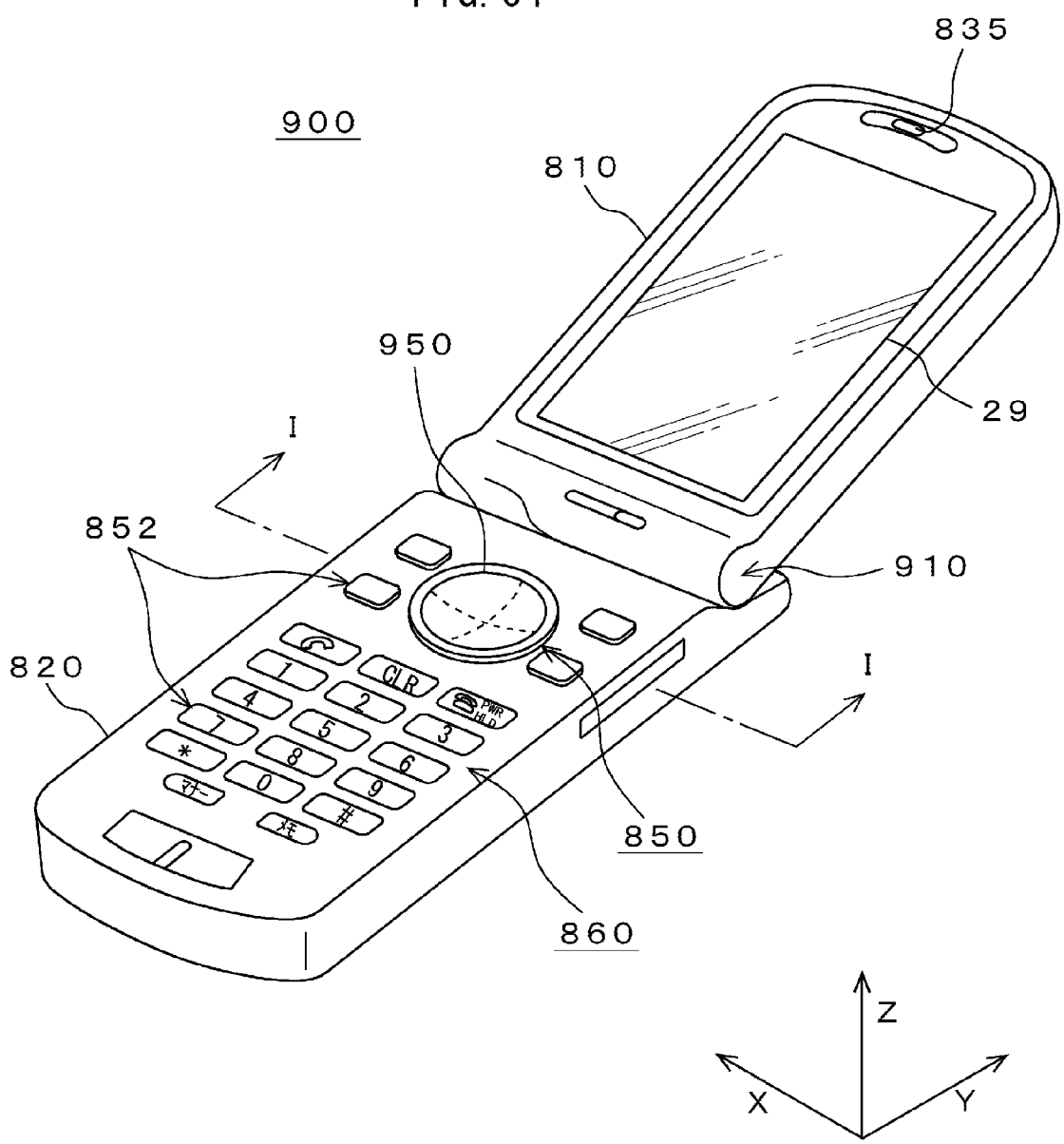
FIG. 64 is a perspective view of a mobile phone 900 as a thirty-first embodiment showing a configuration thereof.
Figure 65:
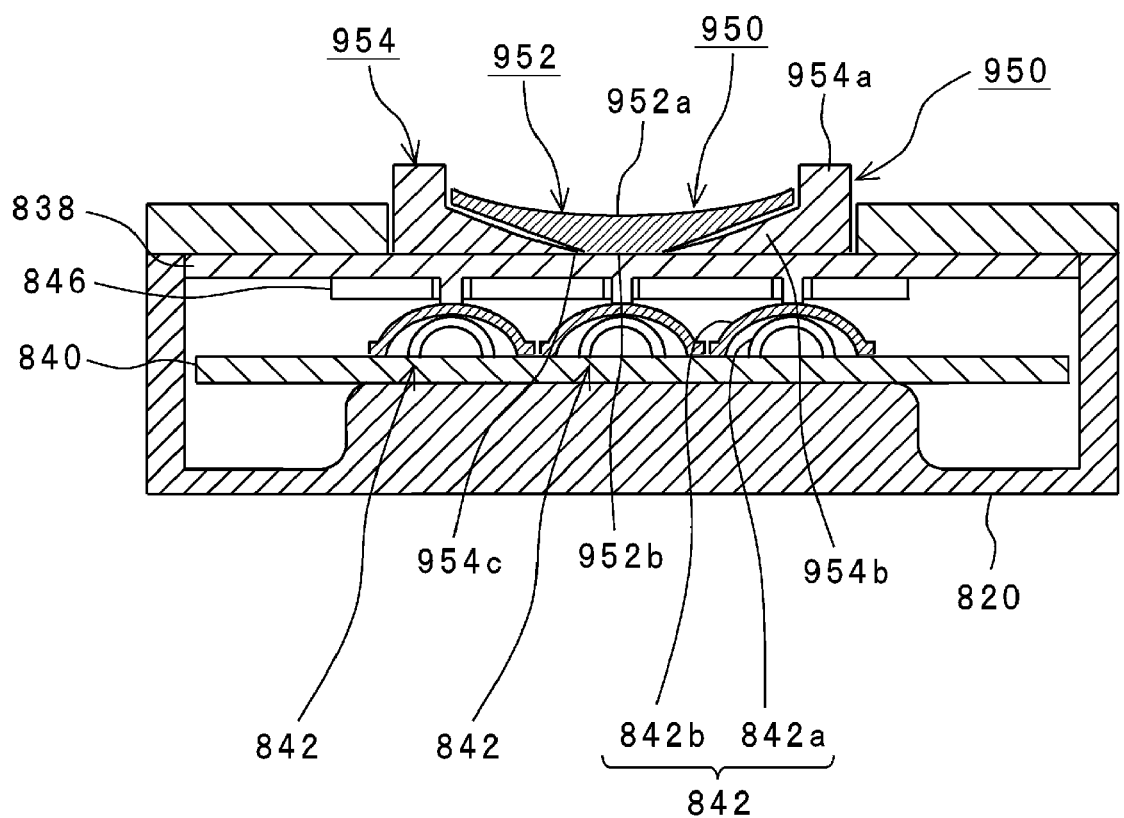
FIG. 65 is a cross-section diagram taken along an I-I line of the mobile phone 900 shown in FIG. 64.
Figure 66:
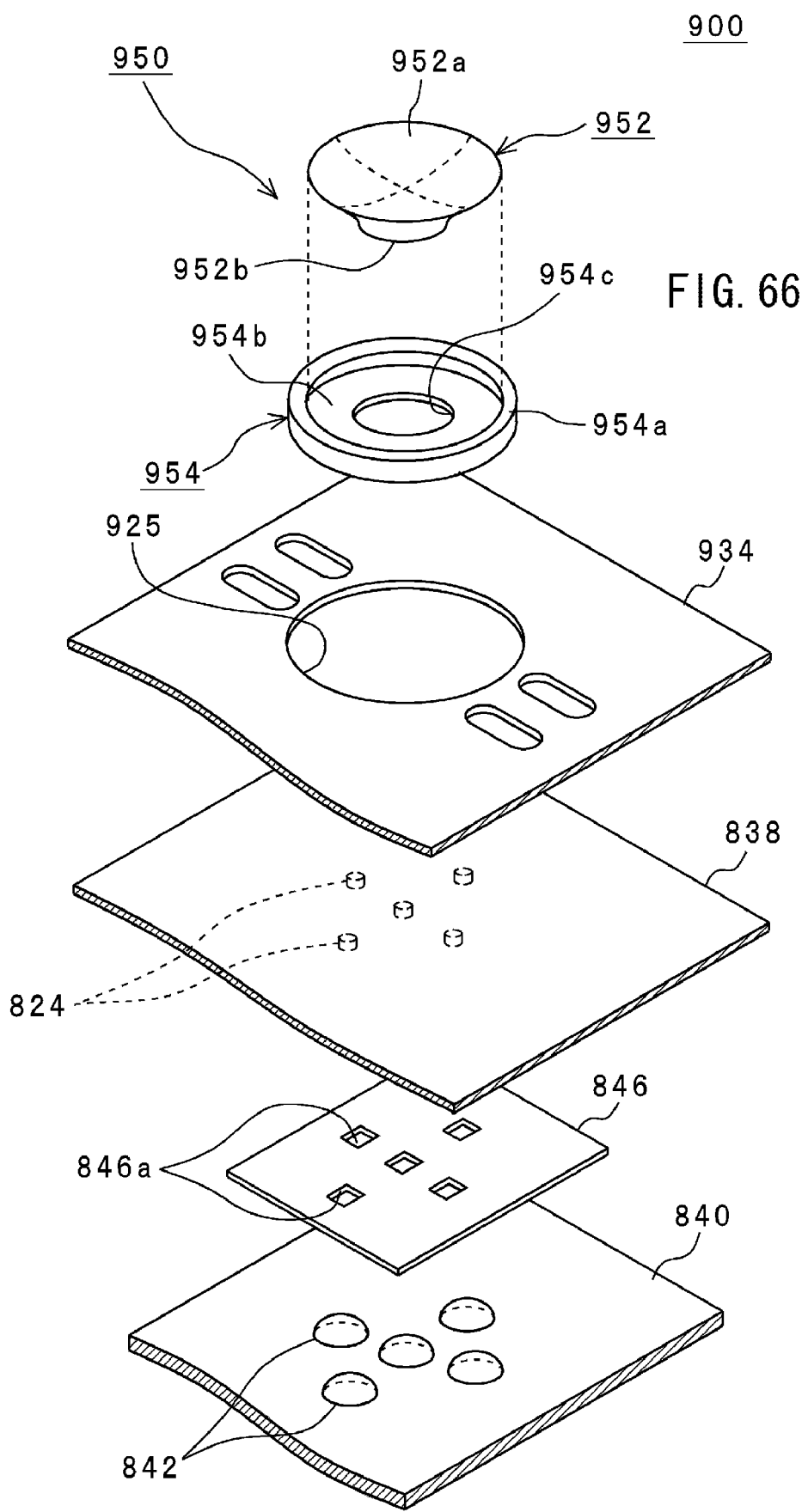
FIG. 66 is an exploded perspective view of the mobile phone 900 showing a configuration thereof.

The following will describe a mobile phone 900 relating to a thirty-first embodiment of the present invention. It should be noted that, the same numeral is assigned with respect to a configuration common to the mobile phone 800 of the thirtieth embodiment, and the detailed explanation will be omitted. FIG. 64 shows a configuration of a mobile phone 900. FIG. 65 shows an internal configuration of the mobile phone 900. FIG. 66 shows a structure of the mobile phone 900.

The mobile phone 900 in which an upper housing 810 and a lower housing 820 are coupled freely rotatably through a hinge portion 910 is a mobile terminal of a so-called folding mechanism. A display unit 29 and an aperture 835 are provided in the main surface of the upper housing 810. An operation unit 860 is provided in the main surface of the lower housing 820. The operation unit 860 contains a key-top 950 and a plurality of operation buttons 852, and the operation buttons 852 include a mail button, a power supply button, a plurality of number buttons and the like.

The key-top 950, as shown in FIG. 66, is mounted on a silicon rubber 838 detachably by an attachment member, not shown, through an opening portion 925 formed in an appearance sheet 934 which constitutes one example of the lower housing 820. The key-top 950 contains an inner key-top 952 and an outer key-top 954, and is integrated by fitting the inner key-top 952 into an inner circumference of the outer key-top 954. The inner key-top 952 forms an approximately disk shape and the upper surface thereof forms a concave operation surface 952a curved in an approximately hemisphere (bowl) shape. A rear surface of the inside key-top 952 is inclined in an approximately reverse conical shape and the lower end surface thereof forms a press portion 952b for turning each dome switch 842 on.

The outer key-top 954 contains an operation key 954a for executing the operation of the up/down and right/left directions and a support portion 954b for supporting the inner key-top 952. The operation key 954a is a ring shaped (cylinder) body formed so as to be along the circumferential edge of the inner key-top 952, and positions corresponding to the up/down and right/left direction of the upper surface thereof function as a direction key. The support portion 954b is inclined in a reverse conical shape corresponding to a rear surface of the inner key-top 952 from the inner circumferential surface of the operation key 954a, and has an opening portion 954c for exposing the press portion 952b of the inner key-top 952 at the center portion thereof. The dome switches 842 are respectively arranged at the positions corresponding to the up/down and right/left directions of the circumferential direction of the operation key 954a and the press portion 952b (a center portion of the inner key-top 952) (see FIG. 67).

Such a configuration allows the sensor 864 to detect position detection information D1 of an operation body when a user slide-operates the concave operation surface 952a of the inner key-top 952 in the up/down and right/left directions so that a cursor on screen is moved in the up/down and right/left directions. Also, when the user pushdown-operates the center portion of the inside key-top 952, the dome switch 842 at the center is turned on through the press portion 952b, and a selected item on screen is determined. Also, when the user pushdown-operates any one of the up/down and right/left positions of the operation key 954a of the outer key-top 954, the dome switch 842 corresponding to the pushdown direction of the up/down and right/left directions is turned on so that a cursor on screen is moved in the up/down and right/left directions.

<Sales Type of Key-Top>

Figure 67:
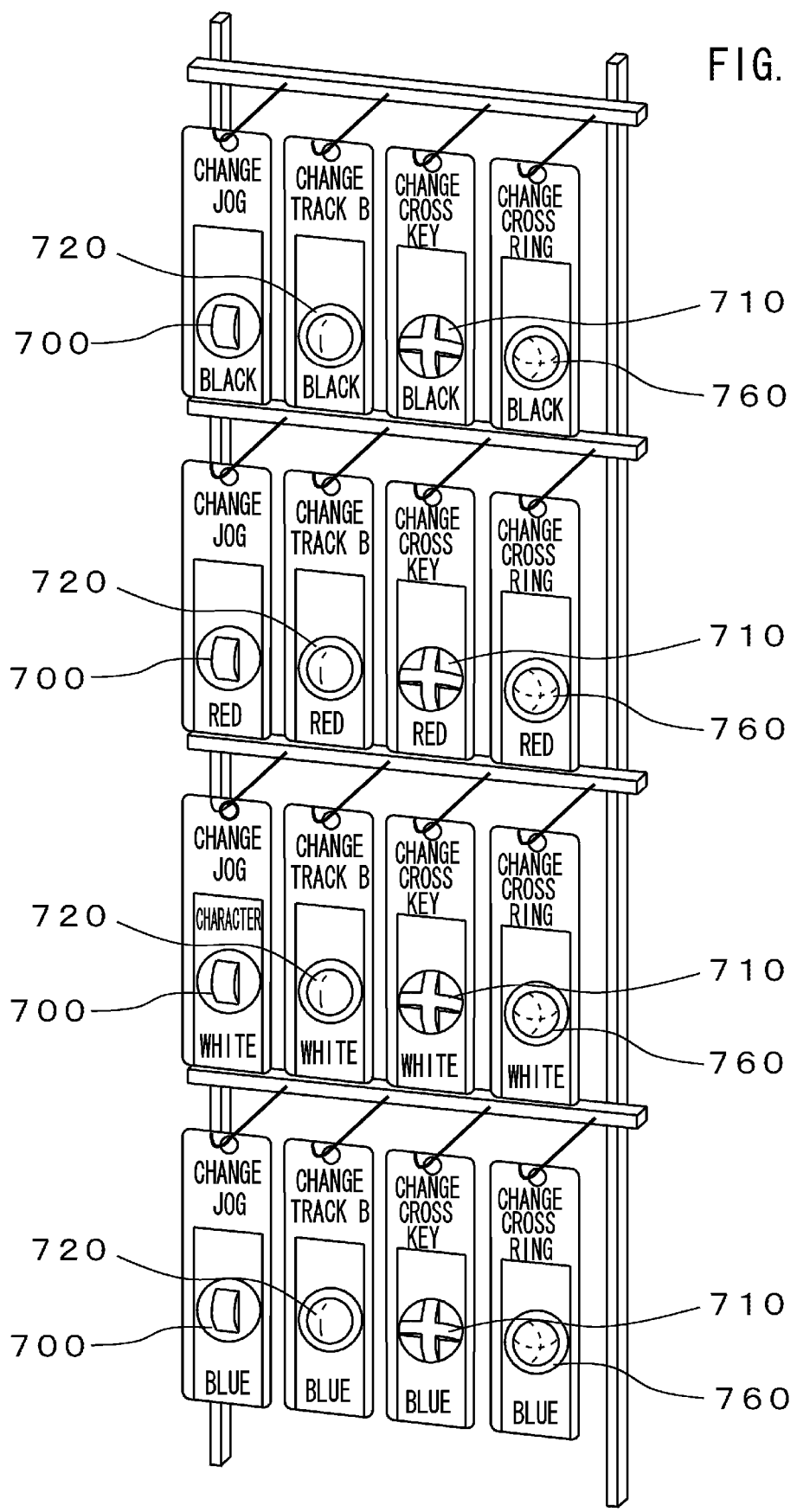
FIG. 67 is a diagram showing a sales type example of key-tops.

FIG. 67 shows sales types of changeable key-tops 700 to 760, 950. In the following example, sales example of the key-tops 700, 710, 720, 760 are shown. In a carrier-shop, a general shop or the like, for example, respective key-tops 700, 710, 720, 760 of types corresponding to a JOG dial mode, a trackball mode and a multi-cursoring mode (cross key, cross ring) are packaged and sold. The key-tops 700, 710, 720, 760 are developed every each mode, for example, with color variation of four colors of a black, a red, a white and a blue. Thus, it is possible for the user, in the shop or the like, to purchase the key-tops 700, 710, 720, 760 corresponding to application of high use-frequency or the key-tops 700, 710, 720, 760 of shapes or colors met a preference of myself readily. It is also possible for the key-tops 700, 710, 720, 760 to be printed with a character or the like.

As explained above, in the present embodiment, the key-tops 700 to 760, 950 are detachably attached to the upper housing 810, so that it is possible to select or exchange the key-tops 700 to 760, 950 freely depending on application for use or the user's taste. For example, operability is different every application, so that there is a case in which a jog operation is suitable or a cursor operation is suitable. Also, there may be a case where a specified application is used in a lot by the user. In such a case, it is possible to attempt improvement of the operability of application by exchanging the key-tops 700 to 760, 950 conformed with the application.

Also, in-between users, there is a person who prefers a jog operation and also there is a person who prefers a trackball operation, so that in every case, it is possible to exchange the key-tops 700 to 760, 950 conformably with the user's taste, thereby improving the user's satisfaction. Further, as mentioned above, many kinds of the key-tops 700 to 760, 950 are sold in the shop or the like and can be purchased readily, thereby enabling various kinds of operability to be realized readily.

Embodiment 32

The following will describe a mobile phone relating to a thirty-second embodiment of the present invention. In the present embodiment, it will be explained by using the mobile phone 800 explained in the embodiment 30. The mobile phone 800 of the present embodiment has operation modes for adjusting the scroll amount of image on screen in response to a sliding speed and acceleration of the key-top 700 on an occasion of its slide operation. For the operation modes, for example, a multi-cursoring mode, a jog mode and a trackball mode are included.

Here, the multi-cursoring mode is an operation mode by which a cursor on screen is moved by a speed and the amount of movement in response to the slide operation when an operation body slide-operates it. The jog mode is an operation mode for providing the artificial operation feeling similar to ones obtained when a jog (rotation body) is rotated by a finger, by moving a cursor on screen in response to a speed or acceleration of an operation body when the operation surface of the key-top 700 is slide-operated. The trackball mode is an operation mode for providing the artificial operation feeling similar to ones obtained when a global body is rotated by a finger, by moving a cursor on screen in response to a speed or acceleration of an operation body when the operation surface of the key-top 700 is slide-operated. It is possible for the jog mode and the trackball mode to be applied to, for example, a case in which application of a telephone directory, a music title list or the like is operated.

The following will describe one example of the operation of the mobile phone 800 when the scroll amount of image in each operation mode is calculated. FIG. 68 shows an operation of the mobile phone 800 when the scroll amount of image in each operation mode is calculated.

In step S100, a CPU 32 judges whether or not a predetermined application is selected on a menu screen displayed on the display unit 29 of the mobile phone 800. On the menu screen, for example, icons corresponding to applications of a mail, a telephone directory, an internet connected service and the like are displayed. If the CPU 32 judged that an icon corresponding to any one of applications displayed on the menu screen is selected by the user, the operation shifts to step S110 where a display changes to the operation screen corresponding to each selected application from the menu screen.

In the step S110, the CPU 32 judges which operation mode the application selected by the user corresponds to. The CPU 32 shifts the operation to step S120 if an operation of the application selected by the user corresponds to a multi-cursoring mode. Also, the CPU 32 shifts the operation to step S140 if an operation of the application selected by the user corresponds to a jog mode. Also, the CPU 32 shifts the operation to step S170 if an operation of the application selected by the user corresponds to a trackball mode.

First, it will be explained with respect to a case in which application corresponding to the multi-cursoring mode is selected. In step S120, the CPU 32 acquires position detection information D1 when the operation surface of the key-top 700 is slide-operated by the user, and the operation shift to step S130. The CPU 32 acquires, as the position detection information D1, position detection information (Xt, Xt+1) of the X coordinate and position detection information (Yt, Yt+1) of the Y coordinate in the time point "t" and the time point "t+1", respectively, of the operation body. Here, the term, "t" indicates a sampling cycle when the position detection information D1 is detected and for example, is set to be 1 ms. The Xt indicates position detection information D1 of the X coordinate in the time point "t" and the Yt indicates position detection information D1 of the Y coordinate in the time point "t". The Xt+1 indicates position detection information D1 of the X coordinate obtained by a next sampling of the time point "t" and the Yt+1 indicates position detection information D1 of the Y coordinate obtained by a next sampling of the time point "t".

Figure 69:
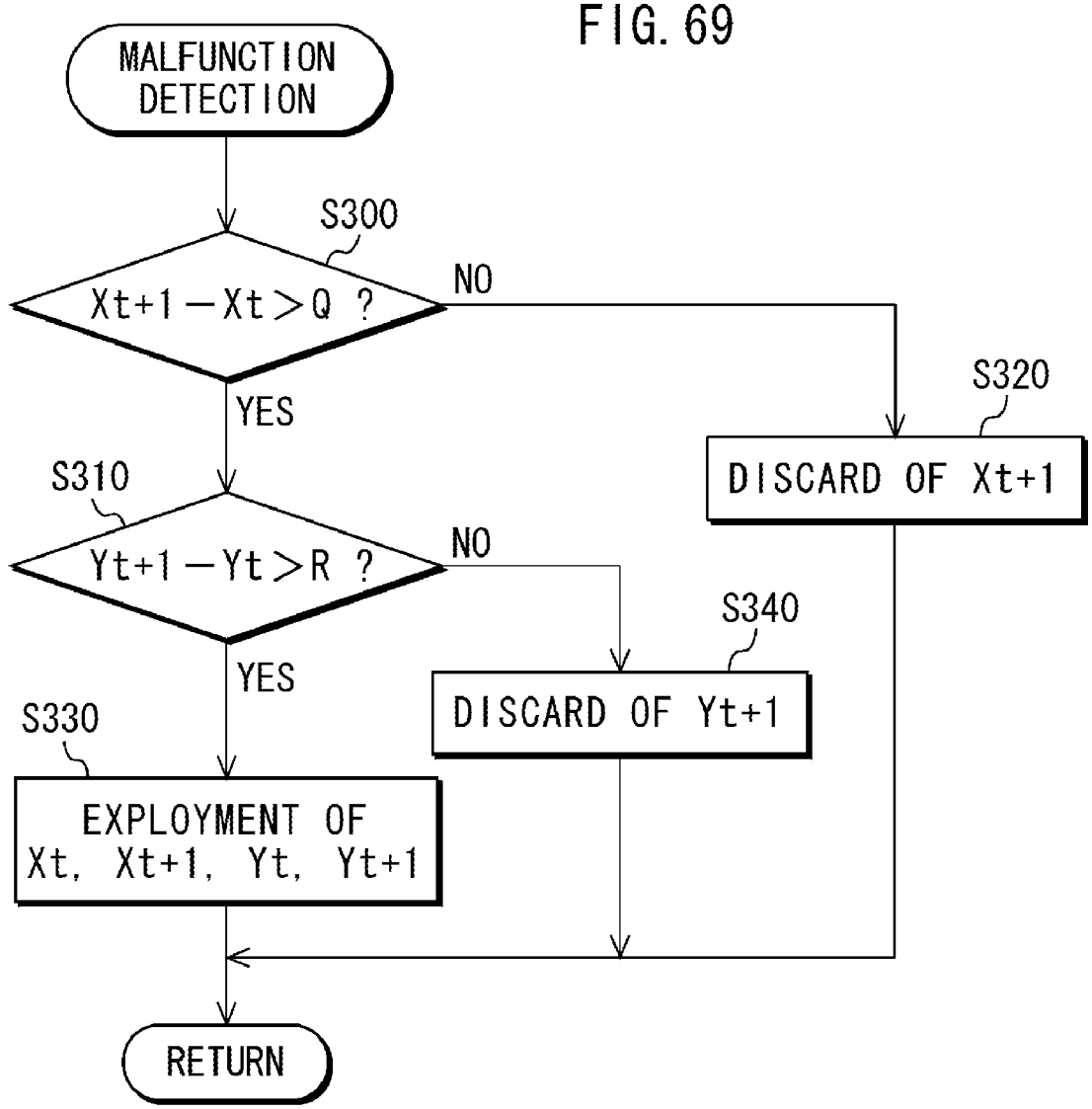
FIG. 69 is a flowchart showing an operation example of malfunction detection.

In step S130, the CPU 32 judges whether or not the detected position detection information D1 is caused by malfunction. FIG. 69 is a flowchart for detecting malfunction. First, in step S300, the CPU 32 judges whether or not the amount of movement (Xt+1−Xt) in the X coordinate of the operation body is larger than a threshold Q. The threshold Q is set to be a value by which, for example, the pushdown operation in case of determining item and a very small amount of movement in case of touching a key-top 700 by mistake other than the slide operation is made as malfunction. In other words, it is set to be such a value which discards input data having not continuity. The operation shifts to step S310 if the CPU 32 judged that the amount of movement (Xt+1−Xt) of the operation body is larger than the threshold Q and the operation shifts to step S320 if the CPU 32 judged that the amount of movement (Xt+1−Xt) of the operation body is not larger than the threshold Q.

In the step S320, the CPU 32 discards the position detection information Xt+1 by judging that the amount of movement (Xt+1−Xt) of the operation body is malfunction. The operation then returns to FIG. 68 and terminates the operation of a series of the malfunction detection.

In step S310, the CPU 32 judges whether or not the amount of movement (Yt+1−yt) in the Y coordinate of the operation body is larger than a threshold R. The threshold R is set to be a value by which, for example, the pushdown operation in case of determining item and a very small amount of movement in case of touching a key-top 700 by mistake other than the slide operation is made as malfunction. The operation shifts to step S330 if the CPU 32 judged that the amount of movement (Yt+1−Yt) of the operation body is larger than the threshold R, and the operation shifts to step S340 if the CPU 32 judged that the amount of movement (Yt+1−Yt) of the operation body is not larger than the threshold R.

In the step S340, the CPU 32 discards the position detection information Yt+1 by judging that the amount of movement (Yt+1−Yt) of the operation body is malfunction. The operation returns to FIG. 68 and the operation of a series of the malfunction detection is terminated.

In the step S330, the CPU 32 employs position detection information Xt, Xt+1, Yt, Yt+1 by judging that the amount of movement (Xt+1−Xt) and the amount of movement (Yt+1−Yt) of the operation body are the slide operation intended by the user. In other words, the movement of a cursor of application screen is controlled based on the amount of movement (Xt+1−Xt) and the amount of movement (Yt+1−Yt) of the operation body. When the operation of a series of the malfunction detection is terminated, the operation returns to the step S130 shown in FIG. 68 and the operation of a series of the malfunction detection is terminated.

Next, it will be explained with respect to a case in which application corresponding to a jog mode is selected. In step S140, the CPU 32 acquires position detection information D1 when the operation surface of the key-top 700 is slide-operated by the user and the operation shifts to step S150. The CPU 32 acquires, for the position detection information D1, position detection information (Xt, Xt+1) of the X coordinate and position detection information (Yt, Yt+1) of the Y coordinate of the operation body in each of the time point "t" and the time point "t+1".

In step S150, the CPU 32 judges whether or not the detected position detection information D1 is caused by malfunction. The malfunction detection is similar as the processing of the step S130 explained in the above-mentioned multi-cursoring mode and step S300 to step S340 shown in FIG. 69, so that the explanation will be omitted. After the malfunction detection is terminated, the operation shifts to step S160.

Figure 70:
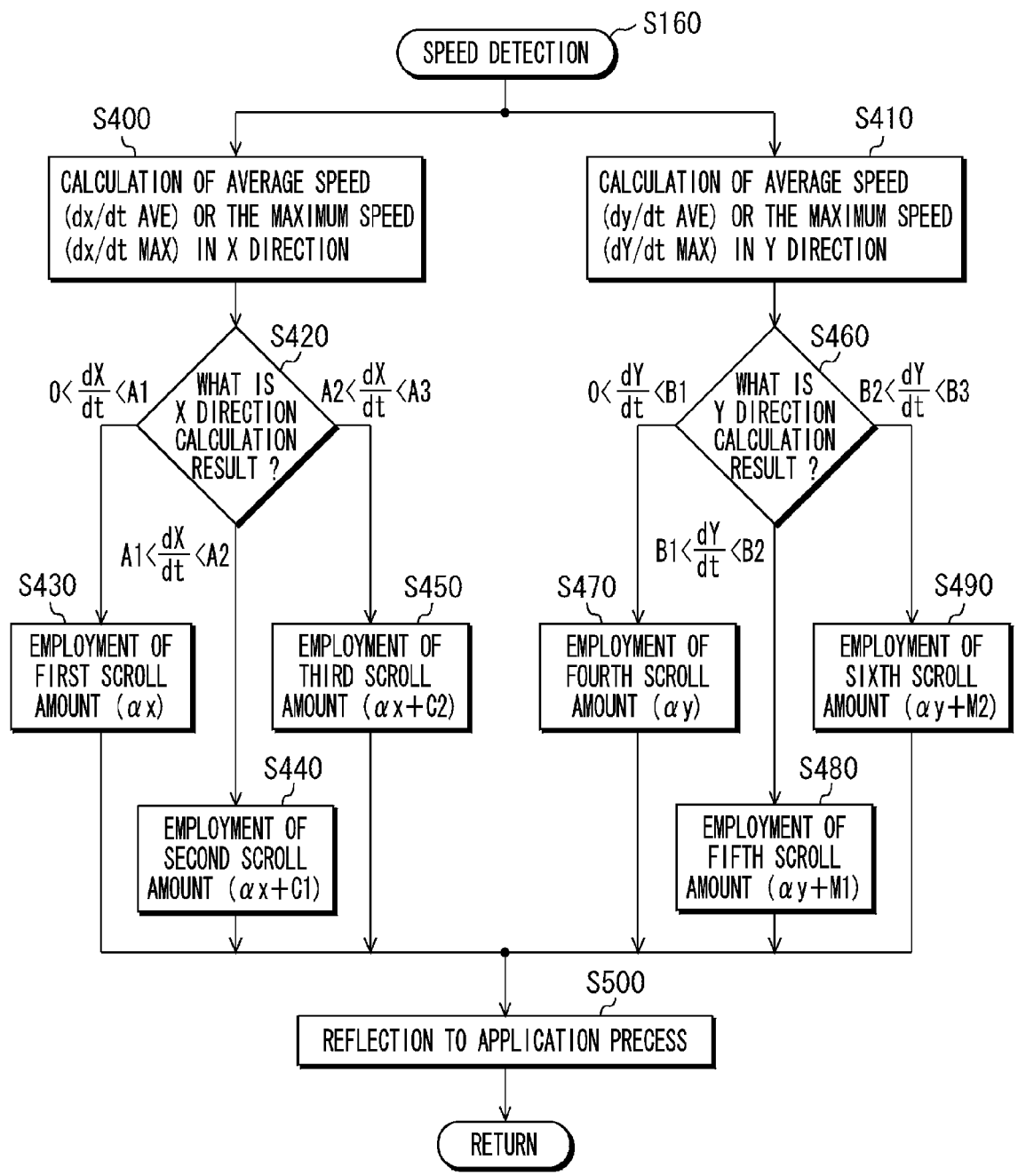
FIG. 70 is a flowchart for calculating amount of scroll in response to the velocity.

In the step S160, the CPU 32 calculates sliding speeds of the operation body in the X direction and the Y direction from position detection information D1 (amount of movement) of the operation body, which has been judged as not to be malfunction. FIG. 70 is a flowchart for calculating the scroll amount in response to the sliding speed of the operation body in the X direction and the Y direction. Here, the term, "dX/dt" indicates a speed (d/dt (Xt+1−Xt)) in the X coordinate and the term, "dY/dt" indicates a speed (d/dt (Yt+1−Yt)) in the Y coordinate.

In step S400, the CPU 32 calculates average speed (dX/dt AVE) or the maximum speed (dX/dt MAX) of the operation body in the x direction from the amount of movement (Xt+1−Xt) of the operation body. Specifically, the CPU 32 calculates a speed of the operation body in X direction at the sampling cycle "t" from the amount of movement (Xt+1−Xt) of the operation body. Then, this speed calculation processing is repeated by a plurality of times in the time point T, and the average speed (dX/dt AVE) is calculated from the sampling speed at each sampling cycle "t" which is obtained. Also, instead of the average speed, it is also allowed to extract the maximum speed (dX/dt MAX) from the speed in each sampling cycle "t".

Similarly, in step S410, the CPU 32 calculates average speed (dY/dt AVE) or the maximum speed (dY/dt MAX) of the operation body in the Y direction from the amount of movement (Yt+1−Yt) of the operation body. The average speed or the like can be calculated by a processing similar to the step S400.

First, it will be explained with respect to a scroll amount calculation processing of the X direction. In step S420, the CPU 32 judges which speed range a speed calculation result of the operation body in the X direction corresponds to. The operation shifts to step S430 if the speed of the operation body in the X direction corresponds to the range of 0<dX/dt<A1. The operation shifts to step S440 if the speed of the operation body in the X direction corresponds to the range of A1<dX/dt<A2. The operation shifts to step S450 if the speed of the operation body in the X direction corresponds to the range of A2<dX/dt<A3. Here, a constant A1 is the standard scroll amount when the general user slide-operates the key-top 700 and respective constants A1, A2, A3 satisfy a relationship of A1<A2<A3.

In step S430, the CPU 32 sets the scroll amount of the image displayed on the screen of the display unit 29 as a first scroll amount $\alpha x$ if the speed of the operation body in the X direction corresponds to the range of 0<dX/dt<A1. The first scroll amount $\alpha x$ is less than the constant A1, so that the scroll amount of the image becomes less than the standard scroll amount.

In step S440, the CPU 32 sets the scroll amount of the screen of the display unit 29 as a second scroll amount if the sliding speed of the operation body in the X direction corresponds to the range of A1<dX/dt<A2. The second scroll amount is calculated by the following equation (1).

$$\text{The second scroll amount} = \text{the first scroll amount } \alpha x + \text{the scroll amount } C1 \quad (1)$$

The scroll amount C1 is the scroll amount in consideration of the imaginative inertia of the key-top 700 when the key-top 700 is slide-operated by a fixed speed. In this manner, when a sliding speed becomes fast as compared with that in the step S430, this sliding speed is reflected to the scroll amount of the image and the scroll amount is changed to the second scroll amount which is larger than the first scroll amount.

In step S450, the CPU 32 sets the scroll amount of the screen of the display unit 29 as a third scroll amount if the speed of the operation body in the X direction corresponds to the range of A2<dX/dt<A3. The third scroll amount is calculated by the following equation (2).

$$\text{The third scroll amount} = \text{the first scroll amount } \alpha x + \text{the scroll amount } C2 \quad (2)$$

The scroll amount C2 is the scroll amount in consideration of the imaginative inertia of the key-top 700 when the key-top 700 is slide-operated by a fixed speed and it is set as a large value than the scroll amount C1. In this manner, when a sliding speed becomes fast as compared with that of the step S440, this sliding speed is reflected to the scroll amount of the image and the scroll amount is changed to the third scroll amount which is larger than the second scroll amount.

Next, it will be explained with respect to a scroll amount calculation processing of the Y direction. In step S460, the CPU 32 judges which speed range a speed calculation result of the operation body in the Y direction corresponds to. The operation shifts to step S470 if the sliding speed of the operation body in the Y direction corresponds to the range of 0<dY/dt<B1. The operation shifts to step S480 if the sliding speed of the operation body in the Y direction corresponds to the range of B1<dY/dt<B2. The operation shifts to step S490 if the sliding speed of the operation body in the Y direction corresponds to the range of B2<dY/dt<B3.

In the step S470, the CPU 32 sets the scroll amount of the image displayed on the screen of the display unit 29 as a fourth scroll amount $\alpha y$ if the sliding speed of the operation body in the Y direction corresponds to the range of 0<dY/dt<B1. The fourth scroll amount $\alpha y$ is less than a constant B1, so that the scroll amount of the image becomes less than the standard scroll amount.

In the step S480, the CPU 32 sets the scroll amount αy of the image of the display unit 29 as a fifth scroll amount if the sliding speed of the operation body in the Y direction corresponds to the range of B1<dY/dt<B2. The fifth scroll amount is calculated by the following equation (3).

The fifth scroll amount=the fourth scroll amount
αy+the scroll amount M1    (3)

The scroll amount M1 is the scroll amount in consideration of the imaginative inertia of the key-top 700 when the key-top 700 is slide-operated by a fixed speed. In this manner, when a sliding speed becomes fast as compared with that of the step S470, this sliding speed is reflected to the scroll amount of the image and the scroll amount is changed to the fifth scroll amount which is larger than the fourth scroll amount.

In the step S490, the CPU 32 sets the scroll amount of the image of the display unit 29 as a sixth scroll amount if the sliding speed of the operation body in the Y direction corresponds to the range of B2<dY/dt<B3. The sixth scroll amount is calculated by the following equation (4).

The sixth scroll amount=the fourth scroll amount
αy+the scroll amount M2    (4)

The scroll amount M2 is the scroll amount in consideration of the imaginative inertia of the key-top 700 when the key-top 700 is slide-operated by a fixed speed and it is set as a large value than the scroll amount M1. In this manner, when a sliding speed becomes fast as compared with that of the step S470, this sliding speed is reflected to the scroll amount of the image and the scroll amount is changed to the sixth scroll amount which is larger than the fifth scroll amount.

In step S500, the CPU 32 executes the processing by reflecting the scroll amount set in the steps S430 to S450 and steps S470 to S490 to each application. For example, when the application is a telephone directory, the telephone directory is scrolled based on each of the first to sixth scroll amounts. Therefore, the more quick the sliding speed of the key-top 700, the more large the scroll amount of the telephone directory.

Next, it will be explained with respect to a case in which application corresponding to a trackball mode is selected. It should be noted that an acceleration calculation processing, which will be mentioned later, is obtained by differentiating the speed calculated by the above-mentioned speed calculation processing, so that the common portion will be simplified and explained.

In step S170, the CPU 32 acquires position detection information D1 when the operation surface of the key-top 700 is slide-operated by the user and the operation shifts to step S180. The CPU 32 acquires, for position detection information D1, position detection information (Xt, Xt+1) of the X coordinate and position detection information (Yt, Yt+1) of the Y coordinate of the operation body in each of the time point "t" and the time point "t+1".

In step S180, the CPU 32 judges whether or not the detected position detection information D1 is caused by malfunction. The judgment of malfunction is executed by the processing similar to the step S130 and the step S300 to the step S340 of FIG. 69 explained in the above-mentioned multi-cursoring mode. After the malfunction detection is terminated, the operation shifts to step S190.

In the step S190, the CPU 32 calculates sliding speeds of the operation body in the Y direction and the Y direction based on the amount of movement of the operation body which has been judged as not to be malfunction. The calculation processing of the sliding speed is executed by the processing similar to the steps S400 to S500 shown in FIG. 70. After the speed calculation processing is terminated, the operation shifts to step S200.

Figure 71:
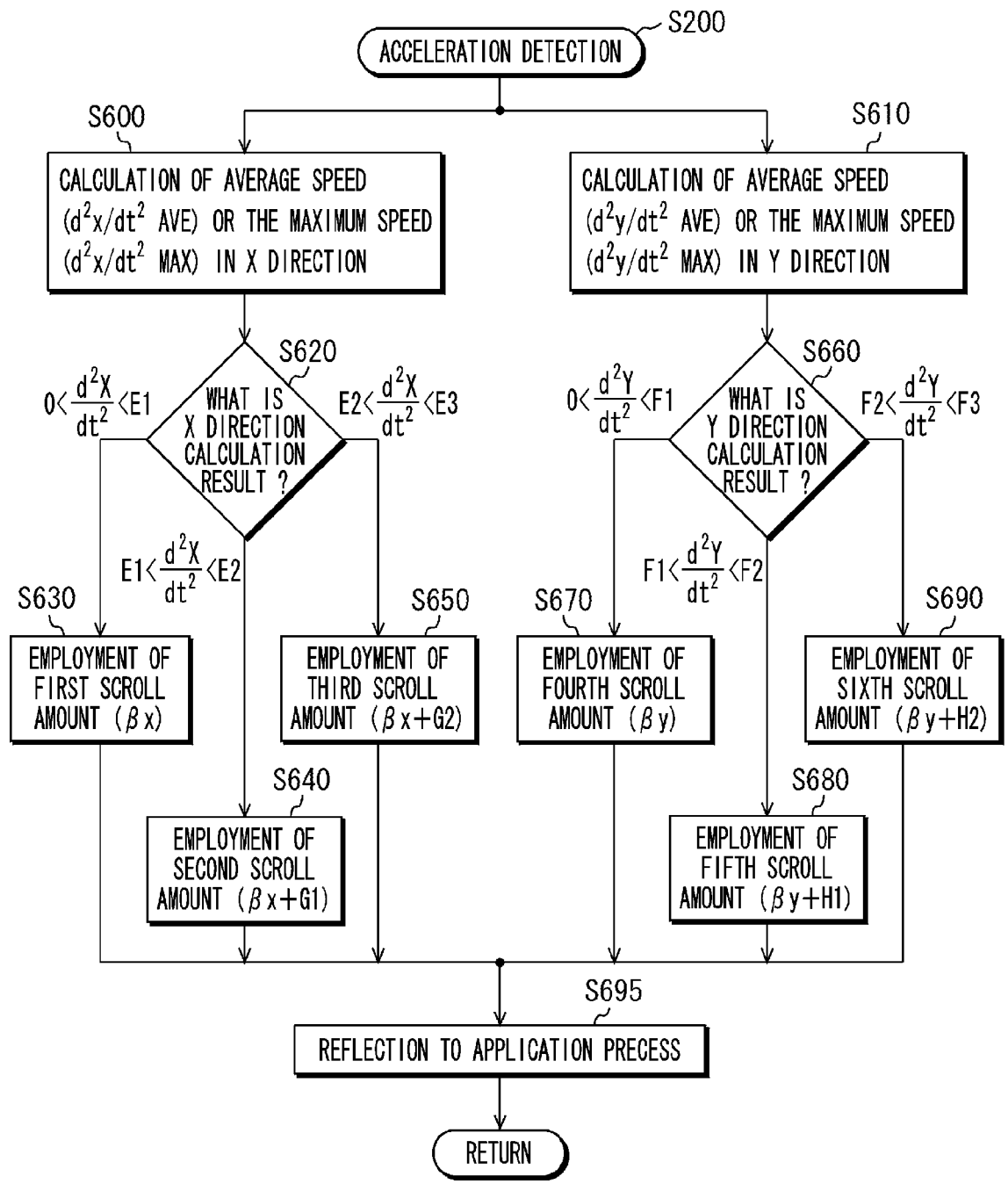
FIG. 71 is a flowchart for calculating amount of scroll in response to the acceleration.

In the step S200, the CPU 32 calculates acceleration of the operation body in the X direction and the Y direction based on the amount of movement of the operation body. FIG. 71 is a flowchart for calculating the scroll amount in response to the acceleration of the operation body in the X direction and the Y direction. Here, the term, "$d^2X/dt^2$" indicates acceleration ($d^2/dt^2$ (Xt+1−Xt)) in the X coordinate and the term, "$d^2Y/dt^2$" indicates acceleration ($d^2/dt^2$ (Yt+1−Yt)) in the Y coordinate.

In step S600, the CPU 32 calculates average acceleration ($d^2X/dt^2$ AVE) or the maximum acceleration ($d^2X/dt^2$ MAX) of the operation body in the X direction based on the amount of movement (Xt+1−Xt) of the operation body. Instead of the average acceleration, it is also allowed to extract the maximum acceleration ($d^2X/dt^2$ MAX) from the acceleration in each sampling cycle "t". It is also allowed for the acceleration to be calculated by using the sliding speed calculated in the above-mentioned steps S400, S410.

Similarly, in step S610, the CPU 32 calculates average acceleration ($d^2Y/dt^2$ AVE) or the maximum acceleration ($d^2Y/dt^2$ MAX) of the operation body in the Y direction based on the amount of movement (Yt+1−Yt) of the operation body.

First, it will be explained with respect to a scroll amount calculation processing of the X direction. In step S620, the CPU 32 judges which acceleration range an acceleration calculation result of the operation body in the X direction corresponds to. The operation shifts to step S630 if the acceleration of the operation body in the X direction corresponds to the range of $0<d^2X/dt^2<E1$. The operation shifts to step S640 if the acceleration of the operation body in the X direction corresponds to the range of $E1<d^2X/dt^2<E2$. The operation shifts to step S650 if the acceleration of the operation body in the X direction corresponds to the range of $E2<d^2X/dt^2<E3$.

Here, the constant E1 is the standard scroll amount when the general user slide-operates the key-top 700 for example, and respective constants E1, E2, E3 satisfy a relationship of E1<E2<E3.

In step S630, the CPU 32 sets the scroll amount of the image displayed on the screen of the display unit 29 as a first scroll amount βx if the acceleration of the operation body in the X direction corresponds to the range of $0<d^2X/dt^2<E1$. The first scroll amount βx is less than the constant E1, so that the scroll amount of the image is made to be less than the standard scroll amount.

In step S640, the CPU 32 sets the scroll amount of the image of the display unit 29 as a second scroll amount if the acceleration of the operation body in the X direction corresponds to the range of $E1<d^2X/dt^2<E2$. The second scroll amount is calculated by the following equation (5).

The second scroll amount=the first scroll amount
βx+the scroll amount G1    (5)

The scroll amount G1 is the scroll amount in consideration of the imaginative inertia of the key-top 700 when the key-top 700 is slide-operated by a fixed acceleration. In this manner, when acceleration becomes large as compared with that of the step S630, this acceleration is reflected to the scroll amount of the image and the scroll amount is changed to the second scroll amount which is larger than the first scroll amount.

In step S650, the CPU 32 sets the scroll amount of the image of the display unit 29 as a third scroll amount if the acceleration of the operation body in the X direction corresponds to the range of $E2<d^2X/dt^2<E3$. The third scroll amount is calculated by the following equation (6).

The third scroll amount=the first scroll amount βx+the scroll amount G2     (6)

The scroll amount G2 is set to be a value which is larger than the scroll amount G1. In this manner, when acceleration becomes large as compared with that of the step S640, this acceleration is reflected to the scroll amount of the image and the scroll amount is changed to the third scroll amount which is larger than the second scroll amount.

Next, it will be explained with respect to a scroll amount calculation processing of the Y direction. In step S660, the CPU 32 judges which acceleration range an acceleration calculation result of the operation body in the Y direction corresponds to. The operation shifts to step S670 if the acceleration of the operation body in the Y direction corresponds to the range of $0<d^2Y/dt^2<F1$. The operation shift to step S680 if the acceleration of the operation body in the Y direction corresponds to the range of $F1<d^2Y/dt^2<F2$. The operation shifts to step S690 if the acceleration of the operation body in the Y direction corresponds to the range of $F2<d^2Y/dt^2<F3$.

In step S670, the CPU 32 sets the scroll amount of the image displayed on the screen of the display unit 29 as a fourth scroll amount βy if the acceleration of the operation body of the Y direction corresponds to the range of $0<d^2Y/dt^2<F1$. The fourth scroll amount αy is less than the constant F1, so that the scroll amount of the image is made to be less than the standard scroll amount.

In step S680, the CPU 32 sets the scroll amount of the image of the display unit 29 as a fifth scroll amount if the acceleration of the operation body in the Y direction corresponds to the range of $F1<d^2Y/dt^2<F2$. The fifth scroll amount is calculated by the following equation (7).

The fifth scroll amount=the fourth scroll amount βy+the scroll amount H1     (7)

The scroll amount H1 is the scroll amount in consideration of the imaginative inertia of the key-top 700 when the key-top 700 is slide-operated by a fixed acceleration. In this manner, when acceleration becomes large as compared with that of the step S670, this acceleration is reflected to the scroll amount of the image and the scroll amount is changed to the fifth scroll amount which is larger than the fourth scroll amount.

In step S690, the CPU 32 sets the scroll amount of the image of the display unit 29 as a sixth scroll amount if the acceleration of the operation body in the Y direction corresponds to the range of $F2<d^2Y/dt^2<F3$. The sixth scroll amount is calculated by the following equation (8).

The sixth scroll amount=the fourth scroll amount βy+the scroll amount H2     (8)

The scroll amount H2 is set to be a value which is larger than the scroll amount H1. In this manner, when acceleration becomes large as compared with that of the step S680, this acceleration is reflected to the scroll amount of the image and the scroll amount is changed to the sixth scroll amount which is larger than the fifth scroll amount.

In step S695, the CPU 32 executes the processing by reflecting the scroll amount set in the steps S630 to S650 and the steps S670 to S690 to each application. For example, when the application is a telephone directory, the telephone directory is scrolled in response to each of the first to sixth scroll amounts. Therefore, the more quick the sliding speed of the key-top 700, the more large the scroll amount of the telephone directory.

As explained above, the mobile phone 800 relating to the present embodiment is the phone in which sliding speed or acceleration of the operation body is calculated on an occasion of the slide operation of the key-top 700 and the calculated sliding speed or acceleration is reflected to the scroll amount of the image. Thus, according to the present embodiment, the more fast the sliding speed or the acceleration, the more large the scroll amount of the image, so that it is possible for the user to obtain the feeling of operating a trackball or a JOG dial artificially at the time of the operation. Consequently, it is possible to provide the input device 850 and the mobile phone 800 which are more excellent in operability and the feeling of attendance. It should be noted that in the embodiment, the scroll amount is calculated by judging which speed range the sliding speed or the like belongs to by providing the threshold, but it is possible also to calculate the scroll amount by multiplying the calculated speed by a certain constant (standard) of the scroll amount.

<Modified Example of Operation Mode Change-Over>

In the above-mentioned thirty-first embodiment, it has been controlled so as to change the operation mode in response to the selected application, but it is not limited to this. For example, it is possible to change the operation mode at a time of change of the key-top and it is possible to change the operation mode in the menu screen.

Figure 72A:
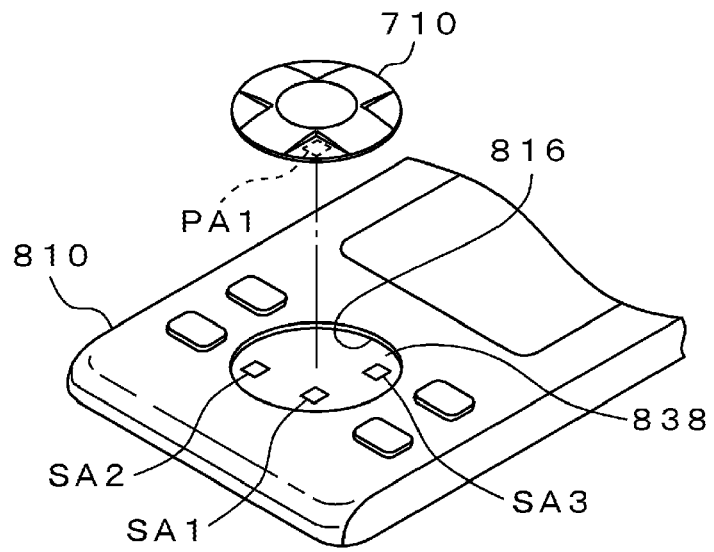
FIGS. 72a to 72C are diagrams each showing an operation mode change example in case of using a key-top.
Figure 72B:
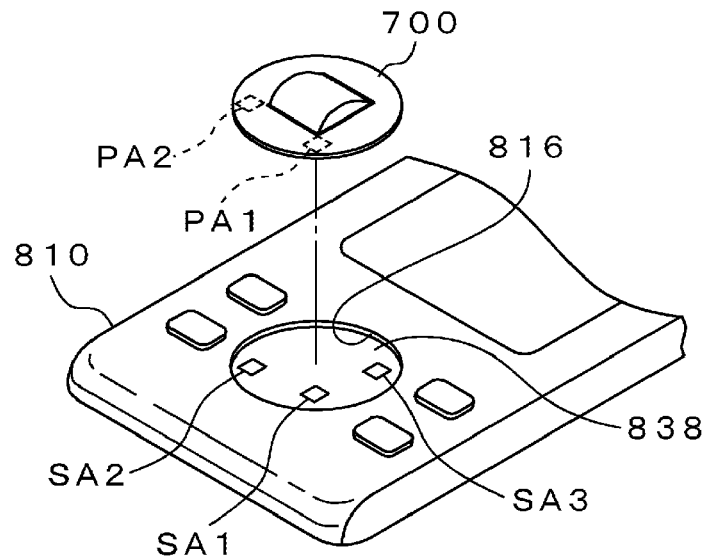
Figure 72C:
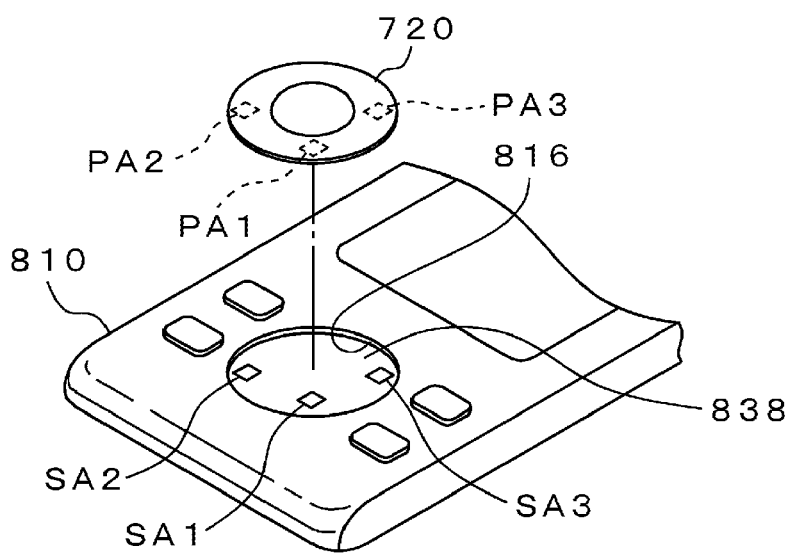

FIG. 72A, FIG. 72B, FIG. 72C show configurations of the key-top and the mobile phone when the operation mode changes in response to the key-top. The following will describe a case where the key-top 700 (see FIG. 54) is changed (exchanged) to, for example, the key-tops 710, 700, 720 by using the mobile phone 800.

As shown in FIGS. 72A to 72C, electrically conductive patterns SA1, SA2, SA3 for judging each operation mode are provided on the front surface of the silicon rubber 838 exposed from the opening portion 816 of the upper housing 810. These electrically conductive patterns SA1, SA2, SA3 are connected to a CPU 32, not shown, (see FIG. 49) and detection information in response to the key-top which can be changed is supplied to the CPU 32.

First, it will be explained with respect to a case in which the key-top 700 is changed to the key-top 710 corresponding to a multi-cursoring mode. As shown in FIG. 72A, an electrically conductive pattern PA1 is pasted on a position of a rear surface of the key-top 710, which faces the electrically conductive pattern SA1 of the upper housing 810. When the key-top 710 is attached to the upper housing 810 at a time of change, electrostatic capacitance, for example, is changed by contacting the electrically conductive pattern PA1 and the electrically conductive pattern SA1. In the CPU 32, it is judged that the key-top attached to the upper housing 810 is a type corresponding to a multi-cursoring mode by detecting the electrostatic capacitance of one place at a time of contact, and the operation mode is changed to a multi-cursoring mode.

Next, it will be explained with respect to a case in which the key-top 700 is changed to a key-top 700 corresponding to a jog mode. As shown in FIG. 72B, electrically conductive patterns PA1, PA2 are pasted on positions of a rear surface of the key-top 700, which face respective electrically conductive patterns SA1, SA2 of the upper housing 810. When the key-top 700 is attached to the upper housing 810 at a time of change, respective electrostatic capacitances, for example, are changed by contacting the electrically conductive pattern PA1 and the electrically conductive pattern SA1 and by contacting the electrically conductive pattern PA2 and the electrically conductive pattern SA2. In the CPU 32, it is judged that the key-top attached to the upper housing 810 is a type corresponding to the jog mode by detecting the electrostatic capacitance of two places at a time of contact, and the operation mode is changed to the jog mode.

Next, it will be explained with respect to a case in which the key-top 700 is changed to a key-top 720 corresponding to a trackball mode. As shown in FIG. 72C, electrically conductive patterns PA1, PA2, PA3 are pasted at positions of a rear surface of the key-top 720, which face the respective electrically conductive patterns SA1, SA2, SA3 of the upper housing 810. When the key-top 720 is attached to the upper housing 810 at a time of change, respective electrostatic capacitances, for example, are changed by contacting the electrically conductive pattern PA1 and the electrically conductive pattern SA1, by contacting the electrically conductive pattern PA2 and the electrically conductive pattern SA2 and by contacting the electrically conductive pattern PA3 and the electrically conductive pattern SA3. In the CPU 32, it is judged that the key-top attached to the upper housing 810 is a type corresponding to the trackball mode by detecting the electrostatic capacitance of three places at a time of contact, and the operation mode is changed to the trackball mode. It is also allowed to execute the detection method by detecting a generating signal caused by the electrical conduction.

Also, when the operation mode is changed in a menu screen (initial screen), icons corresponding to a [multi-cursoring mode], a [JOG dial mode] and a [trackball mode] are displayed in the menu screen. Then, when a predetermined icon is selected by the user, the operation mode is changed by changing to the operation mode corresponding to the selected icon.

<Modified Example of Scroll Amount Calculation>

Figure 73:
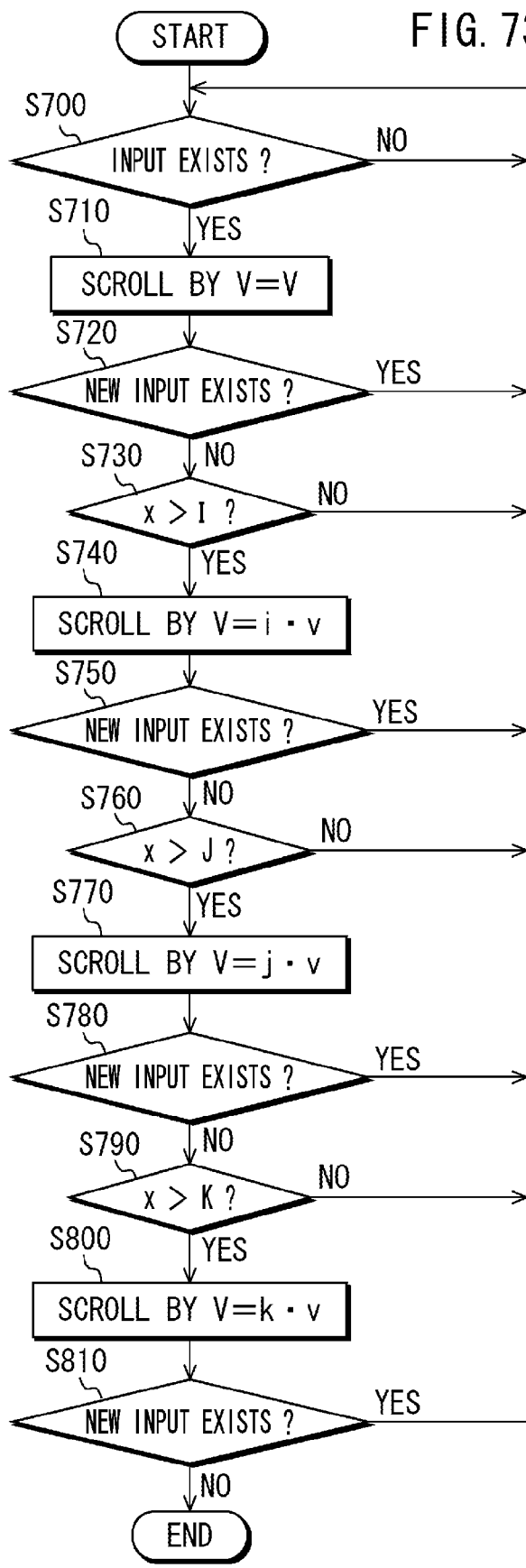
FIG. 73 is a flowchart for calculating amount of scroll in response to the velocity.

The following describe a modified example of the scroll amount calculation at the time of a trackball mode. FIG. 73 is a flowchart in a case in which the scroll amount is calculated in consideration of inertia by the slide operation of the user. In the present embodiment, by using the key-top 720 corresponding to a trackball mode (see FIG. 59), it is assumed that a scroll image (GUI: Graphical User Interface) of a telephone directory, a music title list or the like, for example, is displayed on the screen of the display unit 29.

In step S700, the CPU 32 judges whether or not the position detection information D1 is inputted by the slide operation of the key-top 720 of the user. By the malfunction detection operation of the step S300 to the step S340 shown by FIG. 69, it is possible to judge whether or not the position detection information D1 is inputted. If the CPU 32 judges that the position detection information D1 is inputted, the CPU calculates the scroll amount "x" of the X direction, for example, from the amount of movement of the operation body in the time point T based on the detected position detection information D1 and at the same time, calculates a scroll speed "v" based on the slide operation of the user at that time, and the operation shifts to step S710. On the other hand, if the CPU 32 judged that the position detection information D1 is not inputted from the user, the operation returns to step S700.

In step S710, the CPU 32 controls the display unit 29 such that the scroll image displayed on the screen of the display unit 29 is scrolled by the scroll speed V=v. At this time, the CPU 32 controls such that the scroll amount of the scroll image is a threshold "I" or less. Here, thresholds I, J, K are constants for adjusting the scroll amount of the image in response to the scroll amount "x" by the slide operation of the user, and the thresholds I, J, K satisfy a relationship of 0<I<J<K.

In step S720, the CPU 32 judges whether or not new position detection information D1 is inputted. The operation shifts to step S730 if the CPU 32 judged that the new position detection information D1 is not inputted, and if the CPU 32 judged that the new position detection information D1 is inputted, the CPU controls so as to stop the scroll of the image and the operation returns to step S700.

In step S730, the CPU 32 judges whether or not the scroll amount "x" exceeds the threshold "I". The operation shifts to step S740 when the CPU 32 judged that the scroll amount "x" exceeds the threshold "I". On the other hand, the operation returns to step S700 when the CPU 32 judged that the scroll amount "x" does not exceed the threshold "I". In this case, the scroll image is scrolled by the scroll speed V=v and stopped.

In step S740, the CPU 32 controls the display unit 29 such that the scroll image displayed on the screen of the display unit 29 is scrolled by the scroll speed V=i·v. At this time, the CPU 32 controls such that the scroll amount of the scroll is a threshold (J-I) or less. constants i, j, k are the values considered inertia force in response to the slide operation of the user, and the constants i, j, k satisfy a relationship of k<j<i<1. In this manner, the characteristics of an actual trackball is considered, and a state in which the speed decelerates gradually from initial speed by inertia caused by rotation of a trackball is reflected to the scroll speed of the scroll image. The scroll speed "V" decelerates from the "v" to the "i·v".

In step S750, the CPU 32 judges whether or not new position detection information D1 is inputted. The operation shifts to step S760 if the CPU 32 judged that the new position detection information D1 is not inputted, and if the CPU 32 judged that the new position detection information D1 is inputted, the CPU controls so as to stop the scroll of the image and the operation returns to the step S700.

In step S760, the CPU 32 judges whether or not the scroll amount "x" exceeds the threshold "J". The operation shifts to step S770 when the CPU 32 judged that the scroll amount "x" exceeds the threshold "J", and the operation returns to the step S700 when the CPU 32 judged that the scroll amount "x" does not exceed the threshold "J".

In step S770, the CPU 32 controls the display unit 29 such that the scroll image displayed on the screen of the display unit 29 is scrolled by the scroll speed V=j·v. At this time, the CPU 32 controls such that the scroll amount of the scroll image is a threshold (K-J) or less. Thus, the scroll speed "V" decelerates gradually by v→i·v→j·v.

In step S780, the CPU 32 judges whether or not new position detection information D1 is inputted. The operation shifts to step S790 if the CPU 32 judged that the new position detection information D1 is not inputted, and if the CPU 32 judged that the new position detection information D1 is inputted, the CPU controls so as to stop the scroll of the image, and the operation returns to the step S700.

In the step S790, the CPU 32 judges whether or not the scroll amount "x" exceeds the threshold "K". The operation shifts to step S800 when the CPU 32 judged that the scroll amount "x" exceeds the threshold "K", and the operation returns to the step S700 when the CPU 32 judged that the scroll amount "x" does not exceed the threshold "K".

In step S800, the CPU 32 controls the display unit 29 such that the scroll image displayed on the screen of the display unit 29 is scrolled by the scroll speed V=k·v. At this time, the CPU 32 controls such that the scroll amount of the scroll image is a threshold (x-K) or less. Thus, the scroll speed "V" decelerates gradually by v→i·v→j·v→k·v.

In step S810, the CPU 32 judges whether or not new position detection information D1 is inputted. A series of the above-mentioned operation ends if the CPU 32 judged that the new position detection information D1 is not inputted, and if the CPU 32 judged that the new position detection information D1 is inputted, the operation returns to the step S700.

In the mobile phone 800 relating to the present embodiment, even after the operation body is apart from the key-top 720, it is controlled such that the image is scrolled by a predetermined scroll amount in response to the scroll amount "x" when inputting and the scroll speed of the image decelerates gradually. Thus, it is possible for the user to obtain artificially such a feeling as scrolling the image by inertia like on an occasion of the operation of a trackball and a JOG dial. Consequently, it is possible to provide the input device 850 and the mobile phone 800 which are excellent in operability and the feeling of attendance.

Embodiment 33

Figure 74:
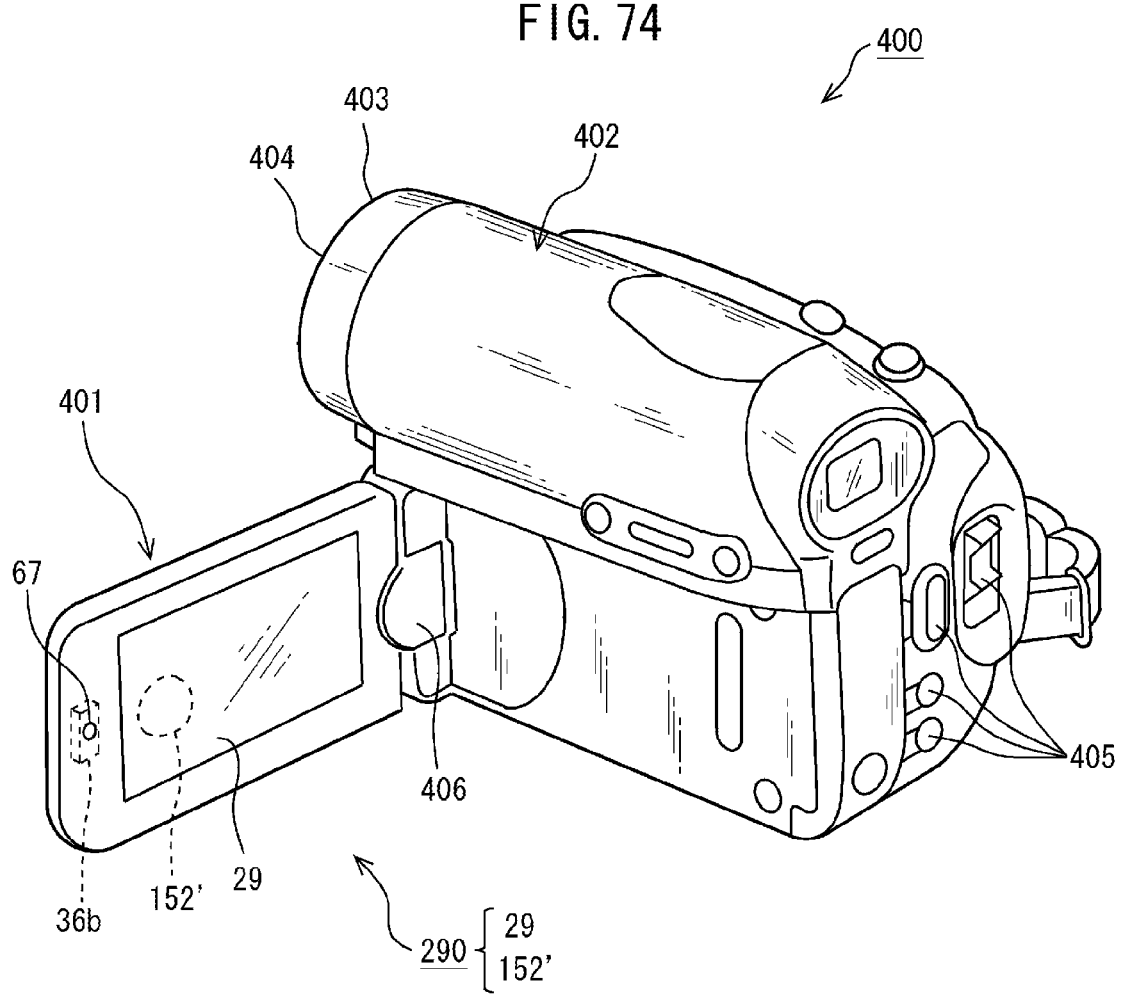
FIG. 74 is a perspective view of a video camera 400 as a thirty-third embodiment including any one of the embodiments of the input devices according to the present invention, which shows a configuration thereof.

FIG. 74 shows a configuration of a video camera 400 including an embodiment of the input device relating to the present invention as a thirtieth embodiment.

The video camera 400 shown in FIG. 74 constitutes another embodiment of an electronic apparatus that has a sense of touch function and presents sense of touch to an operation body (operator) at the time of an information input operation. The video camera 400 images a subject image and also records the surrounding sound. Any one of the input devices 10 to 290 explained in the first to the thirty-second embodiments is provided in the video camera 400, and the speaker 36b with actuator function is also applied to the video camera 400.

The video camera 400 includes a case 402 constituting a decoration and a lens mirror cylinder 403 in which an imaging optical system 404 is built is provided at a front surface upper portion of the case 402. An imaging device (not shown in drawings) for imaging a subject image introduced by the imaging optical system 404 is built-in in the rear end of the lens mirror cylinder 403.

There is provided on the rear surface, on the upper surface and on the side surface of the case 402 with various kinds of operation switches 405 such as a power switch, an imaging start/stop switch, a zoom switch and the like. On the left side surface of the case 402, a touch panel display device 401 is coupled to the case 402 so as to be openable/closable through a hinge, and displays the image imaged by an imaging device, which is not shown in the drawing.

There is provided in the touch panel display device 401, for example, with input device 290 explained in the twenty-ninth embodiment and the speaker 36b including actuator function shown in FIG. 14. According to the input device 290 explained in the twenty-ninth embodiment, as shown in FIG. 48, it is constituted by layering a display top member 63, a sensor 13' and a LCD device 64 in order from the upper portion. The display unit 29 is constituted by including the display top member 63 and the LCD device 64, and a key-top 152' which has a convex shape is arranged at the predetermined position thereof. The display unit 29 displays information inputted by the key-top 152'.

The key-top 152' is arranged, for example, on a little left side of the center region of the display unit 29 in order to improve the operability. The key-top 152' has a hemispheric convex shape having a predetermined height and width. The key-top 152' is slide-operated along one orbit of the hemispheric convex shape or/and is slide-operated along another orbit intersected with the orbit. It is needless to say that icon image for selecting input information is displayed on the display unit 29 through the LCD device 64 and the operator's finger may slide-operate along this icon image.

The speaker 36b is provided in the touch panel display device 40, and the speaker 36b is used containing: a lid member 1 including opening portions 1a, 1b, 1c, 1d at a predetermined region shown in FIG. 14; a housing portion 6 to which this lid member 1 is engaged; a yoke 5 for vibration which includes a bottomed cylindrical shaped concave portion 5a and which is arranged in the housing portion 6 freely movably; spring coils 51, 52 for supporting the yoke 5 freely movably in the housing portion 6; and a magnet 4 fixed at the bottom portion of the yoke 5 supported freely movably in the housing portion 6 thereof. The speaker further contains a coil 3 which includes a winding axis portion and which is arranged freely movably in the circumference of the magnet 4; and a vibration plate 2 which is mounted on one side of the winding axis portion of this coil 3 and which is sandwiched between the lid member 1 and the housing portion 6.

In this embodiment, when the icon image for input operation displayed on the display unit 29 for monitor of the touch panel display device 401 is operated by the finger, any click sound (cyber switch operation sound) is presented from the speaker 36b and at the same time, sense of touch is presented to operator's finger touching on the display screen. It becomes possible to determine, even in the video camera 400, the input of the scroll image 29a, 29b or the like which is displayed on the display unit 29 by this input operation. It should be noted that in the drawing, a hole 67 is an opening portion for click sound leaker.

In this manner, according to the video camera 400 as the thirtieth embodiment, there is included the embodiment of the input device 290 with sense of touch function relating to the present invention, the key-top 152' is provided on a little bit left side as compared with the center region of the display unit 29 in which the display top member 63, the sensor 13' and the LCD device 64 are layered in order, and the display top member 63 and the key-top 152' having a hemispheric convex shape are integrally molded or the key-top 152' is pasted on the display top member 63.

Consequently, it becomes possible to provide the video camera 400 including the input device 290 of an airtight structure to which water-resistance is abundant. Furthermore, in addition to the slide operation feeling of becoming thicker in an arc shape along one orbit of the hemispheric convex shape from one portion of the display surface of the display top member 63 of the display unit 29 in response to the slide operation by the operator's finger, it is possible to present the slide operation feeling of becoming thinner in an arc shape toward the other portion of the display surface. Further, in addition to the slide operation feeling of becoming thicker in an arc shape along another orbit intersected with one obit of the hemispheric convex shape from one portion of the display surface of the display top member 63, it is possible to present the slide operation feeling of becoming thinner in an arc shape toward the other portion of the display surface. Thus, the input operability of the video camera 400 applied with the input device 290 is improved and it becomes possible to obtain the unique operation feeling which does not exist in a touch panel in the past.

In the above-mentioned embodiments, although the slide-type mobile phone 101 or the like and the video camera 400 to which the input device with sense of touch function is applied, with respect to the electronic apparatus, it is not limited to these; it is needless to say that the input device with sense of touch function can be applied to the normal one axis hinge type mobile phone 102, the two-axes hinge type mobile phone 103, a mobile terminal device including display screens in both of the upper housing 11x and the lower housing 11y, a digital camera and the like.

It should be noted that table 1 shows operability evaluation results in the respective input devices that the present inventors carried out.

TABLE 1

|  | slide operation | push operation |
|---|---|---|
| related art "1" | 478 | 478 |
| related art "2" | 302 | 300 |
| the present invention "1" | 450 | 495 |
| the present invention "2" | 468 | 493 |

Figure 2:
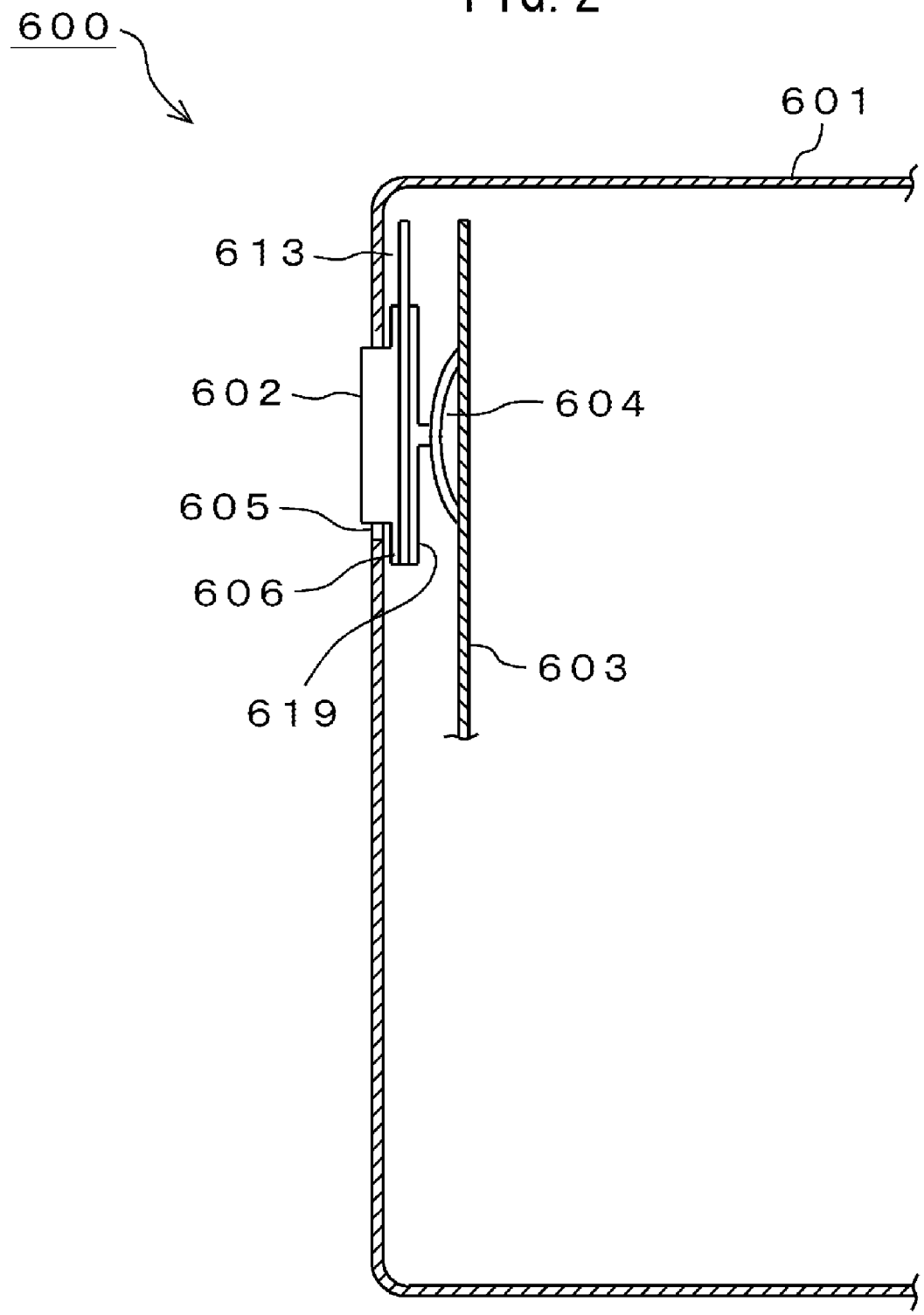
FIG. 2 is a cross-section diagram showing a configuration of an input device 600 relating to related art.

The operability evaluation results shown in table 1 are a summary of comparing operation accuracy in the respective input devices of related art "1", related art "2", the present invention "1" and the present invention "2". Such related art "1" relates to a case of the input device 500 of side jog rotary switch+dome switch structure as shown in FIG. 1. Such related art "2" relates to a case of the input device 600 with plane flat and unrotary key-top+dome switch as shown in FIG. 2. The present invention "1" relates to a case of the input device 30 with unrotary key-top+dome switch relating to the third embodiment shown in FIG. 16. The present invention "2" relates to a case of the input device 40 with unrotary key-top+dome switch+actuator function relating to the fourth embodiment shown in FIG. 17.

The slide operation and the push operation were evaluated with respect to these four input devices 30, 40, 500, 600. Any one of the evaluation methods was such that examinees were fifty members. With respect to the slide operation, the key-top operation in which a cursor was attached to and stopped at an aimed spot (target image) by a vertical scroll screen of the telephone directory application was executed. It was requested that items which the cursor was attached to and stopped at were ten pieces for one member. In this case, the number of right answers in which the cursor could be stopped at the target image by one time of the key-top operation was compared.

Also, with respect to the push operation, the key-top press-in operation was executed from a state of being selected and ended by a vertical scroll screen of the telephone directory application, a dome switch was turned on and the input determination (determination) operation was executed. In this case, it is a [right answer] if the target image which is selected before the key-top is pressed-into is directly determined, and it is made as a [wrong] if a different target image is selected or if the selection of the target image is not determined. The operation accuracy of the input devices 30, 40, 500, 600 was evaluated by comparing these numbers of right answers with respect to related art "1", related art "2", the present invention "1" and the present invention "2" respectively.

According to the operability evaluation result shown in table 1, with respect to the number of right answers in all 500 times of related art "1", related art "2", the present invention "1" and the present invention "2", respectively and in case of related art "1", the slide operation was 478 times and the push operation was 478 times. In case of related art "2", the slide operation was 302 times and the push operation was 300 times. In case of the present invention "1", the slide operation was 450 times and the push operation was 495 times. In case of the present invention "2", the slide operation was 468 times and the push operation was 493 times.

With respect to the slide operation, the present invention "1" and the present invention "2" were a little bit inferior to related art "1" in the number of right answers, but the operational reliability was improved than related art "2". With respect to the push operation, both the present invention "1" and the present invention "2" were a lot of the number of right answers than related art "1" and related art "2" and the operational reliability was improved. According to related art "1", a failure in which a key-top was rotated before a JOG dial was pressed-into and one in the vicinity of the target image was determined by mistake was seen. According to related art "2", a failure of a content in which when a key-top was pressed-into, it happened that a corner of the key-top was pressed-into, and a pusher piece was not pressed into a metal dome portion 511 accurately so that no target image was selected and determined was seen.

On the contrary, the present invention "1" and "2" employed a unrotary key-top+dome switch or a structure including a unrotary key-top+dome switch+actuator function, so that one in the vicinity of the target image was not determined by mistake and furthermore, a pusher piece comes to press-into the dome key accurately, so that it was possible to realize the high operability and reliability and it was possible to provide the input device 30, 40 or the like having excellent usability of user-friendliness.

The present invention is very preferable for applying to a digital camera, a video camera, a mobile phone, a mobile terminal device, a personal computer, a note type PC, a home system electronic apparatus and the remote controller thereof or the like.

It should be understood by those skilled in the art that various modifications, combinations, sub-combinations and alterations may occur depending on design requirements and other factors insofar as they are within the scope of the appended claims or the equivalents thereof.

What is claimed is:

1. An input device that inputs information by a slide operation depending on an operation body, the device comprising:
   a housing including an operation surface;
   a detection unit that is provided in the housing and detects a slide position inputted by a slide operation depending on the operation body; and
   an operation unit that covers at least a portion of the detection unit and is slide-operated along the operation surface of the housing,
   wherein the operation unit has a convex shape which becomes thicker along the sliding direction from one portion of the operation surface of the housing and also which becomes thinner toward the other portion of the operation surface thereof.

2. The input device according to claim 1, wherein a detection area in the detection unit, the detection area detecting the slide position of the operation body, is wider than an operation area in the operation unit, the operation area being slide-operated by the operation body.

3. The input device according to claim 2, wherein the convex shape of the operation unit forms an arc having predetermined height and width, and
   wherein the operation unit is slide-operated along a shape of the arc.

4. The input device according to claim 2, wherein the convex shape of the operation unit forms a hemisphere having predetermined height and width, and
   wherein the operation unit is slide-operated along at least one of one orbit of a shape of the hemisphere and another orbit intersecting with the orbit.

5. The input device according to claim 2, wherein the operation unit is constituted by a material that is different from a material of the housing,
   Wherein surface roughness of the material constituting the operation unit is less than surface roughness of the material constituting the housing.

6. The input device according to claim 2, wherein the operation unit is mounted on the housing detachably.

7. The input device according to claim 2, wherein the detection unit includes an electrostatic capacitance sheet member that detects the slide position of the operation body to output a position detection signal.

8. The input device according to claim 2, wherein the detection unit includes a pressure detecting sheet member that detects a pressure of the slide position of the operation body to output a pressure detection signal.

9. The input device according to claim 2, further comprising a switch portion that is switched by a press-in operation of the operation unit.

10. The input device according to claim 9, wherein the switch portion is provided at a pressing projection lower portion of the operation unit or at a position other than the pressing projection lower portion of the operation unit.

11. The input device according to claim 2, wherein a vibration body generating vibration is provided with respect to the slide position of the operation body, which is detected by the detection unit.

12. The input device according to claim 2, further comprising:
a display unit that displays a scroll image with respect to the slide position of the operation body, the slide position being detected by the detection unit; and
a control unit that detects the slide operation speed of the operation body and adjusts a display pitch of the scroll image on the display unit in response to the slide operation speed of the operation body.

13. The input device according to claim 2 further comprising:
a display unit that displays an image based on the slide position inputted by the operation unit; and
a control unit that performs a display control of the image displayed on the display unit,
wherein the control unit calculates any one of speed and acceleration of the operation body based on the slide position detected by the detection unit and adjusts amount of movement of the image displayed on the display unit in response to any one of the calculated speed and the calculated acceleration.

14. The input device according to claim 13, wherein the control unit calculates amount of movement of the operation body from the slide position of the operation body, the slide position being detected by the detection unit, and determines whether or not the slide position inputted by the operation body is caused by a malfunction based on a comparison result between the calculated amount of movement of the operation body and a preset threshold value.

15. An electronic apparatus comprising:
a housing having an operation surface; and
an input device that is provided at the housing and inputs information by a slide operation depending on an operation body,
wherein the input device includes:
a detection unit that is provided in the housing and detects the slide position of the operation body; and
an operation unit that covers at least a portion of the detection unit and is slide-operated along an operation surface of the housing, and
wherein the operation unit includes a convex shape which becomes thicker along a sliding direction from one portion of the operation surface of the housing and also which becomes thinner toward the other portion of the operation surface thereof.

16. The electronic apparatus according to claim 15, wherein the housing and the operation unit are formed integrally.

17. The electronic apparatus according to claim 16, wherein a ten-key portion is provided on the operation surface of the housing, and
wherein the operation unit is formed by being molded integrally with the ten-key portion.

18. The electronic apparatus according to claim 16, wherein a light source is provided in the housing and the operation unit is provided with a photoconductive member, and
wherein light is illuminated from the light source in the housing to the photoconductive member.

19. The electronic apparatus according to claim 16 further comprising a display unit that displays information inputted by the operation unit,
wherein the operation unit forming a convex shape is arranged at a predetermined position of the display unit.

* * * * *